US012768072B2

(12) United States Patent
Crossmann et al.

(10) Patent No.: US 12,768,072 B2
(45) Date of Patent: Oct. 20, 2026

(54) METHOD AND DEVICE FOR PRODUCING A SiC SOLID MATERIAL

(71) Applicant: Zadient Technologies SAS, Sainte-Hélène-du Lac (FR)

(72) Inventors: Ivo Crossmann, Hamburg (DE); Friedrich Schaaff, Halle (DE); Hilmar Richard Tiefel, Dresden (DE); Kagan Ceran, Saint Baldoph (FR)

(73) Assignee: Zadient Technologies SAS, Sainte-Helene-du-Lac (FR)

( * ) Notice: Subject to any disclaimer, the term of this patent is extended or adjusted under 35 U.S.C. 154(b) by 60 days.

(21) Appl. No.: 18/266,227

(22) PCT Filed: Dec. 13, 2021

(86) PCT No.: PCT/EP2021/085512
§ 371 (c)(1),
(2) Date: Jun. 8, 2023

(87) PCT Pub. No.: WO2022/123083
PCT Pub. Date: Jun. 16, 2022

(65) Prior Publication Data

US 2024/0035201 A1 Feb. 1, 2024

(30) Foreign Application Priority Data

Dec. 11, 2020 (DE) ..................... 10 2020 215 755.3
Nov. 19, 2021 (WO) ................. PCT/EP2021/082331

(51) Int. Cl.
*C03B 25/08* (2006.01)
*C01B 32/956* (2017.01)
(Continued)

(52) U.S. Cl.
CPC ............ *C30B 25/08* (2013.01); *C01B 32/956* (2017.08); *C01B 32/977* (2017.08);
(Continued)

(58) Field of Classification Search
CPC ................ C01B 32/956; C01B 32/977; C01B 33/035; C01B 32/963; C23C 16/325;
(Continued)

(56) References Cited

U.S. PATENT DOCUMENTS 3,011,877 A 12/1961 Schweickert et al.
3,030,189 A 4/1962 Schweickert et al.
(Continued)

FOREIGN PATENT DOCUMENTS

CN 102985363 A 3/2013
CN 108 910 890 A 11/2018
(Continued)

OTHER PUBLICATIONS

Notification of Reasons for Refusal, issued in Japanese Application No. 2023-559160 on Jan. 20, 2025, 8 pages.
(Continued)

*Primary Examiner* — Lawrence D Ferguson
(74) *Attorney, Agent, or Firm* — McDonnell Boehnen Hulbert & Berghoff LLP

(57) ABSTRACT

The present invention relates to a method for producing a preferably elongated SiC solid, in particular of polytype 3C. The method according to the invention preferably includes at least the following steps: introducing at least a first source gas into a process chamber, said first source gas comprising Si, introducing at least one second source gas into the process chamber, the second source gas comprising C, electrically energizing at least one separator element disposed in the process chamber to heat the separator element, setting a deposition rate of more than 200 μm/h, where a pressure in the process chamber of more than 1 bar is generated by the introduction of the first source gas and/or the second source gas, and where the surface of the depo-
(Continued)

sition element is heated to a temperature in the range between 1300 °C and 1800 °C

27 Claims, 19 Drawing Sheets

(51) Int. Cl.

| | |
|---|---|
| ***C01B 32/977*** | (2017.01) |
| ***C23C 16/32*** | (2006.01) |
| ***C23C 16/44*** | (2006.01) |
| ***C23C 16/455*** | (2006.01) |
| ***C23C 16/46*** | (2006.01) |
| ***C23C 16/52*** | (2006.01) |
| ***C23C 16/54*** | (2006.01) |
| ***C30B 23/00*** | (2006.01) |
| ***C30B 23/06*** | (2006.01) |
| ***C30B 25/08*** | (2006.01) |
| ***C30B 25/14*** | (2006.01) |
| ***C30B 25/18*** | (2006.01) |
| ***C30B 29/36*** | (2006.01) |
| ***C30B 35/00*** | (2006.01) |

(52) U.S. Cl.
CPC ........ *C23C 16/325* (2013.01); *C23C 16/4411* (2013.01); *C23C 16/4412* (2013.01); *C23C 16/45593* (2013.01); *C23C 16/46* (2013.01); *C23C 16/463* (2013.01); *C23C 16/52* (2013.01); *C23C 16/545* (2013.01); *C30B 23/005* (2013.01); *C30B 23/06* (2013.01); *C30B 23/066* (2013.01); *C30B 25/14* (2013.01); *C30B 25/18* (2013.01); *C30B 29/36* (2013.01); *C30B 35/007* (2013.01); *C01P 2006/11* (2013.01); *C01P 2006/80* (2013.01)

(58) Field of Classification Search
CPC ............. C23C 16/4404; C23C 16/4411; C23C 16/4412; C23C 16/45593; C23C 16/46; C23C 16/463; C23C 16/52; C23C 16/545; C23C 16/45512; C01P 2006/11; C01P 2006/80; C01P 2006/10; C30B 23/00; C30B 23/005; C30B 23/02; C30B 23/06; C30B 23/066; C30B 25/08; C30B 25/14; C30B 25/18; C30B 29/36; C30B 35/00; C30B 35/007; C30B 25/10; F27B 14/00; H01L 21/02529; H01L 21/02631
See application file for complete search history.

(56) References Cited

U.S. PATENT DOCUMENTS

| | | | |
|---|---|---|---|
| 3,157,541 | A | 11/1964 | Heywang et al. |
| 4,314,525 | A | 2/1982 | Hsu et al. |
| 4,491,604 | A | 1/1985 | Lesk et al. |
| 5,698,261 | A | 12/1997 | Ivanov et al. |
| 6,086,672 | A | 7/2000 | Hunter et al. |
| 6,791,917 | B2 | 9/2004 | Hayashi |
| 7,767,022 | B1 | 8/2010 | Gupta et al. |
| 8,512,471 | B2 | 8/2013 | Zwieback et al. |
| 9,315,895 | B2 | 4/2016 | Miyazawa et al. |
| 10,396,163 | B2 | 8/2019 | Wada et al. |
| 10,907,273 | B2 | 2/2021 | Myronov et al. |
| 11,851,784 | B2 | 12/2023 | Chen et al. |
| 11,859,309 | B2 | 1/2024 | Ahn et al. |
| 12,014,924 | B2 | 6/2024 | Kanbara et al. |
| 12,125,701 | B2 | 10/2024 | Khlebnikov et al. |
| 12,127,701 | B2 | 10/2024 | Kim |
| 12,330,948 | B2 | 6/2025 | Dukes et al. |
| 2002/0019117 | A1 | 2/2002 | Nagasawa |
| 2002/0083891 | A1 | 7/2002 | Vodakov et al. |
| 2004/0178176 | A1 | 9/2004 | Dunn |
| 2004/0194694 | A1 | 10/2004 | Sugiyama et al. |
| 2006/0073707 | A1 | 4/2006 | Powell et al. |
| 2007/0110657 | A1 | 5/2007 | Hunter |
| 2007/0251455 | A1 | 11/2007 | Wan et al. |
| 2008/0022923 | A1 | 1/2008 | Kordina et al. |
| 2008/0072817 | A1 | 3/2008 | Zwieback et al. |
| 2008/0115719 | A1 | 5/2008 | Gupta et al. |
| 2009/0130333 | A1 | 5/2009 | Kim et al. |
| 2010/0291328 | A1 | 11/2010 | Forrest et al. |
| 2011/0159214 | A1 | 6/2011 | Gum et al. |
| 2011/0229638 | A1 | 9/2011 | Qin |
| 2011/0274851 | A1 | 11/2011 | Miyazawa et al. |
| 2011/0290175 | A1 | 12/2011 | Paranjpe et al. |
| 2011/0308449 | A1 | 12/2011 | Katsuno et al. |
| 2012/0225004 | A1 | 9/2012 | Zwieback et al. |
| 2012/0285370 | A1 | 11/2012 | Gupta et al. |
| 2013/0040103 | A1 | 2/2013 | Asamura et al. |
| 2013/0153836 | A1 | 6/2013 | Miyamoto |
| 2013/0309496 | A1 | 11/2013 | Zwieback et al. |
| 2014/0038392 | A1 | 2/2014 | Yonehara et al. |
| 2014/0050648 | A1 | 2/2014 | Becker et al. |
| 2015/0123038 | A1 | 5/2015 | Dassel |
| 2016/0207783 | A1 | 7/2016 | Hopkins et al. |
| 2016/0348274 | A1 | 12/2016 | Genba et al. |
| 2017/0204532 | A1 | 7/2017 | Land |
| 2017/0321345 | A1 | 11/2017 | Xu et al. |
| 2018/0029893 | A1 | 2/2018 | Siller et al. |
| 2018/0118562 | A1 | 5/2018 | Drescher et al. |
| 2018/0290893 | A1 | 10/2018 | Dukes et al. |
| 2018/0327271 | A1 | 11/2018 | DesRosier et al. |
| 2019/0003046 | A1 | 1/2019 | Tanimoto et al. |
| 2019/0323145 | A1 | 10/2019 | Xu et al. |
| 2019/0360118 | A1 | 11/2019 | Fujikawa et al. |
| 2020/0071847 | A1 | 3/2020 | Vogel et al. |
| 2020/0199777 | A1 | 6/2020 | Drachev et al. |
| 2021/0163302 | A1 | 6/2021 | Rimboeck et al. |
| 2021/0301418 | A1 | 9/2021 | Deng et al. |
| 2021/0332497 | A1 | 10/2021 | Chen et al. |
| 2023/0197435 | A1 | 6/2023 | Biard |
| 2023/0407519 | A1 | 12/2023 | Ceran et al. |
| 2024/0026566 | A1 | 1/2024 | Crössmann et al. |
| 2024/0034635 | A1 | 2/2024 | Crössmann et al. |
| 2024/0035153 | A1 | 2/2024 | Crössmann et al. |
| 2024/0035201 | A1 | 2/2024 | Crossmann |
| 2024/0044045 | A1 | 2/2024 | Crossmann et al. |
| 2024/0060211 | A1 | 2/2024 | Crossmann et al. |
| 2024/0093408 | A1 | 3/2024 | Crossmann et al. |
| 2025/0305140 | A1 | 10/2025 | Ceran et al. |
| 2025/0327208 | A1 | 10/2025 | Ceran et al. |
| 2025/0327210 | A1 | 10/2025 | Itou et al. |
| 2025/0341024 | A1 | 11/2025 | Ceran et al. |

FOREIGN PATENT DOCUMENTS

| | | | |
|---|---|---|---|
| CN | 208151525 | U | 11/2018 |
| CN | 108 977 795 | A | 12/2018 |
| CN | 109402731 | A | 3/2019 |
| CN | 110 331 439 | A | 10/2019 |
| CN | 111705363 | A | 9/2020 |
| CN | 116 695 252 | A | 9/2023 |
| DE | 1 184 738 | B | 1/1965 |
| DE | 601 24 472 | T2 | 9/2007 |
| DE | 102010044108 | A1 | 5/2012 |
| DE | 102004059191 | B4 | 7/2020 |
| EP | 1 186 685 | A2 | 3/2002 |
| EP | 1 205 584 | A1 | 5/2002 |
| EP | 0 859 879 | B1 | 7/2002 |
| EP | 1 471 168 | A | 10/2004 |
| EP | 2 264 223 | A2 | 12/2010 |
| EP | 2 465 979 | A2 | 6/2012 |
| EP | 2 024 536 | B1 | 7/2016 |
| EP | 3 351 660 | A1 | 7/2018 |
| EP | 3197847 | B1 | 11/2020 |
| EP | 4 279 451 | A1 | 11/2023 |
| GB | 988097 | A | 4/1965 |
| GB | 1 128 757 | A | 10/1968 |
| JP | 2000-169298 | A | 6/2000 |
| JP | 2002-362998 | A | 12/2002 |

(56) References Cited

FOREIGN PATENT DOCUMENTS

| | | | |
|---|---|---|---|
| JP | 2004-311649 | A | 11/2004 |
| JP | 2009-117533 | A | 5/2009 |
| JP | 2011-111372 | A | 6/2011 |
| JP | 5293732 | B2 | 9/2013 |
| JP | 2017-081800 | A | 5/2017 |
| JP | 2018-016498 | A | 2/2018 |
| JP | 2018-083738 | A | 5/2018 |
| KR | 10-2153501 | B1 | 9/2020 |
| WO | 2007/133025 | A1 | 11/2007 |
| WO | 2007/136209 | A1 | 11/2007 |
| WO | 2012/029952 | A1 | 3/2012 |
| WO | 2013/016823 | A1 | 2/2013 |
| WO | 2013/049314 | A2 | 4/2013 |
| WO | 2022/123083 | A2 | 6/2016 |
| WO | 2016/141579 | A1 | 9/2016 |
| WO | 2016/162428 | A1 | 10/2016 |
| WO | 2017/053883 | A1 | 3/2017 |
| WO | 2018/177707 | A1 | 10/2018 |
| WO | 2018/183585 | A1 | 10/2018 |
| WO | 2019/201439 | A1 | 10/2019 |
| WO | 2019/227395 | A1 | 12/2019 |
| WO | 2020/078328 | A1 | 4/2020 |
| WO | 2021/191511 | A1 | 9/2021 |
| WO | 2022/123072 | A1 | 6/2022 |
| WO | 2022/123078 | A1 | 6/2022 |
| WO | 2022123079 | A1 | 6/2022 |

OTHER PUBLICATIONS

Baliga; B. Jayant, "Wide Bandgap Semiconductor Power Devices", Materials, Physics, Design, and Applications, 2019, 21 pages.

"Carbon fibers", Carbon fibers—Wikipedia, https://en.wikipedia.0rg/w/index.php?title=carb0n_fibers&01did=900826785, 2019, 8 pages.

Wellmann et al., "Modified Physical Vapor Transport Growth of SiC—Control of Gas Phase Composition for Improved Process Conditions", Materials Science Forum, Silicon Carbide and Related Materials, 2005, vols. 483-485, 25-30.

Kobayashi et al., "Tensile Strength of Carbon-Carbon Composites at High Temperature up to 2773K", ICCM, 2009, vol. 17, 8 pages.

Nishizawa et al., "New Crucible Design for SiC Single Crystal Growth by Sublimation", Mat. Res. Soc. Symp., Materials Research Society, 2001, vol. 640, 6 pages.

"Reinforced carbon-carbon", Wikipedia, The Wayback Machine—https://web.archive.orglweb/20220310232011lhtlps:l/en.wikipedia.org/wikilReinforced_carbon%E2%80%93carbon, 2022, 4 pages.

Notice of Reasons for Rejection issued in Japanese Application No. 2023-559160 on Jul. 28, 2025, 6 pages.

Jennings, M. R., "Bow Free 4" Diameter 3C-SiC Epilayers Formed upon Wafer-Bonded Si/SiC Substrates", ECS Solid State Letters, 2012, 1(6), P85-P88.

Notification for the Opinion of Examination issued in Taiwanese Application No. 110146555 on Jul. 8, 2025, 27 pages.

Extended European Search Report issued in European Patent Application No. 22173980.8 on Nov. 22, 2022, 11 pages.

International Search Report issued in Int'l Application No. PCT/EP2023/063306, mailed Oct. 17, 2023, 3 pages.

Written Opinion issued in Int'l Application No. PCT/EP2023/063306, mailed Oct. 17, 2023, 6 pages.

International Search Report and Written Opinion issued in International Application No. PCT/EP2023/057972, mailed Oct. 11, 2023, 10 pages.

Extended European Search Report issued in European Application No. 22173970.9, mailed Feb. 24, 2023, 12 pages.

International Search Report issued in Int'l Application No. PCT/EP2023/063308, mailed Oct. 9, 2023, 4 pages.

Written Opinion issued in Int'l Application No. PCT/EP2023/063308, mailed Oct. 9, 2023, 6 pages.

International Search Report issued in International Application No. PCT/EP2024/057950, mailed on Jun. 13, 2024, 4 pages.

Written Opinion issued in International Application No. PCT/EP2024/057950, mailed on Jun. 13, 2024, 4 pages.

Office Action issued in Taiwanese Patent Application No. 110143210, mailed Oct. 3, 2025, 21 pages.

International Preliminary Report on Patentability issued in International Application No. PCT/EP2024/074980, mailed on Oct. 9, 2025, 32 pages.

Desain et al., "Reaction of chlorine atom with trichlorosilane from 296 to 473K", The Journal of Chemical Physics, 2006, 125(22), 8 pages.

Duan et al., "Chlorination of trichlorosilane/chlorodimethylsilane using metal chlorides: experimental and mechanistic investigations", RSC Advances, 2023, 13(12), 7877-7885.

Zhang et al., "Optimization of thermal field of 150 mm SiC crystal growth by PVT method", RSC Advances, 2022, 12 (31), 19936-19945.

Partial European Search Report issued in International Application No. PCT/EP2025/068311, mailed Oct. 16, 2025, 14 pages.

International Search Report issued in International Application No. PCT/EP2024/074980, mailed on Dec. 4, 2024, 4 pages.

Written Opinion issued in International Application No. PCT/EP2024/074980, mailed on Dec. 4, 2024, 8 pages.

International Search Report issued in International Application No. PCT/EP2024/074973, mailed on Dec. 2, 2024, 4 pages.

Written Opinion issued in International Application No. PCT/EP2024/074973, mailed on Dec. 2, 2024, 10 pages.

Noda et al., "Reaction of Si with HCI to Form Chlorosilanes: Time Dependent Nature and Reacting Model", Journal of the Electrochemical Society, 2004, 151(6), C399-C404.

Office Action from Chinese Application No. 202180083690.X, dated May 21, 2026, with English translation.

Written Opinion of the International Searching Authority in PCT/EP2021/085492, mailed Apr. 4, 2022.

Wellmann, Review of SiC crystal growth technology, Semicond. Sci. Technol., 33(2018) 103001, pp. 1-21.

Office Action from Chinese Application No. 202180089271.7, dated Aug. 8, 2026.

Q. Cheng et al., Influence of hydrogen dilution on the growth of nanocrystalline silicon carbide films by low-frequency inductively coupled plasma chemical vapor deposition, ScienceDirect, Thin Solid Films 516 (2008), 5991-5995.

METHOD AND DEVICE FOR PRODUCING A SiC SOLID MATERIAL

CROSS REFERENCE TO RELATED APPLICATIONS

This application is a U.S. national phase of International Application No. PCT/EP2021/085512 filed Dec. 13, 2021, which claims priority to International Application No. PCT/EP2021/082331 filed Nov. 19, 2021, which claims priority to German Application No. 10 2020 215 755.3 filed Dec. 11, 2020, all of which are incorporated by reference herein in their entirety.

FIELD OF DISCLOSURE

The present invention relates to a SiC production reactor, to a SiC production facility, to a PVT source material production method, to a PVT source material, to a method for the production of at least one SiC crystal, to a SiC crystal, and to a system.

BACKGROUND

Power electronics based on silicon carbide (SiC) wafers exhibit improved performance over those based on conventional silicon (Si) wafers, primarily due to the wider bandgap of SiC which allows it to operate at higher voltages, temperatures, and frequencies. With the worldwide transition to electric vehicles (EVs) gaining momentum, there is an increased interest in high performance SiC based power electronics, but SiC wafers remain considerably more expensive than Si wafers.

Currently, the prevailing method for commercial production of SiC single crystals is physical vapor transport (PVT).

Presently, industrial SiC source material used is produced via the commercial Acheson process and then further purified by powdering and acid leaching. The Acheson process is yet the only known process for the production of SiC source material in industrial scale. Acid leaching is used to extract trace metals from the SiC but only penetrates to a depth of approximately less than 1 micron from the surface of the particles. Thus, the particles need to be small enough so that this penetration layer constitutes a sufficient ratio of the total volume of the particle. Consequently, the power SiC particles typically need to have an average particle size of 200-300 microns. At this average particle size, this material can only be purified to approximately 99.99% or 99.999%, otherwise referred to as 4N or 5N purity respectively.

In some cases, silicon powder is used, in particular mixed with graphite powder and sintered, to produce SiC source material. Powdering SiC material creates high surface area for contamination during handling and exposure to air. The main contaminants of concern are trace metals, nitrogen, and oxygen.

Despite the only moderate 4N or 5N purity of these acid leached or sintered SiC materials they are expensive and contribute significantly to the overall high cost of resultant SiC wafers. The moderate purity also contributes to high wafer costs in that impurities cause defects in crystals that must then be discarded rather than sliced into wafers. In other words, impurities in the source material contribute to low crystal yield.

The presence of trace metals in SiC source material are considered to be a major root cause for crystal defects of the resulting single crystal SiC boule grown by PVT. Currently the quality of singly crystal SiC boule in terms of crystal defects like dislocations is orders of magnitude below that of other semiconducting crystals like silicon or GaAs. These crystal defects lead to unwanted electrical shortcuts in SiC electrical devices (which in most cases are vertical devices) and diminish the electrical device yield. It is therefore mandatory to find a better solution to prevent crystal defects resulting from source material impurities.

Furthermore, metal impurities in a SiC wafer manufactured from a single crystal SiC boule interact with the subsequent implant and doping technologies to manufacture a SiC electrical device, which could lead to device failure and diminishes electrical devices yield.

Furthermore, concentrations or bands of impurities, in particular nitrogen, develop in the boule which then results in wafers from different heights in the same boule with conductivity that may be outside of the required range or varies from one side of a wafer to another. In the case of semi-insulating SiC wafers for RF applications, very low conductivity is required and therefore very low concentrations of trace metals and nitrogen are permissible in the wafer. In the case of conductive SiC wafers for power applications, a certain amount of conductivity is required. But this conductivity is achieved uniformly throughout the SiC boule by providing nitrogen gas into the PVT crucible during the entire growth time.

Form factor of the SiC source material is also important in PVT growth. Powder source material provides high initial surface area for sublimation and therefore a high initial sublimation rate. A high sublimation rate can be uneconomic in the event that all the vaporized SiC species cannot be incorporated into the crystal and become parasitic polycrystalline depositions on other parts of the crucible. Worse, high concentrations of SiC species in front of the crystal growth face can lead to nucleation in the vapor phase and formation of amorphous or polycrystalline inclusions in the monocrystalline boule. Over time, the powder source material tends to sinter together creating a single block of material with substantially reduced surface area and therefore tailing sublimation rate. This spiking and tailing sublimation curve for power source material results in overall slow growth with the possibility of defects in the grown crystal. Finally, powder source material, has a low tap density of approximately 1.2 g/cm$^3$ which limits the mass of material that can be loaded into the crucible and therefore the size of the crystal that can be grown.

Document GB1128757 discloses a method for the depositing of a thin coating of SiC. However, the teaching of GB1128757 does not relate to a method for the production of large quantities of SiC as PVT source material.

DE1184738 (B) discloses a method for producing silicon carbide crystals in monocrystalline and polycrystalline form by reacting silicon halides with carbon tetrachloride in a molar ratio of 1:1 in the presence of hydrogen on heated graphite bodies. In this process, a mixture of 1 volume percent silicon chloroform, 1 volume percent carbon tetrachloride and hydrogen is first passed over the graphite body at a flow rate of 400 to 600 l/h until a compact silicon carbide layer is formed on the graphite body, and then at a flow rate of 250 to 350 l/h over the deposition body at 1500 to 1600 °C.

This state of the art is disadvantageous because it does not meet today's requirements for high-purity SiC cheaply produced in large scale industrial processes. SiC is used in many areas of technology, in particular power applications and/or electromobility, to increase efficiency. In order for the products requiring SiC to be accessible to a mass market, the manufacturing costs must decrease and/or the quality must increase.

SUMMARY

It is therefore the object of the present invention to provide a low-cost supply of silicon carbide (SiC). Additionally or alternatively, high purity SiC shall be provided. Additionally or alternatively SiC shall be provided very fast. Additionally or alternatively SiC shall be producible very effectively. Additionally or alternatively, monocrystalline SiC having advantageous properties shall be produced.

The above mentioned object is solved by a SiC production reactor, in particular for the production of PVT source material, wherein the PVT source material is preferably UPSiC. The SiC production reactor according to the present invention comprises at least a process chamber, a gas inlet unit for feeding one feed-medium or multiple feed-mediums into a reaction space of the process chamber for generating a source medium, one or multiple SiC growth substrate, in particular more or up to 64 SiC growth substrates, arranged inside the process chamber for depositing SiC.

This solution is beneficial since the SiC production reactor can be used to produce SiC material, in particular PVT source material, on an industrial scale.

According to a preferred embodiment of the present invention each SiC growth substrate comprises a first power connection and a second power connection, wherein the first power connections are first metal electrodes and wherein the second power connections are second metal electrodes, wherein the first metal electrodes and the second metal electrodes are preferably shielded from a reaction space inside the process chamber, wherein each SiC growth substrate is coupled between at least one first metal electrode and at least one second metal electrode for heating the outer surface of the SiC growth substrates or the surface of the deposited SiC to temperatures between 1300 °C and 1800 °C, in particular by means of resistive heating and preferably by internal resistive heating. This embodiment is beneficial since the SiC growth substrates can be heated in a very effective manner.

Since flowing electrical current requires an inlet and an outlet electrode, these electrodes are preferably disposed in multiple pairs, such as preferably 12 pairs or 18 pairs or 24 pairs or 36 pairs or more. A deposition substrate respectively SiC growth substrate is preferably attached to each electrode, in particular metal electrode, of an electrode pair (first and second metal electrode) and the substrates are connected at the top by a cross member respectively bridge of the same material as the substrate to complete the electrical circuit. The deposition substrates respectively SiC growth substrates are preferably attached to the electrodes via an intermediate piece respectively chuck. The chuck preferably has a reducing cross-sectional area extending from the electrode to the deposition substrate so that electrical current is concentrated and resistive heating increases. The purpose of the chuck is to maintain a temperature below deposition temperature at the lower wider end and to maintain a temperature above deposition temperature at the upper narrower end. The chuck is preferably conical in shape. The chuck, deposition substrate, and bridge are preferably made from graphite or more preferably from high purity graphite with total ash content of less than 50000 ppm and preferably less than 5000 ppm and highly preferably less than 500 ppm. The deposition substrate is also preferably made from SiC. According to a further aspect of the present invention contact between first metal electrode and SiC growth substrate is in a different plane than the contact between second metal electrode and SiC growth substrate. The second electrode can preferably be arranged or provided on an opposite side of the process chamber and/or as part of the bell jar.

The process chamber is according to a preferred embodiment of the present invention at least surrounded by a base plate, a side wall section and a top wall section. This embodiment is beneficial since the process chamber can be isolated respectively defined by the base plate, side wall section and top wall section. The baseplate is preferably also disposed with a plurality of gas inlet ports and one gas outlet port or multiple a gas outlet ports. The gas inlet ports and outlet port are arranged so as to create an optimal flow of feed gas inside the CVD reactor respectively SiC production reactor, in particular SiC PVT source material production reactor, such that fresh feed gas is continually brought in contact with the deposition surfaces on the deposition substrates.

The gas inlet unit is according to a further preferred embodiment of the present invention coupled with at least one feed-medium source, wherein the one feed-medium source is a Si and C feed-medium source, wherein the Si and C feed-medium source provides at least Si and C, in particular $SiCl_3(CH_3)$, and wherein a carrier gas feed-medium source provides a carrier gas, in particular $H_2$, or wherein the gas inlet unit is coupled with at least two feed-medium sources, one of the two feed-medium sources is a Si feed medium source, wherein the Si feed medium source provides at least Si, in particular a Si gas according to the general formula $SiH_{4-y}X_y$ (X=[Cl, F, Br, J] und y=[0 . . . 4], and another one of the two feed-medium sources is a C feed medium source, wherein the C feed medium source provides at least C, in particular natural gas, Methane, Ethan, Propane, Butane and/or Acetylene, and wherein a carrier gas medium source provides a carrier gas, in particular $H_2$.

Alternatively the first feed medium is a Si feed medium, in particular a Si gas according to the general formula $SiH_{4-y}X_y$ (X=[Cl, F, Br, J] und y=[0 . . . 4], wherein the gas inlet unit is coupled with at least one feed-medium source, wherein a Si and C feed-medium source provides at least Si and C, in particular $SiCl_3(CH_3)$ and wherein a carrier gas feed-medium source provides a carrier gas, in particular $H_2$, or wherein the gas inlet unit is coupled with at least two feed-medium sources, wherein a Si feed medium source provides at least Si, in particular the Si feed medium source provides a first feed medium, wherein the first feed medium is a Si feed medium, in particular a Si gas according to the general formula $SiH_{4-y}X_y$ (X=[Cl, F, Br, J] und y=[0 . . . 4], and wherein a C feed medium source provides at least C, in particular the C feed medium source provided a second feed medium, wherein the second feed medium is a C feed medium, in particular natural gas, Methane, Ethan, Propane, Butane and/or Acetylene, and wherein a carrier gas medium source provides a third feed medium, wherein the third feed medium is a carrier gas, in particular $H_2$.

Natural gas preferably defines a gas having multiple components, wherein the largest component is methane, in particular more than 50% [mass] is methane and preferably more than 70%[mass] is methane and highly preferably more than 90%[mass] is methane and most preferably more than 95%[mass] or more than 99%[mass] is methane.

Thus, the SiC production reactor respectively the CVD SiC apparatus is preferably also equipped with a feed gas unit respectively a medium supply unit for feeding the feed gas to the gas inlet unit. The feed gas unit respectively medium supply unit ensures the feed gases are heated to the right temperature and mixed in the right ratios before they are pumped into the CVD reactor respectively SiC production reactor, in particular SiC PVT source material production reactor. The feed gas unit respectively medium supply unit begins with pipes and pumps which transport feed gases from their respective sources, in particular storage tanks, to the proximity of the CVD reactor respectively SiC production reactor, in particular SiC PVT source material production reactor. Here the mass flowrate of preferably each feed gas is preferably controlled by a separate mass flow meter connected to an overall process control unit so that the correct ratio of the various feed gases can be achieved. The separate feed gases are then preferably mixed in a mixing unit, in particular of the medium supply unit, and pumped into the CVD reactor respectively SiC production reactor, in particular SiC PVT source material production reactor, via the gas inlet unit, in particular via multiple gas inlet ports of the gas inlet unit. Preferably the feed gas unit respectively medium supply unit is able to mix three feed gases including an Si-bearing gas such as STC and/or TCS, a C-bearing gas such as methane, and a carrier gas such as H. In another preferred embodiment of the invention, there is a feed gas that bears both Si and C such as MTCS and the feed gas unit mixes two gases instead of three, namely MTCS and H. It should be noted that STC, TCS, and MTCS are liquid at room temperature. As such a preheater can be required upstream of the gas inlet unit, in particular upstream of the feed gas unit respectively medium supply unit to first heat these feed liquids so that they become feed gases ready for mixing with the other feed gases.

Preferably the gases are mixed such that there is a 1:1 atomic ratio between Si and C. In some cases, it may be more preferably to mix the gases such that there is a different atomic ratio between the Si and the C. Sometimes it is desirable to maintain the deposition surfaces at the higher end of the deposition temperature range of 1300 to 1600 °C to achieve a faster deposition rate. However, in such a condition there is the possibility of excess C deposition in the SiC. This can be moderated by mixing the feed gases such that the Si:C ratio is higher than 1:1, preferably 1:1.1 or 1:1.2, or 1:1.3. Conversely, sometimes it is desirable to maintain the deposition surfaces at the lower end of the deposition temperature range to achieve a slow stress-free deposition. In such a condition there is the possibility of excess Si deposition in the SiC. This can be moderated by mixing the feed gases such that the Si:C ratio is lower than 1:1, preferably 1:0.9, or 1:0.8, or 1:0.7.

A further important consideration for the feed gas mixture is the atomic ratio of H to Si and C. Excess H can dilute the Si and C and reduce the deposition rate. It can also increase the volume of vent gases exiting the CVD reactor respectively SiC production reactor, in particular SiC PVT source material production reactor, and complicate any treatment and recycling of these vent gases. On the other hand, insufficient H can retard the chemical reaction chain that results in the deposition of SiC. The molar ratio of $H_2$ to Si is preferably in the range of 2:1 to 10:1 and more preferably between 4:1 and 6:1.

According to a further embodiment of the present invention more or up to 4 or preferably 6 or 8 more or up to or highly preferably more or up to 16 or 32 or 64 or most preferably up to 128 or up to 256 SiC growth substrates can be arranged inside one SiC production reactor.

This embodiment is beneficial since the output of the SiC reactor can be significantly increased by adding additional SiC growth substrates.

A control unit for setting up a feed medium supply of the one feed-medium or the multiple feed-mediums into the process chamber is provided according to a further preferred embodiment of the present invention, wherein the control unit is configured to set up the feed medium supply between a minimum amount of feed medium supply [mass] per min. and a maximum amount of feed medium supply [mass] per min., wherein the minimum amount of feed medium supply [mass] per min. corresponds to a deposited minimum amount of Si [mass] and a minimum amount of C [mass] at a defined mass growth rate, wherein the defined mass growth rate is larger than 0.1 g per hour and per cm2 of the SiC growth surface, wherein the maximum amount of feed medium supply per min is up to 30% [mass] or to 20% [mass] or up to 10% [mass] or up to 5% [mass] or up to 3% [mass] higher compared to the minimum amount of feed medium supply. This embodiment is beneficial since the feed medium supply can be controlled in dependency of the desired SiC conditions.

The control unit is according to a further preferred embodiment of the present invention configured to control the current flow through the SiC growth substrate/s to maintain the surface temperature of the SiC growth substrate/s or to set up the surface temperature of the deposited SiC. This embodiment is beneficial since the deposition of the SiC can be maintained by setting up the required temperature conditions.

The control unit is according to a further preferred embodiment of the present invention configured to control the current flow and the amount of feed medium supply for at least one hour and preferably for at least two hours or four hours or six hours to continuously deposit SiC with the defined surface growth rate and/or with a defined radial growth rate. This embodiment is beneficial since large SiC solids can be generated.

The control unit is according to a further preferred embodiment of the present invention a hardware arrangement configured to modify the current flow, wherein modification of the current flow within a first defined time span from the start of a production run are predefined. This embodiment is beneficial since the hardware can be adapted to a defined process, thus additional sensors are not necessary. The first-time span is preferably one hour or more than one hour or up to 60% of the duration of the production run or up to 80% of the duration of the production run or up to 90% of the duration of the production run or up to 100% of the duration of the production run. The hardware arrangement is preferably configured to modify the amount of feed medium supply, wherein modification of the amount of feed medium supply within a second defined time span from the start of a production run is predefined, wherein the second time span is one hour or more than one hour or up to 60% of the duration of the production run or up to 80% of the duration of the production run or up to 90% of the duration of the production run or up to 100% of the duration of the production run.

At least one sensor is according to a further preferred embodiment of the present invention provided, wherein the sensor is coupled with the control unit to provide sensor signals or sensor data to the control unit, wherein the control unit controls current flow and the amount of feed medium supply in dependency of the sensor signals or sensor data of the at least one sensor, wherein the at least one sensor is a temperature sensor for monitoring the surface temperature of at least one of the substrates. At least one temperature sensor is preferably a camera, in particular an IR camera, wherein preferably multiple temperature sensors are provided, wherein the number of temperature sensors corresponds to the number of SiC growth substrates, wherein per 10 SiC growth substrates at least 1, in particular 2 or 5 or 10 or 20, temperature sensor is provided or wherein per 5 SiC growth substrates at least 1, in particular 2 or 5 or 10 or 20, temperature sensor is provided or wherein per 2 SiC growth substrates at least 1, in particular 2 or 5 or 10 or 20, temperature sensor is provided, wherein the temperature sensor preferably outputs temperature sensor signals or temperature sensor data representing a measured temperature, in particular surface temperature. This embodiment is beneficial since the conditions inside the SiC production reactor can be immediately adjusted.

At least one substrate diameter measuring sensor is according to a further preferred embodiment of the present invention provided, wherein the substrate diameter measuring sensor is preferably an IR camera for determining substrate diameter growth, wherein the substrate diameter measuring sensor preferably outputs diameter measuring signals or diameter measuring data representing a measured substrate diameter or a variation of a measured substrate diameter and/or a resistance determination means for determining electrical resistance variation for determining substrate diameter growth, wherein the substrate diameter measuring sensor preferably outputs diameter measuring signals or diameter measuring data representing a measured substrate diameter or a variation of a measured substrate diameter. This embodiment is beneficial since in dependency of the measured data or values parameter like current flow or feed medium supply can be amended, in particular increased.

One valve or multiple vales is/are according to a further preferred embodiment of the present invention provided, wherein the one or multiple valves are configured to be actuated in dependency of the measured temperature, in particular in dependency of the temperature sensor signals or temperature sensor data and/or wherein the one or multiple valves are configured to be actuated in dependency of the measured substrate diameter, in particular in dependency of the diameter measuring signals or diameter measuring data. The one valve or the multiple valves can be part of the gas inlet unit. This embodiment is beneficial since a feed medium flow and/or vent gas flow can be controlled. Thus, the control unit is according to a further preferred embodiment of the present invention configured to increasing the electrical energizing of the at least one SiC growth substrate over time, in particular to heat a surface of the deposited SiC to a temperature between 1300 °C and 1800 °C The power supply unit for providing the current is according to a further preferred embodiment of the present invention configured to provide current in dependency of the diameter measuring signals or diameter measuring data. This embodiment is beneficial since a feed medium flow and/or vent gas flow can be controlled.

Thus, the control unit is preferably configured to receive the temperature sensor signals or temperature sensor data and/or the diameter measuring signals or diameter measuring data and to process the temperature sensor signals or temperature sensor data and/or the diameter measuring signals or diameter measuring data and/or to control the one or multiple vales and/or the power supply unit.

The control unit is according to a further preferred embodiment of the present invention configured to control feed-medium flow and temperature of the surface of the deposited SiC for depositing SiC at the set deposition rate, in particular perpendicular deposition rate, for more than 2 hours, in particular for more or up to 3 hours or for more or up to 5 hours or for more or up to 8 hours or preferably for more or up to 10 hours or highly preferably for more or up to 15 hours or most preferably for more or up to 24 hours or up to 72 h or up to 100 h. This embodiment is beneficial since a large amount of SiC can be grown.

The base plate comprises according to a further preferred embodiment of the present invention at least one cooling element, in particular a base cooling element, for preventing heating the base plate above a defined temperature and/or the side wall section comprises at least one cooling element, in particular a bell jar cooling element, for preventing heating the side wall section above a defined temperature and/or the top wall section comprises at least one cooling element, in particular a bell jar cooling element, for preventing heating the top wall section above a defined temperature.

This embodiment is beneficial since the present invention discloses a CVD SiC apparatus for large volume commercial production of ultrapure bulk CVD SiC. The central equipment in the CVD SiC apparatus is the CVD unit respectively CVD reactor respectively SiC production reactor, in particular SiC PVT source material production reactor. The CVD reactor respectively SiC production reactor, in particular SiC PVT source material production reactor, preferably comprises a cooling element, in particular a double walled fluid, in particular water or oil, cooled lower housing respectively baseplate and a double walled liquid cooled upper housing respectively bell jar. The inner walls of the baseplate and in particular the bell jar are preferably made of materials with service temperatures compatible with the operating temperatures of the CVD reactor respectively SiC production reactor, in particular SiC PVT source material production reactor. In particular, the inner wall of the bell jar can be made from stainless steel. Preferably, this inner wall is additionally or alternatively coated with a reflective coating such as preferably silver or preferably gold to reflect back radiant energy and minimize heat losses and therefore electricity costs. The bell jar and/or the base plate are preferably made of stainless steel that withstands high temperatures. However, current high temperature steels with additions of chromium, nickel, cerium or yttrium only withstand temperatures up to 1300 °C (in air). As an example, the steel EN 1.4742 (X10CrAlSi18) is heat resistant up to temperatures of 1000 °C. In another example the alloy steel EN 2.4816 (UNS N06600) withstands temperature of 1250 °C, melts above 1370 °C, however its tensile strength drops to less than 10% of its room temperature value at temperatures above 1100 °C. Therefore, none of these steels can withstand the enormous temperature required for SiC absorption of more than 1300 °C.

It is therefore beneficial to provide a cooling element to reduce the temperature of the bell jar and/or the base plate to a level that is acceptable for the usage of high temperature stainless steel.

The baseplate is preferably disposed with one or multiple fluid, in particular water or oil, cooled electrodes for providing electrical through-connections to the CVD reactor respectively SiC production reactor, in particular SiC PVT source material production reactor, for the purpose of resistively heating deposition substrates. The cooling element is according to a further preferred embodiment of the present invention an active cooling element.

The base plate and/or side wall section and/or top wall section comprises according to a further preferred embodiment of the present invention a cooling fluid guide unit for guiding a cooling fluid, wherein the cooling fluid guide unit is configured limit heating of the base plate and/or side wall section and/or top wall section to a temperature below 1300 °C. This embodiment is beneficial since a metal, in particular steel bell jar can be provided. A steel bell jar is beneficial since it can be produced significant larger compared to quartz bell jars.

A base plate and/or side wall section and/or top wall section sensor unit is provided according to a further preferred embodiment of the present invention to detect temperature of the base plate and/or side wall section and/or top wall section and to output a temperature signal or temperature data, and a fluid forwarding unit is provided for forwarding the cooling fluid through the fluid guide unit. This embodiment is beneficial since a continuous cooling can take place without loss or contamination of the cooling fluid and/or the process chamber.

The fluid forwarding unit is according to a further preferred embodiment of the present invention configured to be operated in dependency of the temperature signal or temperature data provided by the base plate and/or side wall section and/or top wall section sensor unit. This embodiment is beneficial since metal impurities can be avoided in case the bell jar and/or base plate are operated at temperatures below 1000 °C and preferably below 800 °C and highly preferably below 400 °C respectively in case the bell jar and/or base plate are cooled to temperatures below 1000 °C and preferably below 800 °C and highly preferably below 400 °C.

The cooling fluid is according to a further preferred embodiment of the present invention oil or water, wherein the water preferably comprises at least one additive, in particular corrosion inhibiter/s and/or antifouling agent/s (biocides). This embodiment is beneficial since the cooling liquid can be modified to avoid defects or contaminations of the SiC production reactor.

The cooling element is according to a further preferred embodiment of the present invention a passive cooling element. This embodiment is beneficial since a passive cooling element does not require constant monitoring.

The cooling element is according to a further preferred embodiment of the present invention at least partially formed by a polished steel surface of the base plate, the side wall section and/or the top wall section. The cooling element is according to a further preferred embodiment of the present invention a coating, wherein the coating is formed above the polished steel surface and wherein the coating is configured to reflect heat. The coating is according to a further preferred embodiment of the present invention a metal coating or a comprises metal, in particular silver or gold or chrome, or alloy coating, in particular a CuNi alloy. The emissivity of the polished steel surface and/or of the coating is according to a further preferred embodiment of the present invention below 0.3, in particular below 0.1 or below 0.03. This embodiment is beneficial since due to the polished surface and/or the coating a high amount of heat radiation can be reflected back to the SiC growth surface.

Thus, at least one section of the bell jar surface and/or at least one section of the base unit surface comprises according to a further preferred embodiment of the present invention a coating, in particular a reflective coating, wherein the section of the bell jar surface and/or the section of the base unit surface delimits the reaction space, wherein the coating is a metal coating, in particular comprises or consists of gold, silver, aluminum and/or platinum and/or wherein the coating is configured to reflect at least 2% or at least 5% or at least 10% or at least 20% of the radiant energy radiated during one production run onto the coating.

The base plate comprises according to a further preferred embodiment of the present invention at least one active cooling element and one passive cooling element for preventing heating the base plate above a defined temperature and/or the side wall section comprises at least one active cooling element and one passive cooling element for preventing heating the side wall section above a defined temperature and/or the top wall section comprises at least one active cooling element and one passive cooling element for preventing heating the top wall section above a defined temperature.

The side wall section and the top wall section are formed according to a further preferred embodiment of the present invention by a bell jar, wherein the bell jar is preferably movable with respect to the base plate. More than 50% [mass] of the side wall section and/or more than 50% [mass] of the top wall section and/or more than 50% [mass] of base plate is according to a further preferred embodiment of the present invention made of metal, in particular steel. This embodiment is beneficial since large steel bell jars can be manufactured causing a significant increase in process chamber volume and therefore in potential SiC material. Thus a bell jar is preferably provided, wherein the bell jar comprises according to a further preferred embodiment of the present invention a contact region for forming an interface with the base unit, wherein the interface is sealed against leakage of gaseous species, wherein the bell jar comprises a bell jar cooling unit, wherein the bell jar cooling element forms at least one channel or trench or recess for holding or guiding a bell jar cooling liquid, wherein the bell jar cooling element is configured to cool at least one section of the bell jar and preferably the entire bell jar below a defined temperature respectively to remove a defined amount of heat per min during the production run. The bell jar cooling element and/or base plate cooling element is preferably controlled by the control unit. Additionally, or alternatively the bell jar cooling element and/or base cooling element are coupled with each other to form one major cooling unit.

The base unit comprises according to a further preferred embodiment of the present invention at least one base cooling element for cooling the base unit, wherein the base cooling element forms at least one channel or trench or recess for holding or guiding a base cooling liquid. The base cooling element is according to a further preferred embodiment of the present invention arranged in an area of at least one of the first metal electrodes and preferably also in an area of at least one second metal electrode, wherein the base cooling element is configured to cool the base unit, in particular a surface of the base unit, which is arranged inside the reactor, in the area of at least one of the first metal electrodes and preferably also in the area of the at least one second metal electrode below a defined temperature respectively to remove a defined amount of heat per min from the base unit or the base cooling element is configured to cool the entire base unit during a complete production run below a defined temperature respectively to remove a defined amount of heat per min during the production run. This embodiment is beneficial since electrodes can be operated with high current without damaging the SiC reactor.

The first metal electrode and the SiC growth substrate are according to a further preferred embodiment of the present invention connected with each other via a first graphite chuck and/or the second metal electrode and the SiC growth substrate are connected with each other via a second graphite chuck. This embodiment is beneficial since the current can be introduced in a homogeneous manner into the SiC growth substrate. The first graphite chuck and/or the second graphite chuck is/are according to a further preferred embodiment of the present invention mounted to the base unit.

The first metal electrodes and second metal electrodes are according to a further preferred embodiment of the present invention sealed from the reaction chamber to avoid metal species contamination of the reaction chamber by metal species of the first metal electrodes and second metal electrodes, the first metal electrodes and second metal electrodes preferably enter the base unit from a first side of the base unit, wherein the first metal electrodes and second metal electrodes preferably extend inside the base unit to another side of the base unit, wherein the other side of the base unit is opposite to the first side, wherein the first metal electrodes and preferably the second metal electrodes extend inside the base unit to a sealing level below a process chamber surface of the base unit, wherein the process chamber surface is formed on the other side of the base unit. This embodiment is beneficial since contaminations of the reaction space can be avoided.

A sealing wall member is according to a further preferred embodiment of the present invention formed between the sealing level and the process chamber surface, wherein the sealing wall member separates the SiC growth substrate from the first metal electrode and preferably from the second metal electrode. This embodiment is beneficial since short circuiting can be prevented.

The control unit is according to a further preferred embodiment of the present invention configured to control the current flow through the SiC growth substrate/s to maintain the surface temperature of the SiC growth substrate/s or to set up the surface temperature of the deposited SiC, wherein the control unit is coupled to a power supply unit for providing the current, wherein the power supply unit is configured to receive power supply data or power supply signals provided by the control unit; and/or the feed medium supply of the one feed-medium or the multiple feed-mediums into the process chamber, wherein the control unit is coupled to a medium supply unit for providing the one feed-medium or the multiple feed-mediums to the gas inlet unit, wherein the medium supply unit is configured to receive medium supply data or medium supply signals provided by the control unit; and/or a cooling of the base unit, wherein the control unit is coupled to the base cooling element for cooling the base unit, wherein the base cooling element is configured to receive base cooling data or base cooling signals provided by the control unit, and/or a cooling of the bell jar, wherein the control unit is coupled to the bell jar cooling element for cooling the bell jar, wherein the bell jar cooling element is configured to receive bell jar cooling data or bell jar cooling signals provided by the control unit, and/or the control unit is configured to set up a deposition rate, in particular perpendicular deposition rate, of more than 200 μm/h, in particular by controlling at least the power supply unit and the medium supply unit. This embodiment is beneficial since the control unit can control multiple parameters, thus the output can be increased by operating the heating, feeding and cooling units at the same time.

The medium supply unit is according to a further preferred embodiment of the present invention configured to feed the one feed-medium or multiple feed-mediums at a pressure of more than 1 bar, in particular of more than 1.2 bar or preferably of more than 1.5 bar or highly preferably of more than 2 bar or 3 bar or 4 bar or 5 bar respectively of up to 10 bar or up to 20 bar, into the process chamber. Additionally or alternatively the medium supply unit is according to a further preferred embodiment of the present invention configured to feed the one feed-medium or multiple feed-mediums and a carrier gas at a pressure of more than 1 bar, in particular of more than 1.2 bar or 1.5 bar or 2 bar or 3 bar or 4 bar or 5 bar, into the process chamber. This embodiment is beneficial since the material density is high inside the process chamber, thus a high amount of Si and C material reaches the SiC growth surface and therefore causes an enhanced SiC growth.

At least one SiC growth substrate and preferably multiple SiC growth substrates or all SiC growth substrates are according to a further preferred embodiment of the present invention formed like an I or E or U, wherein at least one SiC growth substrate or multiple SiC growth substrates or all SiC growth substrates are connected through the base unit, in particular the sealing wall member, with first metal electrodes and/or at least one SiC growth substrate and preferably multiple SiC growth substrates or all SiC growth substrates are formed like an I or E or U, wherein at least one SiC growth substrate or multiple SiC growth substrates or all SiC growth substrates are connected through the base unit, in particular the sealing wall member, with second metal electrodes. This embodiment is beneficial, in particular with respect to the U-shape, since the length of the SiC growth substrate can be nearly or about 2× the length of an I shape. Furthermore, the electrodes of a U-shaped SiC growth substrate can be mounted to the same wall member, in particular to a base plate.

The inlet unit comprises according to a further preferred embodiment of the present invention multiple orifices for setting up a turbulent gas flow inside the process chamber, in particular in a distance of less than 20 mm or less than 10 mm or less than 2 mm to the surface of the SiC growth substrate or to the surface of the SiC deposited on the SiC growth substrate. Since the surface of the deposited SiC growth, in particular continuously growth, the region wherein turbulent flow has to be maintained can change. This embodiment is beneficial since due to the turbulent flow the speed of deposition can be increased, since more Si and C material reaches the SiC growth substrate surface respectively the SiC growth surface.

The control unit is according to a further preferred embodiment of the present invention configured to control the medium supply unit to feed the one feed-medium or the multiple feed-mediums into the process chamber, wherein the one feed-medium or the multiple feed-mediums comprise the following molar ratio: Si:C, wherein Si=1 and C=0.8 to 1.1 or wherein the one feed-medium or the multiple feed-mediums comprise the following atomic ratio: Si:C, wherein Si=1 and C=0.8 to 1.1. This embodiment is beneficial since the desired material ratio can be controlled and set. Thus, a control unit for setting up a feed medium supply of the one feed-medium and the carrier gas into the process chamber is provided, wherein the control unit is preferably configured to control the medium supply unit to feed the one feed-medium into the process chamber in a defined molar ratio and/or defined atomic ratio, wherein the one feed-medium and the carrier gas comprise the following defined molar ratio: Si:H, wherein Si=1 and H=2 to 10, preferably 5 to 10 and highly preferably 5 to 7, or wherein the one feed-medium and the carrier gas comprise the following defined atomic ratio: Si:H, wherein Si=1 and H=2 to 10, preferably 5 to 10 and highly preferably 5 to 7 or a control unit for setting up a feed medium supply of the multiple feed-mediums into the process chamber, wherein the control unit is configured to control the medium supply unit to feed the multiple feed-mediums into the process chamber in a defined molar ratio and/or defined atomic ratio, wherein the multiple feed-mediums comprise the following defined molar ratio: Si:C, wherein Si=1 and C=0.8 to 1.1 or wherein the multiple feed-mediums comprise the following defined atomic ratio: Si:C, wherein Si=1 and C=0.8 to 1.1.

The Si and C feed-medium source is according to a further preferred embodiment of the present invention coupled with at least one Si and C feed-medium orifice of the inlet unit and the carrier gas feed-medium source is coupled with at least one carrier gas orifice of the inlet unit, wherein the Si and C feed-medium orifice and the carrier gas orifice preferably differ from each other or the Si and C feed-medium source and the carrier gas feed-medium source are coupled with at least one common mixing and/or guiding element, in particular a pipe, wherein the at least one common mixing and/or guiding element is coupled with at least one orifice of the inlet unit.

A Si and C supply device is according to a further preferred embodiment of the present invention provided for feeding the Si and C feed medium from the Si and C feed-medium source via the at least one orifice of the gas inlet unit into the reaction space and/or a carrier gas supply device is provided for feeding the carrier gas feed medium from the carrier gas feed-medium source via the at least one orifice of the inlet unit into the reaction space and/or a feed-medium supply device is provided for a mixture of the Si and C feed-medium and the carrier gas feed-medium from the common mixing and/or guiding element via the at least one orifice of the inlet unit into the reaction space.

Alternatively a Si feed medium source is according to a further preferred embodiment of the present invention coupled with at least one Si feed-medium source orifice of the inlet unit and wherein the C feed medium source is coupled provides at least one C feed-medium source orifice of the inlet unit and wherein a carrier gas medium source is coupled with at least one carrier gas feed-medium source orifice of the inlet unit, wherein the Si feed-medium source orifice and/or the C feed-medium source orifice and/or the carrier gas feed-medium source orifice differ from each other or the Si feed medium source and the C feed medium source are coupled with at least one common mixing and/or guiding element, in particular a pipe, wherein the at least one common mixing and/or guiding element is coupled with at least one orifice of the inlet unit or the Si feed medium source and the carrier gas feed-medium source are coupled with at least one common mixing and/or guiding element, in particular a pipe, wherein the at least one common mixing and/or guiding element is coupled with at least one orifice of the inlet unit or the C feed medium source and the carrier gas feed-medium source are coupled with at least one common mixing and/or guiding element, in particular a pipe, wherein the at least one common mixing and/or guiding element is coupled with at least one orifice of the inlet unit or the Si feed medium source and the C feed medium source and the carrier gas feed-medium source are coupled with at least one common mixing and/or guiding element, in particular a pipe, wherein the at least one common mixing and/or guiding element is coupled with at least one orifice of the inlet unit.

A Si supply device is according to a further preferred embodiment of the present invention provided for feeding the Si feed medium from the Si feed-medium source via the at least one orifice of the inlet unit into the reaction space and/or a C supply device is provided for feeding the C feed medium from the C feed-medium source via the at least one orifice of the inlet unit into the reaction space and/or a carrier gas supply device is provided for feeding the carrier gas from the carrier gas feed-medium source via the at least one orifice of the inlet unit into the reaction space. The Si supply device and/or the C supply device and/or the carrier gas supply device is preferably a pump, in particular a pressure pump.

At least one outlet unit respectively vent gas outlet for removing gas from the reaction space is provided according to a further preferred embodiment of the present invention as part of the bell jar and/or as part of the base unit. This embodiment is beneficial since the used gas can be conducted out of the process chamber, thus the amount of Si and C is less affected by the presence of not vented vent gas. A pump device is according to a further preferred embodiment of the present invention coupled with the outlet unit for removing gas from the reaction space, wherein the pump device is preferably a vacuum pump.

The Si feed-medium source is according to a further preferred embodiment of the present invention configured to provide the Si feed-medium with a purity of at least 6N, in particular 7N or preferably 8N or highly preferably 9N, the C feed-medium source is configured to provide the C feed-medium with a purity of at least 6N, in particular 7N or preferably 8N or highly preferably 9N or the Si and C feed-medium source is configured to provide the Si and C feed-medium with a purity of at least 6N, in particular 7N or preferably 8N or highly preferably 9N and the carrier gas feed-medium source is configured to provide the carrier gas feed-medium with a purity of at least 6N, in particular 7N or preferably 8N or highly preferably 9N. Thus, introducing at least a first feed-medium, in particular a first source gas, into the process chamber can take place, said first feed medium comprises Si, wherein the first-feed medium has a purity which excludes at least 99.99999% (ppm wt) of the substances B, Al, P, Ti, V, Fe, Ni, in particular of one or preferably multiple or highly preferably a majority or most preferably all of the substances B, Al, P, Ti, V, Fe, Ni, and introducing at least a second feed-medium, in particular a second source gas, into the process chamber, the second feed medium comprises C, wherein the second-feed medium has a purity which excludes at least 99.99999% (ppm wt) of the substances B, Al, P, Ti, V, Fe, Ni, in particular of one or preferably multiple or highly preferably a majority or most preferably all of the substances B, Al, P, Ti, V, Fe, Ni, and introducing a carrier gas, wherein the carrier gas has a purity which excludes at least 99.99999% (ppm wt) of the substances B, Al, P, Ti, V, Fe, Ni, in particular of one or preferably multiple or highly preferably a majority or most preferably all of the substances B, Al, P, Ti, V, Fe, Ni, or introducing one feed-medium in particular a source gas, into a process chamber, said feed medium comprises Si and C, wherein the feed medium has a purity which excludes at least 99.99999% (ppm wt) of the substances B, Al, P, Ti, V, Fe, Ni, in particular of one or preferably multiple or highly preferably a majority or most preferably all of the substances B, Al, P, Ti, V, Fe, Ni, and introducing a carrier gas, wherein the carrier gas has a purity which excludes at least 99.99999% (ppm wt) of the substances B, Al, P, Ti, V, Fe, Ni, in particular of one or preferably multiple or highly preferably a majority or most preferably all of the substances B, Al, P, Ti, V, Fe, Ni. Thus, present invention discloses a CVD reactor for the production of SiC source material that is at least 8N or preferably 9N pure when initially manufactured and is preferably provided in a granular or solid form factor that minimizes subsequent surface contamination during handling and use. This ultrapure SiC source material (UP-SiC) is made by the CVD reactor respectively process wherein the feed gases used can be purified to extremely high levels using effective techniques such as distillation.

The SiC respectively PVT source material SiC, in particular UPSiC, is typically first deposited in the form of long thick rods and then disaggregated, in particular cut or comminuted, to shapes or sizes suitable for use in PVT crucibles. The comminution equipment is preferably made of material that do not contaminate the SiC and there is also the possibility of a further acid etching step to remove fines and ensure surface purity. This embodiment is beneficial since large and very pure particles can be produced which have advantageous sublimation properties. In case an etching step is carried out only a few atom layers (less than 1 μm, compared to 10-50 μm in Si etching) will be removed, in particular by HF/HNO3. This is beneficial since due to the etching the bluish-brownish color after annealing can be removed. Additionally or alternatively the oxide layer can also be removed with an acidic pickling acid, e.g. consisting of HCl:HF:H2O2 and/or different acid mechanism.

Chemical vapor deposition occurs when the deposition substrates respectively SiC growth substrates are heated to the deposition temperature range and the feed gas mixture is introduced into the CVD reactor respectively SiC production reactor, in particular SiC PVT source material production reactor. When the feed gas mixture contacts the heated deposition substrate the energy provided initiates a series of forward and backward chemical reactions the net result of which is deposition of solid SiC on the deposition substrate. In the case where the feed gas mixture includes STC and methane, the net reaction can be summarized as follows:

$$SiCl_4+CH_4=SiC+4HCl$$

It should be noted that not every Si-bearing molecule and not every C-bearing molecule comes into contact with the deposition surfaces and undergoes the deposition reaction. Thus, it is preferred to pump in the feed gases at a higher rate than they depositing as SiC on the substrates. For example if X moles of SiC are being deposited per square centimeter of deposition surface every hour, then it may be necessary to pump into the CVD reactor respectively SiC production reactor, in particular SiC PVT source material production reactor, AX moles of Si and AX moles of C every hour, where A is in the range between 8 and 10. The lower that A is the more efficient the conversion efficiency is from feed gas to deposited SiC. This efficiency is improved by optimizing the gas flow inside the CVD reactor respectively SiC production reactor, in particular SiC PVT source material production reactor, to maximize the contacting of the feed gas mixture with the deposition surfaces.

The surface of the base unit delimiting according to a further preferred embodiment of the present invention the reaction space and a top surface section of the surface of the bell jar delimiting the reaction space are spaced arranged in a first distance, wherein the top surface section of the surface of the bell jar is arranged in height direction in the farthest distance to surface of the base unit, wherein the first distance is the farthest distance, and wherein the SiC growth substrate or SiC growth substrates extend for a second distance into the height direction, wherein the second distance has less than 90% of the height of the first distance or the second distance has less than 85% of the height of the first distance or the second distance has less than 80% of the height of the first distance or the second distance has less than 75% of the height of the first distance or the second distance has less than 70% of the height of the first distance or wherein the SiC growth substrate or SiC growth substrates extend for a second distance into the height direction, wherein the first distance is up to 10% higher or up to 20% higher or up to 30% higher or up to 50% higher compared to the second distance. The first distance is according to a further preferred embodiment of the present invention more than or up to or exactly 100 cm or preferably more than or up to or exactly 130 cm or more than or up to or exactly 150 cm or highly preferably more than or up to or exactly 170 cm or more than or up to or exactly 200 cm or more than or up to or exactly 250 cm or more than or up to or exactly 300 cm and/or an inner diameter of the reaction space is more than 50 cm or more than or up to or exactly or more than or up to or exactly 100 cm or preferably more than or up to or exactly 120 cm or highly preferably more than or up to or exactly 150 cm. This embodiment is beneficial since large SiC growth substrates can be used inside the SiC production reactor, thus the production efficiency can be increase.

The interface between the bell jar and the base unit comprises according to a further preferred embodiment of the present invention a sealing, wherein the sealing is configured to withstand pressure above 1 bar, in particular above 2 bar or above 5 bar and highly preferably between 1 and 20 bar. This embodiment is beneficial since a high feed medium density can be generated inside the process chamber causing a beneficial Si and C supply to the SiC growth substrate.

The bell jar, in particular the surface of the bell jar, is according to a further preferred embodiment of the present invention delimiting the reaction space, and/or the base unit, in particular the surface of the base plate delimiting the reaction space, is configured to withstand chemical treatments, in particular caustic soda, in particular for at least 30 seconds or for at least 60 seconds or for at least 5 min. This embodiment is beneficial since the bell jar can be cleaned respectively optimized for reuse.

The SiC growth substrate is according to a further preferred embodiment of the present invention configured to hold a SiC solid which has a mass of more than 1 kg, in particular of more or up to 5 kg or preferably of more or up to 50 kg or highly preferably of more or up to 200 kg and most preferably of more or up to 500 kg, and a thickness of at least 1 cm, in particular of more or up to 2 cm or preferably of more or up to 5 cm or preferably of more or up to 10 cm or highly preferably of more or up to 20 cm or most preferably of more or up to 50 cm. This embodiment is beneficial since large quantities of SiC material respectively PVT source material can be produced.

The reaction space volume allows according to a further preferred embodiment of the present invention the production of one SiC solid or multiple SiC solids at the same time, wherein the SiC solid has a mass of more than 1 kg, in particular of more or up to 5 kg or preferably of more or up to 50 kg or highly preferably of more or up to 200 kg and most preferably of more or up to 500 kg, and a thickness of at least 1 cm, in particular of more or up to 2 cm or preferably of more or up to 5 cm or preferably of more or up to 10 cm or highly preferably of more or up to 20 cm or most preferably of more or up to 50 cm or wherein multiple or all SiC solids have a mass of more than 1 kg, in particular of more or up to 5 kg or preferably of more or up to 50 kg or highly preferably of more or up to 200 kg and most preferably of more or up to 500 kg, and a thickness of at least 1 cm, in particular of more or up to 2 cm or preferably of more or up to 5 cm or preferably of more or up to 10 cm or highly preferably of more or up to 20 cm or most preferably of more or up to 50 cm. This embodiment is beneficial since large quantities of SiC material respectively PVT source material can be produced.

The SiC growth substrate is according to a further preferred embodiment of the present invention a preferably elongated single-piece substrate. The single piece substrate preferably comprises multiple sections having the same or similar diameter and/or the same or similar cross-sectional shape. The diameter, in particular diameter orthogonal to current flow direction, is at least along 50% of the length of the single-piece substrate and preferably at least along 70% of the length of the single-piece substrate and highly preferably at least along 90% of the length of the single-piece substrate and most preferably at least along 95% of the length of the single-piece substrate the same or similar, wherein similar means that the largest diameter is less than 200% of the smallest diameter and preferably the largest diameter is less than 150% of the smallest diameter and highly preferably the largest diameter is less than 110% of the smallest diameter and most preferably the largest diameter is less than 105% of the smallest diameter. The SiC growth substrate is according to a further preferred embodiment of the present invention a multi-piece substrate, wherein the multi-piece substrate comprises at least two elongated substrate parts, wherein the at least two elongated, in particular straight and/or curved, substrate parts are arranged in a row and preferably directly contacting each other, in particular via end faces. Preferably forms at least one substrate part, and preferably two or more than two substrate parts, in the direction of current flow a curve. A diameter orthogonal to the current flow direction of the substrate parts, in particular the straight and/or curved substrate parts, is preferably the same or the largest diameter is less than 200% of the smallest diameter or preferably less than 150% or highly preferably less than 110% and most preferably less than 105% of the smallest diameter. The SiC growth substrate comprises according to a further preferred embodiment of the present invention three or more than three substrate parts, wherein the substrate part contact surfaces between contacting substrate parts have the same or similar shape and/or the same or similar size, wherein a similar size means that the largest surface size of a substrate part contact surface is less than 200% of the surface size of the smallest substrate part contact surface or preferably the largest surface size of a substrate part contact surface is less than 150% of the surface size of the smallest substrate part contact surface or highly preferably the largest surface size of a substrate part contact surface is less than 110% of the surface size of the smallest substrate part contact surface or highly preferably the largest surface size of a substrate part contact surface is less than 105% of the surface size of the smallest substrate part contact surface.

The SiC growth substrate has according to a further preferred embodiment of the present invention a length, wherein the SiC growth substrate is coupled via a first end at least indirectly with one or at least one first metal electrode and via a second end at least indirectly with one or at least one second metal electrode, wherein the distance between the first end of the SiC growth substrate and the first metal electrode is less than 20% of the length of the SiC growth substrate and preferably less than 10% of the length of the SiC growth substrate and most preferably less than 5% of the length of the SiC growth substrate. Length of the SiC growth substrate is preferably defined as physical extension of the center of the SiC growth substrate in current flow direction.

It should further be noted that the total deposition surface area inside the CVD reactor respectively SiC production reactor, in particular SiC PVT source material production reactor, grows over time as more deposition accumulates on the SiC growth substrates and their circumference grows. The SiC growth substrates can be slim rods, which are preferably at least 1.0 cm in diameter and e.g. up to 250 cm in height. When they reach for example a diameter of 10 cm due to deposited SiC they have a total surface area proportionally 10 times larger than in the beginning. It is therefore necessary to also increase the total feed gas mixture flowrate to match this increase in volumetric deposition rate over the course of the deposition run.

A SiC growth substrate can accumulate a layer of deposition such that it can reach a total diameter of for example 20 cm. At this point the circumference is approximately 60 cm and if the perpendicular deposition rate is 1 mm per hour, the volumetric deposition rate is 6 cm3 per hour per every 1 cm of rod height. However, the average volumetric deposition rate throughout the run is actually closer to 3 cm3 per hour per cm because the slim rod starts at such a small diameter.

According to the present invention the average volumetric deposition rate is increased by utilizing a deposition substrate respectively SiC growth substrate with a large starting surface area. Whereas a slim rod of 1 cm diameter has a surface area of approximately 3 cm per cm of height a deposition substrate in the form of a thin 10 cm wide ribbon effectively as a starting surface area of 20 cm per cm of height, dramatically boosting the average volumetric deposition rate and allowing for the same amount of SiC to be deposited in a much shorter run time. Accordingly, the CVD reactor respectively SiC production reactor, in particular SiC PVT source material production reactor, is able to perform more runs per year. As a consequence, fewer CVD reactors respectively SiC production reactors, in particular SiC PVT source material production reactors, are required to manufacture the same overall tonnage of SiC. Therefore, it is a preferred embodiment of the present invention to use deposition substrates with high starting surface areas.

The SiC growth substrate has according to a further preferred embodiment of the present invention an average perimeter of at least 5 cm and preferably of at least 7 cm and highly preferably of at least 10 cm around a cross-sectional area orthogonal to the length direction of the SiC growth substrate or multiple SiC growth substrates have an average perimeter per SiC growth substrate of at least 5 cm and preferably of at least 7 cm and highly preferably of at least 10 cm around a cross-sectional area orthogonal to the length direction of the respective SiC growth substrate. The SiC growth substrate preferably has an average perimeter of up to 25 cm or preferably of up to 50 cm or highly preferably of up to 100 cm. The SiC growth substrate highly preferably has an average perimeter between 5 cm and 100 cm, preferably between 6 cm and 50 cm and highly preferably between 7 cm and 25 cm and most preferably between 7.5 cm and 15 cm or wherein SiC growth substrate has an average perimeter between 5 cm and 20 cm preferably between 5 cm and 15 cm and highly preferably between 5 cm and 12 cm. This embodiment is beneficial since due to a large perimeter a high volumetric growth can be generated. Thus, the same amount of SiC can be produced much faster.

The SiC growth substrate comprises or consists according to a further preferred embodiment of the present invention of SiC or C, in particular graphite, or wherein multiple SiC growth substrates comprise or consist of SiC or C, in particular graphite. Thus, graphite and carbon-carbon composite are preferred materials for use as deposition substrates for SiC. They can be easily separated from the SiC by mechanical means and by combustion and residual C on the SiC in the ppm levels is not detrimental to the performance of the SiC as a source material for PVT growth of monocrystalline SiC. However, it is also possible to remove the residual C from the SiC surface.

The shape of the cross-sectional area orthogonal or perpendicular to the length direction of the SiC growth substrate differs according to a further preferred embodiment of the present invention at least in sections and preferably along more than 50% of the length of the SiC growth substrate and highly preferably along more than 90% of the length of the SiC growth substrate from a circular shape.

A ratio (U/A) between the cross-sectional area (A) and the perimeter (U) around the cross-sectional area is according to a further preferred embodiment of the present invention higher than 1.2 1/cm and preferably higher than 1.5 1/cm and highly preferably higher than 2 1/cm and most preferably higher than 2.5 1/cm. This embodiment is beneficial since a high ratio (U/A) enables higher volumetric growth.

The SiC growth substrate is according to a further preferred embodiment of the present invention formed by at least one carbon ribbon, in particular graphite ribbon, wherein the at least one carbon ribbon comprises a first ribbon end and a second ribbon end, wherein the first ribbon end is coupled with the first metal electrode and wherein the second ribbon end is coupled with the second metal electrode or wherein each of multiple the SiC growth substrates is formed by at least one carbon ribbon, in particular graphite ribbon, wherein the at least one carbon ribbon per SiC growth substrate comprises a first ribbon end and a second ribbon end, wherein the first ribbon end is coupled with the first metal electrode of the respective SiC growth substrate and wherein the second ribbon end is coupled with the second metal electrode of the respective SiC growth substrate. This embodiment is beneficial since the carbon ribbon respectively graphite ribbon can have a large surface and small volume, thus the volume of the process chamber can be used to grow more SiC at the same time. The carbon ribbon, in particular graphite ribbon, comprises according to a further preferred embodiment of the present invention a curing agent.

The SiC growth substrate is according to a further preferred embodiment of the present invention formed by multiple rods, wherein each rod has a first rod end and a second rod end, wherein all first rod ends are coupled with the same first metal electrode and wherein all second rod ends are coupled with the same second metal electrode or wherein each of multiple SiC growth substrates is formed by multiple rods, wherein each rod has a first rod end and a second rod end, wherein all first rod ends are coupled with the same first metal electrode of the respective SiC growth substrate and wherein all second rod ends are coupled with the same second metal electrode of the respective SiC growth substrate. The rods of the SiC growth substrate are according to a further preferred embodiment of the present invention contacting each other or are arranged in a distance to each other. The SiC growth substrate comprises according to a further preferred embodiment of the present invention three or more than three rods or wherein each of multiple SiC growth substrates comprises three or more than three rods. This embodiment is beneficial since the used rods can be standard components and therefore cheaper compared to e.g. graphite ribbons.

The SiC growth substrate is according to a further preferred embodiment of the present invention formed by at least one metal rod, wherein the metal rod has a first metal rod end and a second metal rod end, wherein the first metal rod end is coupled with the first metal electrode and wherein the second metal rod end is coupled with the second metal electrode or wherein each of multiple SiC growth substrates is formed by at least one metal rod, wherein each metal rod has a first metal rod end and a second metal rod end, wherein the first metal rod end is coupled with the first metal electrode of the respective SiC growth substrate and wherein the second metal rod end is coupled with the second metal electrode of the respective SiC growth substrate. This embodiment is beneficial since metal rods are cheap and can be provided in a plurality of shapes, in particular with high ratio (U/A).

The metal rod comprises according to a further preferred embodiment of the present invention a coating, wherein the coating preferably comprises SiC and/or wherein the coating preferably has a thickness of more than 2 μm or preferably of more than 100 μm or highly preferably of more than 500 μm or between 2 μm and 5 mm, in particular between 100 μm and 1 mm. This embodiment is beneficial since the grown solid can be better removed from the metal rod respectively fewer metal particles remain on the SiC solid after removing the SiC solid from the metal rod. Deposition substrates respectively SiC growth substrates made by metals or alloys are also preferred due to the ability for their multiple usage in subsequent SiC production runs. Here, one or multiple coatings (like a thin carbon layer, preferably less than 1000 μm thick and highly preferably less than 500 μm thick and most preferably less than 100 μm thick) could be used to prevent the metal of the substrate from entry into the SiC material body during deposition.

During the deposition run, the feed gas mixture is preferably continually being pumped into the CVD reactor respectively SiC production reactor, in particular SiC PVT source material production reactor, and vent gas is preferably continually exiting the reactor. Because of the deposition reaction, the composition of the vent gas is considerably different than the feed gas mixture. First, as shown by the net deposition reaction, a significant amount of HCl is generated and present in the vent gas along with unreacted feed gases. Second, side reactions occur which cause the formation of other Si-bearing molecules. For example, if the feed gas mixture contains STC, then some TCS will be formed within the CVD reactor respectively SiC production reactor, in particular SiC PVT source material production reactor, as a side reaction and will exit in the vent gas.

In small volume production of SiC it may not be convenient to recycle the vent gas even though the conversion efficiency is relatively low and a large molar ratio of Si-bearing gas and C-bearing gas is used compared to SiC deposited along with a high molar ratio of H. Therefore, in one embodiment of the present invention, the vent gas is first sent to a scrubber where it is contacted with water to remove all Si-bearing compounds and HCl. Then the vent gas is sent to a flare where it is combusted with the assistance of natural gas. As a result, harmless and small quantities of CO2 are exhausted into the air. Meanwhile, the scrubber liquid is sent to recycling companies for further processing, utilization, and disposal.

A gas outlet unit for outputting vent gas and a vent gas recycling unit are provided according to a further preferred embodiment of the present invention, wherein the vent gas recycling unit is connected to the gas outlet unit, wherein the vent gas recycling unit comprises at least a separator unit for separating the vent gas into a first fluid and into a second fluid, wherein the first fluid is a liquid and wherein the second fluid is a gas, wherein a first storage and/or conducting element for storing or conducting the first fluid is part of the separator unit or coupled with the separator unit and wherein a second storage and/or conducting element for storing or conducting the second fluid is part of the separator unit or coupled with the separator unit. This embodiment is beneficial since source material costs can significantly be reduced. The separator unit is preferably operated at a pressure above 5 bar and a temperature below −30 °C. The vent gas is therefore preferably fed into the separation unit, which can be a cold distillation column, where the Si-bearing compounds condense from gas to liquid form and travel down the column and exit out the bottom while the remaining gases of H, HCl, and methane travel up the column and exit out the top. The liquid is the first fluid and preferably comprises predominantly HCl and Chlorosilanes with minor percentage of H2 and C-gas. The gas is the second fluid, preferably comprising predominantly H2 and C-gas with minor percentage of HCl and Chlorosilanes.

The vent gas recycling unit comprises according to a further preferred embodiment of the present invention a further separator unit for separating the first fluid into at least two parts, wherein the two parts are a mixture of chlorosilanes and a mixture of HCl, H2 and at least one C-bearing molecule, and preferably into at least three parts, wherein the three parts are a mixture of chlorosilanes and HCl and a mixture of H2 and at least one C-bearing molecule, wherein the first storage and/or conducting element connects the separator unit with the further separator unit. This embodiment is beneficial since the HCl and H2 and at least one C-bearing molecule can be directly feed into a process chamber of a SiC production reactor for the production of SiC material respectively PVT source material. The further separator unit is preferably configured to be operate at a pressure above 5 bar and a temperature below −30 °C and/or a temperature above 100 °C.

The further separator unit is according to a further preferred embodiment of the present invention coupled with a mixture or chlorosilanes storage and/or conducting element and with a HCl storage and/or conducting element and with a H2 and C storage and/or conducting element.

In the context of the present invention "C" can be understood as "at least one C-bearing molecule", thus the H2 and C storage and/or conducting element can be alternatively understood as H2 and at least one C-bearing molecule storage and/or conducting element.

The mixture of chlorosilanes storage and/or conducting element forms according to a further preferred embodiment of the present invention a section of a mixture of chlorosilanes mass flux path for conducting the mixture of chlorosilanes into the process chamber. This embodiment is beneficial since the chlorosilanes can be used as mixture. Thus, it is not necessary to further process the mixture of chlorosilanes with respect to a separation of the individual chlorosilanes.

Thus, due to the present invention it is also possible to manufacture a SiC source material with at least 6N or preferably 7N or more preferably 8N in large scales, wherein the provided feed gases used are recycled back from vent gases of a first SiC source production reactor. This is achieved by measuring the atomic ratio of H to C in the mixture and providing an appropriate ratio of makeup H hydrogen and C-bearing gas to the CVD reactor along with the mixture such that the overall H to C molar ratio of hydrogen and carbon in the C-bearing gas is in the required range. Under the given conditions in both the CVD reaction and the subsequent cold distillation, any carbon is present as methane. Any side products derived from methane in the CVD reaction will have higher boiling points and been separated from the gas phase in the cold distillation. Methane can be quantified e.g. by inline or online measurement (PAT, process analytical techniques), such as flame ionization detector, infrared spectrometry in any style (e.g. FTIR or NIR) or cavity ring-down spectroscopy (with most sensitive detection limits), or any other inline or online analytical method, which provides results with the required accuracy within seconds. The hydrogen content can be calculated from the measured total mass flow of the gas mixture and the quantified methane concentration. Losses are preferably compensated to maintain the molar ratio of the original feed gas mixture. This embodiment is beneficial since due to the recycling of the vent gas the purity of the recycled Si, C and H2 is further increased, thus the purity of the produced SiC is even better.

A Si mass flux measurement unit for measuring an amount of Si of the mixture of chlorosilanes is provided according to a further preferred embodiment of the present invention as part of the mass flux path prior to the process chamber, in particular prior to a mixing device, and preferably as further Si feed-medium source providing a further Si feed medium. The mixture of chlorosilanes storage and/or conducting element forms according to a further preferred embodiment of the present invention a section of a mixture of chlorosilanes mass flux path for conducting the mixture of chlorosilanes into a further process chamber of a further SiC production reactor. This embodiment is beneficial since it can be very precisely controlled if a feed medium from a feed source or a feed medium from the recycling unit is used. Additionally or alternatively feed medium from the feed source can be added to the feed medium from the recycling unit in case the feed medium of the recycling unit is not sufficient.

The H2 an C storage and/or conducting element forms according to a further preferred embodiment of the present invention a section of a H2 and C mass flux path for conducting the H2 and the at least one C-bearing molecule into the process chamber. It is possible that HCl is also present. A C mass flux measurement unit for measuring an amount of C of the mixture of H2 and the at least one C-bearing molecule is provided according to a further preferred embodiment of the present invention as part of the H2 and C mass flux path prior to the process chamber, in particular prior to a mixing device, and preferably as further C feed-medium source providing a further C feed medium. The H2 an C storage and/or conducting element forms according to a further preferred embodiment of the present invention a section of a H2 and C mass flux path for conducting the H2 and the at least one C-bearing molecule into a further process chamber of a further SiC production reactor. The second storage and/or conducting element forms according to a further preferred embodiment of the present invention a section of the H2 and C mass flux path for conducting the second fluid, which comprises H2 and at least one C-bearing molecule, into the process chamber, wherein the second storage and/or conducting element and the H2 an C storage and/or conducting element are preferably fluidly coupled. The second storage and/or conducting element forms according to a further preferred embodiment of the present invention a section of a further H2 and C mass flux path for conducting the second fluid, which comprises H2 and at least one C-bearing molecule, into the process chamber. A further C mass flux measurement unit for measuring an amount of C of the second fluid is provided according to a further preferred embodiment of the present invention as part of the further H2 and C mass flux path prior to the process chamber, in particular prior to a mixing device. This embodiment is beneficial since besides the usage of chlorosilanes also H2 and at least one C-bearing molecule are recycled and therefore the overall efficiency is increased.

The second storage and/or conducting element is coupled according to a further preferred embodiment of the present invention with a flare unit for burning the second fluid.

A first compressor for compressing the vent gas to a pressure above 5 bar is according to a further preferred embodiment of the present invention provided as part of the separator unit or in a gas flow path between the gas outlet unit and the separator unit. A further compressor for compressing the first fluid to a pressure above 5 bar is according to a further preferred embodiment of the present invention provided as part of the further separator unit or in a gas flow path between the separator unit and the further separator unit.

The further separator unit preferably comprises a cryogenic distillation unit, wherein the cryogenic distillation unit is according to a further preferred embodiment of the present invention preferably configured to be operated at temperatures between −180 C° and −40 C°.

This embodiment is beneficial since TCS has a boiling point of 31.8 °C and STC has a boiling point of 57.7 °C. With such low but substantially different boiling points, TCS and STC can be effectively and economically separated from each other and from any heavy contaminants such as trace metals by conventional distillation methods and apparatuses. On the other hand, purification of methane from N requires more complicated cryogenic distillation. The boiling point of methane is −161.6 °C and the boiling point of N is −195.8 °C. Therefore, a distillation column can to be operated at a temperature somewhere in between so that the methane is liquid and travels toward the bottom of the column and the nitrogen is gaseous and travels toward the top of the column.

A control unit for controlling fluid flow of a feed-medium or multiple feed-mediums is according to a further preferred embodiment of the present invention part of the SiC production reactor, wherein the multiple feed-mediums comprise the first medium, the second medium, the third medium and the further Si feed medium and/or the further C feed medium via the gas inlet unit into the process chamber is provided. The further Si feed medium preferably consists of at least 95% [mass] or at least 98% [mass] or at least 99% [mass] or at least 99.9% [mass] or at least 99.99% [mass] or at least 99,999% [mass] of a mixture of chlorosilanes. The further C feed medium preferably comprises the at least one C-bearing molecule, H2, HCl and a mixture of chlorosilanes, wherein the further C feed medium comprises of at least 3% [mass] or preferably at least 5% [mass] or highly preferably at least 10% [mass] of C respectively of the at least one C-bearing molecule and wherein the further C feed medium comprises up to 10% [mass] or preferably between 0.001% [mass] and 10%[mass], highly preferably between 1% [mass] and 5%[mass], of HCl and wherein the further C feed medium comprises more than 5% [mass] or preferably more than 10% [mass] or highly preferably more than 25% [mass] of H2 and wherein the further C feed medium comprises more than 0.01% [mass] and preferably more than 1% [mass] and highly preferably between 0.001% [mass] and 10%[mass] of the mixture of chlorosilanes.

A heating unit is according to a further preferred embodiment of the present invention arranged in fluid flow direction between the further separator unit and the gas inlet unit for heating the mixture of chlorosilanes to transform the mixture of chlorosilanes from a liquid form into a gaseous form.

The above mentioned object is also solved by a PVT source material production method for the production of PVT source material consisting of SiC, in particular of polytype 3C, at least comprising the steps of:

Providing a source medium inside a process chamber, wherein the process chamber is at least surrounded by a base plate, a side wall section and a top wall section, wherein the process chamber is preferably a process chamber of a SiC production reactor according to the present invention electrically energizing at least one SiC growth substrate and preferably a plurality of SiC growth substrates, disposed in the process chamber to heat the SiC growth substrate/s to a temperature in the range between 1300 °C and 2000 °C, and setting a deposition rate, in particular of more than 200 μm/h and preferably of more than 300 μm/h and highly preferably of more than 500 μm/h, for removing Si and C from the source medium and for depositing the removed Si and C as SiC on the SiC growth substrate/s thereby forming a SiC solid, wherein the SiC solid preferably consist of polycrystalline SiC.

Each SiC growth substrate comprises according to a further preferred embodiment of the present invention a first power connection and a second power connection, wherein the first power connections are first metal electrodes and wherein the second power connections are second metal electrodes, wherein the first metal electrodes and the second metal electrodes are preferably shielded from a reaction space of the process chamber.

PVT source material production method preferably comprises the step of preventing heating of the base plate and/or the side wall section and/or the top wall section above a defined temperature, in particular 1300 °C.

This method is beneficial since ultrapure bulk CVD SiC can be manufacture. By bulk CVD SiC we mean CVD SiC that is in a standalone form and not a coating on another material. Thus, this does not mean that "bulk" refers to the fully dense nature of CVD SiC as compared to other forms of SiC such as sintered SiC. According to the invention SiC, in particular polycrystalline SiC, in particular with a 3C crystal polytype, is manufactured.

It has to be noted that the PVT source material production method can be alternatively understood as a SiC production method, in particular a SiC production method carried out by a CVD reactor.

The aforementioned object is solved according to the invention by a method for producing a preferably elongated SiC solid, in particular of polytype 3C, according to claim 1. The method according to the invention preferably comprises at least the steps:

introducing at least a first source gas into a process chamber, the first source gas comprising Si, introducing at least a second source gas into the process chamber, the second source gas comprising C, electrically charging at least one deposition element arranged in the process chamber for heating the deposition element, and setting a deposition rate of more than 200 μm/h, wherein a pressure in the process chamber of more than 1 bar is generated by the introduction of the first source gas and/or the second source gas, and wherein the surface of the deposition element is heated to a temperature in the range between 1300 °C and 1700 °C.

This solution is advantageous because, due to the chosen parameters, a very fast growth of the deposition element is possible. This rapid growth has a significant impact on the overall cost, allowing SiC to be produced at a significantly lower cost compared to the state of the art.

According to a preferred embodiment of the present invention, the method according to the invention comprises the step of introducing at least one carrier gas into the process chamber, wherein the carrier gas preferably comprises H.

This embodiment is advantageous because the carrier gas can be used to generate an advantageous gas flow in the process chamber.

The above-mentioned object is also solved according to the invention by a method for producing a preferably elongated SiC solid, in particular of polytype 3C, according to claim 3. This method according to the invention preferably comprises the following steps:

introducing at least one source gas, in particular a first source gas, in particular SiCl3(CH3), into a process chamber, the source gas comprising Si and C, introducing at least one carrier gas into the process chamber, the carrier gas preferably comprising H, electrically charging at least one deposition element arranged in the process chamber for heating the deposition element and setting a deposition rate of more than 200 μm/h, wherein a pressure in the process chamber of more than 1 bar is generated by the introduction of the source gas and/or the carrier gas and wherein the surface of the deposition element is heated to a temperature in the range between 1300 °C and 1700 °C or between 1300 °C and 1700 °C.

This solution is advantageous because, due to the chosen parameters, a very fast growth of the deposition element is possible. This rapid growth has a significant impact on the overall cost, allowing SiC to be produced at a significantly lower cost compared to the state of the art.

According to a preferred embodiment of the present invention, the method previously described also comprises the step of introducing at least a second source gas into the process chamber, wherein the second source gas comprises C.

Further preferred embodiments of the present invention are the subject of the following description parts and/or sub-claims.

According to a further preferred embodiment of the present invention, the introduction of the first source gas and/or the second source gas generates a pressure in the process chamber of between 2 bar and 10 bar, preferably the introduction of the first source gas and/or the second source gas generates a pressure in the process chamber of between 4 bar and 8 bar, particularly preferably the introduction of the first source gas and/or the second source gas generates a pressure in the process chamber of between 5 bar and 7 bar, particularly of 6 bar.

This embodiment is advantageous, since the increase in pressure provides more starting material, which is arranged in the form of SiC on the deposition element or through which the deposition element grows.

According to another preferred embodiment of the present invention, the surface of the deposition element is heated to a temperature in the range between 1450 °C and 1700 °C, in particular to a temperature in the range between 1500 °C and 1600 °C or between 1490 °C and 1680 °C.

This embodiment is advantageously an environment is created in which very pure SiC is deposited on the deposition element. In particular, it has been recognized that at too low temperatures the proportion of Si deposited on the deposition element increases and at too high temperatures the proportion of C deposited on the deposition element increases. In the temperature range mentioned, however, the SiC is at its purest.

According to another preferred embodiment of the present invention, the first source gas is introduced into the process chamber via a first supply means and the second source gas is introduced into the process chamber via a second supply means, or the first source gas and the second source gas are mixed prior to introduction into the process chamber and are introduced into the process chamber via a supply means, wherein the source gases are mixed in a molar ratio Si:C of Si=1 and C=0.8 to 1.1 and/or an atomic ratio Si:C of Si=1 and C=0.8 to 1.1 are introduced into the process chamber. This is further advantageous because it allows the Si:C=1:1 ratio in the SiC solid material to be adjusted very precisely via the molar ratio of the two gases.

This embodiment is advantageous a gas composition is created in the processor chamber in which very pure SiC is deposited at the deposition element.

According to another preferred embodiment of the present invention, the carrier gas comprises H, wherein the source gases and the carrier gas are present in a molar ratio Si:C:H of Si=1 and C=0.8 to 1.1 and H=2-10, in particular in a molar ratio Si:C:H of Si=1 and C=0.9 to 1 and H=3-5, and/or an atomic ratio Si:C:H of Si=1 and C=0.8 to 1.1 and H=2-10, in particular in an atomic ratio Si:C:H of Si=1 and C=0.9 to 1 and H=3-5, are introduced into the process chamber.

During deposition, the atomic ratio or molar ratio shown below is preferably present: H2:SiCl4:CH4=5:1:1 alternatively H2:SiCl4:CH4=6:1:1 alternatively H2:SiCl4:CH4=7:1:1 alternatively H2:SiCl4:CH4=8:1:1 alternatively H2:SiCl4:CH4=9:1:1 alternatively H2:SiCl4:CH4=10:1:1.

Thus, the atomic ratio or molar ratio between H2:SiCl4:CH4 during deposition is preferably between 5:1:1 and 10:1:1.

Preferably, a set atomic ratio or molar ratio is kept constant during deposition, this can preferably also apply in the case of changing flow rates. Particularly preferably, the total pressure or the pressure in the process chamber is also kept constant during the deposition.

This embodiment is advantageous as a gas composition is created in the processor chamber and an advantageous gas transport is created in the process chamber, where thereby very pure SiC is deposited very fast at the deposition element.

According to another preferred embodiment of the present invention, the deposition rate is set in the range between 300 μm/h and 2500 μm/h, more particularly in the range between 350 μm/h and 1200 μm/h, more particularly in the range between 400 μm/h and 1000 μm/h, more particularly in the range between 420 μm/h and 800 μm/h.

This embodiment is advantageous, since the production of SiC material is much more favorably convertible.

According to another preferred embodiment of the present invention, the first source gas is SiCl4, SiHCl3 or SiCl4 and the second source gas is CH4 or C3H8, wherein preferably the first source gas is SiCl4 and the second source gas is CH4 or wherein preferably the first source gas is SiHCl3 and the second source gas is CH4 or wherein preferably the first source gas is SiCl4 and the second source gas is C3H8.

This embodiment is advantageous because these source gases enable optimal Si and C provision for deposition.

Preferably, the source gas or the source gases and/or the carrier gas have a purity which excludes at least 99.9999% (ppm wt) of impurities, in particular of the substances B, Al, P, Ti, V, Fe, Ni.

Thus, preferably less than 1 ppm wt of impurities, in particular of the substances B, Al, P, Ti, V, Fe, Ni, is a component of the swelling gas or gases and/or of the carrier gas or less than 0.1 ppm wt of impurities, in particular of the substances B, Al, P, Ti, V, Fe, Ni, is a component of the swelling gas or gases and/or of the carrier gas. of the swelling gases and/or of the carrier gas or less than 0.01 ppm wt of foreign substances, in particular of the substances B, Al, P, Ti, V, Fe, Ni, constituent of the swelling gas or of the swelling gases and/or of the carrier gas.

Particularly preferably, less than 1 ppm wt of substance B is a constituent of the swelling gas or gases and/or of the carrier gas. Particularly preferably, less than 1 ppm wt of substance Al is a constituent of the swelling gas or gases and/or of the carrier gas. Particularly preferably, less than 1 ppm wt of substance P is a constituent of the swelling gas or gases and/or of the carrier gas. Particularly preferably, less than 1 ppm wt of the substance Ti is a constituent of the source gas or gases and/or of the carrier gas. Particularly preferably, less than 1 ppm wt of substance V is a constituent of the swelling gas or gases and/or of the carrier gas. Particularly preferably, less than 1 ppm wt of the substance Fe is a constituent of the swelling gas or gases and/or of the carrier gas. Particularly preferably, less than 1 ppm wt of the substance Ni is a constituent of the swelling gas or gases and/or of the carrier gas.

Particularly preferably, less than 0.1 ppm wt of substance B is a constituent of the swelling gas or gases and/or of the carrier gas. Particularly preferably, less than 0.1 ppm wt of substance Al is a constituent of the source gas or gases and/or of the carrier gas. Particularly preferably, less than 0.1 ppm wt of substance P is a constituent of the swelling gas or gases and/or of the carrier gas. Particularly preferably, less than 0.1 ppm wt of the substance Ti is a constituent of the source gas or gases and/or of the carrier gas. Particularly preferably, less than 0.1 ppm wt of substance V is a constituent of the swelling gas or gases and/or of the carrier gas. Particularly preferably, less than 0.1 ppm wt of the substance Fe is a constituent of the source gas or gases and/or of the carrier gas. Particularly preferably, less than 0.1 ppm wt of the substance Ni is a constituent of the source gas or gases and/or of the carrier gas.

Particularly preferably, less than 0.01 ppm wt of substance B is a constituent of the source gas or gases and/or of the carrier gas. Particularly preferably, less than 0.01 ppm wt of substance Al is a constituent of the source gas or gases and/or of the carrier gas. Particularly preferably, less than 0.01 ppm wt of substance P is a constituent of the source gas or gases and/or of the carrier gas. Particularly preferably, less than 0.01 ppm wt of the substance Ti is a constituent of the source gas or gases and/or of the carrier gas. Particularly preferably, less than 0.01 ppm wt of substance V is a constituent of the source gas or gases and/or of the carrier gas. Particularly preferably, less than 0.01 ppm wt of the substance Fe is a constituent of the source gas or gases and/or of the carrier gas. Particularly preferably, less than 0.01 ppm wt of the substance Ni is a constituent of the source gas or gases and/or of the carrier gas. Also particularly preferably, less than 1 ppm wt of the substance Nitrogen (N) is a constituent of the source gas or gases and/or of the carrier gas.

According to a further preferred embodiment of the present invention, a temperature measuring device, in particular a pyrometer, is used to measure the surface temperature of the deposition element. Preferably, the temperature measuring device outputs a temperature signal and/or temperature data. Particularly preferably, a control device modifies, in particular increases, the electrical loading of the separator element as a function of the temperature signal and/or the temperature data.

This embodiment is advantageous, since disadvantageous effects resulting from the growth can be compensated. In particular, as a result of the SiC formation or deposition, the mass of the deposition element increases, as a result of which the temperature of the deposition element changes, in particular decreases, with the same electrical loading. This would lead to an increase in the Si content. By modifying, in particular increasing, the electrical application, in particular increasing the current flow, the change in temperature can be compensated or reversed.

According to a further preferred embodiment of the present invention, the temperature measuring device performs temperature measurements and outputs temperature signal and/or temperature data at time intervals of less than 5 minutes, in particular less than 3 minutes or less than 2 minutes or less than 1 minute or less than 30 seconds. Preferably, a target temperature or a target temperature range is defined. The control device preferably controls an increase of the electrical application as soon as the temperature signal and/or the temperature data represents a surface temperature which is lower than a defined threshold temperature, whereby the threshold temperature is a temperature which is lower by a defined value than the set temperature or the lower limit of the set temperature range. The defined value is preferably less than 10 °C or less than 5 °C or less than 3 °C or less than 2 °C or less than 1.5 °C or less than 1 °C.

This embodiment is advantageous because very accurate temperature changes can be detected and compensated or reversed. Very high purity can be achieved as a result. The current flow or the current intensity can thereby preferably increase over the period of the deposition by a factor of up to 1.1 or 1.5 or 1.8 or 2 or 2.3 or 2.5 or 2.8 or 3 or 3.5 or 5 or 10. The current flow or the current intensity can thereby preferably increase over the period of deposition by at least a factor of 1.1 or 1.5 or 1.8 or 2 or 2.3 or 2.5 or 2.8 or 3 or 3.5 or 5 or 10.

According to a further preferred embodiment of the present invention, more per unit time is introduced into the process chamber from the source gas, in particular the first source gas and/or the second source gas, continuously or stepwise, in particular in a defined ratio. Preferably, more of the source gas, in particular the first source gas and/or the second source gas, is introduced into the process chamber as a function of time, and/or more of the source gas, in particular the first source gas and/or the second source gas, is introduced into the process chamber as a function of the electrical loading.

This embodiment is advantageous since the source gas mass can be adapted to the surface increase of the deposition element. As a result, an optimum amount (mass) of Si and C can preferably be maintained in the process chamber throughout the entire production process.

The above-mentioned object is also solved by a device for producing a preferably elongated SiC solid, in particular of polytype 3C, in particular for carrying out a previously mentioned method according to claim 12. This device according to the invention preferably comprises at least one process chamber for receiving an electrically chargeable deposition element, a first source gas, wherein the first source gas comprises Si, a second source gas, wherein the second source gas comprises C, a first feed device and/or a second feed device, a first supply means and/or a second supply means for introducing the first source gas and/or the second source gas with a pressure of more than 1 bar into the process chamber, a temperature measuring means for measuring the surface temperature of the deposition element, and a control means for setting a deposition rate of more than 200 μm/h. Preferably, the control device is able to adjust the electrical application to the separator element, the electrical application being adjustable from 1300 °C and 1700 °C to generate a surface temperature.

The above-mentioned object is also solved by a device for producing a preferably elongated SiC solid, in particular of polytype 3C, in particular for carrying out a previously mentioned method according to claim 13. This device according to the invention preferably comprises at least one process chamber for receiving an electrically chargeable deposition element, at least one source gas, in particular SiCl3(CH3), wherein the source gas comprises Si and C, and a carrier gas, wherein the carrier gas preferably comprises H, a first supply means and/or a second supply means for introducing the source gas and/or the carrier gas with a pressure of more than 1 bar into the process chamber, a temperature measuring means for measuring the surface temperature of the deposition element, and a control means for setting a deposition rate of more than 200 μm/h. Preferably, the control means is capable of adjusting the electrical application to the separator element, the electrical application being adjustable from 1300 °C and 1700 °C to produce a surface temperature.

The separating element described within the scope of the present invention, in particular preferably in all embodiments, is preferably an elongated body, which preferably consists of graphite or carbon or SiC or which has graphite or carbon and/or SiC. It is also possible that the separating element is made of graphite or carbon and SiC plates, in particular with a thickness of less than 5 mm or less than 2 mm or less than 1 mm or less than 0.1 mm, are arranged thereon or are covered therewith. Alternatively, it is also possible that an SiC layer is grown on the graphite. The SiC plates and/or the grown SiC layer can be e.g. mono-crystalline or poly-crystalline. The deposition element is preferably coupled to a first electrical contact in the region of a first end in its longitudinal extension, in particular closer to the first end of the longitudinal extension than to the second end of its longitudinal extension. In addition, the deposition element is preferably coupled to a second electrical contact in the region of a second end in its longitudinal extension, in particular closer to the second end than to the first end of its longitudinal extension. Preferably, for heating the separator element, an electric current is introduced into the separator element via one of the two contacts and is discharged from the separator element via the other contact.

Furthermore, the above object is solved by a SiC solid state material, in particular 3C-SiC solid state material, having a purity excluding at least 99.9999% (ppm wt) of the substances B, Al, P, Ti, V, Fe, Ni and/or a density of less than 3.21 g/cm3 according to claim 14.

The SiC solid material or the deposition element (after termination of the deposition process) preferably has a diameter of at least or exactly 4 inches or at least or exactly or up to 6 inches or at least or exactly or up to 8 inches or at least or exactly or up to 10 inches.

Preferably, the SiC solid state material according to the invention is produced by a method according to any one of claims 1 to 11. Preferably, the SiC solid-state material has a purity which excludes at least 99.9999% (ppm wt) of the substances B, Al, P, Ti, V, Fe, Ni. Thus, preferably less than 1 ppm wt of the substances B, Al, P, Ti, V, Fe, Ni is part of the SiC solid material or less than 0.1 ppm wt of the substances B, Al, P, Ti, V, Fe, Ni is part of the SiC solid material or less than 0.01 ppm wt of the substances B, Al, P, Ti, V, Fe, Ni is part of the SiC solid material.

Especially preferred is less than 1 ppm wt of substance B component of the SiC material. Especially preferred is less than 1 ppm wt of the substance Al component of the SiC material. Especially preferred is less than 1 ppm wt of the substance P component of the SiC material. Especially preferred is less than 1 ppm wt of the substance Ti component of the SiC material. Especially preferred is less than 1 ppm wt of the substance V component of the SiC material. Especially preferred is less than 1 ppm wt of the substance Fe component of the SiC material. Especially preferred is less than 1 ppm wt of the substance Ni component of the SiC material.

Especially preferred is less than 1 ppm wt of the substance B component of the SiC material. Especially preferred is less than 1 ppm wt of the substance Al component of the SiC material. Especially preferred is less than 1 ppm wt of the substance P component of the SiC material. Especially preferred is less than 1 ppm wt of the substance Ti component of the SiC material. Especially preferred is less than 1 ppm wt of the substance V component of the SiC material. Especially preferred is less than 1 ppm wt of the substance Fe component of the SiC material. Especially preferred is less than 1 ppm wt of the substance Ni component of the SiC material.

Particularly preferred is less than 0.1 ppm wt of the substance B component of the SiC material. Particularly preferred is less than 0.1 ppm wt of substance Al component of the SiC material. Particularly preferably, less than 0.1 ppm wt of substance P is a constituent of the SiC material. Particularly preferred is less than 0.1 ppm wt of the substance Ti component of the SiC material. Particularly preferably, less than 0.1 ppm wt of substance V is a constituent of the SiC material. Particularly preferred is less than 0.1 ppm wt of the substance Fe component of the SiC material. Particularly preferred is less than 0.1 ppm wt of the substance Ni component of the SiC material.

Particularly preferred is less than 0.01 ppm wt of the substance B component of the SiC material. Particularly preferred is less than 0.01 ppm wt of substance Al component of the SiC material. Particularly preferably, less than 0.01 ppm wt of substance P is a constituent of the SiC material. Particularly preferred is less than 0.01 ppm wt of the substance Ti component of the SiC material. Particularly preferably, less than 0.01 ppm wt of substance V is a constituent of the SiC material. Particularly preferred is less than 0.01 ppm wt of the substance Fe component of the SiC material. Particularly preferably, less than 0.01 ppm wt of the substance Ni is a constituent of the SiC material.

In the context of the present patent specification, ppm wt is preferably to be understood as wt ppm.

In addition, a low Nitrogen (N) content is preferable, because Nitrogen incorporates into the PVT SiC crystal from the SiC source material and changes the electrical properties. In some cases, SiC crystals are doped with Nitrogen during the PVT process which is preferably done by additional N-gas during the PVT process. Even in this case a high Nitrogen content in the source material can lead to non-uniform Nitrogen distribution in the SiC crystal. It is therefore beneficial according to the invention to also keep the Nitrogen content of the SiC source material at a very small level.

This is solved with the described method according to the invention, in particular by using a defined quality of source gases. Thus, the resulting SiC source material has an elemental N content measured by elemental analysis of less than 30000 ppba (atomic) which roughly corresponds to less than 10.5 ppm (weight).

Particularly preferably, less than 10 ppm wt of the substance N is a constituent of the SiC material.

Particularly preferably, less than 2000 ppb wt of the substance N is a constituent of the SiC material.

Particularly preferably, less than 1000 ppb wt of the substance N is a constituent of the SiC material.

Particularly preferably, less than 500 ppb wt of the substance N is a constituent of the SiC material.

In addition, the above-mentioned invention also further suppresses other impurities of many other elements. The following Table 1 shows a typical measurement results by means of a glow discharge mass spectroscopy.

Customer Zadient Technologies SAS

Measurement method Glow Discharge Mass Spectrometry

Sample ID F210608074-SR

TABLE 1

| Element | Concentration [ppm wt] | Element | Concentration [ppm wt] | Element | Concentration [ppm wt] |
|---|---|---|---|---|---|
| Li | <0.005 | As | <0.01 | Sm | <0.01 |
| Be | <0.005 | Se | <0.1 | Eu | <0.05 |
| B | <0.005 | Br | <0.01 | Gd | <0.01 |
| F | <0.01 | Rb | <0.005 | Tb | <0.01 |
| Na | <0.01 | Sr | <0.005 | Dy | <0.01 |
| Mg | <0.05 | Y | <0.001 | Ho | <0.01 |
| Al | <0.01 | Zr | <0.005 | Er | <0.01 |
| P | <0.005 | Nb | <0.005 | Tm | <0.01 |
| S | 0.09 | Mo | <0.05 | Yb | <0.01 |
| Cl | 1.5 | Ru | <0.005 | Lu | <0.01 |
| K | <0.05 | Rh | <0.005 | Hf | <0.005 |
| Ca | <0.1 | Pd | <0.05 | Ta | <5 |
| Sc | <0.001 | Ag | <0.05 | W | <0.005 |
| Ti | <0.001 | Cd | <0.1 | Re | <0.005 |
| V | <0.001 | Sn | <0.05 | Os | <0.005 |
| Cr | <0.1 | Sb | <0.05 | Ir | <0.005 |
| Mn | <0.005 | Te | <0.05 | Pt | <0.01 |
| Fe | <0.05 | Cs | <0.01 | Au | <0.1 |
| Co | <0.005 | Ba | <0.01 | Hg | <0.05 |
| Ni | <0.005 | Ce | <0.05 | Tl | <0.005 |
| Cu | <0.01 | Pr | <0.05 | Pb | 0.008 |
| Zn | <0.1 | Nd | <0.01 | Bi | <0.005 |
| Ga | <0.01 | | | Th | <0.001 |
| Ge | <0.1 | | | U | <0.001 |

The above Table 1 shows impurity levels of one SiC sample produced according to the invention which are measured by glow discharge mass spectroscopy. In particular, the elements Na, Mg, S, K, Ca and Pb have a concentration of less than 0.1 ppm weight which is advantageous according to purity of SiC of the invention.

TABLE 2

| Sample ID | N content by elemental analysis | | |
|---|---|---|---|
| | (atom/cm^3) | ppba (atomic) | ppbw (weight) |
| 1 | <4E+15 | <80 | <28 |
| 2 | <8E+15 | <160 | <56 |
| 3 | <1E+16 | <200 | <70 |
| 4 | <1E+17 | <2000 | <700 |

The above Table 2 shows an elemental analysis of different SiC samples produced by the method according to the invention with different process parameters. The nitrogen content varies and can be kept below 1 ppm wt for all cases. In particular, the nitrogen content can be kept below 100 ppb wt in more preferable process conditions.

Furthermore, the above-mentioned object is solved by using the SiC solid-state material according to claim 14 in a PVT reactor for producing monocrystalline SiC.

Furthermore, the above-mentioned object is solved by using the aforementioned SiC solid-state material or the SiC solid-state material according to claim 14 in a PVT reactor (PVT=Physical Vapor Transport) for the production of monocrystalline SiC.

This solution is advantageous because the pure SiC solid-state material provides a very advantageous starting material for a PVT process. On the one hand, this material is advantageous because it is available as a solid-state block. This solid block can then be crushed, for example, into fragments with a defined minimum size or mass or volume. Preferably, at least 50% (by weight) or at least 70% (by weight) or at least 80% (by weight) or at least 90% (by weight) or at least 950% (by weight) of the SiC solid material is thereby broken into fragments whose volume is greater than 0.5 cm3 or greater than 1 cm3 or greater than 1.5 cm3 or 2 cm3 or 5 cm3.

Alternatively, the solid block may be divided, in particular split or sawed, into a plurality of preferably at least substantially homogeneous pieces, in particular orthogonal to its longitudinal axis or direction of extension. Preferably, the divided pieces are slices with a minimum thickness of 0.5 cm or 1 cm or 3 cm or 5 cm, in particular a thickness of up to 20 cm or 30 cm or 50 cm. In both cases (crushing or dividing) solids with a minimum size can be provided. This is advantageous because when heating the SiC solid material (starting material) compared to very fine-grained starting material for the PVT process, a significantly more homogeneous temperature distribution in the starting material is possible, resulting in a significantly more homogeneous vaporization of the starting material. In addition, in the case of very fine-grained starting material, relative movements between the individual material fragments occur due to the rising vapor and the material removal at the individual material fragments, resulting in turbulence that negatively affects the crystal growth process. These disadvantages are eliminated by using the larger fragments or parts.

This solution is further advantageous because, due to the larger fragments or parts, the total surface area is significantly smaller than when very fine-grained material is used. Thus, the total surface area is easier to determine and to use as a parameter for adjustment in the PVT process.

This solution is further advantageous because, due to the low density of the SiC solid-state material produced according to the invention, the transformation of the boundary layer forming the surface of the solid-state material can take place more quickly.

The SiC solid-state material produced according to the invention, in particular 3C-SiC solid-state material, is preferably introduced into a reactor or furnace device or PVT reactor described below, which has at least the following features: Such a novel reactor is preferably a reactor or PVT reactor for crystal growth, in particular for SiC crystal growth. Said reactor or furnace device also comprises at least one or more or exactly one crucible or crucible unit, wherein the at least one crucible or crucible unit is arranged within the furnace volume. The crucible or crucible unit comprises, and has or forms, a crucible housing, the crucible housing forming a housing, the housing having an outer surface and an inner surface, the inner surface at least partially defining a crucible volume. A receiving space for receiving a starting material is arranged or formed within the crucible volume. Preferably, a seed holder unit for receiving a defined seed wafer 18 is also provided, which is arranged in particular within the crucible volume, or such a seed holder unit is arrangeable within the crucible volume. The reactor or oven device also has at least one heating unit, in particular for heating the starting material and/or the crucible housing of the crucible unit. If a seed holder unit is provided, the receiving space for receiving the starting material is preferably arranged at least partially between the heating unit and the seed holder unit.

This oven device is advantageous in that it can be modified in one or more ways to release at least one of the above-mentioned objects, or several or all of the above-mentioned objects.

Further preferred embodiments are the subject of the further specification parts and/or the dependent claims.

According to a preferred embodiment of the present invention, the furnace apparatus further comprises at least one leak prevention device for preventing leakage of gaseous silicon during operation from the interior of the crucible or crucible unit into a portion of the furnace volume surrounding the crucible unit. This design is advantageous as the disadvantages of leaky Si vapor are eliminated.

According to another preferred embodiment of the present invention, the leak prevention agent is selected from a group of leak prevention agents. The group of leak prevention means preferably comprises at least (a) a covering element for covering surface parts and/or a density increasing element for increasing the density of a volume section of the crucible housing of the crucible unit, (b) a filter unit for collecting gaseous Si and/or (c) a pressure unit for building up a first pressure inside the crucible unit and a second pressure inside the furnace but outside the crucible unit, the second pressure being higher than the first pressure, (d) seals arranged between housing parts of the crucible unit. This embodiment is advantageous as several features are provided to provide an improved furnace device. It is possible to provide such an oven apparatus with one or more or all of the features of said group of leak prevention means. Thus, the present invention also provides solutions for different needs, in particular for different products, especially crystals with different properties.

According to another preferred embodiment of the present invention, the leak prevention agent reduces the leakage from the crucible volume through the crucible housing into the furnace volume of sublimation vapors, in particular of Si vapor, generated during a run, in particular by at least 50% (mass) or by at least 80% (mass) or by at least 90% (mass) or by more than 99% (mass) or by at least 99.9% (mass). This embodiment is advantageous because, due to the significant reduction in leaky Si-steam furnaces, components such as the crucible housing and the heating unit can be reused multiple times, in particular more than 10 times or more than 20 times or more than 50 times or more than 100 times. Thus, the crucible unit or the crucible housing or sections of the crucible unit or sections of the crucible housing have a permeability of less than 10−2 cm2/s or of less than 10−5 cm2/s or of less than 10−10 cm2/s, in particular with respect to Si vapor.

According to a further preferred embodiment of the present invention, the crucible housing comprises carbon, in particular at least 50% (by mass) of the crucible housing consists of carbon and preferably at least 80% (by mass) of the crucible housing consists of carbon and most preferably at least 90% (by mass) of the crucible housing consists of carbon or the crucible housing consists entirely of carbon, in particular the crucible housing comprises at least 90% (by mass) graphite or consists of graphite to withstand temperatures above 2000 °C, in particular at least or up to 3000 °C or at least up to 3000 °C or up to 3500 °C or at least up to 3500 °C or up to 4000 °C or at least up to 4000 °C The crucible housing is preferably impermeable to silicon gas (Si vapor). This design is advantageous because it prevents Si vapor from penetrating through the crucible housing and damaging the crucible housing and components outside the crucible housing. Additionally or alternatively, the crucible unit or the crucible housing structure or the crucible housing have glassy carbon coated graphite and/or solid glassy carbon and/or pyrocarbon coated graphite and/or tantalum carbide coated graphite and/or solid tantalum carbide.

According to another preferred embodiment of the present invention, the leak protection means is a covering element for covering the surface of the housing, in particular the inner surface and/or the outer surface, or for covering surface parts of the housing, in particular surface parts of the inner surface of the housing and/or surface parts of the outer surface of the housing. This embodiment is advantageous because the covering element can be generated on a surface of the housing or can be attached to a surface of the housing. However, either of the two steps (generating/attaching) can be performed in a cost effective and reliable manner.

According to another preferred embodiment of the present invention, the cover element is a sealing element, wherein the sealing element is a coating. The coating preferably consists of a material or a combination of materials which reduces the leakage of sublimation vapors, in particular Si vapor, generated during a run, from the crucible volume through the crucible housing into the furnace volume, in particular by at least 50% (mass) or by at least 80% (mass) or by at least 90% (mass) or by more than 99% (mass) or by at least 99.9% (mass).

The coating preferably withstands temperatures above 2000 °C, in particular at least or up to 3000 °C or at least up to 3000 °C or up to 3500 °C or at least up to 3500 °C or up to 4000 °C or at least up to 4000 °C. This embodiment is advantageous because a modified crucible unit has at least two layers of material, one layer forming a crucible shell and the other layer reducing the permeability of Si vapor. The coating most preferably comprises one or more materials selected from a group of materials comprising at least carbon, in particular pyrocarbon and vitreous carbon. Thus, the crucible unit, in particular the crucible housing or the housing of the crucible unit, is preferably coated with pyro-carbon and/or glassy carbon. The layer of pyrocarbon preferably has a thickness of more than or up to 10 μm, in particular of more than or up to 20 μm or of more than or up to 50 μm or of more than or up to 100 μm or of more than or up to 200 μm or of more than or up to 500 μm. The glassy carbon layer preferably has a thickness of more than or up to 10 μm, in particular of more than or up to 20 μm or of more than or up to 50 μm or of more than or up to 100 μm or of more than or up to 100 μm or of more than or up to 200 μm or of more than or up to 500 μm.

According to a further preferred embodiment, the coating is produced by chemical vapor deposition or wherein the coating is produced by painting, in particular on a precursor material, in particular phenol formaldehyde, and pyrolysis after painting. This embodiment is advantageous because the coating can be generated in a reliable manner.

According to another preferred embodiment of the present invention, the leak protection agent is a density-increasing element or a sealing element for increasing the density of a volume portion of the crucible housing of the crucible unit, wherein the density-increasing element is arranged or created in the internal structure of the crucible housing, wherein the density-increasing element is a sealing element, wherein the sealing element prevents leakage of sublimation vapors, in particular Si-vapor generated during a run, from the crucible volume through the crucible housing into the furnace volume, in particular by at least 50% (mass) or by at least 80% (mass) or by at least 90% (mass) or by more than 99% (mass) or by at least 99.9% (mass). This embodiment is advantageous because the dimensions of the crucible unit remain the same or similar or are not affected by the modification. The sealing element is preferably created inside the crucible housing by impregnation or deposition.

According to another preferred embodiment of the present invention, the leak prevention means is a filter unit for collecting gaseous Si. The filter unit comprises a filter body, the filter body having a filter input surface or input section for introducing gas containing SiC species vapor, Si vapor and process gases into the filter body and an output section or filter output surface for outputting filtered process gases. A filter element is disposed between the filter input surface and the filter output surface, the filter element forming a trapping section for adsorbing and condensing SiC species vapor and Si vapor in particular. Therefore, the filter material is preferably adapted to cause absorption and condensation of Si vapor on a filter material surface. This design is advantageous because the total amount of Si vapor inside the crucible unit can be significantly reduced with the help of the filter unit. This also significantly reduces the amount of Si vapor that can escape. Most and preferably all of the Si vapor is preferably collected as a condensed liquid film on the inner surfaces of the filter. Additionally or alternatively, a section is defined in the uppermost portions of the filter where the temperature is below the melting point of Si and the condensed vapors actually solidify. Preferably, the Si vapors do not solidify into particles, and preferably a solid film is produced on the inner surfaces of the filter. This film can be amorphous or polycrystalline. Excess Si2C and SiC2 vapors preferably also reach the lower region of the filter and are deposited there preferably as solid polycrystalline deposits on the inner surfaces.

According to a preferred embodiment of the present invention, the filter element forms or defines a gas flow path from the filter inlet surface to the outlet surface. The filter element has a height S1 and wherein the gas flow path through the filter element has a length S2, wherein S2 is preferably at least 10 times longer than S1, in particular S2 is at least 100 times longer than S1 or S2 is at least or up to 1000 times longer than S1 or S2 is at least or up to 10000 times longer than S1. This embodiment is advantageous because the filter unit has the ability to absorb or trap more than or up to 50% (mass), in particular more than or up to 50% (mass) or more than or up to 70% (mass) or more than or up to 90% (mass) or more than or up to 95% (mass) or more than or up to 99% (mass) of the Si vapor generated by vaporization of the feedstock, in particular the feedstock used or required during a run. By "one run" is preferably meant the generation or production of a crystal, in particular SiC crystal or SiC block or SiC boule.

According to another preferred embodiment of the present invention, the filter unit is arranged between a first part of the crucible unit housing and a second part, in particular crucible lid or filter lid, of the crucible unit housing. At least 50% (vol.), in particular at least 80% (vol.) or at least 90% (vol.), of the first part of the housing of the crucible unit are arranged in vertical direction below the seed holder unit, wherein a first crucible volume is present between the first part of the housing of the crucible unit and the seed holder, wherein the first crucible volume can be operated in such a way that at least 80% or preferably 90% or even more preferably 100% of the first crucible volume is above the condensation temperature Tc of silicon at the prevailing pressure. Additionally, up to 50% (vol.) or up to 20% (vol.) or up to 10% (vol.) of the first part of the crucible unit housing is arranged vertically above the seed holder unit. Alternatively, at least 50% (vol.), in particular at least 80% (vol.) or 90% (vol.), of the second housing part of the crucible unit is arranged in vertical direction above the seed holder unit. A second crucible volume is preferably present between the second part of the housing of the crucible unit and the seed holder unit. At least 60%, or preferably 80%, or more preferably 90% of the filter element is below the condensation temperature Tc. Thus, the thermal conditions within the filter element of the filter unit allow condensation of Si vapor. Thus, the filter element can condense or trap Si very effectively.

According to another preferred embodiment of the present invention, the filter unit is arranged between a first wall portion of the first part of the housing and a further wall portion of the second part of the housing, the filter body forming a filter outer surface, the filter outer surface connecting the first wall portion of the first part of the housing and the further wall portion of the second part of the housing, the filter outer surface forming part of the outer surface of the cross unit. This embodiment is advantageous because a large-sized filter unit can be used without increasing the amount of material of the crucible housing of the crucible unit.

According to another preferred embodiment of the present invention, the filter outer surface comprises a filter surface cover element. The filter surface covering element is preferably a sealing element, wherein the sealing element is preferably a coating, wherein the coating is preferably produced on the filter surface or attached to the filter surface or forms the filter surface. The coating preferably consists of a material or a combination of materials which reduces the leakage of sublimation vapors, in particular Si vapor, generated during a run, from the crucible volume through the crucible housing into the furnace volume, in particular by at least 50% (mass) or by at least 80% (mass) or by at least 90% (mass) or by more than 99% (mass) or by at least 99.9% (mass), the coating withstanding temperatures above 2.000 °C, in particular at least or up to 3000 °C or at least up to 3000 °C or up to 3500 °C or at least up to 3500 °C or up to 4000 °C or at least up to 4000 °C.

The coating has one or more materials selected from a group of materials comprising at least carbon, in particular pyrocarbon and glassy carbon. Therefore, the coating is preferably a glass-carbon coating or a pyrocarbon coating or a glass-carbon undercoat and a pyrocarbon topcoat or a pyrocarbon undercoat and a glass-carbon topcoat. Thus, the filter unit, in particular the outer surface of the filter unit, is preferably coated with pyrocarbon and/or glassy carbon. The pyrocarbon layer preferably has a thickness of more than or up to 10 μm, in particular of more than or up to 20 μm or of more than or up to 50 μm or of more than or up to 100 μm or of more than or up to 200 μm or of more than or up to 500 μm. The glassy carbon layer preferably has a thickness of more than or of up to 10 μm, in particular of more than or of up to 20 μm or of more than or of up to 50 μm or of more than or of up to 100 μm or of more than or of up to 200 μm or of more than or of up to 500 μm.

According to another preferred embodiment of the present invention, the filter body forms an inner filter surface. The filter inner surface or filter inner surface is preferably arranged coaxially with the filter outer surface. The filter body is preferably annular in shape. The outer filter surface preferably has a cylindrical shape and/or wherein the inner filter surface preferably has a cylindrical shape. The filter outer surface and the filter inner surface extend in vertical direction. This embodiment is advantageous because the filter unit can be used in a circular crucible unit and/or in a crucible unit having a circular crucible volume. Thus, the filter unit or the furnace apparatus in which the filter unit is located does not require any substantial modifications, so that the furnace apparatus according to the present invention can be manufactured at low cost.

According to a further preferred embodiment of the present invention, the filter inner surface comprises a further filter inner surface cover element. The further filter inner surface covering element is preferably a sealing element, wherein the sealing element is preferably a coating. The coating is preferably created on the filter surface, or attached to the filter surface, or forms the filter surface. The coating preferably has a material or combination of materials that reduces the leakage of sublimation vapors, in particular Si vapor, generated during a run, from the crucible volume through the crucible housing to the furnace volume, in particular by at least 50% (mass) or by at least 80% (mass) or by at least 90% (mass) or by more than 99% (mass) or by at least 99.9% (mass).

The coating preferably resists temperatures above 2000 °C, in particular above 2200 °C or above 2000 °C, in particular at least or up to 3000 °C or at least up to 3000 °C or up to 3500 °C or at least up to 3500 °C or up to 4000 °C or at least up to 4000 °C The coating preferably has one or more materials selected from a group of materials containing at least carbon, in particular pyrocarbon and glassy carbon. Thus, the filter unit, in particular the inner surface of the filter unit, is preferably coated with pyrocarbon and/or glassy carbon. The pyrocarbon layer preferably has a thickness of more than or up to 10 μm, in particular of more than or up to 20 μm or of more than or up to 50 μm or of more than or up to 100 μm or of more than or up to 200 μm or of more than or up to 500 μm. The glassy carbon layer preferably has a thickness of more than or of up to 10 μm, in particular of more than or of up to 20 μm or of more than or of up to 50 μm or of more than or of up to 100 μm or of more than or of up to 200 μm or of more than or of up to 500 μm.

According to another preferred embodiment of the present invention, the filter element comprises a filter element member, wherein the filter element member comprises filter particles and a binder. The filter particles comprise carbon or consist of carbon, wherein the binder holds the filter particles in fixed relative positions to each other. The filter particles wi-resist temperatures above 2000 °C, in particular above 2000 °C, in particular at least or up to 3000 °C or at least up to 3000 °C or up to 3500 °C or at least up to 3500 °C or up to 4000 °C or at least up to 4000 °C. The binder withstands temperatures above 2000 °C, in particular 2000 °C, in particular at least or up to 3000 °C or at least up to 3000 °C or up to 3500 °C or at least up to 3500 °C or up to 4000 °C or at least up to 4000 °C. This embodiment is advantageous because a filter unit is provided that can withstand conditions within a crucible unit during operation of the furnace apparatus. In addition, the combination of filter particles and binder forms a surface area that is substantially larger compared to the outer surface area of the filter unit, particularly up to or at least 10 times larger or up to or at least 100 times larger or up to or at least 1000 times larger or up to or at least 10000 times larger. This embodiment is further advantageous because the filter unit has a capacity to absorb or capture more than or up to 50% (mass), in particular more than or up to 50% (mass) or more than or up to 70% (mass) or more than or up to 90% (mass) or more than or up to 95% (mass) or more than or up to 99% (mass) of the Si vapor generated by vaporization of the starting material, in particular the starting material required in each case in one pass.

According to another preferred embodiment of the present invention, the binder comprises starch or wherein the binder comprises modified starch.

This embodiment is advantageous because the binder resists temperatures above 2000 °C, in particular above or up to 2000°, in particular at least or up to 3000 °C or at least up to 3000 °C or up to 3500 °C or at least up to 3500 °C or up to 4000 °C or at least up to 4000 °C. The binder co-resists temperatures above 2000 °C, in particular 2000 °C, in particular at least or up to 3000 °C or at least up to 3000 °C or up to 3500 °C or at least up to 3500 °C or up to 4000 °C or at least up to 4000 °C.

According to a further preferred embodiment of the present invention, the gas inlet is arranged between the receiving space and the holder seed unit, the gas inlet preferably being arranged closer to the receiving space in the vertical direction than the seed holder unit, in particular the vertical distance between the seed holder unit and the gas inlet is preferably more than twice the vertical distance between the receiving space and the gas inlet, in particular more than five times the vertical distance between the receiving space and the gas inlet or more than eight times the vertical distance between the receiving space and the gas inlet or more than ten times the vertical distance between the receiving space and the gas inlet or more than twenty times the vertical distance between the receiving space and the gas inlet. This embodiment is advantageous because a gas flow can be established that causes the vaporized starting material to homogeneously reach the seed wafer 18 or the growth front of the crystal.

According to a further preferred embodiment of the present invention, the gas inlet is covered by a gas guiding element or a gas distributing element. The gas distribution element preferably extends parallel to a bottom surface of the crucible unit, in particular the inner bottom surface of the crucible unit. Additionally or alternatively, the gas distribution element extends in a horizontal plane. This embodiment is advantageous because the introduced gas can be homogeneously distributed to the annular receiving space and thus to the starting material presented in the receiving space or to the vaporized starting material flowing out of the receiving space. The vaporized feedstock material moves by thermally driven diffusion. Additionally or alternatively, the vaporized feedstock material moves by convection of injected gas, in particular Ar and/or N2.

According to a further preferred embodiment of the present invention, the gas distribution element is arranged at a defined distance from the bottom surface of the crucible unit, in particular the inner bottom surface of the crucible unit. The defined distance in vertical direction between the bottom side of the gas distribution element and the bottom surface of the crucible unit is preferably smaller than 0.5× vertical distance between the receiving space and the gas inlet (i.e. less than half the vertical distance between the receiving space and the gas inlet) or less than 0.3× vertical distance between the receiving space and the gas inlet or less than 0.1× vertical distance between the receiving space and the gas inlet or less than 0.05× vertical distance between the receiving space and the gas inlet.

According to another preferred embodiment of the present invention, the gas distribution element is a gas baffle. The gas baffle preferably forms a lower surface and an upper surface. The lower surface and the upper surface preferably extend parallel to each other at least in sections. The distance between the lower surface and the upper surface is preferably less than 0.5× distance between the receiving space and the gas inlet, or less than 0.3× distance between the receiving space and the gas inlet, or less than 0.1× distance between the receiving space and the gas inlet, or less than 0.05× distance between the receiving space and the gas inlet. This embodiment is advantageous because a truly thin gas distribution plate can be used. This is advantageous because the gas distribution plate does not require a significant amount of material. In addition, the gas distribution plate does not affect heat radiation radiated from a lower portion covered by the gas distribution plate.

According to another preferred embodiment form of the present invention, the means for preventing leakage is a pressure unit for building up a first pressure inside the crucible unit and a second pressure inside the furnace but outside the crucible unit, wherein the second pressure is higher than the first pressure and wherein the second pressure is below 200 Torr, in particular below 100 Torr or below 50 Torr, in particular between 0.01 Torr and 30 Torr. The second pressure is preferably up to 10 Torr or up to 20 Torr or up to 50 Torr or up to 100 Torr or up to 180 Torr higher than the first pressure. This embodiment is advantageous because leakage of Si vapor is prevented due to the higher pressure around the crucible unit.

A pipe system is part of the furnace apparatus according to another preferred embodiment of the present invention. The pipe system preferably comprises a first pipe or crucible pipe connecting the crucible volume to a vacuum unit, and a second pipe or furnace pipe connecting the part of the furnace surrounding the crucible unit to the vacuum unit. The vacuum unit preferably has a control element for controlling the pressure inside the crucible volume and the pressure in the part of the furnace surrounding the crucible unit. The vacuum unit preferably reduces the pressure inside the crucible volume via the crucible tube or inside the part of the furnace surrounding the crucible unit via the furnace tube if the control element determines that the pressure inside the crucible volume is above a first threshold and/or if the control element determines that the pressure inside the part of the furnace surrounding the crucible unit is above a second threshold. This embodiment is advantageous because the pressure difference between the pressure inside the crucible volume and the pressure inside the furnace and around the crucible volume can be reliably maintained.

According to another preferred embodiment of the present invention, the furnace system comprises two or more than two leak prevention means selected from the group consisting of leak prevention means. This embodiment is advantageous because the furnace apparatus comprises at least the cover element and/or the density increasing element and the filter unit for collecting gaseous Si, or because the furnace apparatus comprises at least the cover element and/or the density increasing element and the pressure unit for building up the first pressure inside the crucible unit and the second pressure inside the furnace, but outside the crucible unit or since the furnace device comprises at least the pressure unit for building up the first pressure inside the crucible unit and the second pressure inside the furnace but outside the crucible unit and the filter unit.

However, it is also possible that the furnace device comprises at least the cover element and/or the density increasing element and the filter unit for collecting gaseous Si and the pressure unit for setting the first pressure inside the crucible unit and the second pressure inside the furnace but outside the crucible unit.

This embodiment is advantageous because the leakage of Si vapor can be prevented in various ways, so that it is possible to set up the furnace unit according to the present invention to meet the requirements depending on various needs.

According to a further preferred embodiment of the present invention, the heating unit comprises at least one, in particular horizontal, heating element, wherein the heating element is arranged in vertical direction below the receiving space. Thus, the heating element preferably overlaps the receiving space at least partially and preferably predominantly or completely. This design is advantageous because the receiving space and the part of the crucible volume or crucible housing enclosed by the receiving space can be heated from below the crucible volume. This is advantageous because the height of the receiving space and the height of the part of the crucible volume or crucible housing surrounded by the receiving space are the same for seed wafers 18 with a small diameter or with a larger diameter. This allows the starting material to be homogeneously heated. The heating unit preferably also has at least one further, in particular vertical, heating element, the further heating element preferably being arranged next to the crucible unit, in particular next to a side wall of the crucible unit surrounding the crucible unit. The heating element and/or the further heating element is preferably arranged inside the furnace insert outside the crucible unit, in particular outside the crucible volume.

According to a further preferred embodiment of the present invention, the receiving space is formed in a wall part of the crucible unit or is arranged on a wall or bottom part inside the crucible unit. The receiving space preferably extends about a central axis, the central axis preferably being coaxial with a central axis of the seed holder unit. The receiving space is preferably arranged at a defined distance from the central axis.

According to a further preferred embodiment of the present invention, a gas tube or gas guiding device is provided for introducing gas into the crucible unit. The gas tube or gas guiding means, or a portion of the gas tube or gas guiding means, or a gas inlet attached to the gas tube or gas guiding means, or a part of the gas tube or gas guiding means is at least partially, and preferably predominantly or completely, surrounded by the receiving space. The gas tube or gas guiding means preferably extends at least partially in the direction of the center axis. The gas tube or gas conducting means preferably enters the crucible volume through a bottom part of the crucible unit or through a bottom part of the crucible housing of the crucible unit. This embodiment is advantageous because gas can be provided into the crucible volume via a gas line or gas guiding device. Furthermore, since the gas inlet is surrounded by the receiving volume, the gas introduced via the gas inlet can be distributed to the different parts of the receiving volume, in particular homogeneously. In this way, a mixture of injected gas and vaporized feedstock can be generated, in particular in a homogeneous manner.

According to another preferred embodiment of the present invention, the receiving space has an annular shape. The receiving space is preferably shaped or formed as a trench, in particular a circular trench, or by multiple recesses, in particular circular recesses. These multiple recesses are preferably arranged along a predetermined contour, the predetermined contour preferably being circular in shape. This embodiment is advantageous because the seed wafer 18 is preferably circular in shape. Thus, the evaporated starting material advantageously approaches the growth surface of the seed wafer 18 or a growth surface of the growing crystal.

According to a further preferred embodiment of the present invention, the defined distance between the receiving space and the center axis is up to 30% or up to 20% or up to 10% or up to 5% or up to 1% shorter than the diameter of the defined seed wafer 18. Alternatively, the defined distance between the receiving space and the center axis is up to 1% or up to 5% or up to 10% or up to 20% or up to 30% longer than the diameter of the defined seed wafer 18. Alternatively, the defined distance between the receiving space and the center axis coincides with the diameter of the defined seed wafer 18. This embodiment is advantageous as it further supports homogeneous distribution of the vaporized starting material over the growth surface of the seed wafer 18 or over a growth surface of the growing crystal.

According to another preferred embodiment of the present invention, the receiving space encloses a housing bottom portion or a portion above the housing bottom. The bottom section is a solid material section. The solid material section or a crucible massive bottom section preferably has a height (in vertical direction) or a wall thickness which is greater than 0.3× the smallest distance of the receiving space from the center axis, or is greater than 0.5× the smallest distance of the receiving space from the center axis, or is 0.7× the smallest distance between the receiving space and the center axis, or is greater than 0.9× the smallest distance between the receiving space and the center axis, or is 1.1× the smallest distance between the receiving space and the center axis, or is greater than 1.5× the smallest distance between the receiving space and the center axis. This design is advantageous because the lower part or the surrounding lower part can be heated by the heating unit. If the lower part is heated, it heats the space between the seed wafer 18 and also the seed wafer 18. If the lower part is heated, it heats the space between the seed wafer 18 and also the seed wafer 18. Since the lower part is preferably a solid block of material and/or a crucible-shaped solid bottom section, the heating of the space between the seed wafer 18 and the bottom section and the heating of the seed wafer 18 or the wax-turn surface of the growing crystal is performed in a homogeneous manner. The bottom portion preferably has an outer surface portion, which is preferably a surface portion of the crucible body, and an inner surface portion, the inner surface portion preferably being parallel to the outer surface portion. This is advantageous because the bottom portion can be homogeneously heated. The inner surface portion of the bottom portion is preferably a flat surface, wherein the flat surface is preferably arranged in a horizontal plane. The inner surface portion is preferably arranged parallel to the surface of the seed wafer 18. This embodiment is advantageous because the space between the seed wafer 18 and the bottom portion and the seed wafer 18 and/or the growth surface of the growing crystal can be homogeneously heated.

The bottom portion thus has an inner surface, the inner surface of the bottom portion being disposed within the crucible volume and preferably parallel to the seed holder unit. The center of the inner surface and the center of the seed holder unit are preferably arranged on the same vertical axis, wherein a distance between the inner surface of the bottom section is preferably arranged at a predefined distance from the seed holder unit. The distance is preferably greater than 0.5× the smallest distance between the receiving space and the center axis or greater than 0.7× the smallest distance between the receiving space and the center axis or greater than 0.8× the smallest distance between the receiving space and the center axis or greater than 1× the smallest distance between the receiving space and the center axis or greater than 1.2× the smallest distance between the receiving space and the center axis, or greater than 1.5× the smallest distance between the receiving space and the center axis, or greater than 2× the smallest distance between the receiving space and the center axis, or greater than 2.5× the smallest distance between the receiving space and the center axis. This embodiment is advantageous because large (wide and/or long) crystals can be grown.

The filter unit is arranged vertically above the receiving chamber. This embodiment is advantageous because the evaporated feedstock and/or the injected gas flows from a lower crucible section to an upper crucible section, so the filter unit is preferably arranged in the gas flow path.

According to another preferred embodiment of the present invention, the filter unit and the receiving space are preferably arranged coaxially. This embodiment is advantageous, since vaporized starting material and/or introduced gas or a mixture of vaporized starting material and introduced gas can pass homogeneously through the preferably cylindrical sei-den wall. In this way, accumulations of vaporized starting material and/or introduced gas can be pre-aerated. This is advantageous because it allows the crystal to grow homogeneously. Homogeneous growth preferably means that the growth rate on all surface parts of the growth area of the crystal is within a defined range and/or the accumulation of defects and/or doping is uniformly distributed, the term "uniformly distributed" defining a permissible range of deviations.

According to a further preferred embodiment of the present invention, an outer diameter of the filter unit corresponds to an outer diameter of the receiving space and/or wherein an inner diameter of the filter unit preferably corresponds to an inner diameter of the receiving space. This embodiment is advantageous because the housing shape does not cause any notable complexity and thus allows for low-cost manufacturing. The outer diameter of the filter unit is preferably at least or up to 1.05× larger compared to the outer diameter of the receiving space, or wherein the outer diameter of the filter unit is preferably at least or up to 1.1× larger compared to the outer diameter of the receiving space, or wherein the outer diameter of the filter unit is preferably at least or up to 1.3× larger compared to the outer diameter of the receiving space, or wherein the outer diameter of the filter unit is preferably at least or up to 1.5× larger compared to the outer diameter of the receiving space. Alternatively, the outer diameter of the receiving space is preferably at least or up to 1.05× larger compared to the outer diameter of the filter unit or wherein the outer diameter of the receiving space is preferably at least or up to 1.1× larger compared to the outer diameter of the filter unit or wherein the outer diameter of the receiving space is preferably at least or up to 1.3× larger compared to the outer diameter of the filter unit or wherein the outer diameter of the receiving space is preferably at least or up to 1.5× larger compared to the outer diameter of the filter unit. Additionally or alternatively, the inner diameter of the receiving space is preferably at least or up to 1.05× larger compared to the inner diameter of the filter unit, or wherein the inner diameter of the receiving space is preferably at least or up to 1.1× larger, or wherein the inner diameter of the receiving space is preferably at least or up to 1.3× larger compared to the inner diameter of the filter unit, or wherein the inner diameter of the receiving space is preferably at least or up to 1.5× larger compared to the inner diameter of the filter unit. Alternatively, the inner diameter of the filter unit is preferably at least or up to 1.05× larger compared to the inner diameter of the receiving space or wherein the inner diameter of the filter unit is preferably at least or up to 1.1× larger compared to the inner diameter of the receiving space or wherein the inner diameter of the filter unit is preferably at least or up to 1.3× larger compared to the inner diameter of the receiving space or wherein the inner diameter of the filter unit is preferably at least or up to 1.5× larger compared to the inner diameter of the receiving space.

According to another preferred embodiment of the present invention, a growth guiding element is arranged or provided in a vertical direction above the receiving space for guiding vaporized starting material and/or introduced gas into a space between the seed holder unit and the inner bottom surface of the crucible unit. This embodiment is advantageous because the growth guiding element preferably performs several functions. On the one hand, the growth guide element guides the vaporized starting material to the seed wafer 18 or to the growing crystal. On the other hand, the growth guide element influences the shape of the growing crystal by limiting its radial expansion.

According to another preferred embodiment of the present invention, the growth guide element comprises a first wall section or a first growth guide section and a second wall section or a second growth guide section. The first growth guide section is preferably shaped to match a corresponding wall section of the crucible housing. Matching in this context preferably means that the wall portion of the crucible housing and the growth guide member are preferably coupled by a form-fit and/or press-fit connection. The second portion of the growth guide is preferably shaped to manipulate the shape of a growing crystal. The first portion of the growth guide and the second portion of the growth guide are coaxially arranged according to another preferred embodiment of the present invention. The first section of the growth guide is arranged at a first diameter with respect to the central axis, and wherein the second section of the growth guide is arranged at a second diameter with respect to the central axis, the first diameter being larger compared to the second diameter. The first growth guide section and the second growth guide section are interconnected by a third wall section and a third growth guide section, respectively, the third growth guide section extending at least partially in a horizontal direction. The first growth guide section and the third growth guide section form an arcuate section and a fourth growth guide section, respectively, and/or wherein the second growth guide section and the third growth guide section are arranged at an angle between 60° and 120°, in particular at an angle between 70° and 110°, in particular at an angle of 90°. The fourth growth leader section may have, for example, a convex or concave or conical shape. The first wall section, the second section of the growth aid and the third section of the growth aid are preferably integral parts of the growth aid. Preferably, the growth aid is made of graphite. This embodiment is advantageous because the growth guide element has a simple but effective shape. Thus, the growth guide element can be manufactured in a cost-effective manner.

According to another preferred embodiment of the present invention, the outer diameter of the filter unit is at least or up to 1.05× larger than the first diameter of the growth guide element, or wherein the outer diameter of the filter unit is preferably at least or up to 1.1× larger than the first diameter of the growth guide element, or wherein the outer diameter of the filter unit is preferably at least or up to 1.3× larger than the first diameter of the growth guide or wherein the outer diameter of the filter unit is preferably at least or up to 1.3× larger than the first diameter of the growth guide or wherein the outer diameter of the filter unit is preferably at least or up to 1.5× larger compared to the first diameter of the growth guide and/or wherein the second diameter of the growth guide is preferably at least or up to 1.05× larger compared to the inner diameter of the filter unit or wherein the second diameter of the growth guide is preferably at least or up to 1.1× larger compared to the inner diameter of the filter unit or wherein the second diameter of the growth guide is preferably at least or up to 1.3× larger compared to the inner diameter of the filter unit or wherein the second diameter of the growth guide is preferably at least or up to 1.5× larger compared to the inner diameter of the filter unit.

wherein the upper vertical end of the growth guide of the second section of the growth guide and the seed holding unit form a gas flow channel, wherein the smallest distance between the upper vertical end of the growth guide of the second section of the growth guide and the seed holding unit is smaller than 0.3× second diameter of the growth guide or smaller than 0.1× second diameter of the growth guide or smaller than 0.08× second diameter of the growth guide or smaller than 0.05× second diameter of the growth guide or smaller than 0.03× second diameter of the growth guide or smaller than 0.01× second diameter of the growth guide.

According to a further preferred embodiment of the present invention, the coating is preferably applied to the receiving space, in particular the surface of the receiving space within the crucible volume and/or to the growth guide element or the growth guide plate or gas distribution plate. The coating preferably has a material or combination of materials that reduces the permeability of Si vapor through the wall portions bounding the receiving space and/or through the wall portions bounding the growth guide element to 10−3 m2/s, or preferably 10−11 m2/s, or more preferably 10−12 m2/s.

The coating preferably withstands temperatures above 2000 °C, in particular at least or up to 3000 °C or at least up to 3000 °C or up to 3500 °C or at least up to 3500 °C or up to 4000 °C or at least up to 4000 °C. This embodiment is advantageous because a modified containment and/or growth guide element has at least two layers of material, one layer forming the structure of the containment and/or growth guide element, and the other layer reducing or avoiding permeability of Si-vapor. Most preferably, the coating has one or more materials selected from a group of materials comprising at least carbon, in particular pyrocarbon and glassy carbon. Thus, the receiving space and/or the growth directing element is preferably coated with pyrocarbon and/or glassy carbon. The layer of pyrocarbon preferably has a thickness of more than or up to 10 μm, in particular of more than or up to 20 μm or of more than or up to 50 μm or of more than or up to 100 μm or of more than or up to 200 μm or of more than or up to 500 μm. The glassy carbon layer preferably has a thickness of more than or of up to 10 μm, in particular of more than or of up to 20 μm or of more than or of up to 50 μm or of more than or of up to 100 μm or of more than or of up to 200 μm or of more than or of up to 500 μm. According to a further preferred embodiment, the coating is produced by chemical vapor deposition or wherein the coating is produced by painting, in particular on a precursor material, in particular phenol formaldehyde, and pyrolysis after painting. This embodiment is advantageous because the coating can be generated in a reliable manner.

According to another preferred embodiment of the present invention, the heating unit comprises at least one heating element. The heating element is preferably arranged vertically below the receiving space and/or below a bottom part of the crucible unit, the bottom part of the crucible unit being surrounded by the receiving space. This design is advantageous because the receiving space and/or the bottom section surrounded by the receiving space can be heated by the heating element. The heating element preferably overlaps the receiving space and/or the bottom section surrounded by the receiving space at least partially and preferably to more than 50% or to more than 70% or up to 90% or completely. This design is advantageous because a homogeneous temperature distribution can be set, in particular homogeneous temperature levels can be generated.

According to a further preferred embodiment of the present invention, the furnace apparatus comprises a gas flow unit. The gas flow unit preferably has a gas inlet for conducting gas into the crucible unit or into the crucible volume and a gas outlet for withdrawing gas from the crucible unit or from the crucible volume. The gas inlet is preferably arranged closer to the bottom of the crucible unit than the gas outlet. Both the gas inlet and the gas outlet are preferably arranged within the crucible volume. This design is advantageous because the conditions within the crucible volume and/or the vapor composition and/or the liquid flow (direction and/or velocity) within the crucible can be influenced or controlled.

According to another preferred embodiment of the present invention, the gas outlet comprises a gas carrying means, in particular a tube. The gas outlet preferably has a sensor, in particular a temperature and/or pressure sensor, the sensor preferably being arranged inside the conducting means, in particular tube, or as part of the conducting means, in particular tube, or being attached to an outer wall of the conducting means, in particular tube. This embodiment is advantageous because the temperature and/or pressure conditions can be monitored.

Additionally or alternatively, the gas inlet according to a further preferred embodiment of the present invention comprises a gas conducting means, in particular a pipe. The gas inlet preferably has a sensor, in particular a temperature and/or pressure sensor, the sensor preferably being arranged inside the conduit means, in particular tube, or as part of the conduit means, in particular tube, or being attached to an outer wall of the conduit means, in particular tube. This embodiment is advantageous because the temperature and/or pressure conditions can be monitored.

According to a further preferred embodiment of the present invention, the sensor in the gas inlet and/or gas outlet is a pyrometer. This embodiment is advantageous because the pyrometer can withstand high temperatures. This embodiment is also advantageous because the pyrometer can be used multiple times, making it a very cost-effective solution.

According to another preferred embodiment of the present invention, the sensor in the gas inlet and/or gas outlet is in connection with a control unit. This embodiment is advantageous because the control unit receives sensor signals or sensor data. Thus, the control unit can output conditions within the crucible unit, in particular as a function of a time stamp, to an operator for monitoring the production or growth process. Additionally or alternatively, the control unit may be provided with control rules to control the oven apparatus depending on the control rules, the time and/or the sensor output.

According to another preferred embodiment of the present invention, the receiving space is formed by one or at least one continuous trench or a plurality of recesses. The trench or the recesses preferably at least partially and preferably substantially or preferably completely enclose a surface arranged or provided or materialized inside the crucible unit, in particular an inner surface of a wall and/or bottom section of the crucible unit, wherein the receiving space preferably has an annular shape. The heating element preferably covers at least 30% or at least 40% or at least 50% or at least 60% or at least 70% or at least 70% or at least 80% or at least 90% or at least 90% or at least 95% of a bottom surface of the receiving space and at least 20% or at least 30% or at least 40% or at least 50% or at least 60% or at least 70% or at least 70% or at least 80% or at least 90% or at least 95% of the surface at least partially surrounded by the receiving space. The area at least partially surrounded by the receiving space preferably belongs to a solid wall or a crucible bottom wall or a crucible bottom section, respectively, which extend at least over a distance V1 in vertical direction, wherein in the receiving space a distance V2 extends in vertical direction between a receiving space bottom surface and a top surface of the lowermost side wall part of the receiving space, wherein $V2>V1$ (i.e.: distance V2 is greater in the vertical direction). i.e.: distance V2 is greater compared to distance V1), in particular $V2>1.1\times V1$ or $V2>1.2\times V1$ or $V2>1.5\times V1$ or $V2>2\times V1$, or $V2=V1$ or $V2<V1$, in particular $V2<1.1\times V1$ or $V2<1.2\times V1$ or $V2<1.5\times V1$ or $V2<2\times V1$.

The receiving space thus preferably encloses a lower part of the housing and, in particular, has the surface surrounded by the receiving space. The bottom portion is preferably a solid material portion. The solid crucible bottom portion preferably has a height (in the vertical direction) greater than 0.3× the smallest distance between the receiving space and the center axis, or greater than 0.5× the smallest distance between the receiving space and the center axis, or 0.7× the smallest distance between the receiving space and the center axis or which is greater than 0.9× the smallest distance between the receiving space and the center axis or 1.1× the smallest distance between the receiving space and the center axis or which is greater than 1.5× the smallest distance between the receiving space and the center axis.

According to another preferred embodiment of the present invention, the bottom portion has an inner surface or the surface surrounded by the receiving space. The inner surface of the bottom part is arranged within the crucible volume and preferably parallel to the seed holder unit. The center of the inner surface and the center of the seed holder and/or the center of a seed wafer 18 held by the seed holder unit are preferably arranged on the same vertical axis. The inner surface of the lower part is preferably arranged at a predefined distance from the seed holder unit. The distance is preferably greater than 0.5× the smallest distance between the receiving space and the center axis or greater than 0.7× the smallest distance between the receiving space and the center axis or greater than 0.8× the smallest distance between the receiving space and the center axis or greater than 1× the smallest distance between the receiving space and the center axis or greater than 1.2× the smallest distance between the receiving space and the center axis or greater than 1.5× the smallest distance between the receiving space and the center axis or greater than 2× the smallest distance between the receiving space and the center axis or greater than 2.5× the smallest distance between the receiving space and the center axis. This embodiment is advantageous because the crucible volume has, at least in sections and preferably predominantly or completely, a rotationally symmetrical shape that supports homogeneous distribution of the vaporized starting material on the seed wafer 18 or the growing crystal.

According to a further preferred embodiment of the present invention, the area surrounded by the receiving space has at least a size of 0.5× the size of the top surface of the defined seed wafer 18 or has at least a size of 0.8× the size of the top surface of the defined seed wafer 18 or has at least a size of 0.9× the size of the top surface of the defined seed wafer 18 or has at least a size of 1× the size of the top surface of the defined seed wafer 18 or has at least a size of 1.1× the size of the top surface of the defined seed wafer 18. Additionally or alternatively, the center of the surface surrounded by the receiving space and the center of the top surface of the defined seed wafer 18 are preferably disposed on the same vertical axis. Additionally or alternatively, the surface surrounded by the receiving space and the upper surface of the defined seed wafer 18 are preferably arranged parallel to each other. This embodiment is advantageous because a heat distribution can be homogeneously performed over the surface surrounded by the receiving space.

According to another preferred embodiment of the present invention, a control unit is provided for controlling the pressure level within the crucible unit and/or the furnace and/or for controlling the gas flow into the crucible unit and/or for controlling the heating unit. Preferably, the heating unit is controlled to generate an isothermal temperature profile parallel to the support unit or orthogonal to the vertical direction or horizon-tally. This embodiment is advantageous because the control unit could use predefined rules and/or sensor data or sensor signals to monitor the growth process and change operating parameters of one or more of the aforementioned units to control crystal growth.

A filter unit is provided according to another preferred embodiment of the present invention. The filter unit preferably surrounds the seed crystal holder unit and/or wherein the filter unit is preferably arranged at least partially above the seed crystal holder unit, in particular at least 60% (vol.) of the filter unit is arranged above the seed crystal holder unit. The filter unit comprises a filter body, wherein the filter body comprises a filter input surface for introducing gas containing Si-vapor into the filter body and an output surface for discharging filtered gas, wherein the filter input surface is preferably arranged in vertical direction at a level below the level of the output surface. At least one or exactly one filter element is arranged between the filter input surface and the output surface. It is possible that the filter element forms the filter input surface and/or the output surface. Preferably, the filter element forms a separation area for adsorption and condensation of Si vapor. This design is advantageous because Si vapor can be trapped inside the filter element, thus reducing defects caused by Si vapor. Preferably, the separation area has at least or up to 50% (vol.) of the filter element volume or at least or up to 80% (vol.) of the filter element volume or at least or up to 90% (vol.) of the filter element volume. Thus, it is possible that 1%-50% (vol.) or 10%-50% (vol.) or 1%-30% (vol.) of the filter element volume is a vapor section or a section in which the vaporized feedstock is in a vapor configuration.

In accordance with another preferred embodiment of the present invention, the filter element forms a gas flow path from the filter input surface to the output surface. The filter element preferably has a height S1 and the gas flow path through the filter element has a length S2, wherein S2 is at least 10 times longer than S1, in particular S2 is 100 times longer than S1 or S2 is 1000 times longer than S1. This design is advantageous because the filter element has sufficient capacity to absorb all the Si vapor generated during a flow or during the growth of a crystal, in particular a SiC crystal. Therefore, the filter element preferably forms a porous, large surface area for capturing Si sublimation vapor during PVT growth, in particular SiC single crystal/s. The filter element preferably has a material with a surface area of at least 100 m2/g or of at least 1000 m2/g.

According to another preferred embodiment of the present invention, the filter unit is arranged between a first part of the crucible unit housing and a second part of the crucible unit housing. At least 50% (vol.), in particular at least 80% (vol.) or 90% (vol.) of the first housing part of the crucible unit are arranged in vertical direction below the seed holder unit. A first crucible volume is provided between the first housing part of the crucible unit and the seed holder, wherein the first crucible volume can be operated such that at least 80% or preferably 90% or more preferably 100% of the first crucible volume is above the condensation temperature Tc of silicon at the prevailing pressure. Additionally, up to 50% (vol.) or up to 20% (vol.) or up to 10% (vol.) of the first part of the crucible unit housing is arranged vertically above the seed holder unit. Alternatively, at least 50% (vol.), in particular at least 80% (vol.) or 90% (vol.), of the second housing part of the crucible unit is arranged in vertical direction above the seed holder unit. A second crucible volume is preferably provided between the second housing part of the crucible unit and the seed holder. At least 60%, or preferably 80%, or more preferably 90% of the filter element is below the condensation temperature Tc. This embodiment is advantageous because the output material vaporizes or is vaporized at Tc or above and condenses or condenses at Tc or below. Therefore, the fact that Si vapor condenses below a certain temperature can be used to trap condensed Si in the filter element. Therefore, the filter element is very effective.

According to another preferred embodiment of the present invention, the filter unit is arranged between a first wall part of the first housing part and a further wall part of the second housing part. The filter body preferably forms a filter outer surface. The filter outer surface preferably connects the first wall part of the first housing part and the further wall part of the second housing part. The filter outer surface preferably forms a part of the outer surface of the crucible unit. This embodiment is advantageous because the filter unit can be arranged to increase the volume of the crucible unit without the need for one or more additional crucible housing parts.

According to another preferred embodiment of the present invention, the filter outer surface comprises a filter outer surface cover element. The filter outer surface cover element is preferably a sealing element. The sealing element is preferably a coating. The coating is preferably created on the filter surface, or attached to the filter surface, or forms the filter surface. The coating preferably has a material or combination of materials that reduces leakage of sublimation vapors, in particular Si vapor, generated during a run, from the crucible volume through the crucible housing into the furnace volume, in particular by at least 50% (mass) or by at least 80% (mass) or by at least 90% (mass) or by more than 99% (mass) or by at least 99.9% (mass).

The coating preferably withstands temperatures above 2000 °C, in particular at least or up to 3000 °C or at least up to 3000 °C or up to 3500 °C or at least up to 3500 °C or up to 4000 °C or at least up to 4000 °C. The coating preferably comprises one or more materials selected from a group of materials comprising at least carbon, in particular pyrocarbon and vitreous carbon. This embodiment is advantageous because the filter unit can also form an outer barrier of the crucible unit. Thus, the filter unit preferably absorbs or traps Si and preferably also prevents Si vapor from escaping. The ash content of the filter element is preferably below 5% (mass) or below 1% (mass). This means that the less than 5% or less than 1% of the mass of the filter element is ash.

According to another preferred embodiment of the present invention, the filter body forms an inner filter surface. The filter inner surface is preferably coaxial with the filter outer surface. The filter body is preferably annular in shape. The filter outer surface preferably has a cylindrical shape and/or the filter inner surface preferably has a cylindrical shape. The filter outer surface and/or the filter inner surface has the longest extension in vertical direction or in circumferential direction. This embodiment is advantageous because the filter unit can be positioned in a simple manner due to its shape. Additionally or alternatively, the filter inner surface encloses a space above the seed holder unit. The space surrounded by the seed holder unit may serve as a cooling space for cooling the filter element and/or for cooling the seed holder unit. A cooling unit may be provided, wherein the cooling unit preferably comprises at least one cooling tube for guiding a cooling liquid. This cooling tube may be arranged to at least partially or at least mainly (more than 50% in circumferential direction) surround or completely surround the crucible unit. Additionally or alternatively, the cooling tube can be arranged inside the crucible volume, in particular in the space surrounded by the filter inner surface. However, it is also possible that the cooling tube extends from the outside of the crucible unit through a wall of the crucible unit and/or a wall of the filter unit into the crucible volume, in particular into the space surrounded by the filter inner surface. It is additionally possible that the cooling tube extends to the outside of the furnace. This embodiment is advantageous because the temperature inside the crucible unit can be advantageously controlled. In addition, it is possible to set a temperature distribution profile in the crucible volume with a much steeper gradient compared to a situation without a cooling unit.

According to a further preferred embodiment of the present invention, the filter inner surface has a further filter inner surface cover element. The further filter inner surface covering element is preferably a sealing element. The sealing element is preferably a coating, wherein the coating is preferably created on the filter surface or attached to the filter surface or forms the filter surface. The coating preferably has a material or combination of materials that resists leakage of sublimation vapors, in particular Si vapor, generated during a run, in particular at least 50% (mass) or at least 80% (mass) or at least 90% (mass) or more than 99% (mass) or at least 99.9% (mass), from the crucible volume through the crucible housing back into the furnace volume.

The coating preferably withstands temperatures above 2000 °C, in particular at least or up to 3000 °C or at least up to 3000 °C or up to 3500 °C or at least up to 3500 °C or up to 4000 °C or at least up to 4000 °C. The coating preferably has one or more materials selected from a group of materials comprising at least carbon, in particular pyrocarbon and vitreous carbon. This solution is advantageous because the leakage of Si vapor into the space surrounded by the inner surface of the filter is prevented.

The filter element preferably consists of an activated carbon block and/or one or more, in particular different, graphite foams, including those made of carbonized bread and/or rigid graphite insulation and/or flexible graphite insulation.

According to another preferred embodiment of the present invention, the filter element comprises a filter element member. The filter element preferably comprises filter particles and a binder. The filter particles preferably comprise carbon or consist of carbon material. The binder preferably holds the filter particles in fixed relative positions to each other. The filter particles preferably withstand temperatures above 2000 °C, in particular at least or up to 3000 °C or at least up to 3000 °C or up to 3500 °C or at least up to 3500 °C or up to 4000 °C or at least up to 4000 °C. The filter particles preferably resist temperatures above 2000 °C, in particular at least or up to 3000 °C or at least up to 3000 °C or up to 3500 °C or at least up to 4000 °C. The filter particles preferably withstand temperatures above 1700 °C, in particular above 2000 °C, in particular up to or above 2000 °C, in particular at least or up to 3000 °C or at least up to 3000 °C or up to 3500 °C or at least up to 3500 °C or up to 4000 °C or at least up to 4000 °C. This solution is advantageous because the solid filter element has no toxic materials. In addition, the solid filter element can be manufactured at low cost. The filter unit, in particular the filter element, is preferably a disposable unit or element.

According to a further preferred embodiment of the present invention, the binder comprises starch or wherein the binder comprises starch.

According to a further preferred embodiment of the present invention, the furnace system comprises a gas flow unit. The gas flow unit preferably has a gas inlet for conducting gas into the crucible unit and a gas outlet for discharging gas from the crucible unit into the furnace or through the furnace to the outside of the furnace. The gas inlet is preferably arranged upstream of the filter unit in the gas flow direction, in particular upstream of the receiving space in the gas flow direction, and wherein the gas outlet is arranged downstream of the filter unit in the gas flow direction. Thus, a gas inlet is preferably arranged in a transformation zone within the crucible unit. The transformation zone preferably also comprises the seed holder unit and the receiving space. A starting material may be transformed from a solid configuration to a vapor configuration, and from the vapor configuration to a solid target body. The starting material may be disposed within the receiving space, and the solid target body may be held by the seed holder unit. The solid target body is a crystal, in particular a SiC crystal. The gas introduced via the gas inlet preferably mixes with and/or reacts with the starting material in the vapor configuration and/or during solidification. The gas outlet is preferably arranged in a trapping zone, wherein the trapping zone also comprises the outlet surface of the filter unit, wherein the gas composition in the trapping zone is preferably free of Si vapor or has no Si vapor. The temperature in the capture zone is preferably below the solidification temperature of gaseous Si or Si vapor. This embodiment is advantageous because the crystal growth process can be manipulated. For example, it is possible to add one or more gases to dope the crystal. Additionally or alternatively, it is possible to modify, in particular to accelerate, the vapor transport from the receiving space to the seed wafer 18 or crystal. Homogeneous growth preferably means that the growth rate on all surface parts of the growth area of the crystal is within a defined range and/or the accumulation of defects and/or doping is uniformly distributed, the term "uniformly distributed" defining a permissible range of deviations.

According to a further preferred embodiment of the present invention, an outer diameter of the filter unit corresponds to an outer diameter of the receiving space and/or wherein an inner diameter of the filter unit preferably corresponds to an inner diameter of the receiving space. This embodiment is advantageous because the housing shape does not cause any notable complexity and thus allows for low-cost manufacturing. The outer diameter of the filter unit is preferably at least or up to 1.05× larger compared to the outer diameter of the receiving chamber or wherein the outer diameter of the filter unit is preferably at least or up to 1.1× larger compared to the outer diameter of the receiving space or wherein the outer diameter of the filter unit is preferably at least or up to 1.3× larger compared to the outer diameter of the receiving space or wherein the outer diameter of the filter unit is preferably at least or up to 1.5× larger compared to the outer diameter of the receiving space. Alternatively, the outer diameter of the receiving space is preferably at least or up to 1.05× larger compared to the outer diameter of the filter unit or wherein the outer diameter of the receiving space is preferably at least or up to 1.1× larger compared to the outer diameter of the filter unit or wherein the outer diameter of the receiving space is preferably at least or up to 1.3× larger compared to the outer diameter of the filter unit or wherein the outer diameter of the receiving space is preferably at least or up to 1.5× larger compared to the outer diameter of the filter unit. Additionally or alternatively, the inner diameter of the receiving space is preferably at least or up to 1.05× larger compared to the inner diameter of the filter unit, or wherein the inner diameter of the receiving space is preferably at least or up to 1.1× larger, or wherein the inner diameter of the receiving space is preferably at least or up to 1.3× larger compared to the inner diameter of the filter unit, or wherein the inner diameter of the receiving space is preferably at least or up to 1.5× larger compared to the inner diameter of the filter unit. Alternatively, the inner diameter of the filter unit is preferably at least or up to 1.05× larger compared to the inner diameter of the receiving space or wherein the inner diameter of the filter unit is preferably at least or up to 1.1× larger compared to the inner diameter of the receiving space or wherein the inner diameter of the filter unit is preferably at least or up to 1.3× larger compared to the inner diameter of the receiving space or wherein the inner diameter of the filter unit is preferably at least or up to 1.5× larger compared to the inner diameter of the receiving space.

According to another preferred embodiment of the present invention, a growth guiding member is arranged or provided vertically above the receiving space for guiding vaporized starting material and/or introduced gas into a space between the seed holder unit and the inner bottom surface of the crucible unit. This embodiment is advantageous because the growth guide element preferably performs several functions. On the one hand, the growth guide element guides the vaporized starting material to the seed wafer 18 or to the growing crystal. On the other hand, the growth guiding element influences the shape of the growing crystal by limiting its radial extent.

According to another preferred embodiment of the present invention, the growth guide element comprises a first wall section or a first growth guide section and a second wall section or a second growth guide section. The first growth guide section is preferably shaped to match a corresponding wall section of the crucible housing. Matching in this context preferably means that the wall portion of the crucible housing and the growth guide member are preferably coupled by a form-fit and/or press-fit connection. The second portion of the growth guide is preferably shaped to manipulate the shape of a growing crystal. The first portion of the growth guide and the second portion of the growth guide are coaxially arranged according to another preferred embodiment of the present invention. The first section of the growth guide is arranged at a first diameter with respect to the central axis, and wherein the second section of the growth guide is arranged at a second diameter with respect to the central axis, the first diameter being larger compared to the second diameter. The first growth guide section and the second growth guide section are interconnected by a third wall section and a third growth guide section, respectively, the third growth guide section extending at least partially in a horizontal direction. The first growth guide section and the third growth guide section form an arcuate section and a fourth growth guide section, respectively, and/or wherein the second growth guide section and the third growth guide section are arranged at an angle between 60° and 120°, in particular at an angle between 70° and 110°, in particular at an angle of 90°. The fourth growth leader section may have, for example, a convex or concave or conical shape. The first wall section, the second section of the growth aid and the third section of the growth aid are preferably integral parts of the growth aid. Preferably, the growth aid is made of graphite. This embodiment is advantageous because the growth guide element has a simple but effective shape. Thus, the growth guide element can be manufactured in a cost-effective manner.

According to another preferred embodiment of the present invention, the outer diameter of the filter unit is at least or up to 1.05× larger than the first diameter of the growth guide element, or wherein the outer diameter of the filter unit is preferably at least or up to 1.1× larger than the first diameter of the growth guide element, or wherein the outer diameter of the filter unit is preferably at least or up to 1.3× larger than the first diameter of the growth guide or wherein the outer diameter of the filter unit is preferably at least or up to 1.3× larger than the first diameter of the growth guide or wherein the outer diameter of the filter unit is preferably at least or up to 1.5× larger compared to the first diameter of the growth guide and/or wherein the second diameter of the growth guide is preferably at least or up to 1.05× larger compared to the inner diameter of the filter unit or wherein the second diameter of the growth guide is preferably at least or up to 1.1× larger compared to the inner diameter of the filter unit or wherein the second diameter of the growth guide is preferably at least or up to 1.3× larger compared to the inner diameter of the filter unit or wherein the second diameter of the growth guide is preferably at least or up to 1.5× larger compared to the inner diameter of the filter unit.

wherein the upper vertical end of the growth guide of the second section of the growth guide and the seed holder unit form a gas flow channel, wherein the smallest distance between the upper vertical end of the growth guide of the second section of the growth guide and the seed holder unit is smaller than 0.3× second diameter of the growth guide or smaller than 0.1× second diameter of the growth guide or smaller than 0.08× second diameter of the growth guide or smaller than 0.05× second diameter of the growth guide or smaller than 0.03× second diameter of the growth guide or smaller than 0.01× second diameter of the growth guide.

According to a further preferred embodiment of the present invention, the coating is preferably applied to the receiving space, in particular the surface of the receiving space within the crucible volume and/or to the growth guide element or the growth guide plate or gas distribution plate. The coating preferably has a material or combination of materials that reduces the permeability of Si vapor through the wall portions bounding the receiving space and/or through the wall portions bounding the growth guide element to 10−3 m2/s, or preferably 10−11 m2/s, or more preferably 10−12 m2/s.

The coating preferably withstands temperatures above 2000 °C, in particular at least or up to 3000 °C or at least up to 3000 °C or up to 3500 °C or at least up to 3500 °C or up to 4000 °C or at least up to 4000 °C. This embodiment is advantageous because a modified containment and/or growth guide element has at least two layers of material, one layer forming the structure of the containment and/or growth guide element, and the other layer reducing or avoiding permeability of Si-vapor. Most preferably, the coating has one or more materials selected from a group of materials comprising at least carbon, in particular pyrocarbon and glassy carbon. Thus, the receiving space and/or the growth directing element is preferably coated with pyrocarbon and/or glassy carbon. The layer of pyrocarbon preferably has a thickness of more than or up to 10 μm, in particular of more than or up to 20 μm or of more than or up to 50 μm or of more than or up to 100 μm or of more than or up to 200 μm or of more than or up to 500 μm. The glassy carbon layer preferably has a thickness of more than or of up to 10 μm, in particular of more than or of up to 20 μm or of more than or of up to 50 μm or of more than or of up to 100 μm or of more than or of up to 200 μm or of more than or of up to 500 μm. According to a further preferred embodiment, the coating is produced by chemical vapor deposition or wherein the coating is produced by painting, in particular on a precursor material, in particular phenol formaldehyde, and pyrolysis after painting. This embodiment is advantageous because the coating can be generated in a reliable manner.

According to another preferred embodiment of the present invention, the heating unit comprises at least one heating element. The heating element is preferably arranged vertically below the receiving space and/or below a bottom part of the crucible unit, the bottom part of the crucible unit being surrounded by the receiving space. This design is advantageous because the receiving space and/or the bottom section surrounded by the receiving space can be heated by the heating element. The heating element preferably overlaps the receiving space and/or the bottom section surrounded by the receiving space at least partially and preferably to more than 50% or to more than 70% or up to 90% or completely. This design is advantageous because a homogeneous temperature distribution can be set, in particular homogeneous temperature levels can be generated.

According to a further preferred embodiment of the present invention, the furnace apparatus comprises a gas flow unit. The gas flow unit preferably has a gas inlet for conducting gas into the crucible unit or into the crucible volume and a gas outlet for withdrawing gas from the crucible unit or from the crucible volume. The gas inlet is preferably arranged closer to the bottom of the crucible unit than the gas outlet. Both the gas inlet and the gas outlet are preferably arranged within the crucible volume. This design is advantageous because the conditions within the crucible volume and/or the vapor composition and/or the liquid flow (direction and/or velocity) within the crucible can be influenced or controlled.

According to another preferred embodiment of the present invention, the gas outlet comprises a gas carrying means, in particular a tube. The gas outlet preferably has a sensor, in particular a temperature and/or pressure sensor, the sensor preferably being arranged inside the conducting means, in particular tube, or as part of the conducting means, in particular tube, or being attached to an outer wall of the conducting means, in particular tube. This embodiment is advantageous because the temperature and/or pressure conditions can be monitored.

Additionally or alternatively, the gas inlet according to a further preferred embodiment of the present invention comprises a gas conducting means, in particular a pipe. The gas inlet preferably has a sensor, in particular a temperature and/or pressure sensor, the sensor preferably being arranged inside the conduit means, in particular tube, or as part of the conduit means, in particular tube, or being attached to an outer wall of the conduit means, in particular tube. This embodiment is advantageous because the temperature and/or pressure conditions can be monitored.

According to a further preferred embodiment of the present invention, the sensor in the gas inlet and/or gas outlet is a pyrometer. This embodiment is advantageous because the pyrometer can withstand high temperatures. This embodiment is also advantageous because the pyrometer can be used multiple times, making it a very cost-effective solution.

According to another preferred embodiment of the present invention, the sensor in the gas inlet and/or gas outlet is in connection with a control unit. This embodiment is advantageous because the control unit receives sensor signals or sensor data. Thus, the control unit can output conditions within the crucible unit, in particular as a function of a time stamp, to an operator for monitoring the production or growth process. Additionally or alternatively, the control unit may be provided with control rules to control the oven apparatus depending on the control rules, the time and/or the sensor output.

According to another preferred embodiment of the present invention, the receiving space is formed by one or at least one continuous trench or a plurality of recesses. The trench or the recesses preferably at least partially and preferably substantially or preferably completely enclose a surface arranged or provided or materialized inside the crucible unit, in particular an inner surface of a wall and/or bottom section of the crucible unit, wherein the receiving space preferably has an annular shape. The heating element preferably covers at least 30% or at least 40% or at least 50% or at least 60% or at least 70% or at least 70% or at least 80% or at least 90% or at least 90% or at least 95% of a bottom surface of the receiving space and at least 20% or at least 30% or at least 40% or at least 50% or at least 60% or at least 70% or at least 70% or at least 80% or at least 90% or at least 95% of the surface at least partially surrounded by the receiving space. The area at least partially surrounded by the receiving space preferably belongs to a solid wall or a crucible bottom wall or a crucible bottom section, respectively, which extend at least over a distance V1 in vertical direction, wherein in the receiving space a distance V2 extends in vertical direction between a receiving space bottom surface and a top surface of the lowermost side wall part of the receiving space, wherein $V2>V1$ (i.e.: distance V2 is greater in the vertical direction). i.e.: distance V2 is greater compared to distance V1), in particular $V2>1.1\times V1$ or $V2>1.2\times V1$ or $V2>1.5\times V1$ or $V2>2\times V1$, or $V2=V1$ or $V2<V1$, in particular $V2<1.1\times V1$ or $V2<1.2\times V1$ or $V2<1.5\times V1$ or $V2<2\times V1$.

The receiving space thus preferably encloses a lower part of the housing and, in particular, has the surface surrounded by the receiving space. The bottom portion is preferably a solid material portion. The solid crucible bottom portion preferably has a height (in the vertical direction) greater than 0.3× the smallest distance between the receiving space and the center axis, or greater than 0.5× the smallest distance between the receiving space and the center axis, or 0.7× the smallest distance between the receiving space and the center axis or which is greater than 0.9× the smallest distance between the receiving space and the center axis or 1.1× the smallest distance between the receiving space and the center axis or which is greater than 1.5× the smallest distance between the receiving space and the center axis.

According to another preferred embodiment of the present invention, the bottom portion has an inner surface or the surface surrounded by the receiving space. The inner surface of the bottom part is arranged within the crucible volume and preferably parallel to the seed holder unit. The center of the inner surface and the center of the seed holder and/or the center of a seed wafer 18 held by the seed holder unit are preferably arranged on the same vertical axis. The inner surface of the lower part is preferably arranged at a predefined distance from the seed holder unit. The distance is preferably greater than 0.5× the smallest distance between the receiving space and the center axis, or greater than 0.7× the smallest distance between the receiving space and the center axis, or greater than 0.8× the smallest distance between the receiving space and the center axis, or greater than 1× the smallest distance between the receiving space and the center axis, or greater than 1.2× the smallest distance between the receiving space and the center axis or greater than 1.5× the smallest distance between the receiving space and the center axis or greater than 2× the smallest distance between the receiving space and the center axis or greater than 2.5× the smallest distance between the receiving space and the center axis. This embodiment shape is advantageous because the crucible volume has, at least in sections and preferably predominantly or completely, a rotationally symmetrical shape that supports a homogeneous distribution of the evaporated starting material on the seed wafer 18 or the growing crystal.

According to another preferred embodiment of the present invention, the area surrounded by the receiving space has at least a size of 0.5× the size of the top surface of the defined seed wafer 18 or has at least a size of 0.8× the size of the top surface of the defined seed wafer 18 or has at least a size of 0.9× the size of the top surface of the defined seed wafer 18 or has at least a size of 1× the size of the top surface of the defined seed wafer 18 or has at least a size of 1.1× the size of the top surface of the defined seed wafer 18. Additionally or alternatively, the center of the surface surrounded by the receiving space and the center of the top surface of the defined seed wafer 18 are preferably disposed on the same vertical axis. Additionally or alternatively, the surface surrounded by the receiving space and the upper surface of the defined seed wafer 18 are preferably arranged parallel to each other. This embodiment is advantageous because a heat distribution can be homogeneously performed over the surface surrounded by the receiving space.

According to another preferred embodiment of the present invention, a control unit is provided for controlling the pressure level within the crucible unit and/or the furnace and/or for controlling the gas flow into the crucible unit and/or for controlling the heating unit. Preferably, the heating unit is controlled to generate an isothermal temperature profile parallel to the support unit or orthogonal to the vertical direction or horizon-tally. This embodiment is advantageous because the control unit could use predefined rules and/or sensor data or sensor signals to monitor the growth process and change operating parameters of one or more of the aforementioned units to control crystal growth.

A filter unit is provided according to another preferred embodiment of the present invention. The filter unit preferably surrounds the seed holder unit and/or wherein the filter unit is preferably arranged at least partially above the seed holder unit, in particular at least 60% (vol.) of the filter unit is arranged above the seed holder unit. The filter unit comprises a filter body, wherein the filter body comprises a filter input surface for introducing gas containing Si-vapor into the filter body and an output surface for discharging filtered gas, wherein the filter input surface is preferably arranged in vertical direction at a level below the level of the output surface. At least one or exactly one filter element is arranged between the filter input surface and the output surface. It is possible that the filter element forms the filter input surface and/or the output surface. Preferably, the filter element forms a separation region for adsorption and condensation of Si-vapor. This design is advantageous because Si vapor can be trapped inside the filter element, thus reducing defects caused by Si vapor. The capture area preferably has at least or up to 50% (vol.) of the filter element volume or at least or up to 80% (vol.) of the filter element volume or at least or up to 90% (vol.) of the filter element volume. Thus, it is possible that 1%-50% (vol.) or 10%-50% (vol.) or 1%-30% (vol.) of the filter element volume is a vapor section or a section in which the vaporized starting material is in a vapor configuration.

In accordance with another preferred embodiment of the present invention, the filter element forms a gas flow path from the filter input surface to the output surface. The filter element preferably has a height S1 and the gas flow path through the filter element has a length S2, wherein S2 is at least 10 times longer than S1, in particular S2 is 100 times longer than S1 or S2 is 1000 times longer than S1. This design is advantageous because the filter element has sufficient capacity to absorb all the Si vapor generated during a flow or during the growth of a crystal, in particular a SiC crystal. Therefore, the filter element preferably forms a porous, large surface area for capturing Si sublimation vapor during PVT growth, in particular SiC single crystal/s. The filter element preferably has a material with a surface area of at least 100 m2/g or of at least 1000 m2/g.

According to another preferred embodiment of the present invention, the filter unit is arranged between a first part of the crucible unit housing and a second part of the crucible unit housing. At least 50% (vol.), in particular at least 80% (vol.) or 90% (vol.) of the first housing part of the crucible unit are arranged in vertical direction below the seed holder unit. A first crucible volume is provided between the first housing part of the crucible unit and the seed holder unit, wherein the first crucible volume can be operated such that at least 80% or preferably 90% or even more preferably 100% of the first crucible volume is above the condensation temperature Tc of silicon at the prevailing pressure. Additionally, up to 50% (vol.) or up to 20% (vol.) or up to 10% (vol.) of the first part of the crucible unit housing is vertically disposed above the seed holder unit. Alternatively, at least 50% (vol.), in particular at least 80% (vol.) or 90% (vol.), of the second housing part of the crucible unit is arranged in vertical direction above the seed holder unit. A second crucible volume is preferably provided between the second housing part of the crucible unit and the seed holder unit. At least 60%, or preferably 80%, or even more preferably 90% of the filter element is below the condensation temperature Tc. This embodiment is advantageous because the starting material vaporizes or is vaporized at Tc or above and condenses or condenses at Tc or below. Therefore, the fact that Si vapor condenses below a certain temperature can be used to trap condensed Si in the filter element. Therefore, the filter element is very effective.

According to another preferred embodiment of the present invention, the filter unit is arranged between a first wall part of the first housing part and a further wall part of the second housing part. The filter body preferably forms a filter outer surface. The filter outer surface preferably connects the first wall part of the first housing part and the further wall part of the second housing part. The filter outer surface preferably forms a part of the outer surface of the crucible unit. This embodiment is advantageous because the filter unit can be arranged to increase the volume of the crucible unit without the need for one or more additional crucible housing parts.

According to another preferred embodiment of the present invention, the filter outer surface comprises a filter outer surface cover element. The filter outer surface cover element is preferably a sealing element. The sealing element is preferably a coating. The coating is preferably created on the filter surface, or attached to the filter surface, or forms the filter surface. The coating preferably has a material or combination of materials that reduces leakage of sublimation vapors, in particular Si vapor, generated during a run, from the crucible volume through the crucible housing into the furnace volume, in particular by at least 50% (mass) or by at least 80% (mass) or by at least 90% (mass) or by more than 99% (mass) or by at least 99.9% (mass).

The coating preferably withstands temperatures above 2000 °C, in particular at least or up to 3000 °C or at least up to 3000 °C or up to 3500 °C or at least up to 3500 °C or up to 4000 °C or at least up to 4000 °C. The coating preferably comprises one or more materials selected from a group of materials comprising at least carbon, in particular pyrocarbon and vitreous carbon. This embodiment is advantageous because the filter unit can also form an outer barrier of the crucible unit. Thus, the filter unit preferably absorbs or traps Si and preferably also prevents Si vapor from escaping. The ash content of the filter element is preferably below 5% (mass) or below 1% (mass). This means that the less than 5% or less than 1% of the mass of the filter element is ash.

According to another preferred embodiment of the present invention, the filter body forms an inner filter surface. The filter inner surface is preferably coaxial with the filter outer surface. The filter body is preferably annular in shape. The filter outer surface preferably has a cylindrical shape and/or the filter inner surface preferably has a cylindrical shape. The filter outer surface and/or the filter inner surface has the longest extension in vertical direction or in circumferential direction. This embodiment is advantageous because the filter unit can be positioned in a simple manner due to its shape. Additionally or alternatively, the filter inner surface encloses a space above the seed holder unit. The space surrounded by the seed holder unit may serve as a cooling space for cooling the filter element and/or for cooling the seed holder unit. A cooling unit may be provided, wherein the cooling unit preferably comprises at least one cooling tube for guiding a cooling liquid. This cooling tube may be arranged to at least partially or at least mainly (more than 50% in circumferential direction) surround or completely surround the crucible unit. Additionally or alternatively, the cooling tube can be arranged within the crucible volume, in particular in the space surrounded by the filter inner surface. However, it is also possible that the cooling tube extends from the outside of the crucible unit through a wall of the crucible unit and/or a wall of the filter unit into the crucible volume, in particular into the space surrounded by the filter inner surface. It is additionally possible for the cooling tube to extend to the outside of the furnace. This embodiment is advantageous because the temperature inside the crucible unit can be advantageously controlled. In addition, it is possible to set a temperature distribution profile in the crucible volume with a much steeper gradient compared to a situation without a cooling unit.

According to a further preferred embodiment of the present invention, the filter inner surface has a further filter inner surface cover element. The further filter inner surface covering element is preferably a sealing element. The sealing element is preferably a coating, wherein the coating is preferably created on the filter surface or attached to the filter surface or forms the filter surface. The coating preferably has a material or combination of materials that resists leakage of sublimation vapors, in particular Si vapor, generated during a run, in particular at least 50% (mass) or at least 80% (mass) or at least 90% (mass) or more than 99% (mass) or at least 99.9% (mass), from the crucible volume through the crucible housing back into the furnace volume.

The coating preferably withstands temperatures above 2000 °C, in particular at least or up to 3000 °C or at least up to 3000 °C or up to 3500 °C or at least up to 3500 °C or up to 4000 °C or at least up to 4000 °C. The coating preferably has one or more materials selected from a group of materials containing at least carbon, in particular pyrocarbon and vitreous carbon. This solution is advantageous as it prevents the leakage of Si vapor into the space surrounded by the inner surface of the filter.

The filter element preferably comprises an activated carbon block and/or one or more, in particular different, graphite foams, including those made of carbonized bread and/or rigid graphite insulation and/or flexible graphite insulation.

According to another preferred embodiment of the present invention, the filter element comprises a filter element member. The filter element preferably comprises filter particles and a binder. The filter particles preferably comprise carbon or consist of carbon material. The binder preferably holds the filter particles in fixed relative positions to each other. The filter particles preferably withstand temperatures above 2000 °C, in particular at least or up to 3000 °C or at least up to 3000 °C or up to 3500 °C or at least up to 3500 °C or up to 4000 °C or at least up to 4000 °C. The filter particles preferably resist temperatures above 2000 °C, in particular at least or up to 3000 °C or at least up to 3000 °C or up to 3500 °C or at least up to 4000 °C. The filter particles preferably withstand temperatures above 1700 °C, in particular above 2000 °C, in particular up to or above 2000 °C, in particular at least or up to 3000 °C or at least up to 3000 °C or up to 3500 °C or at least up to 3500 °C or up to 4000 °C or at least up to 4000 °C. This solution is advantageous because the solid filter element has no toxic materials. In addition, the solid filter element can be manufactured at low cost. The filter unit, in particular the filter element, is preferably a disposable unit or element.

According to a further preferred embodiment of the present invention, the binder comprises starch or wherein the binder comprises starch.

According to a further preferred embodiment of the present invention, the furnace system comprises a gas flow unit. The gas flow unit preferably has a gas inlet for conducting gas into the crucible unit and a gas outlet for discharging gas from the crucible unit into the furnace or through the furnace to the outside of the furnace. The gas inlet is preferably arranged upstream of the filter unit in the gas flow direction, in particular upstream of the receiving space in the gas flow direction, and wherein the gas outlet is arranged downstream of the filter unit in the gas flow direction. Thus, a gas inlet is preferably arranged in a transformation zone within the crucible unit. The transformation zone preferably also comprises the seed holder unit and the receiving space. A starting material may be transformed from a solid configuration to a vapor configuration, and from the vapor configuration to a solid target body. The starting material may be disposed within the receiving space and wherein the solid target body may be held by the seed holder unit. The solid target body is a crystal, in particular a SiC crystal. The gas introduced via the gas inlet preferably mixes with and/or reacts with the starting material in the vapor configuration and/or during solidification. The gas outlet is preferably located in a capture zone, comprising also the exit surface of the filter unit, wherein the gas composition in the capture zone is preferably free of Si vapor or has no Si vapor. The temperature in the capture zone is preferably below the solidification temperature of gaseous Si or Si vapor. This embodiment is advantageous because the crystal growth process can be manipulated. For example, it is possible to add one or more gases to dope the crystal. Additionally or alternatively, it is possible to modify, in particular accelerate, the vapor transport from the receiving space to the seed wafer 18 or crystal. Additionally or alternatively, the gas can be provided in a defined temperature or temperature range.

An inert gas, in particular argon, or a gas mixture, in particular argon and nitrogen, can be or is introduced into the crucible unit or into the crucible volume or into the conversion zone via the gas inlet.

The size of the crucible housing is configurable or changeable according to another preferred embodiment of the present invention. The crucible housing surrounds a first vo-lumen VI in a crystal growth configuration and the crucible housing surrounds a second vo-lumen VII in a coating regeneration configuration. The crystal growth configuration represents a configuration or setting that is present during growth of a crystal or during solidification of evaporated starting material on a seed wafer 18 or at a growth front of a crystal growing on the seed wafer 18. The regeneration configuration represents a setting that is present in the event that a seed holder unit is removed and no crystal growth is possible because no seed wafer 18 is present. In the regeneration configuration, the filter unit is preferably not part of the crucible unit and a lid disposed on top of the filter unit in the crystal growth configuration is preferably in contact with a sidewall portion of the crucible housing that is in contact with the lower end of the filter unit during the crystal growth configuration. The volume VI is preferably larger compared to the volume VII, wherein the volume VI is at least 10% or at least or up to 20% or at least or up to 30% or at least or up to 40% or at least or up to 50% or at least or up to 60% or at least or up to 70% or at least or up to 80% or at least or up to 100% or at least or up to 100% or at least or up to 120% or at least or up to 150% or at least or up to 200% or at least or up to 250% larger than the volume VII. This embodiment is advantageous because the crucible unit can be reconditioned after use, in particular after one run or after several runs, in particular up to or at least three, up to or at least five or up to or at least ten runs. Thus, the overall service life of the crucible unit is very long. Since the heating unit can also be used multiple times, a very cost-effective furnace apparatus is thus provided.

The housing preferably has at least one further wall element in the crystal growth configuration compared to the layer regeneration configuration. The further wall element is preferably a filter unit or the filter unit. In the layer regeneration configuration, the filter unit is removed. A lower housing wall member of the housing, which is in contact with the filter unit in the crystal growth configuration, and an upper housing wall member of the housing, which is in contact with the filter unit in the crystal growth configuration, are in contact with each other in the coating regeneration configuration. At least one seal is preferably disposed between the lower housing wall member and the upper housing wall member in the coating regeneration configuration. In the crystal growth configuration, at least one seal is preferably arranged between the filter unit and the upper housing wall element, and wherein at least one seal is preferably arranged between the filter unit and the lower housing wall element. This embodiment is advantageous, since in any configuration the leakage of gas or steam is prevented.

According to another preferred embodiment of the present invention, the crucible unit comprises one or at least one receiving space gas guide element in the coating regeneration configuration. The receiving space gas guiding element extends into the receiving space to guide gas into the receiving space. This embodiment is advantageous because the gas introduced during the coating regeneration configuration better contacts the surface of the receiving space.

According to another preferred embodiment of the present invention, the gas inlet is arranged in a conversion zone within the crucible unit. The conversion zone preferably comprises the seed holder unit and/or the receiving space. This embodiment form is advantageous because the flow of the vaporized starting material and/or the composition of the liquid flowing upward from the receiving space to the seed wafer 18 and/or the growing crystal can be modified.

The receiving space gas guiding element preferably rests at least partially on the respective gas distributing element, wherein the gas distributing element preferably holds the receiving space gas guiding element, in particular by means of a form-fit connection. This embodiment is advantageous because the installation can be carried out quickly and easily.

The receiving space gas guide element preferably has an annular or circular shape. This embodiment is advantageous because the amount of vaporized starting material better matches the amount of vaporized material that solidifies on the seed wafer 18 of the crystal, compared to another shape, such as a rectangular receiving space shape. The receiving space gas guide member preferably has carbon or is made of carbon and/or graphite.

According to a further preferred embodiment of the present invention, the first section of the growth conductor and the third section of the growth conductor form, in particular on the underside, a fourth section of the growth conductor and/or wherein the second section of the growth conductor and the third section of the growth conductor are arranged at an angle between 60° and 120°, in particular at an angle between 70° and 110°, in particular at an angle of 90°.

A growth plate gas guide member is preferably provided to guide gas to a surface on top of the third section of the growth guide member. The growth plate gas guide member preferably has an annular or circular shape. The growth plate gas guide member is preferably disposed on the upper or top wall portion of the housing. The growth plate gas guide element preferably has carbon or is made of carbon and/or graphite.

Thus, a method and a reactor or furnace apparatus or apparatus for PVT growth of SiC single crystal/s preferably comprises the following: providing a furnace volume capable of accommodating a crucible unit and heaters, and insulating and/or providing a crucible unit with a lid inside the vacuum chamber and/or with a seed holder seed holder integrated into or attached to the lid and/or with a SiC single crystal seed attached to the seed holder and/or with an axial heater positioned below the crucible unit, so that radially flat temperature isotherms can be generated in the growing crystal and/or placing source material in the crucible unit so that there is no source material between the axial heat source and the seed and/or generating a vacuum in the crucible unit, heating and sublimating the source material resp. of the SiC solid material (originating from the method according to the invention) and growing the crystal, in particular the SiC single crystal).

The above mentioned object is also solved by a SiC production reactor, in particular for the production of PVT source material, wherein the PVT source material is preferably UPSiC. The SiC production reactor comprises at least a process chamber, a gas inlet unit for feeding one feed-medium or multiple feed-mediums into a reaction space of the process chamber, wherein the gas inlet unit is coupled with at least one feed-medium source, wherein a Si and C feed-medium source provides at least Si and C, in particular SiCl3(CH3) and wherein a carrier gas feed-medium source provides a carrier gas, in particular H2. Alternatively the gas inlet unit is coupled with at least two feed-medium sources, wherein a Si feed medium source provides at least Si, in particular the Si feed medium source provides a first feed medium, wherein the first feed medium is a Si feed medium, in particular a Si gas according to the general formula $SiH_{4-y}X_y$ (X=[Cl, F, Br, J] and y=[0 . . . 4], and wherein a C feed medium source provides at least C, in particular the C feed medium source provided a second feed medium, wherein the second feed medium is a C feed medium, in particular natural gas, Methane, Ethan, Propane, Butane and/or Acetylene, and wherein a carrier gas medium source is also coupled with the gas inlet unit and provides a third feed medium, wherein the third feed medium is a carrier gas, in particular H2. The SiC production reactor also comprises one or multiple SiC growth substrate, in particular more than 3 or 4 or 6 or 8 or 16 or 32 or 64 or up to 128 or up to 256, are arranged inside the process chamber for depositing SiC, wherein each SiC growth substrate comprises a first power connection and a second power connection, wherein the first power connections are first metal electrodes and wherein the second power connections are second metal electrodes, wherein the first metal electrodes and the second metal electrodes are preferably shielded from the reaction space, wherein each SiC growth substrate is coupled between at least one first metal electrode and at least one second metal electrode for heating the outer surface of the SiC growth substrates or the surface of the deposited SiC to temperatures between 1300 °C and 1800 °C, in particular by means of resistive heating and preferably by internal resistive heating. The SiC production reactor preferably also comprises a gas outlet unit for outputting vent gas and a vent gas recycling unit, wherein the vent gas recycling unit is connected to the gas outlet unit, wherein the vent gas recycling unit comprises at least a separator unit for separating the vent gas into a first fluid and into a second fluid, wherein the first fluid is a liquid and wherein the second fluid is a gas, wherein a first storage and/or conducting element for storing or conducting the first fluid is part of the separator unit or coupled with the separator unit and wherein a second storage and/or conducting element for storing or conducting the second fluid is part of the separator unit or coupled with the separator unit.

This solution is beneficial since the vent gases can be reused, thus the amount of recycled Si, C respectively at least one C-bearing molecule and H2 can be used again for the production of SiC material, in particular PVT source material. Thus, a much higher amount of SiC can be produced based on an initial amount of source gases compared to a SiC production reactor which does not recycle the vent gases.

The vent gas recycling unit preferably comprises a further separator unit for separating the first fluid into at least two parts, wherein the two parts are a mixture of chlorosilanes and a mixture of HCl, H2 and at least one C-bearing molecule. Alternatively the further separator unit separates the first fluid into at least three parts, wherein the three parts are a mixture of chlorosilanes and HCl and a mixture of H2 and at least one C-bearing molecule, wherein the first storage and/or conducting element connects the separator unit with the further separator unit. The further separator unit is preferably coupled with a mixture or chlorosilanes storage and/or conducting element and with a HCl storage and/or conducting element and with a H2 and C storage and/or conducting element. The mixture of chlorosilanes storage and/or conducting element preferably forms a section of a mixture of chlorosilanes mass flux path for conducting the mixture of chlorosilanes into the process chamber. A Si mass flux measurement unit for measuring an amount of Si of the mixture of chlorosilanes is preferably provided as part of the mass flux path prior to the process chamber, in particular prior to a mixing device, and preferably as further Si feed-medium source providing a further Si feed medium. The mixture of chlorosilanes storage and/or conducting element preferably forms a section of a mixture of chlorosilanes mass flux path for conducting the mixture of chlorosilanes into a further process chamber of a further SiC production reactor. The H2 an C storage and/or conducting element preferably forms a section of a H2 and C mass flux path for conducting the H2 and at least one C-bearing molecule into the process chamber. A C mass flux measurement unit for measuring an amount of C of the mixture of H2 and the at least one C-bearing molecule is preferably provided as part of the H2 and C mass flux path prior to the process chamber, in particular prior to a mixing device, and preferably as further C feed-medium source providing a further C feed medium. The H2 an C storage and/or conducting element preferably forms a section of a H2 and C mass flux path for conducting the H2 and the at least one C-bearing molecule into a further process chamber of a further SiC production reactor. The second storage and/or conducting element preferably forms a section of the H2 and C mass flux path for conducting the second fluid, which comprises H2 and the at least one C-bearing molecule, into the process chamber, wherein the second storage and/or conducting element and the H2 an C storage and/or conducting element are preferably fluidly coupled. The second storage and/or conducting element preferably forms a section of a further H2 and C mass flux path for conducting the second fluid, which comprises H2 and the at least one C-bearing molecule, into the process chamber. A further C mass flux measurement unit for measuring an amount of C of the second fluid is preferably provided as part of the further H2 and C mass flux path prior to the process chamber, in particular prior to a mixing device. The second storage and/or conducting element is alternatively coupled with a flare unit for burning the second fluid. The separator unit is preferably configured to operate at a pressure above 5 bar and a temperature below −30 °C. A first compressor for compressing the vent gas to a pressure above 5 bar is preferably provided as part of the separator unit or in a gas flow path between the gas outlet unit and the separator unit. The further separator unit is preferably configured to operate at a pressure above 5 bar and a temperature below −30 °C and/or a temperature above 100 °C. A further compressor for compressing the first fluid to a pressure above 5 bar is preferably provided as part of the further separator unit or in a gas flow path between the separator unit and the further separator unit. The further separator unit preferably comprises a cryogenic distillation unit, wherein the cryogenic distillation unit is preferably configured to be operated at temperatures between −180 C° and −40 C°. A control unit for controlling fluid flow of a feed-medium or multiple feed-mediums is preferably part of the SiC production reactor, wherein the multiple feed-mediums comprise the first medium, the second medium, the third medium and the further Si feed medium and/or the further C feed medium via the gas inlet unit into the process chamber is provided. The further Si feed medium preferably consists of at least 95% [mass] or at least 98% [mass] or at least 99% [mass] or at least 99.9% [mass] or at least 99.99% [mass] or at least 99.999% [mass] and highly preferably of at least 99.99999% [mass] of a mixture of chlorosilanes. The further C feed medium preferably comprises the at least one C-bearing molecule, HCl, H2 and a mixture of chlorosilanes, wherein the further C feed medium comprises at least 3% [mass] or preferably at least 5% [mass] or highly preferably at least 10% [mass] of C respectively of the at least one C-bearing molecule and wherein the further C feed medium comprises up to 10% [mass] or preferably between 0.001% [mass] and 10%[mass], highly preferably between 1% [mass] and 5%[mass], of HCl, and wherein the further C feed medium comprises more than 5% [mass] or preferably more than 10% [mass] or highly preferably more than 25% [mass] of H2 and wherein the further C feed medium comprises more than 0.01% [mass] and preferably more than 1% [mass] and highly preferably between 0.001% [mass] and 10%[mass] of the mixture of chlorosilanes.

A heating unit is preferably arranged in fluid flow direction between the further separator unit and the gas inlet unit for heating the mixture of chlorosilanes to transform the mixture of chlorosilanes from a liquid form into a gaseous form.

The process chamber is at least surrounded by a base plate, a side wall section and a top wall section, The base plate preferably comprises at least one cooling element, in particular a base cooling element, for preventing heating the base plate above a defined temperature and/or the side wall section preferably comprises at least one cooling element, in particular a bell jar cooling element, for preventing heating the side wall section above a defined temperature and/or the top wall section preferably comprises at least one cooling element, in particular a bell jar cooling element, for preventing heating the top wall section above a defined temperature. The cooling element is preferably an active cooling element. The base plate and/or side wall section and/or top wall section preferably comprises a cooling fluid guide unit for guiding a cooling fluid, wherein the cooling fluid guide unit is configured limit heating of the base plate and/or side wall section and/or top wall section to a temperature below 1000 °C. A base plate and/or side wall section and/or top wall section sensor unit is preferably provided to detect temperature of the base plate and/or side wall section and/or top wall section and to output a temperature signal or temperature data and/or a cooling fluid temperature sensor is provided to detect the temperature of the cooling fluid, and a fluid forwarding unit is preferably provided for forwarding the cooling fluid through the fluid guide unit, wherein the fluid forwarding unit is preferably configured to be operated in dependency of the temperature signal or temperature data provided by the base plate and/or side wall section and/or top wall section sensor unit and/or cooling fluid temperature sensor. The cooling fluid is preferably oil or water, wherein the water preferably comprises at least one additive, in particular corrosion inhibiter/s and/or antifouling agent/s (biocides). The cooling element can be additionally or alternatively a passive cooling element. The cooling element is preferably at least partially formed by a polished steel surface of the base plate, the side wall section and/or the top wall section. The cooling element is preferably a coating, wherein the coating is formed above the polished steel surface and wherein the coating is configured to reflect heat. The coating is preferably a metal coating or a comprises metal, in particular silver or gold or chrome, or alloy coating, in particular a CuNi alloy. The emissivity of the polished steel surface and/or of the coating is preferably below ϵe 0.3, in particular below 0.1 or below 0.03. The base plate preferably comprises at least one active cooling element and one passive cooling element for preventing heating the base plate above a defined temperature and/or the side wall section preferably comprises at least one active cooling element and one passive cooling element for preventing heating the side wall section above a defined temperature and/or the top wall section preferably comprises at least one active cooling element and one passive cooling element for preventing heating the top wall section above a defined temperature. The side wall section and the top wall section are preferably formed by a bell jar, wherein the bell jar is preferably movable with respect to the base plate. More than 50% [mass] of the side wall section and/or more than 50% [mass] of the top wall section and/or more than 50% [mass] of the base plate is preferably made of metal, in particular steel.

The SiC growth substrate preferably has an average perimeter of at least 5 cm and preferably of at least 7 cm and highly preferably of at least 10 cm around a cross-sectional area orthogonal to the length direction of the SiC growth substrate or multiple SiC growth substrates have an average perimeter per SiC growth substrate of at least 5 cm and preferably of at least 7 cm and highly preferably of at least 10 cm around a cross-sectional area orthogonal to the length direction of the respective SiC growth substrate. This solution is beneficial since the volumetric deposition rate is significantly higher compared to small SiC growth substrates, thus it is possible to deposit the same amount of SiC material within a shorter time. This helps to reduce run time and therefore increases efficiency of the SiC production reactor. The SiC growth substrate comprises or consists preferably of SiC or C, in particular graphite, or wherein multiple SiC growth substrates comprise or consist of SiC or C, in particular graphite. the shape of the cross-sectional area orthogonal to the length direction of the SiC growth substrate differs at least is sections and preferably along more than 50% of the length of the SiC growth substrate and highly preferably along more than 90% of the length of the SiC growth substrate from a circular shape. A ratio U/A between the cross-sectional area A and the perimeter U around the cross-sectional area is preferably higher than 1.2 1/cm and preferably higher than 1.5 1/cm and highly preferably higher than 2 1/cm and most preferably higher than 2.5 1/cm. The SiC growth substrate is preferably formed by at least one carbon ribbon, in particular graphite ribbon, wherein the at least one carbon ribbon comprises a first ribbon end and a second ribbon end, wherein the first ribbon end is coupled with the first metal electrode and wherein the second ribbon end is coupled with the second metal electrode. Alternatively, each of multiple the SiC growth substrates is formed by at least one carbon ribbon, in particular graphite ribbon, wherein the at least one carbon ribbon per SiC growth substrate comprises a first ribbon end and a second ribbon end, wherein the first ribbon end is coupled with the first metal electrode of the respective SiC growth substrate and wherein the second ribbon end is coupled with the second metal electrode of the respective SiC growth substrate. The carbon ribbon, in particular graphite ribbon, preferably comprises a curing agent. The SiC growth substrate is preferably formed by multiple rods, wherein each rod has a first rod end and a second rod end, wherein all first rod ends are coupled with the same first metal electrode and wherein all second rod ends are coupled with the same second metal electrode. Alternatively, each of multiple SiC growth substrates is formed by multiple rods, wherein each rod has a first rod end and a second rod end, wherein all first rod ends are coupled with the same first metal electrode of the respective SiC growth substrate and wherein all second rod ends are coupled with the same second metal electrode of the respective SiC growth substrate. The rods of the SiC growth substrate are preferably contacting each other or are arranged in a distance to each other. The SiC growth substrate preferably comprises three or more than three rods. Alternatively, each of multiple SiC growth substrates comprises three or more than three rods. The SiC growth substrate is preferably formed by at least one metal rod, wherein the metal rod has a first metal rod end and a second metal rod end, wherein the first metal rod end is coupled with the first metal electrode and wherein the second metal rod end is coupled with the second metal electrode. Alternatively, each of multiple SiC growth substrates is formed by at least one metal rod, wherein each metal rod has a first metal rod end and a second metal rod end, wherein the first metal rod end is coupled with the first metal electrode of the respective SiC growth substrate and wherein the second metal rod end is coupled with the second metal electrode of the respective SiC growth substrate. The metal rod preferably comprises a coating, wherein the coating preferably comprises SiC and/or wherein the coating preferably has a thickness of more than 2 μm or preferably of more than 100 μm or highly preferably of more than 500 μm or between 2 μm and 5 mm, in particular between 100 μm and 1 mm, or of less than 500 μm.

The above mentioned object is also solved by a SiC production facility. Said SiC production facility comprises at least multiple SiC production reactors, in particular SiC production reactors according to the present invention, wherein each SiC production reactor at least comprises a process chamber, a gas inlet unit for feeding a feed-medium or multiple feed-mediums into the process chamber, a SiC growth substrate arranged inside the process chamber, a first power connection and a second power connection, wherein the SiC growth substrate is coupled between the first power connection and the second power connection for heating the SiC growth substrate due to resistant heating and preferably by internal resistive heating, a gas outlet unit for outputting vent gas.

The SiC production facility preferably also comprises a vent gas recycling unit, wherein the vent gas recycling unit is fluidly connected to the gas outlets of the SiC production reactors, wherein the vent gas recycling unit comprises a separator unit for separating the vent gas into a first liquid fluid and into a second gaseous fluid.

The above mentioned object is also solved by a PVT source material production method for the production of PVT source material consisting of SiC, in particular of polytype 3C, in particular with a SiC production reactor according to the present invention. The PVT source material production method comprises at least the steps: Providing a source medium inside a process chamber, wherein a gas outlet unit for outputting vent gas out of the process chamber and a vent gas recycling unit are provided, wherein the vent gas recycling unit is connected to the gas outlet unit, wherein the vent gas recycling unit comprises at least a separator unit for separating the vent gas into a first fluid and into a second fluid, wherein the vent gas recycling unit comprises a further separator unit for separating the first fluid into at least two parts, wherein the two parts are a mixture of chlorosilanes and a mixture of HCl, H2 and at least one C-bearing molecule, or alternatively into at least three parts, wherein the three parts are a mixture of chlorosilanes and HCl and a mixture of H2 and at least one C-bearing molecule, wherein the first storage and/or conducting element connects the separator unit with the further separator unit, wherein the further separator unit is coupled with a mixture or chlorosilanes storage and/or conducting element and preferably with a HCl storage and/or conducting element and preferably with a H2 and C storage and/or conducting element, wherein the mixture of chlorosilanes storage and/or conducting element forms a section of a mixture of chlorosilanes mass flux path for conducting the mixture of chlorosilanes into the process chamber, Feeding the mixture of chlorosilanes via the mixture of chlorosilanes mass flux path into the process chamber for providing at least one part of the source medium, Electrically energizing at least one SiC growth substrate and preferably a plurality of SiC growth substrates, disposed in the process chamber to heat the SiC growth substrate/s to a temperature in the range between 1300 °C and 2000 °C, wherein each SiC growth substrate comprises a first power connection and a second power connection, wherein the first power connections are first metal electrodes and wherein the second power connections are second metal electrodes, wherein the first metal electrodes and the second metal electrodes are preferably shielded from the reaction space, and setting a deposition rate, in particular of more than 200 μm/h, for removing Si and C from the source medium and for depositing the removed Si and C as SiC, in particular polycrystalline SiC, on the SiC growth substrate/s.

Measuring a Si mass flux of the mixture of chlorosilanes is a further preferred step, wherein the Si mass flux measurement is carried out by a Si mass flux measuring unit, wherein the Si mass flux measuring unit is provided as part of the mixture of chlorosilanes mass flux path prior to the process chamber, in particular prior to a mixing device. Controlling feeding of the mixture of chlorosilanes to a mixing device in dependency of an output of the Si mass flux measuring unit is another preferred step of the method. Conducting the second fluid, which comprises H2 and C, into the process chamber is another preferred step, wherein the second fluid is conducted via a second storage and/or conducting element which forms a section of the H2 and C mass flux path into the process chamber. Measuring a C mass flux is another preferred step, wherein the C mass flux measurement is carried out by a C mass flux measuring unit, wherein the C mass flux measuring unit is provided as part of the H2 and C mass flux path prior to the process chamber, in particular prior to a mixing device. Controlling feeding the second fluid in dependency of an output of the C mass flux measuring unit is another preferred step. Measuring a Si mass flux of the mixture of chlorosilanes is another preferred step, wherein the Si mass flux measurement is carried out by a Si mass flux measuring unit, wherein the Si mass flux measuring unit is provided as part of the mixture of chlorosilanes mass flux path prior to the process chamber, in particular prior to a mixing device. Conducting the second fluid, which comprises H2 and C, into the process chamber is another preferred step, wherein the second fluid is conducted via a second storage and/or conducting element which forms a section of the H2 and C mass flux path into the process chamber. Measuring a C mass flux is another preferred step, wherein the C mass flux measurement is carried out by a C mass flux measuring unit, wherein the C mass flux measuring unit is provided as part of the H2 and C mass flux path prior to the process chamber, in particular prior to a mixing device. Controlling feeding of the mixture of chlorosilanes to a mixing device in dependency of an output of the Si mass flux measuring unit is another preferred step and controlling feeding the second fluid in dependency of an output of the C mass flux measuring unit is another preferred step. The process chamber is preferably at least surrounded by a base plate, a side wall section and a top wall section. More than 50% [mass] of the side wall section and more than 50% [mass] of the top wall section and more than 50% [mass] of the base plate is preferably made of metal, in particular steel. The base plate preferably comprises at least one cooling element for preventing heating the base plate above a defined temperature and/or the side wall section comprises at least one cooling element for preventing heating the side wall section above a defined temperature and/or the top wall section comprises at least one cooling element for preventing heating the top wall section above a defined temperature. A base plate and/or side wall section and/or top wall section sensor unit is preferably provided to detect temperature of the base plate and/or side wall section and/or top wall section and to output a temperature signal or temperature data and/or a cooling fluid temperature sensor is provided to detect the temperature of the cooling fluid, and a fluid forwarding unit is preferably provided for forwarding the cooling fluid through the fluid guide unit. The fluid forwarding unit is preferably configured to be operated in dependency of the temperature signal or temperature data provided by the base plate and/or side wall section and/or top wall section sensor unit and/or cooling fluid temperature sensor. The step of providing a source medium inside a process chamber preferably also comprises introducing at least a first feed-medium, in particular a first source gas, into the process chamber, said first feed medium comprises Si, wherein the first-feed medium has a purity which excludes at least 99.9999% (ppm wt) of the substances B, Al, P, Ti, V, Fe, Ni, and introducing at least a second feed-medium, in particular a second source gas, into the process chamber, the second feed medium comprises C, in particular natural gas, Methane, Ethan, Propane, Butane and/or Acetylene, wherein the second-feed medium has a purity which excludes at least 99.9999% (ppm wt) of the substances B, Al, P, Ti, V, Fe, Ni, and introducing a carrier gas, wherein the carrier gas has a purity which excludes at least 99.9999% (ppm wt) of the substances B, Al, P, Ti, V, Fe, Ni. The step of providing a source medium inside a process chamber alternative comprises the steps: introducing one feed-medium in particular a source gas, into the process chamber, said feed medium comprises Si and C, in particular $SiCl3(CH3)$, wherein the feed medium has a purity which excludes at least 99.9999% (ppm wt) of the substances B, Al, P, Ti, V, Fe, Ni, and introducing a carrier gas, wherein the carrier gas has a purity which excludes at least 99.9999% (ppm wt) of the substances B, Al, P, Ti, V, Fe, Ni.

Setting a pressure inside the process chamber above 1 bar by introducing a defined amount of a mixture of the first source gas, which provides Si, and the second source gas, which provides C, into the process chamber is another preferred step, wherein the defined amount is an amount between 0.32 g of the mixture per hour and per cm2 of a SiC growth surface and 10 g of the mixture per hour and per cm2 of the SiC growth surface. Setting a pressure inside the process chamber above 1 bar by introducing a defined amount of a Si and C containing source gas into the process chamber is an alternative step, wherein the defined amount is an amount between 0.32 g of the Si and C containing source gas or gases per hour and per $cm^2$ of the SiC growth surface and 10 g of the Si and C containing source gas or gases per hour and per $cm^2$ of the SiC growth surface (g/(h $cm^2$)).

The SiC growth substrate preferably has an average perimeter of at least 5 cm around a cross-sectional area orthogonal to the length direction of the SiC growth substrate or multiple SiC growth substrates have an average perimeter per SiC growth substrate of at least 5 cm around a cross-sectional area orthogonal to the length direction of the respective SiC growth substrate.

The SiC depositing on the SiC growth substrate preferably has impurities of less than 10 ppm (weight) of the substance N and of less than 1000 ppb (weight), in particular of less than 500 ppb (weight), of one or preferably multiple or highly preferably a majority or most preferably all of the substances B, Al, P, Ti, V, Fe, Ni and highly preferably of less than 2 ppm (weight) of the substance N and of less than 100 ppb (weight) of each of the substances B, Al, P, Ti, V, Fe, Ni or highly preferably of less than 10 ppb (weight) of the substance Ti. Alternatively, the SiC depositing on the SiC growth substrate has impurities of less than 10 ppm (weight) of the substance N and of less than 1000 ppb (weight), in particular of less than 500 ppb (weight), of the sum of all of the metals Ti, V, Fe, Ni.

The method preferably also comprises the step of disaggregating the SiC solid into SiC particles, wherein the SiC particles are disaggregated into an average length of more than 100 μm.

The above mentioned object is also solved by a PVT source material, wherein the PVT source material forms a SiC solid, wherein the SiC solid is characterized by a mass of more than 1 kg, a thickness of at least 1 cm, a length of more than 50 cm and wherein the SiC solid has impurities of less than 10 ppm (weight) of the substance N and of less than 1000 ppb (weight), in particular of less than 500 ppb (weight), of each of the substances B, Al, P, Ti, V, Fe, Ni.

This solution is beneficial since massive SiC source material solids have significant advantages as PVT source material.

The SiC solid preferably has impurities of less than 2 ppm (weight) of the substance N and of less than 100 ppb (weight) of each of the substances B, Al, P, Ti, V, Fe, Ni and highly preferably of less than 10 ppb (weight) of the substance Ti. Additionally or alternatively the SiC solid has impurities of less than 10 ppm (weight) of the substance N and of less than 1000 ppb (weight), in particular of less than 500 ppb (weight), of the sum of all of the metals Ti, V, Fe, Ni.

The SiC solid preferably forms a boundary surface in a defined distance to a central axis of the SiC solid, and wherein the SiC solid forms an outer surface, wherein the outer surface and the boundary surface are formed in a distance to each other, wherein the distance extends orthogonal to the central axis, wherein an average distance between the outer surface and boundary surface is larger compared to an average distance between the boundary surface and the central axis. The average distance between the outer surface and boundary surface is calculated in the following manner: (shortest distance (in radial direction) plus longest distance (in radial direction))/2. The average distance between the outer surface and boundary surface is preferably at least two times larger compared to the average distance between the boundary surface and the central axis. The average distance between the outer surface and boundary surface is preferably at least five times larger compared to the average distance between the boundary surface and the central axis. The boundary surface preferably has an average perimeter of at least 5 cm and preferably of at least 7 cm and highly preferably of at least 10 cm around a cross-sectional area orthogonal to the central axis.

The SiC solid preferably comprises less than 30% (mass) of excess C or preferably less than 20% (mass) of excess C or highly preferably less than 10% (mass) of excess C or most preferably less than 5% (mass) of excess C compared to an ideal stoichiometric ratio between Si and C and/or the SiC solid preferably comprises less than 30% (mass) of excess Si or preferably less than 20% (mass) of excess Si or highly preferably less than 10% (mass) of excess Si or most preferably less than 5% (mass) of excess Si compared to an ideal stoichiometric ratio between Si and C.

The PVT source material is preferably SiC of polytype 3C and/or polycrystalline SiC.

The shape of the cross-sectional area orthogonal to the central axis preferably differs at least is sections and preferably along more than 50% of the extension of the SiC solid in the direction of the central axis and highly preferably along more than 90% of the extension of the SiC solid in the direction of the central axis and most preferably along 100% of the extension of the SiC solid in the direction of the central axis from a circular shape.

A ratio U/A between the cross-sectional area A and the perimeter U around the cross-sectional area is preferably higher than 1.2 1/cm and preferably higher than 1.5 1/cm and highly preferably higher than 2 1/cm and most preferably higher than 2.5 1/cm. The boundary surface preferably surrounds a solid core member. The core member preferably comprises graphite or consists of graphite. The core member alternatively consists of SiC or comprises SiC. The SiC of the core member and the SiC between the outer surface and the boundary surface preferably differ with respect to at least with respect to the amount of excess C per volume or excess Si per volume. The interface between the SiC core member and the boundary surface preferably forms a region having different optical properties compared to a central section of the core member and/or a central section of the SiC solid.

Since the PVT source material is produced in a CDV reactor it is alternatively possible to name it “SiC material produced in a CDV reactor” or just “SiC material”

The above mentioned, object is also solved by a PVT source material production method for the production of PVT source material according to the invention. The PVT source material production method comprises at least the steps of: Providing a source medium inside a process chamber, wherein providing a source medium inside the process chamber comprises the steps: Introducing at least a first feed-medium, in particular a first source gas, into the process chamber, said first feed medium comprises Si, in particular according to the general formula $SiH_{4-y}$, $X_y$ (X=[Cl, F, Br, J] and y=[0 . . . 4], wherein the first-feed medium has a purity which excludes at least 99.9999% (ppm wt) of the substances B, Al, P, Ti, V, Fe, Ni and introducing at least a second feed-medium, in particular a second source gas, into the process chamber, the second feed medium comprises C, in particular natural gas, Methane, Ethan, Propane, Butane and/or Acetylene, wherein the second-feed medium has a purity which excludes at least 99.9999% (ppm wt) of the substances B, Al, P, Ti, V, Fe, Ni, and introducing a carrier gas, wherein the carrier gas has a purity which excludes at least 99.9999% (ppm wt) of the substances B, Al, P, Ti, V, Fe, Ni, or introducing one feed-medium in particular a source gas, into the process chamber, said feed medium comprises Si and C, in particular SiCl3(CH3), wherein the feed medium has a purity which excludes at least 99.9999% (ppm wt) of the substances B, Al, P, Ti, V, Fe, Ni, and introducing a carrier gas, wherein the carrier gas has a purity which excludes at least 99.9999% (ppm wt) of the substances B, Al, P, Ti, V, Fe, Ni, electrically energizing at least one SiC growth substrate and preferably a plurality if SiC growth substrates, disposed in the process chamber to heat the SiC growth substrate/s to a temperature in the range between 1300 °C and 2000 °C, wherein each SiC growth substrate comprises a first power connection and a second power connection, wherein the first power connections are first metal electrodes and wherein the second power connections are second metal electrodes, wherein the first metal electrodes and the second metal electrodes are preferably shielded from a reaction space inside the process chamber, and setting a deposition rate, in particular of more than 200 μm/h, for removing Si and C from the source medium and for depositing the removed Si and C as SiC, in particular polycrystalline SiC, on the SiC growth substrate/s and thereby forming a SiC solid.

Setting a pressure inside the process chamber above 1 bar is a further preferred step of the method. Introducing a defined amount of a mixture of the first source gas, which provides Si, and the second source gas, which provides C, into the process chamber is another preferred step of the method, wherein the defined amount is an amount between 0.32 g of the mixture per hour and per cm2 of a SiC growth surface and 10 g of the mixture per hour and per cm2 of the SiC growth surface. introducing a defined amount of a Si and C containing source gas into the process chamber is another preferred step of the method, wherein the defined amount is an amount between 0.32 g of the Si and C containing source gas per hour and per cm2 of the SiC growth surface and 10 g of the Si and C containing source gas per hour and per cm2 of the SiC growth surface. Setting a pressure inside the process chamber above 1 bar by introducing a defined amount of a mixture of the first source gas, which provides Si, and the second source gas, which provides C, into the process chamber is another preferred step of the method, wherein the defined amount is an amount between 0.32 g of the mixture per hour and per cm2 of a SiC growth surface and 10 g of the mixture per hour and per cm2 of the SiC growth surface. Setting a pressure inside the process chamber above 1 bar by introducing a defined amount of a Si and C containing source gas into the process chamber is another preferred step of the method, wherein the defined amount is an amount between 0.32 g of the Si and C containing source gas per hour and per cm2 of the SiC growth surface and 10 g of the Si and C containing source gas per hour and per cm2 of the SiC growth surface. Increasing the electrical energizing of the at least one SiC growth substrate over time, in particular to heat a surface of the deposited SiC to a temperature between 1300 °C and 1800 °C, is another preferred step of the method. The deposition rate is preferably set to more than 200 μm/h and highly preferably to more than 500 μm/h and most preferably to more than 800 μm/h.

Depositing Si and C at the set deposition rate for more than 5 hours, in particular for more or up to 8 hours or for more or up to 12 hours or for more or up to 18 hours or preferably for more or up to 24 hours or highly preferably for more or up to 48 hours or most preferably for more or up to 72 hours, is another preferred step of the method.

Growing the SiC solid during depositing of C and Si to a mass of more than in particular of more or up to 25 kg or preferably of more or up to 50 kg or highly preferably of more or up to 200 kg and most preferably of more or up to 500 kg, is another preferred step of the method and/or growing the SiC solid during depositing of C and Si to a thickness of at least 5 cm, in particular of more or up to 7 cm or preferably of more or up to or preferably of more or up to 15 cm or highly preferably of more or up to 20 cm or most preferably of more or up to 50 cm, is another preferred step of the method.

A control unit for setting up a feed medium supply of the one feed-medium or the multiple feed-mediums into the process chamber is preferably provided, wherein the control unit is configured to set up the feed medium supply between a minimum amount of feed medium supply [mass] per min. and a maximum amount of feed medium supply [mass] per min., wherein the minimum amount of feed medium supply [mass] per min. preferably corresponds to a deposited minimum amount of Si [mass] and a minimum amount of C [mass] at the defined growth rate.

The maximum amount of feed medium supply per min is preferably up to 30% [mass] or to 20% [mass] or up to 10% [mass] or up to 5% [mass] or up to 3% [mass] higher compared to the minimum amount of feed medium supply.

The process chamber is at least surrounded by a base plate, a side wall section and a top wall section, The base plate preferably comprises at least one cooling element, in particular a base cooling element, for preventing heating the base plate above a defined temperature and/or the side wall section preferably comprises at least one cooling element, in particular a bell jar cooling element, for preventing heating the side wall section above a defined temperature and/or the top wall section preferably comprises at least one cooling element, in particular a bell jar cooling element, for preventing heating the top wall section above a defined temperature. The cooling element is preferably an active cooling element. The base plate and/or side wall section and/or top wall section preferably comprises a cooling fluid guide unit for guiding a cooling fluid, wherein the cooling fluid guide unit is configured limit heating of the base plate and/or side wall section and/or top wall section to a temperature below 1000 °C. A base plate and/or side wall section and/or top wall section sensor unit is preferably provided to detect temperature of the base plate and/or side wall section and/or top wall section and to output a temperature signal or temperature data and/or a cooling fluid temperature sensor is provided to detect the temperature of the cooling fluid, and a fluid forwarding unit is preferably provided for forwarding the cooling fluid through the fluid guide unit, wherein the fluid forwarding unit is preferably configured to be operated in dependency of the temperature signal or temperature data provided by the base plate and/or side wall section and/or top wall section sensor unit and/or cooling fluid temperature sensor. The cooling fluid is preferably oil or water, wherein the water preferably comprises at least one additive, in particular corrosion inhibiter/s and/or antifouling agent/s (biocides). The cooling element can be additionally or alternatively a passive cooling element. The cooling element is preferably at least partially formed by a polished steel surface of the base plate, the side wall section and/or the top wall section. The cooling element is preferably a coating, wherein the coating is formed above the polished steel surface and wherein the coating is configured to reflect heat. The coating is preferably a metal coating or a comprises metal, in particular silver or gold or chrome, or alloy coating, in particular a CuNi alloy. The emissivity of the polished steel surface and/or of the coating is preferably below ϵe 0.3, in particular below 0.1 or below 0.03. The base plate preferably comprises at least one active cooling element and one passive cooling element for preventing heating the base plate above a defined temperature and/or the side wall section preferably comprises at least one active cooling element and one passive cooling element for preventing heating the side wall section above a defined temperature and/or the top wall section preferably comprises at least one active cooling element and one passive cooling element for preventing heating the top wall section above a defined temperature. The side wall section and the top wall section are preferably formed by a bell jar, wherein the bell jar is preferably movable with respect to the base plate. More than 50% [mass] of the side wall section and/or more than 50% [mass] of the top wall section and/or more than 50% [mass] of the base plate is preferably made of metal, in particular steel.

A gas outlet unit for outputting vent gas and a vent gas recycling unit are preferably provided and preferably operated according to the method. The vent gas recycling unit is connected to the gas outlet unit, wherein the vent gas recycling unit comprises at least a separator unit for separating the vent gas into a first fluid and into a second fluid, wherein the first fluid is a liquid and wherein the second fluid is a gas, wherein a first storage and/or conducting element for storing or conducting the first fluid is part of the separator unit or coupled with the separator unit and wherein a second storage and/or conducting element for storing or conducting the second fluid is part of the separator unit or coupled with the separator unit. The step of providing a source medium inside a process chamber, preferably comprises feeding the first fluid from the vent gas recycling unit into the process chamber, wherein the first fluid comprises at least a mixture of chlorosilanes. The vent gas recycling unit preferably comprises a further separator unit for separating the first fluid into at least two parts, wherein the two parts are a mixture of chlorosilanes and a mixture of HCl, H2 and at least one C-bearing molecule and preferably into at least three parts, wherein the three parts are a mixture of chlorosilanes and HCl and a mixture of H2 and at least one C-bearing molecule, wherein the first storage and/or conducting element connects the separator unit with the further separator unit, wherein the further separator unit is coupled with a mixture or chlorosilanes storage and/or conducting element and with a HCl storage and/or conducting element and with a H2 and C storage and/or conducting element, wherein the mixture of chlorosilanes storage and/or conducting element forms a section of a mixture of chlorosilanes mass flux path for conducting the mixture of chlorosilanes into the process chamber, wherein a Si mass flux measurement unit for measuring an amount of Si of the mixture of chlorosilanes is provided as part of the mass flux path prior to the process chamber, in particular prior to a mixing device, and preferably as further Si feed-medium source providing a further Si feed medium.

The SiC growth substrate preferably has an average perimeter of at least 5 cm around a cross-sectional area orthogonal to the length direction of the SiC growth substrate or multiple SiC growth substrates have an average perimeter per SiC growth substrate of at least 5 cm around a cross-sectional area orthogonal to the length direction of the respective SiC growth substrate.

Since the PVT source material is produced in a CDV reactor it is alternatively possible to name the PVT source material production method "SiC material production method carried out in a CVD reactor" or just "SiC material production method".

The above mentioned object is also solved by a PVT source material, wherein the PVT source material consists of SiC particles, wherein the average length of the SiC particles is more than 100 μm, wherein the SiC particles have impurities of less than 10 ppm (weight) of the substance N and of less than 1000 ppb (weight), in particular of less than 500 ppb (weight), of each of the substances B, Al, P, Ti, V, Fe, Ni.

This solution is beneficial since very pure particle of a size (length) larger than 100 μm have very beneficial properties, in particular as PVT source material.

The SiC particles preferably have impurities of less than 2 ppm (weight) of the substance N and of less than 100 ppb (weight) of each of the substances B, Al, P, Ti, V, Fe, Ni and highly preferably of less than 10 ppb (weight) of the substance Ti. Additionally or alternatively the SiC particles preferably have impurities of less than 10 ppm (weight) of the substance N and of less than 1000 ppb (weight), in particular of less than 500 ppb (weight), of the sum of all of the metals Ti, V, Fe, Ni.

The apparent density of the SiC particles is preferably above 1.4 g/cm3 and highly preferably above 1.6 g/cm3. The tap density of the SiC particles is preferably above 1.6 g/cm3 and highly preferably above 1.8 g/cm3. The apparent density is hereby measured according to ISO 697 and wherein tap density is hereby measured according to ISO 787.

The PVT source material is preferably produced according to a PVT source material production method for the production of PVT source material, wherein the PVT source material production method comprises the steps: Providing a source medium inside a process chamber, wherein providing a source medium inside a process chamber comprises the steps: Introducing at least a first feed-medium, in particular a first source gas, into a process chamber, said first feed medium comprises Si, in particular according to the general formula $SiH_{4-y}X_y$ (X=[Cl, F, Br, J] and y=[0 . . . 4], wherein the first-feed medium has a purity which excludes at least 99.9999% (ppm wt) of the substances B, Al, P, Ti, V, Fe, Ni, and introducing at least a second feed-medium, in particular a second source gas, into the process chamber, the second feed medium comprises C, in particular natural gas, Methane, Ethan, Propane, Butane and/or Acetylene, wherein the second-feed medium has a purity which excludes at least 99.9999% (ppm wt) of the substances B, Al, P, Ti, V, Fe, Ni, introducing a carrier gas, wherein the carrier gas has a purity which excludes at least 99.9999% (ppm wt) of the substances B, Al, P, Ti, V, Fe, Ni, or introducing one feed-medium in particular a source gas, into a process chamber, said feed medium comprises Si and C, in particular SiC13 (CH3), wherein the feed medium has a purity which excludes at least 99.9999% (ppm wt) of the substances B, Al, P, Ti, V, Fe, Ni, introducing a carrier gas, wherein the carrier gas has a purity which excludes at least 99.9999% (ppm wt) of the substances B, Al, P, Ti, V, Fe, Ni, electrically energizing at least one SiC growth substrate and preferably a plurality if SiC growth substrates, disposed in the process chamber to heat the SiC growth substrate/s to a temperature in the range between 1300 °C and 2000 °C, setting a deposition rate, in particular of more than 200 μm/h, for removing Si and C from the source medium and for depositing the removed Si and C as SiC, in particular as polycrystalline SiC, on the SiC growth substrate/s and thereby forming a SiC solid and Disaggregating the SiC solid into SiC particles having an average length of more than 100 μm. The PVT source material is preferably SiC of polytype 3C and/or polycrystalline SiC. The average length of the SiC particles is preferably more than 500 μm and highly preferably more than 1000 μm and most preferably more than 2000 μm. The SiC particles preferably comprises less than 30% (mass) of excess C or preferably less than 20% (mass) of excess C or highly preferably less than 10% (mass) of excess C or most preferably less than 5% (mass) of excess C compared to an ideal stoichiometric ratio between Si and C. The SiC particles preferably comprises less than 30% (mass) of excess Si or preferably less than 20% (mass) of excess Si or highly preferably less than 10% (mass) of excess Si or most preferably less than 5% (mass) of excess Si compared to an ideal stoichiometric ratio between Si and C.

Since the PVT source material is produced in a CDV reactor it is alternatively possible to name it "SiC material produced in a CDV reactor" or just "SiC material"

The above mentioned object is also solved by a PVT source material lot. Said PVT source material lot comprises at least 1 kg PVT source material according to the present invention.

The above mentioned object is also solved by a PVT source material production method for the production of PVT source material according to the present invention. The PVT source material production method preferably comprises the steps of: Providing a source medium inside a process chamber, wherein providing a source medium inside the process chamber comprises the steps: Introducing at least a first feed-medium, in particular a first source gas, into the process chamber (856), said first feed medium comprises Si, in particular according to the general formula $SiH_{4-y}X_y$ (X=[Cl, F, Br, J] and y=[0 . . . 4], wherein the first-feed medium has a purity which excludes at least 99.9999% (ppm wt) of the substances B, Al, P, Ti, V, Fe, Ni, and introducing at least a second feed-medium, in particular a second source gas, into the process chamber, the second feed medium comprises C, in particular natural gas, Methane, Ethan, Propane, Butane and/or Acetylene, wherein the second-feed medium has a purity which excludes at least 99.9999% (ppm wt) of the substances B, Al, P, Ti, V, Fe, Ni, and introducing a carrier gas, wherein the carrier gas has a purity which excludes at least 99.9999% (ppm wt) of the substances B, Al, P, Ti, V, Fe, Ni, or introducing one feed-medium in particular a source gas, into the process chamber (856), said feed medium comprises Si and C, in particular SiCl3(CH3), wherein the feed medium has a purity which excludes at least 99.99999% (ppm wt) of the substances B, Al, P, Ti, V, Fe, Ni, and introducing a carrier gas, wherein the carrier gas has a purity which excludes at least 99.99999% (ppm wt) of the substances B, Al, P, Ti, V, Fe, Ni, electrically energizing at least one SiC growth substrate and preferably a plurality if SiC growth substrates, disposed in the process chamber to heat the SiC growth substrate/s to a temperature in the range between 1300 °C and 2000 °C, wherein each SiC growth substrate comprises a first power connection and a second power connection, wherein the first power connections are first metal electrodes and wherein the second power connections are second metal electrodes, wherein the first metal electrodes and the second metal electrodes are preferably shielded from a reaction space inside the process chamber, and setting a deposition rate, in particular of more than 200 μm/h, for removing Si and C from the source medium and for depositing the removed Si and C as SiC, in particular as polycrystalline SiC, on the SiC growth substrate/s and thereby forming a SiC solid and disaggregating the SiC solid into SiC particles having an average length of more than 100 μm. This method is beneficial since very pure SiC material can be produced in industrial scale.

Setting a pressure inside the process chamber above 1 bar is a preferred step of the method.

Introducing a defined amount of a mixture of the first source gas, which provides Si, and the second source gas, which provides C, into the process chamber is another preferred step of the method, wherein the defined amount is an amount between 0.32 g of the mixture per hour and per cm2 of a SiC growth surface and 10 g of the mixture per hour and per cm2 of the SiC growth surface. Alternatively introducing a defined amount of a Si and C containing source gas into the process chamber is another preferred step of the method, wherein the defined amount is an amount between 0.32 g of the Si and C containing source gas per hour and per cm2 of the SiC growth surface and 10 g of the Si and C containing source gas per hour and per cm2 of the SiC growth surface. Alternatively setting a pressure inside the process chamber above 1 bar by introducing a defined amount of a mixture of the first source gas, which provides Si, and the second source gas, which provides C, into the process chamber is another preferred step of the method, wherein the defined amount is an amount between 0.32 g of the mixture per hour and per cm2 of a SiC growth surface and 10 g of the mixture per hour and per cm2 of the SiC growth surface. Alternatively setting a pressure inside the process chamber above 1 bar by introducing a defined amount of a Si and C containing source gas into the process chamber, wherein the defined amount is an amount between 0.32 g of the Si and C containing source gas per hour and per cm2 of the SiC growth surface and 10 g of the Si and C containing source gas per hour and per cm2 of the SiC growth surface.

Increasing the electrical energizing of the at least one SiC growth substrate over time, in particular to heat a surface of the deposited SiC to a temperature between 1300 °C and 1800 °C, is another preferred step of the method. The deposition rate is preferably set to more than 200 μm/h and highly preferably to more than 500 μm/h and most preferably to more than 800 μm/h.

Depositing Si and C at the set deposition rate for more than 5 hours, in particular for more or up to 8 hours or for more or up to 12 hours or for more or up to 18 hours or preferably for more or up to 24 hours or highly preferably for more or up to 48 hours or most preferably for more or up to 72 hours, is another preferred step of the method.

Growing the SiC solid during depositing of C and Si to a mass of more than 5 kg, in particular of more or up to 25 kg or preferably of more or up to 50 kg or highly preferably of more or up to 200 kg and most preferably of more or up to 500 kg, is another preferred step of the method and growing the SiC solid during depositing of C and Si to a thickness of at least 5 cm, in particular of more or up to 7 cm or preferably of more or up to 10 cm or preferably of more or up to 15 cm or highly preferably of more or up to 20 cm or most preferably of more or up to 50 cm, is another preferred step of the method.

A control unit for setting up a feed medium supply of the one feed-medium or the multiple feed-mediums into the process chamber is preferably provided, wherein the control unit can be configured to set up the feed medium supply between a minimum amount of feed medium supply [mass] per min. and a maximum amount of feed medium supply [mass] per min., wherein the minimum amount of feed medium supply [mass] per min. preferably corresponds to a deposited minimum amount of Si [mass] and a minimum amount of C [mass] at the defined growth rate.

The maximum amount of feed medium supply per min is up to 30% [mass] or to 20% [mass] or up to 10% [mass] or up to 5% [mass] or up to 3% [mass] is preferably higher compared to the minimum amount of feed medium supply.

The process chamber is at least surrounded by a base plate, a side wall section and a top wall section, The base plate preferably comprises at least one cooling element, in particular a base cooling element, for preventing heating the base plate above a defined temperature and/or the side wall section preferably comprises at least one cooling element, in particular a bell jar cooling element, for preventing heating the side wall section above a defined temperature and/or the top wall section preferably comprises at least one cooling element, in particular a bell jar cooling element, for preventing heating the top wall section above a defined temperature. The cooling element is preferably an active cooling element. The base plate and/or side wall section and/or top wall section preferably comprises a cooling fluid guide unit for guiding a cooling fluid, wherein the cooling fluid guide unit is configured limit heating of the base plate and/or side wall section and/or top wall section to a temperature below 1000 °C. A base plate and/or side wall section and/or top wall section sensor unit is preferably provided to detect temperature of the base plate and/or side wall section and/or top wall section and to output a temperature signal or temperature data and/or a cooling fluid temperature sensor is provided to detect the temperature of the cooling fluid, and a fluid forwarding unit is preferably provided for forwarding the cooling fluid through the fluid guide unit, wherein the fluid forwarding unit is preferably configured to be operated in dependency of the temperature signal or temperature data provided by the base plate and/or side wall section and/or top wall section sensor unit and/or cooling fluid temperature sensor. The cooling fluid is preferably oil or water, wherein the water preferably comprises at least one additive, in particular corrosion inhibiter/s and/or antifouling agent/s (biocides). The cooling element can be additionally or alternatively a passive cooling element. The cooling element is preferably at least partially formed by a polished steel surface of the base plate, the side wall section and/or the top wall section. The cooling element is preferably a coating, wherein the coating is formed above the polished steel surface and wherein the coating is configured to reflect heat. The coating is preferably a metal coating or a comprises metal, in particular silver or gold or chrome, or alloy coating, in particular a CuNi alloy. The emissivity of the polished steel surface and/or of the coating is preferably below ϵe 0.3, in particular below 0.1 or below 0.03. The base plate preferably comprises at least one active cooling element and one passive cooling element for preventing heating the base plate above a defined temperature and/or the side wall section preferably comprises at least one active cooling element and one passive cooling element for preventing heating the side wall section above a defined temperature and/or the top wall section preferably comprises at least one active cooling element and one passive cooling element for preventing heating the top wall section above a defined temperature. The side wall section and the top wall section are preferably formed by a bell jar, wherein the bell jar is preferably movable with respect to the base plate. More than 50% [mass] of the side wall section and/or more than 50% [mass] of the top wall section and/or more than 50% [mass] of the base plate is preferably made of metal, in particular steel.

A gas outlet unit for outputting vent gas and a vent gas recycling unit are preferably provided and preferably operated according to the method. The vent gas recycling unit is connected to the gas outlet unit, wherein the vent gas recycling unit comprises at least a separator unit for separating the vent gas into a first fluid and into a second fluid, wherein the first fluid is a liquid and wherein the second fluid is a gas, wherein a first storage and/or conducting element for storing or conducting the first fluid is part of the separator unit or coupled with the separator unit and wherein a second storage and/or conducting element for storing or conducting the second fluid is part of the separator unit or coupled with the separator unit. The step of providing a source medium inside a process chamber, preferably comprises feeding the first fluid from the vent gas recycling unit into the process chamber, wherein the first fluid comprises at least a mixture of chlorosilanes. The vent gas recycling unit preferably comprises a further separator unit for separating the first fluid into at least two parts, wherein the two parts are a mixture of chlorosilanes and a mixture of HCl, H2 and at least one C-bearing molecule and preferably into at least three parts, wherein the three parts are a mixture of chlorosilanes and HCl and a mixture of H2 and at least one C-bearing molecule, wherein the first storage and/or conducting element connects the separator unit with the further separator unit, wherein the further separator unit is coupled with a mixture or chlorosilanes storage and/or conducting element and with a HCl storage and/or conducting element and with a H2 and C storage and/or conducting element, wherein the mixture of chlorosilanes storage and/or conducting element forms a section of a mixture of chlorosilanes mass flux path for conducting the mixture of chlorosilanes into the process chamber, wherein a Si mass flux measurement unit for measuring an amount of Si of the mixture of chlorosilanes is provided as part of the mass flux path prior to the process chamber, in particular prior to a mixing device, and preferably as further Si feed-medium source providing a further Si feed medium.

The SiC growth substrate preferably has an average perimeter of at least 5 cm around a cross-sectional area orthogonal to the length direction of the SiC growth substrate or multiple SiC growth substrates have an average perimeter per SiC growth substrate of at least 5 cm around a cross-sectional area orthogonal to the length direction of the respective SiC growth substrate.

Since the PVT source material is produced in a CDV reactor it is alternatively possible to name the PVT source material production method “SiC material production method carried out in a CVD reactor” or just “SiC material production method”.

The above mentioned object is also solved by a method for the production of at least one SiC crystal. This method comprises steps: Providing a CVD reactor for the production of SiC of a first type, introducing at least one source gas, in particular a first source gas, in particular SiCl3(CH3), into a process chamber for generating a source medium, wherein the source medium comprises Si and C, introducing at least one carrier gas into the process chamber, the carrier gas preferably comprising H, electrically energizing at least one SiC growth substrate disposed in the process chamber to heat the SiC growth substrate, wherein the surface of the SiC growth substrate is heated to a temperature in the range between 1300 °C and 1800 °C, depositing SiC of the first type onto the SiC growth substrate, in particular at a deposition rate of more than 200 μm/h, wherein the deposited SiC is preferably polycrystalline SiC, removing the deposited SiC of the first type from the CVD reactor, transforming the removed SiC into fragmented SiC of the first type or into one or multiple solid bodies SiC of the first type, providing a PVT reactor for the production of SiC of a second type. The PVT reactor comprises a furnace unit, wherein the furnace unit comprises a furnace housing with an outer surface and an inner surface, at least one crucible unit, wherein the crucible unit is arranged inside the furnace housing, wherein the crucible unit comprises a crucible housing, wherein the crucible housing has an outer surface and an inner surface, wherein the inner surface at least partially defines a crucible volume, wherein a receiving space for receiving a source material is arranged or formed inside the crucible volume, wherein a seed holder unit for holding a defined seed wafer is arranged inside the crucible volume, wherein the seed wafer holder holds a seed wafer, wherein the furnace housing inner wall and the crucible housing outer wall define a furnace volume, at least one heating unit for heating the source material, wherein the receiving space for receiving the source material is at least in parts arranged above the heating unit and below the seed holder unit. The method further comprises the steps of adding the fragmented SiC of the first type or adding one or multiple solid bodies of SiC of the first type as source material into the receiving space, sublimating the SiC of the first type inside the PVT reactor and depositing the sublimated SiC on the seed wafer as SiC of the second type. This method is beneficial since both the PVT source material as well as the SiC crystal are produced in a very efficient manner with very high quality.

The step of introducing at least one source gas and at least one carrier gas preferably comprises: Introducing at least a first feed-medium, in particular a first source gas, into the process chamber, said first feed medium comprises Si, in particular the Si feed medium source provides a Si gas according to the general formula $SiH_{4-y}X_y$ (X=[Cl, F, Br, J] and y=[0 . . . 4], wherein the first-feed medium has a purity which excludes at least 99.9999% (ppm wt) of the substances B, Al, P, Ti, V, Fe, Ni, and introducing at least a second feed-medium, in particular a second source gas, into the process chamber, the second feed medium comprises C, in particular natural gas, Methane, Ethan, Propane, Butane and/or Acetylene, wherein the second-feed medium has a purity which excludes at least 99.9999% (ppm wt) of the substances B, Al, P, Ti, V, Fe, Ni, and introducing a carrier gas, wherein the carrier gas has a purity which excludes at least 99.9999% (ppm wt) of the substances B, Al, P, Ti, V, Fe, Ni. Alternatively the step of introducing at least one source gas and at least one carrier gas preferably comprises: Introducing one feed-medium in particular a source gas, into the process chamber, said feed medium comprises Si and C, in particular SiCl3(CH3), wherein the feed medium has a purity which excludes at least 99.9999% (ppm wt) of the substances B, Al, P, Ti, V, Fe, Ni, and introducing a carrier gas, wherein the carrier gas has a purity which excludes at least 99.9999% (ppm wt) of the substances B, Al, P, Ti, V, Fe, Ni. The fragmented SiC preferably represents SiC particles, wherein the SiC particles have an average length of at least 100 μm.

The SiC particles preferably have impurities of less than 10 ppm (weight) of the substance N and of less than 1000 ppb (weight), in particular than 500 ppb (weight), of each of the substances B, Al, P, Ti, V, Fe, Ni and highly preferably of less than 2 ppm (weight) of the substance N and of less than 100 ppb (weight) of each of the substances B, Al, P, Ti, V, Fe, Ni or of less than 10 ppb (weight) of the substance Ti. Alternatively, the SiC particles have impurities of less than 10 ppm (weight) of the substance N and of less 1000 ppb (weight), in particular of less than 500 ppb (weight), of the sum of all of the metals Ti, V, Fe, Ni. The apparent density of the SiC particles is preferably above 1.4 g/cm3 and highly preferably above 1.6 g/cm3. The tap density of the SiC particles is preferably above 1.6 g/cm3 and highly preferably above 1.8 g/cm3.

Each of the one or multiple solid bodies of SiC is preferably characterized by a mass of more than 0.3 kg, preferably at least 1 kg, a thickness of at least 1 cm, preferably at least 5 cm, a length of more than 10 cm, preferably at least 25 cm or at least 50 cm, and impurities of less than 10 ppm (weight) of the substance N and of less than 1000 ppb (weight), in particular of less than 500 ppb (weight), of each of the substances B, Al, P, Ti, V, Fe, Ni. Each of the one or multiple solid bodies of SiC highly preferably has impurities of less than 2 ppm (weight) of the substance N and of less than 100 ppb (weight) of each of the substances B, Al, P, Ti, V, Fe, Ni or of less than 10 ppb (weight) of the substance Ti. Alternatively, each of the one or multiple solid bodies of SiC has impurities of less than 10 ppm (weight) of the substance N and of less than 1000 ppb (weight), in particular of less than 500 ppb (weight), of the sum of all of the metals Ti, V, Fe, Ni.

Setting a pressure inside the process chamber above 1 bar is another preferred step of the method.

Introducing a defined amount of a mixture of the first source gas, which provides Si, and the second source gas, which provides C, into the process chamber is another preferred step of the method, wherein the defined amount is an amount between 0.32 g of the mixture per hour and per cm2 of a SiC growth surface and 10 g of the mixture per hour and per cm2 of the SiC growth surface. Alternatively introducing a defined amount of a Si and C containing source gas into the process chamber is another preferred step of the method, wherein the defined amount is an amount between 0.32 g of the Si and C containing source gas per hour and per cm2 of the SiC growth surface and 10 g of the Si and C containing source gas per hour and per cm2 of the SiC growth surface. Alternatively setting a pressure inside the process chamber above 1 bar by introducing a defined amount of a mixture of the first source gas, which provides Si, and the second source gas, which provides C, into the process chamber is another preferred step of the method, wherein the defined amount is an amount between 0.32 g of the mixture per hour and per cm2 of a SiC growth surface and 10 g of the mixture per hour and per cm2 of the SiC growth surface. Alternatively setting a pressure inside the process chamber above 1 bar by introducing a defined amount of a Si and C containing source gas into the process chamber is another preferred step of the method, wherein the defined amount is an amount between 0.32 g of the Si and C containing source gas per hour and per cm2 of the SiC growth surface and 10 g of the Si and C containing source gas per hour and per cm2 of the SiC growth surface. The process chamber is preferably surrounded by a base plate, a side wall section and a top wall section, wherein more than 50% [mass] of the side wall section and more than 50% [mass] of the top wall section and more than 50% [mass] of the base plate is made of metal, in particular steel. A base plate and/or side wall section and/or top wall section sensor unit is preferably provided to detect temperature of the base plate and/or side wall section and/or top wall section and to output a temperature signal or temperature data and/or a cooling fluid temperature sensor is provided to detect the temperature of the cooling fluid, and a fluid forwarding unit is preferably provided for forwarding the cooling fluid through the fluid guide unit. The fluid forwarding unit is preferably configured to be operated in dependency of the temperature signal or temperature data provided by the base plate and/or side wall section and/or top wall section sensor unit and/or cooling fluid temperature sensor. The SiC growth substrate preferably has an average perimeter of at least 5 cm around a cross-sectional area orthogonal to the length direction of the SiC growth substrate or multiple SiC growth substrates have an average perimeter per SiC growth substrate of at least 5 cm around a cross-sectional area orthogonal to the length direction of the respective SiC growth substrate. The SiC depositing on the SiC growth substrate has preferably impurities of less than 10 ppm (weight) of the substance N and of less than 1000 ppb (weight), in particular of less than 500 ppb (weight), of each of the substances B, Al, P, Ti, V, Fe, Ni and highly preferably of less than 2 ppm (weight) of the substance N and of less than 100 ppb (weight) of each of the substances B, Al, P, Ti, V, Fe, Ni or of less than 10 ppb (weight) of the substance Ti. Alternatively, the SiC depositing on the SiC growth substrate has impurities of less than 10 ppm (weight) of the substance N and of less than 1000 ppb (weight), in particular of less than 500 ppb (weight), of the sum of all of the metals Ti, V, Fe, Ni. A gas outlet unit for outputting vent gas and a vent gas recycling unit are preferably provided as units which are operated as part of the method of the present invention, wherein the vent gas recycling unit is connected to the gas outlet unit, wherein the vent gas recycling unit comprises at least a separator unit for separating the vent gas into a first fluid and into a second fluid, wherein the first fluid is a liquid and wherein the second fluid is a gas, wherein a first storage and/or conducting element for storing or conducting the first fluid is part of the separator unit or coupled with the separator unit and wherein a second storage and/or conducting element for storing or conducting the second fluid is part of the separator unit or coupled with the separator unit. Additionally, the method preferably comprises the step of providing a source medium inside a process chamber, said step preferably comprises feeding the first fluid from the vent gas recycling unit into the process chamber, wherein the first fluid comprises at least a mixture of chlorosilanes. The gases introduced into the CVD reactor preferably comprise less than 99.9999% (ppm wt) of one, multiple or all of the following substances B (Boron), Al (Aluminium), P (Phosphor), Ti (Titan), V (Vanadium), Fe (Eisen), Ni (Nickel). A crucible gas flow unit for causing a gas flow inside the crucible volume is preferably provided, wherein the crucible gas flow unit comprises a crucible gas inlet tube for conducting gas into the crucible volume and a crucible gas outlet tube for conducting gas out of the crucible volume. A growth guide is preferably arranged inside the crucible housing, wherein the growth guide forms a growth-guide-gas-path-section-boundary for guiding the gas flow into the direction of the seed holder unit, wherein the growth guide and the seed holder unit form a gas-flow passage. The method preferably also comprises the steps establishing gas flow through the crucible volume by conducting at least a carrier gas into the crucible volume through the crucible gas inlet tube and by conducting at least the carrier gas out of the crucible volume through the crucible gas outlet tube, establishing a defined gas flow velocity through the gas-flow passage by controlling gas flow through the crucible gas inlet tube into the crucible volume and/or establishing the defined gas flow velocity through the gas-flow passage by controlling gas flow through the crucible gas outlet tube out of the crucible volume, wherein the defined gas flow velocity is between 1 cm/s and 10 cm/s and preferably between 2 cm/s and 6 cm/s.

The receiving space is preferably located between the crucible gas inlet tube and the seed holder unit. The method preferably comprises the step of conducting gas flow around the receiving space and/or through the receiving space.

A filter unit is preferably arranged inside the crucible volume between the seed holder unit and the crucible gas outlet tube for capturing at least $Si_2C$ sublimation vapor, $SiC_2$ sublimation vapor and Si sublimation vapor, wherein the filter unit forms a filter-unit-gas-flow-path from a filter input surface to a filter output surface, wherein the filter gas flow path is part of a gas flow path between the crucible gas inlet tube and the crucible gas outlet tube, wherein the filter unit preferably has a height S1 and wherein the filter-unit-gas-flow-path through the filter unit preferably has a length S2, wherein S2 is at least 2 times, in particular 10 times, longer compared to S1. The method preferably comprises the step of guiding gas from the gas flow passage to the filter input surface and from the filter input surface through the filter unit to a filter output surface and from the filter output surface to the crucible gas outlet tube.

A pressure unit for setting up a crucible volume pressure inside the crucible volume is preferably provided, wherein the pressure unit is configured to cause crucible volume pressure above 2666.45 Pa and preferably above 5000 Pa or in a range between 2666.45 Pa and 50000.00 Pa. The method preferably comprises the step of generating a crucible volume pressure inside the crucible volume above 2666.45 Pa and preferably above 5000 Pa or in a range between 2666.45 Pa and 50000.00 Pa.

The PVT reactor preferably comprises a crucible gas flow unit, wherein the crucible gas flow unit comprises a crucible gas inlet tube for conducting gas into the crucible volume, wherein the crucible gas inlet tube is arranged in vertical direction below the receiving space. The method preferably comprises the step of conducting gas via the crucible gas flow unit into the crucible housing.

The above mentioned object is also solved by a system for the production of SiC which comprises a CVD reactor for the production of SiC of a first type as PVT source material. The CVD reactor comprises at least a process chamber, wherein the process chamber is at least surrounded by a base plate, a side wall section and a top wall section, a gas inlet unit for feeding one feed-medium or multiple feed-mediums into a reaction space of the process chamber for generating a source medium, wherein the gas inlet unit is coupled with at least one feed-medium source, wherein a Si and C feed-medium source provides at least Si and C, in particular SiCl3(CH3), and wherein a carrier gas feed-medium source provides a carrier gas, in particular H2, or wherein the gas inlet unit is coupled with at least two feed-medium sources, wherein a Si feed medium source provides at least Si, in particular the Si feed medium source provides a Si gas according to the general formula $SiH_{4-y}X_y$ (X=[Cl, F, Br, J] and y=[0 . . . 4], and wherein a C feed medium source provides at least C, in particular natural gas, Methane, Ethan, Propane, Butane and/or Acetylene, and wherein a carrier gas medium source provides a carrier gas, in particular H2, one or multiple SiC growth substrate, in particular more than 3 or 4 or 6 or 8 or 16 or 32 or 64 or up to 128 or up to 256, are arranged inside the process chamber for depositing SiC, wherein each SiC growth substrate comprises a first power connection and a second power connection, wherein the first power connections are first metal electrodes and wherein the second power connections are second metal electrodes, wherein each SiC growth substrate is coupled between at least one first metal electrode and at least one second metal electrode for heating the outer surface of the SiC growth substrates or the surface of the deposited SiC to temperatures between 1300 °C and 1800 °C, in particular by means of resistive heating and preferably by internal resistive heating, so that SiC of the first type is deposited onto the SiC growth substrate, wherein the deposited SiC of the first type from the CVD reactor is used in a PVT reactor for the production of SiC of a second type. The PVT reactor comprises a furnace unit, wherein the furnace unit comprises a furnace housing with an outer surface and an inner surface, at least one crucible unit, wherein the crucible unit is arranged inside the furnace housing, wherein the crucible unit comprises a crucible housing, wherein the crucible housing has an outer surface and an inner surface, wherein the inner surface at least partially defines a crucible volume, wherein a receiving space for receiving a source material in form of the SiC of the first type from the CVD reactor is arranged or formed inside the crucible volume, wherein a seed holder unit for holding a defined seed wafer is arranged inside the crucible volume, wherein the seed wafer holder holds a seed wafer, wherein the furnace housing inner wall and the crucible housing outer wall define a furnace volume, at least one heating unit for heating the source material in form of the SiC of the first type from the CVD reactor, wherein the receiving space for receiving the source material in form of the SiC of the first type from the CVD reactor is at least in parts arranged above the heating unit and below the seed holder unit. The system further causes adding of the SiC of the first type from the CVD reactor as source material into the receiving space, sublimating the SiC of the first type inside the PVT reactor and depositing the sublimated SiC on the seed wafer as SiC of the second type. The first metal electrodes and the second metal electrodes are preferably shielded from a reaction space inside the process chamber.

The above mentioned object is also solved by a SiC production reactor, in particular for the production of UPSiC, in particular as PVT source material. Said SiC production reactor preferably comprises at least a process chamber, wherein the process chamber is at least surrounded by a base plate, a side wall section and a top wall section, a gas inlet unit for feeding one feed-medium or multiple feed-mediums into a reaction space of the process chamber for generating a source medium, wherein the gas inlet unit is coupled with at least one feed-medium source, wherein a Si and C feed-medium source provides at least Si and C, in particular SiCl3(CH3), and wherein a carrier gas feed-medium source provides a carrier gas, in particular H2. Alternatively the gas inlet unit can be coupled with at least two feed-medium sources, wherein a Si feed medium source provides at least Si, in particular the Si feed medium source provides a Si gas according to the general formula $SiH_{4-y}X_y$ (X=[Cl, F, Br,J] and y=[0 . . . 4], and wherein a C feed medium source provides at least C, in particular natural gas, Methane, Ethan, Propane, Butane and/or Acetylene, and wherein a carrier gas medium source provides a carrier gas, in particular H2. The SiC production reactor further comprises one or multiple SiC growth substrate, in particular more than 3 or 4 or 6 or 8 or 16 or 32 or 64 or up to 128 or up to 256, are arranged inside the process chamber for depositing SiC, wherein each SiC growth substrate comprises a first power connection and a second power connection, wherein the first power connections are first metal electrodes and wherein the second power connections are second metal electrodes, wherein the first metal electrodes and the second metal electrodes are preferably shielded from the reaction space, wherein each SiC growth substrate is coupled between at least one first metal electrode and at least one second metal electrode for heating the outer surface of the SiC growth substrates or the surface of the deposited SiC to temperatures between 1300 °C and 1800 °C, in particular by means of resistive heating and preferably by internal resistive heating. The SiC growth substrate preferably has an average perimeter of at least 5 cm and preferably of at least 7 cm and highly preferably of at least 10 cm around a cross-sectional area orthogonal to the length direction of the SiC growth substrate or multiple SiC growth substrates have an average perimeter per SiC growth substrate of at least 5 cm and preferably of at least 7 cm and highly preferably of at least 10 cm around a cross-sectional area orthogonal to the length direction of the respective SiC growth substrate. This solution is beneficial since the volumetric deposition rate is significantly higher compared to small SiC growth substrates, thus it is possible to deposit the same amount of SiC material within a shorter time. This helps to reduce run time and therefore increases efficiency of the SiC production reactor. The SiC growth substrate comprises or consists preferably of SiC or C, in particular graphite, or wherein multiple SiC growth substrates comprise or consist of SiC or C, in particular graphite. the shape of the cross-sectional area orthogonal to the length direction of the SiC growth substrate differs at least is sections and preferably along more than 50% of the length of the SiC growth substrate and highly preferably along more than 90% of the length of the SiC growth substrate from a circular shape. A ratio U/A between the cross-sectional area A and the perimeter U around the cross-sectional area is preferably higher than 1.2 1/cm and preferably higher than 1.5 1/cm and highly preferably higher than 2 1/cm and most preferably higher than 2.5 1/cm. The SiC growth substrate is preferably formed by at least one carbon ribbon, in particular graphite ribbon, wherein the at least one carbon ribbon comprises a first ribbon end and a second ribbon end, wherein the first ribbon end is coupled with the first metal electrode and wherein the second ribbon end is coupled with the second metal electrode. Alternatively, each of multiple the SiC growth substrates is formed by at least one carbon ribbon, in particular graphite ribbon, wherein the at least one carbon ribbon per SiC growth substrate comprises a first ribbon end and a second ribbon end, wherein the first ribbon end is coupled with the first metal electrode of the respective SiC growth substrate and wherein the second ribbon end is coupled with the second metal electrode of the respective SiC growth substrate. The carbon ribbon, in particular graphite ribbon, preferably comprises a curing agent. The SiC growth substrate is preferably formed by multiple rods, wherein each rod has a first rod end and a second rod end, wherein all first rod ends are coupled with the same first metal electrode and wherein all second rod ends are coupled with the same second metal electrode. Alternatively, each of multiple SiC growth substrates is formed by multiple rods, wherein each rod has a first rod end and a second rod end, wherein all first rod ends are coupled with the same first metal electrode of the respective SiC growth substrate and wherein all second rod ends are coupled with the same second metal electrode of the respective SiC growth substrate. The rods of the SiC growth substrate are preferably contacting each other or are arranged in a distance to each other. The SiC growth substrate preferably comprises three or more than three rods. Alternatively, each of multiple SiC growth substrates comprise three or more than three rods. The SiC growth substrate is preferably formed by at least one metal rod, wherein the metal rod has a first metal rod end and a second metal rod end, wherein the first metal rod end is coupled with the first metal electrode and wherein the second metal rod end is coupled with the second metal electrode. Alternatively, each of multiple SiC growth substrates are formed by at least one metal rod, wherein each metal rod has a first metal rod end and a second metal rod end, wherein the first metal rod end is coupled with the first metal electrode of the respective SiC growth substrate and wherein the second metal rod end is coupled with the second metal electrode of the respective SiC growth substrate. The metal rod preferably comprises a coating, wherein the coating preferably comprises SiC and/or wherein the coating preferably has a thickness of more than 2 μm or preferably of more than 100 μm or highly preferably of more than 500 μm or between 2 μm and 5 mm, in particular between 100 μm and 1 mm, or of less than 500 μm. The base plate preferably comprises at least one cooling element, in particular a base cooling element, for preventing heating the base plate above a defined temperature and/or the side wall section preferably comprises at least one cooling element, in particular a bell jar cooling element, for preventing heating the side wall section above a defined temperature and/or the top wall section preferably comprises at least one cooling element, in particular a bell jar cooling element, for preventing heating the top wall section above a defined temperature. The cooling element is preferably an active cooling element. The base plate and/or side wall section and/or top wall section preferably comprises a cooling fluid guide unit for guiding a cooling fluid, wherein the cooling fluid guide unit is configured limit heating of the base plate and/or side wall section and/or top wall section to a temperature below 1000 °C. A base plate and/or side wall section and/or top wall section sensor unit is preferably provided to detect temperature of the base plate and/or side wall section and/or top wall section and to output a temperature signal or temperature data and/or a cooling fluid temperature sensor is provided to detect the temperature of the cooling fluid, and a fluid forwarding unit is preferably provided for forwarding the cooling fluid through the fluid guide unit, wherein the fluid forwarding unit is preferably configured to be operated in dependency of the temperature signal or temperature data provided by the base plate and/or side wall section and/or top wall section sensor unit and/or cooling fluid temperature sensor. The cooling fluid is preferably oil or water, wherein the water preferably comprises at least one additive, in particular corrosion inhibiter/s and/or antifouling agent/s (biocides). The cooling element can be additionally or alternatively a passive cooling element. The cooling element is preferably at least partially formed by a polished steel surface of the base plate, the side wall section and/or the top wall section. The cooling element is preferably a coating, wherein the coating is formed above the polished steel surface and wherein the coating is configured to reflect heat. The coating is preferably a metal coating or a comprises metal, in particular silver or gold or chrome, or alloy coating, in particular a CuNi alloy. The emissivity of the polished steel surface and/or of the coating is preferably below 0.3, in particular below 0.1 or below 0.03. The base plate preferably comprises at least one active cooling element and one passive cooling element for preventing heating the base plate above a defined temperature and/or the side wall section preferably comprises at least one active cooling element and one passive cooling element for preventing heating the side wall section above a defined temperature and/or the top wall section preferably comprises at least one active cooling element and one passive cooling element for preventing heating the top wall section above a defined temperature. The side wall section and the top wall section are preferably formed by a bell jar, wherein the bell jar is preferably movable with respect to the base plate. More than 50% [mass] of the side wall section and/or more than 50% [mass] of the top wall section and/or more than 50% [mass] of the base plate is preferably made of metal, in particular steel. A gas outlet unit for outputting vent gas and a vent gas recycling unit are preferably provided as part of the SiC production reactor, wherein the vent gas recycling unit is connected to the gas outlet unit, wherein the vent gas recycling unit comprises at least a separator unit for separating the vent gas into a first fluid and into a second fluid, wherein the first fluid is a liquid and wherein the second fluid is a gas, wherein a first storage and/or conducting element for storing or conducting the first fluid is part of the separator unit or coupled with the separator unit and wherein a second storage and/or conducting element for storing or conducting the second fluid is part of the separator unit or coupled with the separator unit. The vent gas recycling unit preferably comprises a further separator unit for separating the first fluid into at least two parts, wherein the two parts are a mixture of chlorosilanes and a mixture of HCl, H2 and at least one C-bearing molecule. Alternatively the further separator unit separates the first fluid into at least three parts, wherein the three parts are a mixture of chlorosilanes and HCl and a mixture of H2 and at least one C-bearing molecule, wherein the first storage and/or conducting element connects the separator unit with the further separator unit, wherein the further separator unit is coupled with a mixture or chlorosilanes storage and/or conducting element and with a HCl storage and/or conducting element and with a H2 and C storage and/or conducting element, wherein the mixture of chlorosilanes storage and/or conducting element forms a section of a mixture of chlorosilanes mass flux path for conducting the mixture of chlorosilanes into the process chamber, wherein a Si mass flux measurement unit for measuring an amount of Si of the mixture of chlorosilanes is provided as part of the mass flux path prior to the process chamber, in particular prior to a mixing device, and preferably as further Si feed-medium source providing a further Si feed medium.

The present invention is also solved by a PVT source material production method or SiC production method for the production of PVT source material, wherein the PVT source material consists of SiC, in particular of polytype 3C. The PVT source material production method at least comprises the step of: Providing a source medium inside a process chamber. The process chamber can be a process chamber of a SiC production reactor according to the present invention. The method further comprises the steps: Electrically energizing at least one SiC growth substrate and preferably a plurality if SiC growth substrates, disposed in the process chamber to heat the SiC growth substrate/s to a temperature in the range between 1300 °C and 2000 °C, wherein each SiC growth substrate comprises a first power connection and a second power connection, wherein the first power connections are first metal electrodes and wherein the second power connections are second metal electrodes, wherein the first metal electrodes and the second metal electrodes are preferably shielded from a reaction space inside the process chamber, and wherein the SiC growth substrate has an average perimeter of at least 5 cm around a cross-sectional area orthogonal to the length direction of the SiC growth substrate or multiple SiC growth substrates have an average perimeter per SiC growth substrate of at least 5 cm around a cross-sectional area orthogonal to the length direction of the respective SiC growth substrate, and Setting a deposition rate, in particular of more than 200 μm/h, for removing Si and C from the source medium and for depositing the removed Si and C as SiC, in particular as polycrystalline SiC, on the SiC growth substrate/s hereby forming a SiC solid. This method is beneficial since a large quantity of SiC material, which can be used as PVT source material, can be produced in a fast manner.

The SiC depositing on the SiC growth substrate has preferably impurities of less than 10 ppm (weight) of the substance N and of less than 1000 ppb (weight), in particular of less than 500 ppb (weight), of each of the substances B, Al, P, Ti, V, Fe, Ni and highly preferably of less than 2 ppm (weight) of the substance N and of less than 100 ppb (weight) of each of the substances B, Al, P, Ti, V, Fe, Ni or of less than 10 ppb (weight) of the substance Ti. Alternatively, the SiC depositing on the SiC growth substrate has impurities of less than 10 ppm (weight) of the substance N and of less than 1000 ppb (weight), in particular of less than 500 ppb (weight), of the sum of all of the metals Ti, V, Fe, Ni.

Providing a source medium inside a process chamber preferably comprises the steps: introducing at least a first feed-medium, in particular a first source gas, into the process chamber, said first feed medium comprises Si, wherein the first-feed medium has a purity which excludes at least 99.9999% (ppm wt) of the substances B, Al, P, Ti, V, Fe, Ni, and introducing at least a second feed-medium, in particular a second source gas, into the process chamber, the second feed medium comprises C, in particular natural gas, Methane, Ethan, Propane, Butane and/or Acetylene, wherein the second-feed medium has a purity which excludes at least 99.9999% (ppm wt) of the substances B, Al, P, Ti, V, Fe, Ni, and introducing a carrier gas, wherein the carrier gas has a purity which excludes at least 99.9999% (ppm wt) of impurities. Alternative the method comprises the steps introducing one feed-medium in particular a source gas, into the process chamber, said feed medium comprises Si and C, in particular SiCl3(CH3), wherein the feed medium has a purity which excludes at least 99.9999% (ppm wt) of the substances B, Al, P, Ti, V, Fe, Ni, and introducing a carrier gas, wherein the carrier gas has a purity which excludes at least 99.9999% (ppm wt) of the substances B, Al, P, Ti, V, Fe, Ni. Setting a pressure inside the process chamber above 1 bar is a further preferred step. The method preferably comprises the step of introducing a defined amount of a mixture of the first source gas, which provides Si, and the second source gas, which provides C, into the process chamber, wherein the defined amount is an amount between 0.32 g of the mixture per hour and per cm2 of a SiC growth surface and 10 g of the mixture per hour and per cm2 of the SiC growth surface or the step of introducing a defined amount of a Si and C containing source gas into the process chamber, wherein the defined amount is an amount between 0.32 g of the Si and C containing source gas per hour and per cm2 of the SiC growth surface and 10 g of the Si and C containing source gas per hour and per cm2 of the SiC growth surface. Alternatively setting a pressure inside the process chamber above 1 bar by introducing a defined amount of a mixture of the first source gas, which provides Si, and the second source gas, which provides C, into the process chamber, wherein the defined amount is an amount between 0.32 g of the mixture per hour and per cm2 of a SiC growth surface and 10 g of the mixture per hour and per cm2 of the SiC growth surface or setting a pressure inside the process chamber above 1 bar by introducing a defined amount of a Si and C containing source gas into the process chamber, wherein the defined amount is an amount between 0.32 g of the Si and C containing source gas per hour and per cm2 of the SiC growth surface and 10 g of the Si and C containing source gas per hour and per cm2 of the SiC growth surface.

Increasing the electrical energizing of the at least one SiC growth substrate over time, in particular to heat a surface of the deposited SiC respectively the SiC growth surface to a temperature between 1300 °C and 1800 °C is a further preferred step of the method.

A gas outlet unit for outputting vent gas and a vent gas recycling unit are preferably provided and preferably operated according to the method. The vent gas recycling unit is connected to the gas outlet unit, wherein the vent gas recycling unit comprises at least a separator unit for separating the vent gas into a first fluid and into a second fluid, wherein the first fluid is a liquid and wherein the second fluid is a gas, wherein a first storage and/or conducting element for storing or conducting the first fluid is part of the separator unit or coupled with the separator unit and wherein a second storage and/or conducting element for storing or conducting the second fluid is part of the separator unit or coupled with the separator unit. The step of providing a source medium inside a process chamber, preferably comprises feeding the first fluid from the vent gas recycling unit into the process chamber, wherein the first fluid comprises at least a mixture of chlorosilanes. Disaggregating the SiC solid into SiC particles having an average length of more than 100 μm is a further preferred step of the method.

The above mentioned object is also solved by a SiC production reactor, in particular for the production of UPSiC, in particular as PVT source material. Said SiC production reactor preferably comprises at least a process chamber, wherein the process chamber is at least surrounded by a base plate, a side wall section and a top wall section, a gas inlet unit for feeding one feed-medium or multiple feed-mediums into a reaction space of the process chamber for generating a source medium, wherein the gas inlet unit is coupled with at least one feed-medium source, wherein a Si and C feed-medium source provides at least Si and C, in particular SiCl3(CH3), and wherein a carrier gas feed-medium source provides a carrier gas, in particular H2. Alternatively the gas inlet unit can be coupled with at least two feed-medium sources, wherein a Si feed medium source provides at least Si, in particular the Si feed medium source provides a Si gas according to the general formula $SiH_{4-y}X_y$ (X=[Cl, F, Br, J] and y=[0 . . . 4], and wherein a C feed medium source provides at least C, in particular natural gas, Methane, Ethan, Propane, Butane and/or Acetylene, and wherein a carrier gas medium source provides a carrier gas, in particular H2. The SiC production reactor further comprises one or multiple SiC growth substrate, in particular more than 3 or 4 or 6 or 8 or 16 or 32 or 64 or up to 128 or up to 256, are arranged inside the process chamber for depositing SiC, wherein each SiC growth substrate comprises a first power connection and a second power connection, wherein the first power connections are first metal electrodes and wherein the second power connections are second metal electrodes, wherein the first metal electrodes and the second metal electrodes are preferably shielded from the reaction space, wherein each SiC growth substrate is coupled between at least one first metal electrode and at least one second metal electrode for heating the outer surface of the SiC growth substrates or the surface of the deposited SiC to temperatures between 1300 °C and 1800 °C, in particular by means of resistive heating and preferably by internal resistive heating. The base plate preferably comprises at least one cooling element, in particular a base cooling element, for preventing heating the base plate above a defined temperature and/or the side wall section comprises at least one cooling element, in particular a bell jar cooling element, for preventing heating the side wall section above a defined temperature and/or the top wall section comprises at least one cooling element, in particular a bell jar cooling element, for preventing heating the top wall section above a defined temperature. The cooling element is preferably an active cooling element. The base plate and/or side wall section and/or top wall section preferably comprises a cooling fluid guide unit for guiding a cooling fluid, wherein the cooling fluid guide unit is configured limit heating of the base plate and/or side wall section and/or top wall section to a temperature below 1000 °C. A base plate and/or side wall section and/or top wall section sensor unit is preferably provided to detect temperature of the base plate and/or side wall section and/or top wall section and to output a temperature signal or temperature data and/or a cooling fluid temperature sensor is provided to detect the temperature of the cooling fluid, and a fluid forwarding unit is provided for forwarding the cooling fluid through the fluid guide unit, wherein the fluid forwarding unit is preferably configured to be operated in dependency of the temperature signal or temperature data provided by the base plate and/or side wall section and/or top wall section sensor unit and/or cooling fluid temperature sensor. This solution is beneficial since the base plate, the side wall section and the top wall section can be made of metal, in particular steel. A metal base plate, side wall section and a top wall section allows the production of larger reactors and therefore helps to increase the output or to reduce the costs.

The cooling fluid is preferably oil or water, wherein the water preferably comprises at least one additive, in particular corrosion inhibiter/s and/or antifouling agent/s (biocides). The cooling element is preferably a passive cooling element. The cooling element is preferably at least partially formed by a polished steel surface of the base plate, the side wall section and/or the top wall section. The cooling element is preferably a coating, wherein the coating is formed above the polished steel surface and wherein the coating is configured to reflect heat. The coating is preferably a metal coating or a comprises metal, in particular silver or gold or chrome, or alloy coating, in particular a CuNi alloy. The emissivity of the polished steel surface and/or of the coating is preferably below ϵe 0.3, in particular below 0.1 or below 0.03. The base plate preferably comprises at least one active cooling element and one passive cooling element for preventing heating the base plate above a defined temperature and/or the side wall section comprises at least one active cooling element and one passive cooling element for preventing heating the side wall section above a defined temperature and/or the top wall section comprises at least one active cooling element and one passive cooling element for preventing heating the top wall section above a defined temperature. The side wall section and the top wall section are preferably formed by a bell jar, wherein the bell jar is preferably movable with respect to the base plate. More than 50% [mass] of the side wall section and/or more than 50% [mass] of the top wall section and/or more than 50% [mass] of the base plate is made of metal, in particular steel. The SiC growth substrate preferably has an average perimeter of at least 5 cm around a cross-sectional area orthogonal to the length direction of the SiC growth substrate or multiple SiC growth substrates have an average perimeter per SiC growth substrate of at least 5 cm around a cross-sectional area orthogonal to the length direction of the respective SiC growth substrate. The SiC growth substrate preferably comprises or consists of SiC or C, in particular graphite, or wherein multiple SiC growth substrates comprise or consist of SiC or C, in particular graphite. The shape of the cross-sectional area orthogonal to the length direction of the SiC growth substrate preferably differs at least is sections and preferably along more than 50% of the length of the SiC growth substrate and highly preferably along more than 90% of the length of the SiC growth substrate from a circular shape. A ratio U/A between the cross-sectional area A and the perimeter U around the cross-sectional area is preferably higher than 1.2 1/cm and preferably higher than 1.5 1/cm and highly preferably higher than 2 1/cm and most preferably higher than 2.5 1/cm. The SiC growth substrate is preferably formed by at least one carbon ribbon, in particular graphite ribbon, wherein the at least one carbon ribbon comprises a first ribbon end and a second ribbon end, wherein the first ribbon end is coupled with the first metal electrode and wherein the second ribbon end is coupled with the second metal electrode. Alternatively, each of multiple the SiC growth substrates is formed by at least one carbon ribbon, in particular graphite ribbon, wherein the at least one carbon ribbon per SiC growth substrate comprises a first ribbon end and a second ribbon end, wherein the first ribbon end (884) is coupled with the first metal electrode of the respective SiC growth substrate and wherein the second ribbon end is coupled with the second metal electrode of the respective SiC growth substrate. The SiC growth substrate is preferably formed by multiple rods, wherein each rod has a first rod end and a second rod end, wherein all first rod ends are coupled with the same first metal electrode and wherein all second rod ends are coupled with the same second metal electrode. Alternatively, each of multiple SiC growth substrates is formed by multiple rods, wherein each rod has a first rod end and a second rod end, wherein all first rod ends are coupled with the same first metal electrode of the respective SiC growth substrate and wherein all second rod ends are coupled with the same second metal electrode of the respective SiC growth substrate. The SiC growth substrate is preferably formed by at least one metal rod, wherein the metal rod has a first metal rod end and a second metal rod end, wherein the first metal rod end is coupled with the first metal electrode and wherein the second metal rod end is coupled with the second metal electrode. Alternatively, each of multiple SiC growth substrates is formed by at least one metal rod, wherein each metal rod has a first metal rod end and a second metal rod end, wherein the first metal rod end is coupled with the first metal electrode of the respective SiC growth substrate and wherein the second metal rod end is coupled with the second metal electrode of the respective SiC growth substrate. A gas outlet unit for outputting vent gas and a vent gas recycling unit are preferably provided, wherein the vent gas recycling unit is connected to the gas outlet unit, wherein the vent gas recycling unit comprises at least a separator unit for separating the vent gas into a first fluid and into a second fluid, wherein the first fluid is a liquid and wherein the second fluid is a gas, wherein a first storage and/or conducting element for storing or conducting the first fluid is part of the separator unit or coupled with the separator unit and wherein a second storage and/or conducting element for storing or conducting the second fluid is part of the separator unit or coupled with the separator unit.

The vent gas recycling unit preferably comprises a further separator unit for separating the first fluid into at least two parts, wherein the two parts are a mixture of chlorosilanes and a mixture of HCl, H2 and at least one C-bearing molecule and preferably into at least three parts, wherein the three parts are a mixture of chlorosilanes and HCl and a mixture of H2 and at least one C-bearing molecule, wherein the first storage and/or conducting element connects the separator unit with the further separator unit, wherein the further separator unit is coupled with a mixture or chlorosilanes storage and/or conducting element and with a HCl storage and/or conducting element and with a H2 and C storage and/or conducting element, wherein the mixture of chlorosilanes storage and/or conducting element forms a section of a mixture of chlorosilanes mass flux path for conducting the mixture of chlorosilanes into the process chamber, wherein a Si mass flux measurement unit for measuring an amount of Si of the mixture of chlorosilanes is provided as part of the mass flux path prior to the process chamber, in particular prior to a mixing device, and preferably as further Si feed-medium source providing a further Si feed medium.

The above mentioned object is also solved by a PVT source material production method, wherein the PVT source material consists of SiC, in particular of polytype 3C. PVT source material can be understood as SiC material produced in a CVD reactor. The mentioned method comprises the steps of: Providing a source medium inside a process chamber, wherein the process chamber is at least surrounded by a base plate, a side wall section and a top wall section, wherein the base plate comprises at least one cooling element for preventing heating the base plate above a defined temperature and/or wherein the side wall section comprises at least one cooling element for preventing heating the side wall section above a defined temperature and/or wherein the top wall section comprises at least one cooling element for preventing heating the top wall section above a defined temperature electrically energizing at least one SiC growth substrate and preferably a plurality of SiC growth substrates, disposed in the process chamber to heat the SiC growth substrate/s to a temperature in the range between 1300 °C and 2000 °C, wherein each SiC growth substrate comprises a first power connection and a second power connection, wherein the first power connections are first metal electrodes and wherein the second power connections are second metal electrodes, wherein the first metal electrodes and the second metal electrodes are preferably shielded from a reaction space of the process chamber, and Setting a deposition rate, in particular of more than 200 μm/h, for removing Si and C from the source medium and for depositing the removed Si and C as SiC, in particular as polycrystalline SiC, on the SiC growth substrate/s and thereby forming a SiC solid and preventing heating of the base plate and/or the side wall section and/or the top wall section above a defined temperature, in particular 1000 °C. More than 50% [mass] of the side wall section and more than 50% [mass] of the top wall section and more than 50% [mass] of the base plate is preferably made of metal, in particular steel. A base plate and/or side wall section and/or top wall section sensor unit is preferably provided to detect temperature of the base plate and/or side wall section and/or top wall section and to output a temperature signal or temperature data and/or a cooling fluid temperature sensor is provided to detect the temperature of the cooling fluid, and a fluid forwarding unit is preferably provided for forwarding the cooling fluid through the fluid guide unit. The fluid forwarding unit can be configured to be operated in dependency of the temperature signal or temperature data provided by the base plate and/or side wall section and/or top wall section sensor unit and/or cooling fluid temperature sensor. The step of providing a source medium inside a process chamber preferably comprises the steps of introducing at least a first feed-medium, in particular a first source gas, into the process chamber, said first feed medium comprises Si, wherein the first-feed medium has a purity which excludes at least 99.9999% (ppm wt) of the substances B, Al, P, Ti, V, Fe, Ni, and introducing at least a second feed-medium, in particular a second source gas, into the process chamber, the second feed medium comprises C, in particular natural gas, Methane, Ethan, Propane, Butane and/or Acetylene, wherein the second-feed medium has a purity which excludes at least 99.9999% (ppm wt) of the substances B, Al, P, Ti, V, Fe, Ni, and introducing a carrier gas, wherein the carrier gas has a purity which excludes at least 99.9999% (ppm wt) of the substances B, Al, P, Ti, V, Fe, Ni. Alternatively the steps of introducing one feed-medium in particular a source gas, into the process chamber, said feed medium comprises Si and C, in particular SiCl3 (CH3), wherein the feed medium has a purity which excludes at least 99.9999% (ppm wt) of the substances B, Al, P, Ti, V, Fe, Ni, and introducing a carrier gas, wherein the carrier gas has a purity which excludes at least 99.9999% (ppm wt) of the substances B, Al, P, Ti, V, Fe, Ni. The method preferably also comprises a step of setting a pressure inside the process chamber above 1 bar. Introducing a defined amount of a mixture of the first source gas, which provides Si, and the second source gas, which provides C, into the process chamber, wherein the defined amount is an amount between 0.32 g of the mixture per hour and per cm2 of a SiC growth surface and 10 g of the mixture per hour and per cm2 of the SiC growth surface is also preferred. Alternatively, a step of introducing a defined amount of a Si and C containing source gas into the process chamber is preferred, wherein the defined amount is an amount between 0.32 g of the Si and C containing source gas per hour and per cm2 of the SiC growth surface and 10 g of the Si and C containing source gas per hour and per cm2 of the SiC growth surface. Setting a pressure inside the process chamber above 1 bar by introducing a defined amount of a mixture of the first source gas, which provides Si, and the second source gas, which provides C, into the process chamber is a further preferred step. The defined amount is preferably an amount between 0.32 g of the mixture per hour and per cm2 of a SiC growth surface and 10 g of the mixture per hour and per cm2 of the SiC growth surface. Setting a pressure inside the process chamber above 1 bar by introducing a defined amount of a Si and C containing source gas into the process chamber is an alternative step of the method, wherein the defined amount is an amount between 0.32 g of the Si and C containing source gas per hour and per cm2 of the SiC growth surface and 10 g of the Si and C containing source gas per hour and per cm2 of the SiC growth surface.

The SiC growth surface is at the beginning of a production run the surface of all SiC growth substrates on which SiC can be deposited inside the process chamber. Due to deposition of SiC on the SiC growth substrate the deposited SiC forms a new surface, said new surface is the SiC growth surface.

The SiC growth substrate preferably has an average perimeter of at least 5 cm around a cross-sectional area orthogonal to the length direction of the SiC growth substrate or multiple SiC growth substrates have an average perimeter per SiC growth substrate of at least 5 cm around a cross-sectional area orthogonal to the length direction of the respective SiC growth substrate.

The SiC depositing on the SiC growth substrate has preferably impurities of less than 10 ppm (weight) of the substance N and of less than 1000 ppb (weight), in particular of less than 500 ppb (weight), of one or preferably multiple or highly preferably a majority or most preferably all of the substances B, Al, P, Ti, V, Fe, Ni or the SiC depositing on the SiC growth substrate has highly preferably impurities of less than 2 ppm (weight) of the substance N and of less than 100 ppb (weight) of each of the substances B, Al, P, Ti, V, Fe, Ni or the SiC depositing on the SiC growth substrate has most preferably impurities of less than 10 ppb (weight) of the substance Ti. The SiC depositing on the SiC growth substrate has alternatively impurities of less than 10 ppm (weight) of the substance N and of less than 1000 ppb (weight), in particular of less than 500 ppb (weight), of the sum of all of the metals Ti, V, Fe, Ni.

A gas outlet unit for outputting vent gas and a vent gas recycling unit are preferably provided as units which are operated as part of the method of the present invention, wherein the vent gas recycling unit is connected to the gas outlet unit, wherein the vent gas recycling unit comprises at least a separator unit for separating the vent gas into a first fluid and into a second fluid, wherein the first fluid is a liquid and wherein the second fluid is a gas, wherein a first storage and/or conducting element for storing or conducting the first fluid is part of the separator unit or coupled with the separator unit and wherein a second storage and/or conducting element for storing or conducting the second fluid is part of the separator unit or coupled with the separator unit. Additionally, the method preferably comprises the step of providing a source medium inside a process chamber, said step preferably comprises feeding the first fluid from the vent gas recycling unit into the process chamber, wherein the first fluid comprises at least a mixture of chlorosilanes. Disaggregating the SiC solid into SiC particles having an average length of more than 100 μm is a further preferred step of the present method.

The above mentioned object is also solved by a PVT source material produced according to any of the before mentioned methods.

The above mentioned object is also solved by a method for the production of at least one SiC crystal. The method for the production of at least one SiC crystal comprises the step: Providing a PVT reactor for the production of at least one SiC crystal, wherein the PVT reactor comprises a furnace unit, wherein the furnace unit comprises a furnace housing with an outer surface and an inner surface, at least one crucible unit, wherein the crucible unit is arranged inside the furnace housing, wherein the crucible unit comprises a crucible housing, wherein the crucible housing has an outer surface and an inner surface, wherein the inner surface at least partially defines a crucible volume, wherein a receiving space for receiving a source material is arranged or formed inside the crucible volume, wherein a seed holder unit for holding a defined seed wafer is arranged inside the crucible volume, wherein the seed wafer holder holds a seed wafer, wherein the furnace housing inner wall and the crucible housing outer wall define a furnace volume, at least one heating unit for heating the source material, wherein the receiving space for receiving the source material is at least in parts arranged above the heating unit and below the seed holder unit, adding PVT source material produced according to any herein disclosed method respectively produced in a herein disclosed CVD reactor as source material into the receiving space, sublimating the added PVT source material and depositing the sublimated SiC on the seed wafer and thereby forming the at least one or exactly one SiC crystal. This solution is beneficial since due to the properties of the PVT furnace a SiC crystal growth fast. Furthermore, since the PVT source material has a specific form factor (particles having a length lager than 100 μm) sublimation happens in a very efficient manner.

The PVT reactor comprises according to a preferred embodiment of the present invention a crucible gas flow unit, wherein the crucible gas flow unit comprises a crucible gas inlet tube for conducting gas into the crucible volume, wherein the crucible gas inlet tube is arranged in vertical direction below the receiving space and the method preferably also comprises the step of conducting gas via the crucible gas flow unit into the crucible housing.

The above mentioned object is also solved by a SiC crystal produced according to a herein disclosed method according to the present invention.

The above mentioned object is also solved by a SiC crystal, wherein the SiC crystal has impurities of less than 1000 ppb (weight), in particular of less than 500 ppb (weight), of each of the substances B, Al, P, Ti, V, Fe, Ni and highly preferably of less than 100 ppb (weight) of each of the substances B, Al, P, Ti, V, Fe, Ni or of less than 10 ppb (weight) of the substances Ti.

Additionally or alternatively the SiC crystal has impurities of less than 1000 ppb (weight), in particular of less than 500 ppb (weight), of the sum of all of the metals Ti, V, Fe, Ni.

The SiC crystal is according to a further preferred embodiment of the present invention a monocrystalline SiC crystal forming a monolithic block, wherein the monolithic block has a volume of more than 100 $cm^3$ and preferably of more than 500 $cm^3$ and most preferably of more than 1000 $cm^3$. The monolithic block has most preferably a volume of more than 400 $cm^3$ and preferably of more than 5000 $cm^3$ and most preferably of more than 10000 $cm^3$.

It is possible to use the term "elements" in exchange to "substances" or "element" in exchange to "substance".

Further advantages, objectives and features of the present invention are explained with reference to the following description of accompanying drawings, in which the device(s) according to the invention are shown by way of example. Components or elements of the device according to the invention, which at least substantially correspond in the figures with respect to their function, can be marked with the same reference signs, whereby these components or elements do not have to be numbered or explained in all figures.

Individual or all representations of the figures described in the following are preferably to be regarded as construction drawings, i.e. the dimensions, proportions, functional relationships and/or arrangements resulting from the figure or figures preferably correspond exactly or preferably substantially to those of the device according to the invention or the product according to the invention or the method according to the invention.

DETAILED DESCRIPTION

Figure 1:
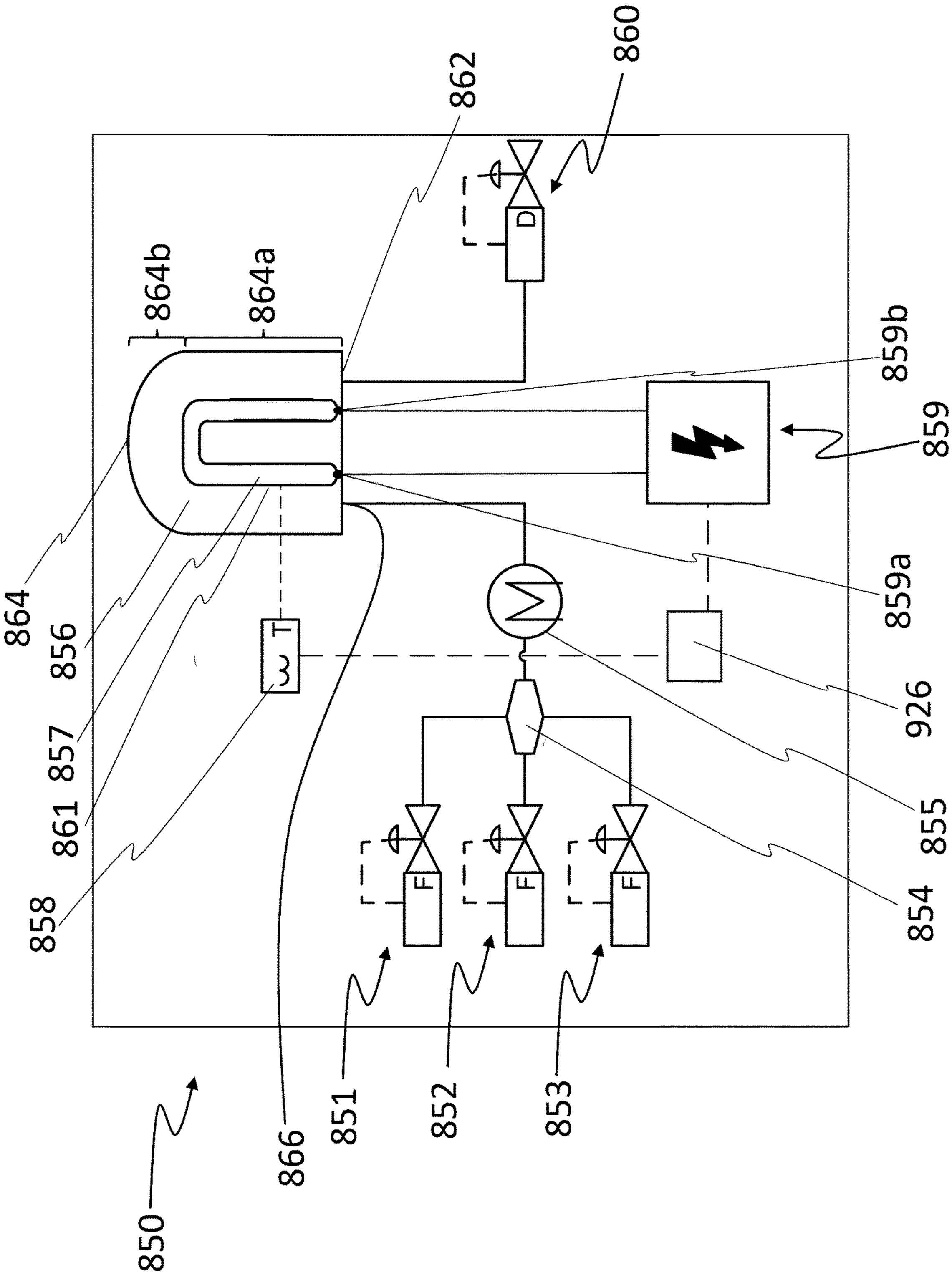
FIG. 1 schematically an example of a device for carrying out a method according to the invention, and FIG. 2 schematically showing an example of a PVT reactor into which the SiC solid-state material according to the invention is introduced as starting material.

FIG. 1 shows an example of a manufacturing device 850 for producing SiC material, in particular 3C-SiC material. This device 850 comprises a first feeding device 851, a second feeding device 852 and a third feeding device 853. The first feed device 851 is preferably designed as a first mass flow controller, in particular for controlling the mass flow of a first source fluid, in particular a first source liquid or a first source gas, wherein the first source fluid preferably comprises Si, in particular e.g. silanes/chlorosilanes of the general composition SiH4-mClm or organochlorosilanes of the general composition SiR4-mClm (where R=hydrogen, hydrocarbon or chlorohydrocarbon). The second feed device 852 is preferably designed as a second mass flow controller, in particular for controlling the mass flow of a second source fluid, in particular a second source liquid or a second source gas, wherein the second source fluid preferably comprises C, e.g. hydrocarbons or chlorohydrocarbons, preferably with a boiling point <100 °C, particularly preferably methane. The third feed device 853 is preferably designed as a third mass flow controller, in particular for controlling the mass flow of a carrier fluid, in particular a carrier gas, wherein the carrier fluid or carrier gas preferably comprises H or H2, respectively, or mixtures of hydrogen and inert gases.

The reference sign 854 indicates a mixing device or a mixer by which the source fluids and/or the carrier fluid can be mixed with one another, in particular in predetermined ratios. The reference sign 855 indicates an evaporator device or an evaporator by which the fluid mixture which can be supplied from the mixing device 854 to the evaporator device 855 can be evaporated.

The evaporated fluid mixture is then fed to a process chamber 856 or a separator vessel, which is designed as a pressure vessel. At least one deposition element 857 and preferably several deposition elements 857 are arranged in the process chamber 856, wherein Si and C are deposited from the vaporized fluid mixture at the deposition element 857 and SiC is formed.

The reference sign 858 indicates a temperature measuring device, which is preferably provided for determining the surface temperature of the deposition element 857 and is preferably connected to a control device (not shown) by data and/or signal technology.

The reference sign 859 indicates an energy source, in particular for introducing electrical energy into the separating element 857 for heating the separating element. The energy source 859 is thereby preferably also connected to the control device in terms of signals and/or data. Preferably, the control device controls the energy supply, in particular power supply, through the deposition element 857 depending on the measurement signals and/or measurement data output by the temperature measurement device 858.

Furthermore, a pressure holding device is indicated by the reference sign 860. The pressure holding device 860 can preferably be implemented by a pressure-regulated valve or the working pressure of a downstream exhaust gas treatment system.

Figure 2:
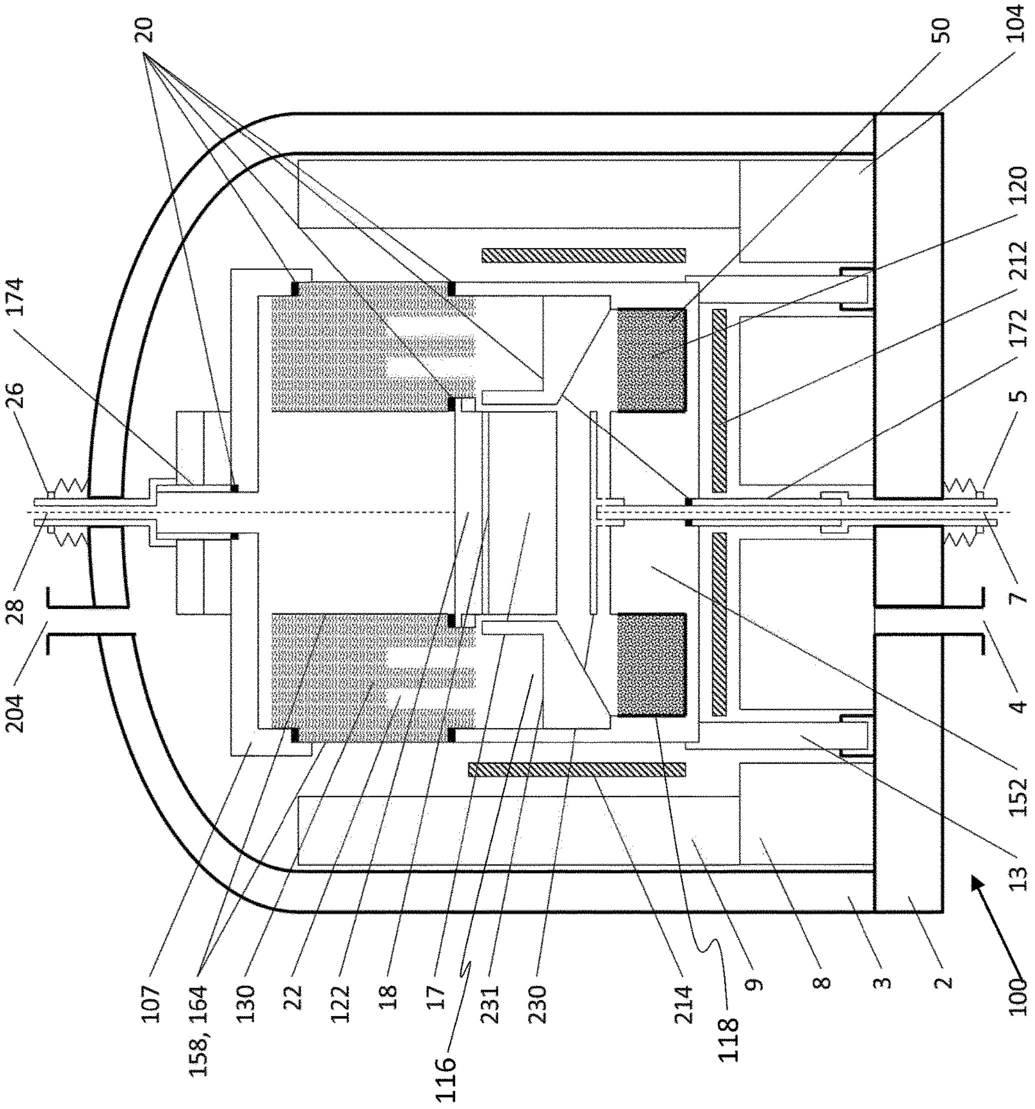

FIG. 2 shows an embodiment of a furnace or a furnace apparatus 100 or a PVT furnace or a PVT reactor according to the principles of the present invention, wherein the SiC solid-state material produced according to the invention, in particular 3C-SiC is introduced into this PVT furnace or PVT reactor as starting material for the production of preferably single-crystalline SiC solid-state material. The furnace 100 has a cylindrical shape and comprises a lower furnace unit or lower furnace housing 2 and an upper furnace unit or upper furnace housing 3, both typically of double-walled, water-cooled stainless steel construction, defining a furnace volume 104. The lower furnace housing 2 has a furnace gas inlet 4 and the upper furnace housing 3 has a furnace vacuum outlet or furnace vacuum outlet 204. Inside the furnace volume 104 is a crucible unit supported by crucible legs 13. Below the crucible unit is an axial heating element 214 and around the sides of the crucible unit is a radial heating element 212. Below the axial heating element 214 is a bottom insulation 8 and around the radial heating element 212 is a side insulation 9. The lower crucible housing 152 has a solid central portion surrounded by an annular trench into which the feedstock material 50 is loaded. A crucible gas inlet tube 172 seals against the lower central portion of the lower crucible housing 152, and process gases such as argon and nitrogen flow through a well in the solid central portion and are distributed into the crucible volume by a gas distribution plate 190. The crucible gas inlet tube or crucible gas inlet pipe 172 is connected to an adjustable crucible gas inlet 5 that extends through the furnace lower housing 2.

The crucible lower housing 152 also includes a growth directing element 230 used to tune the heat field and vapor flow around the sides of the crystal 17. The crystal 17 grows on a seed wafer 18 that is attached to a seed holder 122. The seed holder 122 seals against the lower inner edge of a thick-walled tubular filter or filter unit 130. The lower crucible housing 152 seals against the lower outer edge of this filter 130. The filter includes filter grooves 22 to increase surface area for removal of excess SiC2 and Si2C sublimation vapors. The filter 130 also includes a filter outer surface coating 158, 164 on its inner and outer walls to minimize permeability to Si vapor.

The upper outer edge of the filter 130 seals against a crucible lid or filter cover 107 or a crucible upper housing 154, which in turn seals against a crucible vacuum outlet tube 174. The crucible vacuum outlet tube 174 is connected to an adjustable crucible vacuum outlet 26 which extends through the furnace upper housing 3. All sealing surfaces are provided with seals 20.

The crucible gas inlet tube 172, the crucible unit, the seed holder unit 122, the filter 130, the filter cover 107, and the crucible vacuum outlet tube 174 define a crucible volume 116. The temperature of the bottom of the gas distribution plate 190 is measured by a pyrometer along the lower pyrometer sight line 7. The temperature of the top of the seed holder 122 is measured with a pyrometer along the upper pyrometer sight line 28.

The oven 100 is operated under conditions of high temperature and low pressure. First, the oven volume 104 and crucible volume 116 are purged of air with an inert gas such as argon to prevent oxidation. Then, axial heating element 214 and radial heating element 212 are used to create a thermal field inside crucible volume 116 such that the temperature of the bottom of gas distribution plate 190 is typically in the range of 2200-2400 °C and the temperature of the crystal growth surface is typically in the range of 2000-2200 °C, with flat radial isotherms throughout crystal 17. The lower temperature of crystal 17 is achieved by having little or no insulation above seed crystal holder 122, allowing heat to pass through crystal 17 and seed crystal holder 122 and radiate to the water-cooled inner wall of upper furnace housing 3.

The pressure inside the crucible volume 116 during crystal growth is typically in the range of 0.1-50 Torr and is slightly lower than the pressure inside the furnace volume 104. This negative relative pressure inside the crucible volume 116 minimizes the leakage of sublimation vapors into the furnace volume 104.

Under the temperature and pressure conditions described, the starting material sublimates, releasing Si, SiC2, and Si2C vapors. The temperature gradient between the starting material 50 and the cooler crystal 17 drives these sublimation vapors toward the crystal 17, where the SiC2 and Si2C vapors become incorporated into the crystal 17 and lead to its growth. Excess SiC2 and Si2C vapors form polycrystalline deposits on the sides of the seed holder unit 122, the lower surfaces of the filter 130, and the upper inner walls of the crucible unit. In one embodiment, a low flow rate of Argon and/or nitrogen convectively assists in the thermally driven diffusion of the sublimation vapors to the crystal 17. In another embodiment, a low flow rate of nitrogen is added to dope the crystal 17 and modify its electrical properties. The gas flows radially outward from the gas distribution plate 190 and mixes with the sublimation vapors rising from the starting material 50.

All components within the furnace volume 104 are made of materials that are compatible with the operating temperatures and pressures and that do not contaminate the crystal 17. In one embodiment, the bottom insulation 8 and side insulation 9 may be made of graphite felt or graphite foam. The axial heating element 214 and the radial heating element 212 may be made of graphite, as may the crucible legs 13 and the crucible gas inlet tube 172.

The crucible base 152, the gas distribution plate or gas distribution plate 190, the wax-tumor conducting element 230, and the seed holder or seed holder 122 can be made of materials that also minimize permeation of the Si vapor. These materials include glassy infiltrated graphite, glassy carbon, pyrocarbon coated graphite, and tan-talkarbide ceramics and coatings. While graphite has a permeability of 10−1 cm/s, glassy infiltrated graphite has a permeability of 10−3 cm/s, glassy carbon has a permeability of 10−11 cm/s, and pyrocarbon coated graphite has a permeability of 10−12 cm/s. The Si vapor generated from the sublimating feedstock 50, which does not significantly permeate these components or is embedded in the crystal 17, passes between the growth guide element 230 and the crystal 17 or the growing crystal and enters the filter 130.

The filter 130 comprises a porous material having a large surface area. In one embodiment, this material is activated carbon powder with a unit surface area of about 2,000 m2/g bonded with a high temperature binder such as carbonized starch. The inner and outer walls of the filter 130 have filter outer surface coatings 158, 164 made of a material that minimizes permeation of Si vapor. In one embodiment, this material is a glassy carbon coating. Since the Si vapor does not substantially permeate the outer surface coatings 158, 164 of the filter, the Si vapor rises further into the filter 130 and eventually condenses in the upper portion of the filter 130 due to the lower temperatures.

Thus, the present invention may relate to a method or furnace device or apparatus for PVT growth of single crystal/s, particularly SiC single crystal/s, having multiples or all of the features or steps listed below:

Providing a furnace housing capable of housing a crucible unit, heating elements and insulation, the furnace housing also having an adjustable lower crucible gas inlet tube and an adjustable upper crucible vacuum outlet tube. Providing a crucible unit and a growth guide, both of which are substantially impermeable to Si vapor. Loading the crucible unit with SiC source material.

Providing a lid assembly for the crucible unit, comprising: A large surface area annular porous filter for trapping Si sublimation vapors, having outer and inner vertical tubular surfaces coated with a coating that is substantially impermeable to Si vapor and having upper and lower outer circumferential sealing shoulders; a seed holder. A filter comprising: a plurality of filter elements coated with a coating that is substantially impermeable to Si-vapor and that has upper and lower outer circumferential sealing shoulders; a seed holder that is also substantially impermeable to Si-vapor and that is attached to and seals the lower inner opening of the filter; a SiC single crystal seed attached to the seed holder; a filter cap that seals against the upper outer circumferential sealing shoulder of the filter and that also seals against the vacuum outlet tube of the crucible.

Raising the crucible gas inlet tube and lowering the crucible vacuum outlet tube so that the crucible gas inlet tube presses and seals against the crucible unit, the crucible unit presses and seals against the lower outer circumferential sealing shoulder of the filter, the upper outer circumferential sealing shoulder of the filter presses and seals against the filter cap, and the filter cap presses and seals against the crucible vacuum outlet tube. Providing seals at all seal interfaces to improve the gas tightness of the seal interfaces.

Creating an inert vacuum in the crucible volume defined by the crucible unit and filter assembly. Creating an inert vacuum in the furnace volume via a separate furnace gas inlet and a separate furnace vacuum outlet.

Maintaining the crucible volume at a lower pressure than the furnace volume. Heating and sublimation of the starting material.

Activating the flow of carrier and dopant gases, if required, into the crucible unit. Grow the crystal while confining the Si vapor in the filter, preventing the Si vapor from penetrating and coating the crucible unit, heating elements, insulation, and any other components in the furnace volume.

Therefore, a PVT furnace is preferably provided for the production of SiC single crystal/s in which the sublimating Si vapors are prevented from penetrating the crucible housing wall, heating elements, and insulation. First, the penetration of Si vapor into these components changes their thermal properties, making it difficult to grow a good crystal because the thermal field is not stable. Second, the physical structure of these components is eventually destroyed by the Si. Therefore, the present PVT furnace avoids such infiltration.

This is preferably achieved by making the walls, in particular the inner walls of the crucible housing, impermeable to Si vapor and/or by removing the Si vapor from the gas mixture inside the crucible volume, in particular by adsorption and condensation or by deposition on a surface, which surface may be a fil-ter. This surface may be located, for example, inside the crucible unit or outside the crucible unit, but inside the furnace or even outside the entire furnace unit. In case this surface is located outside the crucible unit, fluid communication is preferably provided by means of at least one pipe or pipe system to functionally connect this surface to the crucible volume.

In this way, heating elements can be introduced into the furnace volume and generate the thermal field necessary for the growth of large diameter boules without worrying about the heating elements being destroyed by the Si vapor. In this way, the life of the insulation and the crucible housing can be drastically extended. In addition, since all of these materials have stable thermal properties, a higher yield of boules meeting specifications is possible.

In principle, the present invention also relates to the introduction of SiC solid-state material produced in accordance with the invention, in particular 3C-SiC, into a furnace apparatus 100, in particular a furnace apparatus 100 for growing crystals, in particular for growing SiC crystals, in particular monocrystalline crystals. The furnace apparatus comprises a furnace unit 104, wherein the furnace unit 102 comprises a furnace housing 108, at least one crucible unit, wherein the crucible unit is arranged within the furnace housing 108, wherein the crucible unit comprises a crucible housing 110, wherein the housing 110 comprises an outer surface 112 and an inner surface 114, wherein the inner surface 114 at least partially defines a crucible volume 116, wherein a receiving space 118 for receiving a starting material 50 is disposed or formed within the crucible volume 116, wherein a seed holder unit 122 for holding a defined seed wafer 18 is disposed within the crucible volume 116, and at least one heating unit 124 for heating the starting material 50, wherein the receiving space 118 for receiving the starting material 50 is disposed at least partially between the heating unit 124 and the seed holder unit 122.

Further, the present invention relates to a reactor 100, and more particularly to a reactor 100 for crystal growth, and more particularly for SiC crystal growth. The reactor comprises a furnace 102, the furnace 102 comprising a furnace chamber 104, at least one crucible, the crucible being arranged within the furnace chamber 104, the crucible comprising a frame structure 108, the frame structure 108 comprising a housing 110, the housing 110 comprising an outer surface 112 and an inner surface 114, the inner surface 114 at least partially forming a crucible chamber 116, wherein a receiving space 118 for receiving a source material 50 is disposed or formed within the crucible chamber 116, wherein a seed holder unit 122 for holding a defined seed wafer is disposed within the crucible chamber 116, and at least one heating unit 124 for heating the source material 50, wherein the receiving space 118 for receiving the source material 50 is disposed at least partially between the heating unit 124 and the seed holder unit 122.

Thus, the present invention relates to a method for producing a preferably elongated SiC solid, in particular of poly-type 3C. The method according to the invention preferably comprises at least the following steps:

Introducing at least a first source gas into a process chamber, the first source gas comprising Si, introducing at least a second source gas into the process chamber, the second source gas comprising C, electrically energizing at least one separator element disposed in the process chamber to heat the separator element, setting a deposition rate of more than 200 μm/h, wherein a pressure in the process chamber of more than 1 bar is generated by the introduction of the first source gas and/or the second source gas, and wherein the surface of the deposition element is heated to a temperature in the range between 1300 °C and 1700 °C.

Figure 3:
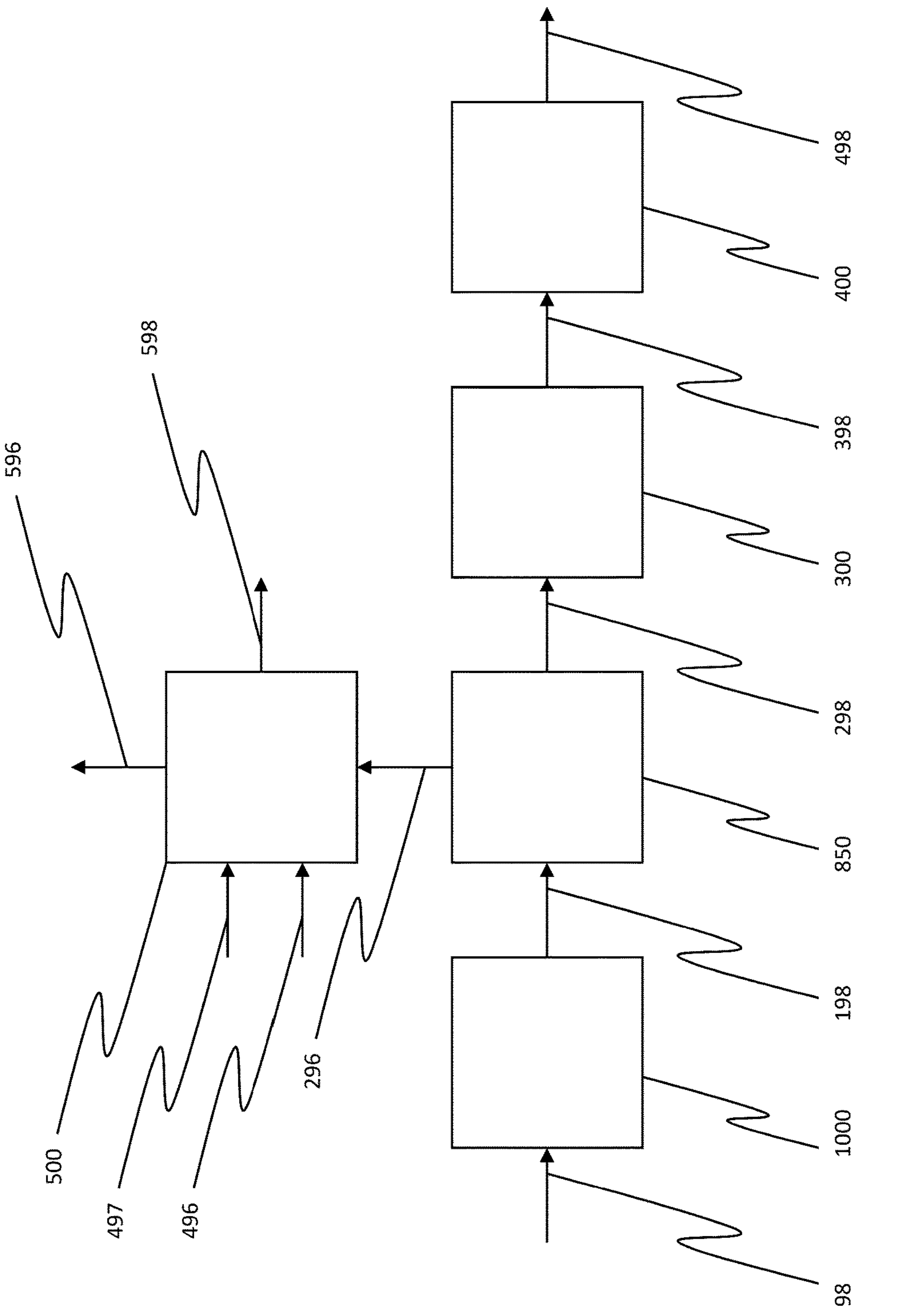
FIG. 3 shows an example of the CVD SiC apparatus according to the present invention, wherein also a vent gas treatment unit is shown.

In one preferred embodiment of the present invention, FIG. 3 shows preferred main units of the SiC, in particular UPSiC, production reactor 850, in particular for the production of SiC, wherein the SiC production reactor 850 comprises according to this embodiment a SiC vent gas treatment. The separate feed gases 98 are pumped from their respective storage units to the feed gas unit 1000 where there are mixed in the required mass ratios to form the feed gas mixture 198. The feed gas mixture 198 is the fed to the CVD unit respectively CVD reactor respectively SiC production reactor, in particular SiC PVT source material production reactor, 850 where the deposition reaction occurs resulting in the production of SiC rods 298 and vent gas 296. The vent gas 296 is routed to the vent gas treatment unit 500 where preferably scrubber inlet water 496 is used to remove Si-bearing compounds and HCl from the vent gas 296. The scrubber outlet water 598 containing the absorbed Si-bearing compounds and HCl is discharged and the scrubbed vent gas is preferably sent to a flare for combustion. The flare can use flare combustion gas 497 such as natural gas to achieve the combustion of the scrubbed vent gas and the resulting flare exhaust gas is discharged.

The SiC rods 298 are preferably conveyed to the comminution unit 300 where they are reduced to the required form factor, e.g., granules. Also, any heterogenous material, e.g., graphite seed rods, are preferably separated from the SiC material in such a manner as to minimize any residual contamination from this material, e.g., by heating the SiC to at least 1500 °C to burn off any residual graphite. The SiC, in particular UPSiC, granules 398 are preferably conveyed to the acid etching unit 400 where they preferably undergo an additional or alternative surface cleaning step of acid etching in an acid bath. Finally, the SiC, in particular UPSiC, etched granules 498 which have been washed and dried after the acid bath are ready for packaging and shipment.

Figure 4:
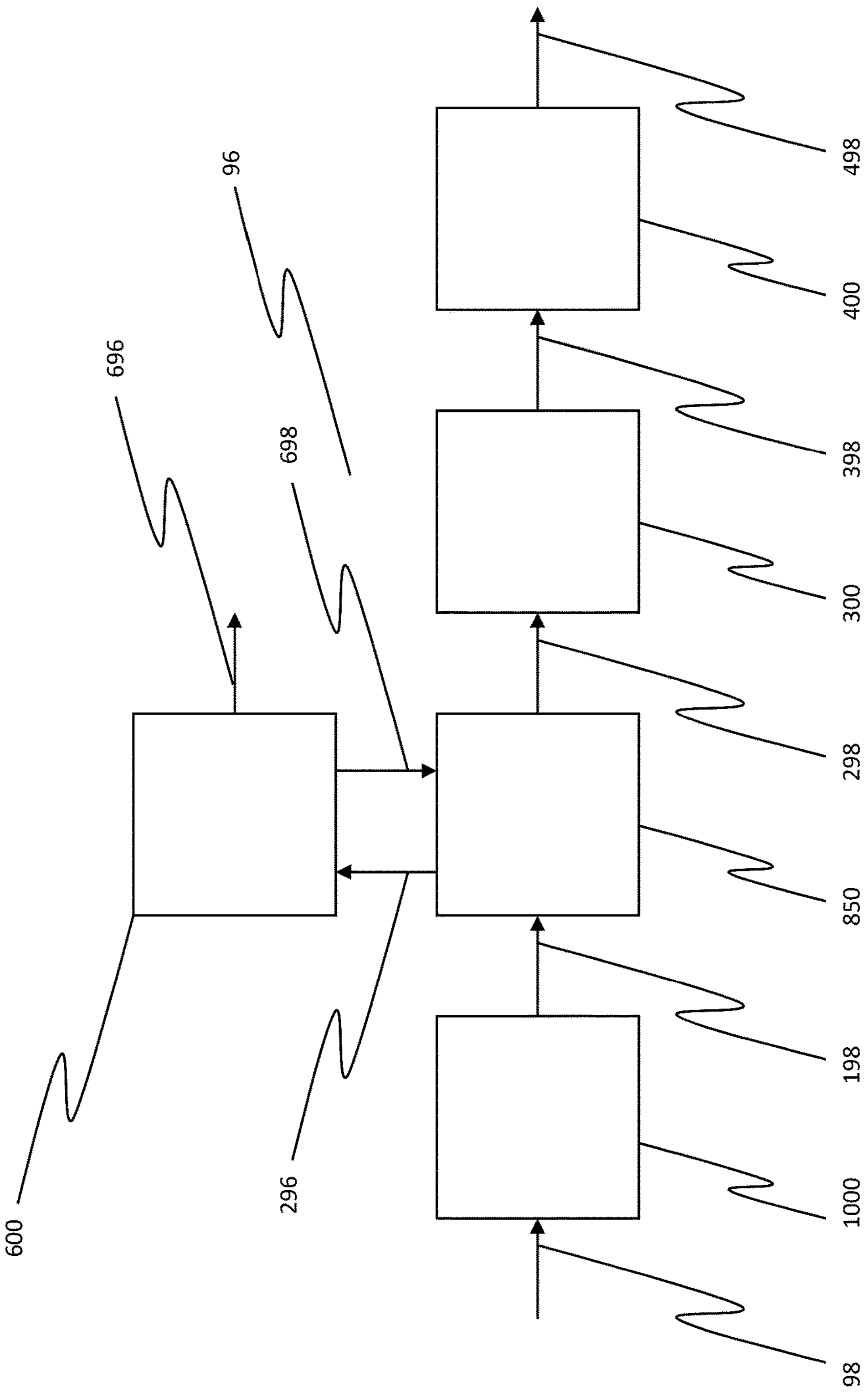
FIG. 4 shows an example of the CVD SiC apparatus according to the present invention, wherein also a vent gas recovery unit is shown.

In another preferred embodiment of the present invention, FIG. 4 shows the main units of the entire CVD SiC, in particular UPSiC, apparatus 850 in this case with vent gas recycling. Here the vent gas 296 exits the CVD unit respectively CVD reactor respectively SiC production reactor, in particular SiC PVT source material production reactor, 850 and is routed to the vent gas recycling unit 600. HCl is preferably separated from the vent gas 296 and exits the vent gas recycling unit 600 as the HCl discharge 696. The recycled vent gas 698 is then fed back to the CVD unit respectively CVD reactor respectively SiC production reactor, in particular SiC PVT source material production reactor, 850 thus reducing the amount of fresh feed gas mixture 198 required and reducing production costs.

Since product purity is highly beneficial, in the apparatuses described in FIGS. 3 and 2, preferably extreme care is taken not to introduce any contaminants, particularly trace metals and nitrogen or oxygen into the feed gases or any intermediate and final products. Virtually all equipment and piping is fabricated from metals, particularly various steel alloys, but they are highly preferably kept at temperatures where the entrainment of metal particles into the feed gases and products is minimized. The feed gases and products are preferably further isolated from any moisture or air that could result in nitrogen and or oxygen contamination. Nitrogen could be used as a blanket and purge gas in tanks, pipes and vessels, but it is preferably removed from any liquid feedstocks with degassing equipment and any nitrogen purge gases are preferably chased with hydrogen to minimize the possibility of nitrogen contamination.

Figure 5:
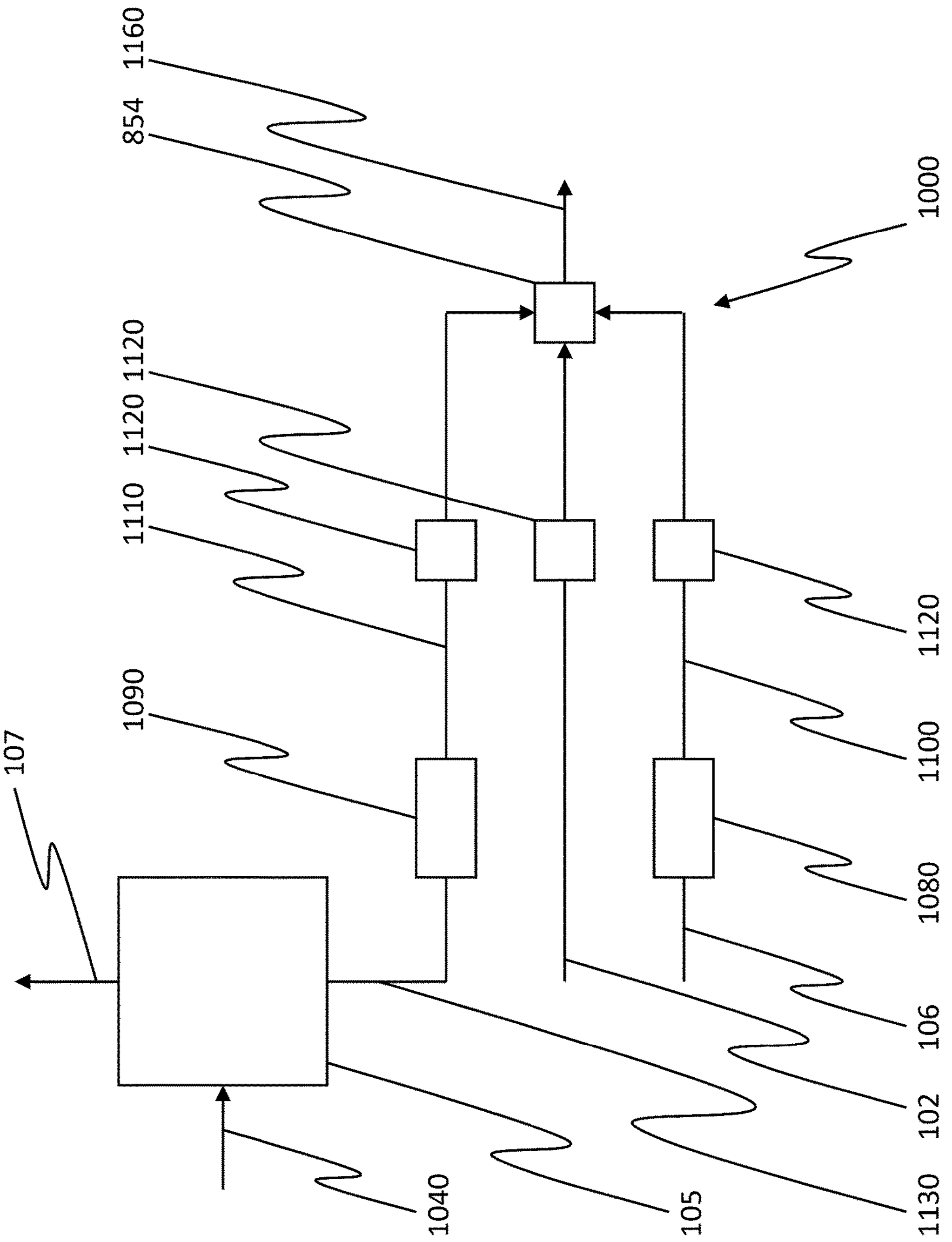
FIG. 5 shows an example of a feed gas unit according to the present invention with three gases.

FIG. 5 shows an example of the preparation of three separate feed gases into the feed gas mixture 1160 in the feed gas unit 1000. First, a preferably industrial C-bearing gas 1040 preferably natural gas needs to be purified of excess nitrogen to result in a C-bearing gas 111 pure enough for use in the manufacture of SiC, in particular UPSiC. Thus, the industrial C-bearing gas 1040 is highly preferably routed to a cryogenic distillation unit 105 where the low temperatures cause the industrial C-bearing gas 1040 to condense into its liquid state. Any contaminating nitrogen remains in its gaseous state and exits as N gas discharge 1070 from the top of the cryogenic distillation unit 105. Meanwhile the C-bearing liquid 1130 preferably exits from the bottom of the cryogenic distillation unit 105 and preferably pumped to a C-bearing liquid evaporator 1090 where it is evaporated into C-bearing gas 111. The C-bearing gas 111 mass flow rate is adjusted by the mass flow meter 1120 and the correct flowrate of C-bearing gas is preferably routed to the mixer respectively mixing device 854.

Already purified hydrogen gas 102 is preferably also passed through a mass flow meter 1120 and fed to the mixer respectively mixing device 854 in the correct ratio respectively a defined ratio with the C-bearing gas 111. Finally, an already purified Si-bearing liquid 106 preferably silicon tetrachloride (STC) is fed to a Si-bearing liquid evaporator 1080 and evaporated into Si-bearing gas 110. This Si-bearing gas 110 is preferably also fed to a mass flow meter 1120 and preferably sent to the mixer 114 in the correct respectively in a defined mass flow ratio to the hydrogen gas 102 and/or the C-bearing gas 111. The mixer 114 ensures that the three gases are homogenously mixed and outputs the feed gas mixture 1160.

Figure 6:
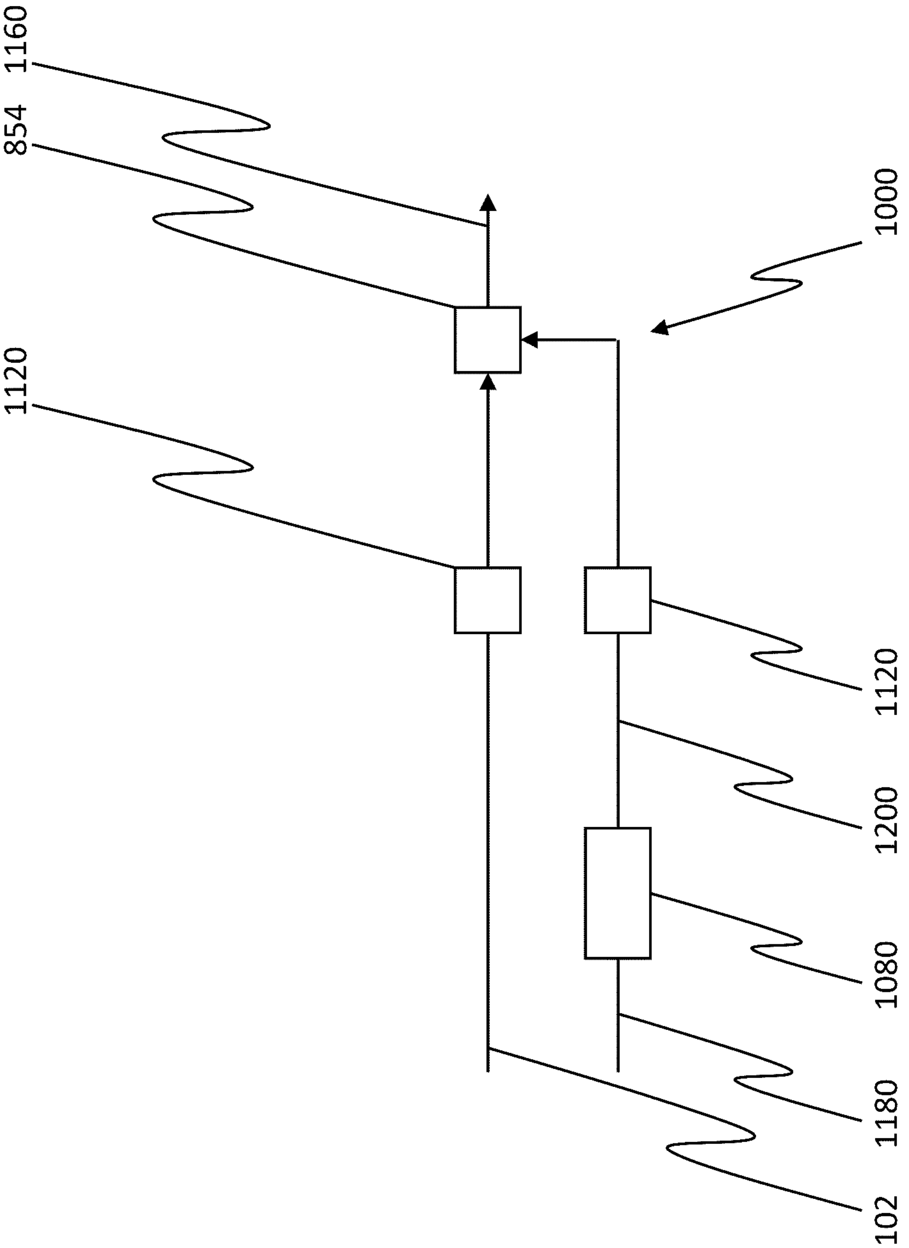
FIG. 6 shows an example of the feed gas unit according to the present invention with two gases.

In another preferred embodiment of the present invention shown in FIG. 6, a single C/Si-bearing liquid 1180 is evaporated in Si-bearing liquid evaporator 1080 to become C/Si-bearing gas 1200. This C/Si-bearing gas 1200 is preferably sent to mass flow meter 1120 where its mass flowrate is preferably adjusted to create the required or defined mass ratio with hydrogen gas 102 which preferably has also passed through a mass flow meter 1120. The two gases are preferably mixed into a homogenous mixture in the mixer respectively mixing device 854 and exit as the feed gas mixture 1160.

Figure 7:
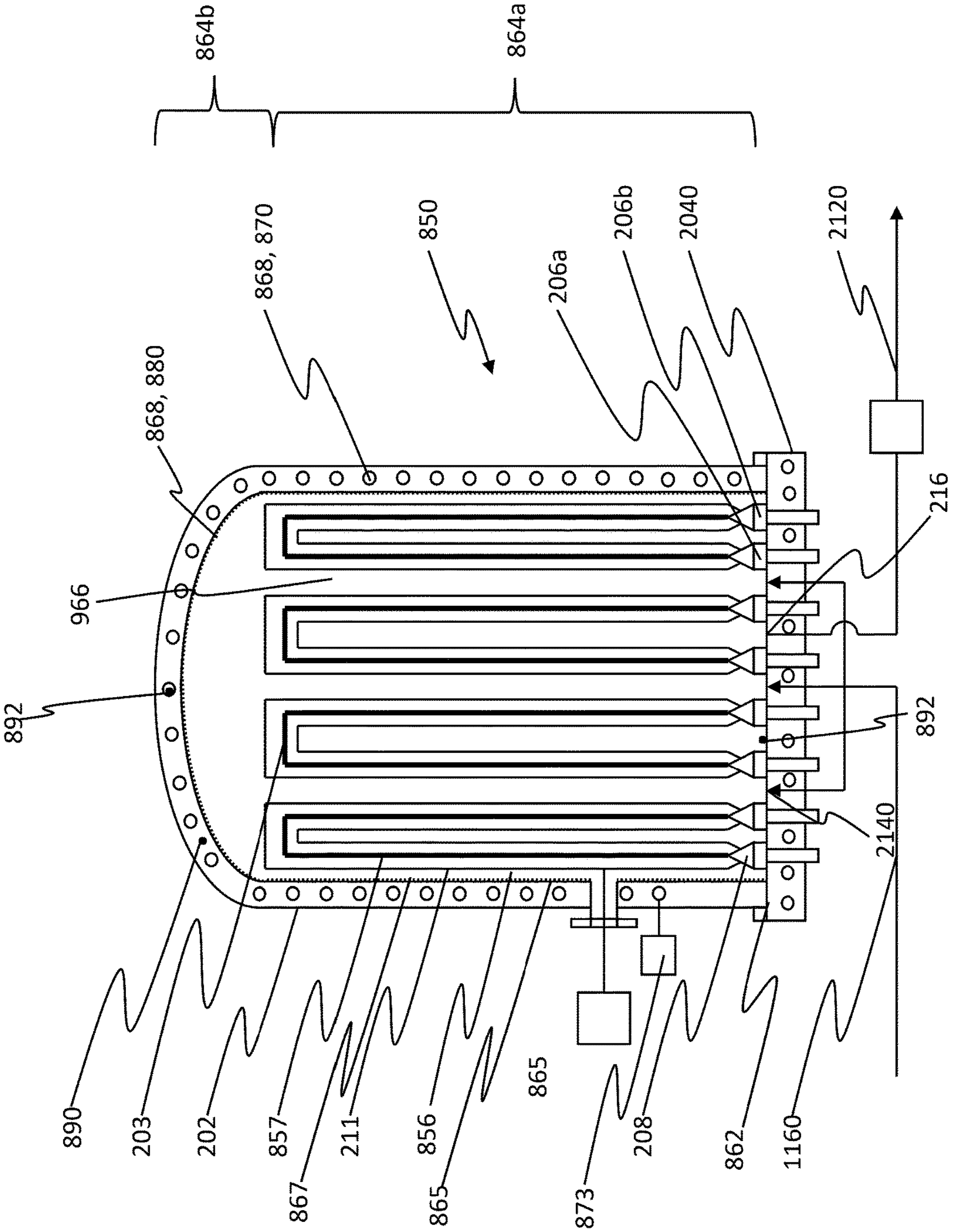
FIG. 7 shows an example of the CVD unit side view cross section according to the present invention.

FIG. 7 shows the CVD unit respectively CVD reactor respectively SiC production reactor, in particular SiC PVT source material production reactor, 850 of one preferred embodiment of the present invention. The CVD unit respectively CVD reactor respectively SiC production reactor, in particular SiC PVT source material production reactor, 850 preferably comprises a fluid, in particular oil or water, cooled steel upper housing 202 or bell jar which seals, in particular by means of one or multiple gaskets, against a preferably fluid, in particular oil or water, cooled lower housing 2040 or base plate creating a deposition chamber respectively process chamber 856 which can be pressurized preferably to at least 6 bar, in particular to a pressure between 2 bar and 15 bar. The feed gas mixture 1160 preferably enters the deposition chamber respectively process chamber 856 through a plurality of feed gas inlets 2140 and the vent gas 2120 preferably exists through the gas outlet unit respectively vent gas outlet 216. Inside the deposition chamber preferably a plurality of resistively self-heated deposition substrates respectively SiC growth substrate 857 preferably made of graphite or silicon carbide or metal are provided which are connected to chucks 208 which are preferably made of graphite. The chucks 208 are in turn connected to water cooled electrodes 206 preferably made of copper which pass through the baseplate so that they can be connected to an external source of electrical power. The deposition substrates respectively SiC growth substrate 857 are preferably arranged as pairs via cross members 203 to complete an electrical circuit for resistive heating.

The purpose of the chucks 208 is to create a temperature gradient between the electrodes 206 which are in a temperature range of preferably between 850 and 400 °C and the deposition substrate respectively SiC growth substrate 857 which is preferably in temperature range of 1300 and 1600 °C. The chuck 208 preferably achieves this by having a continuously reducing current flow cross section area resulting in higher and higher resistive heating. Thus, the chuck 208 preferably has a conical shape. In this manner the starting point for the deposition of CVD SiC crust 211 can be controlled preferably to a point for example midway up the chuck 208 such that the final deposition substrate respectively SiC growth substrate 857 with the deposited CVD SiC crust 211 has a structurally strong connection at the bottom and will not break or fall over.

The plurality of feed gas inlets 2140 is preferably designed to create a turbulent gas flow pattern inside the deposition chamber respectively process chamber 856 so as to maximize the contact of fresh feed gas with the surface of the CVD SiC crust 211 being deposited on the deposition substrates respectively SiC growth substrate 857. Additionally or alternatively it is possible to provide a gas turbulence generating apparatus, in particular inside the process chamber. The gas turbulence generating apparatus can be a ventilator or circulator pump. This ensures that a minimum excess of feed gas mixture 1160 is used to produce a given quantity of CVD SiC crust 211. The vent gas 2120 which contains unreacted feed gas mixture as well as altered Si-bearing gas and HCl gas is forced out of the deposition chamber respectively process chamber 856 through the vent gas outlet by the incoming feed gas mixture 1160.

Figure 7A:
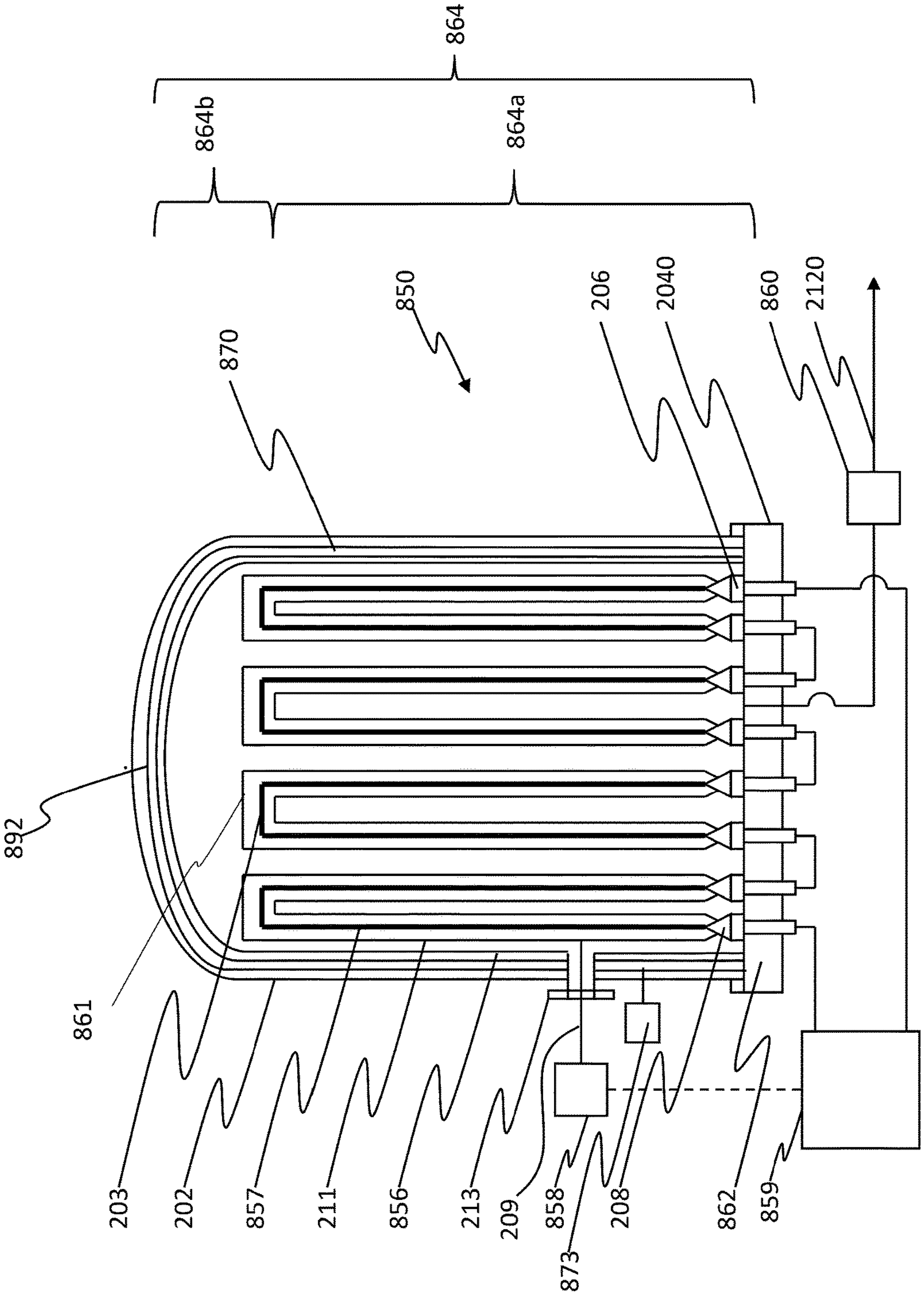
FIG. 7*a* shows an example of the temperature and pressure control method for the CVD unit according to the present invention.

FIG. 7*a*. shows examples of the temperature and pressure control methods for the CVD unit. A temperature control unit respectively temperature measuring device 858 is positioned such that to measure the temperature of the CVD SiC crust 211 along the temperature measurement path 209 preferably through the sight glass 213 which is preferably fluid, in particular oil or water, cooled. The temperature control unit respectively temperature measuring device 858 preferably measures the temperature of the surface of the CVD SiC crust and sends a signal to the power supply unit respectively energy source 859 to increase or decrease power to the deposition substrates respectively SiC growth substrate 857 depending on whether the temperature is below or above the desired temperature respectively. The power supply unit respectively energy source 859 is wired to the fluid, in particular oil or water cooled electrodes 206 and adjusts voltage and/or current to the fluid, in particular oil or water, cooled electrodes 206 accordingly. The deposition substrates respectively SiC growth substrate 857 are wired in pairs and have connecting cross members at the top so as to form a complete electrical circuit for the flow of current.

Pressure inside the deposition chamber respectively process chamber 856 is adjusted by means of a pressure control unit respectively pressure maintaining device 860 which senses the pressure and decreases or increases the flowrate of vent gas 2120 from the deposition chamber respectively process chamber 856.

Thus, as shown in FIGS. 7 and 7*a* the SiC production reactor 850 according to the present invention preferably comprises at least a process chamber 856, wherein the process chamber 856 is at least surrounded by a base plate 862, a side wall section 864*a* and a top wall section 864*b*. the reactor 850 preferably comprises a gas inlet unit 866 for feeding one feed-medium or multiple feed-mediums into a reaction space of the process chamber 856 for generating a source medium inside the process chamber 856. The base plate 862 preferably comprises at least one cooling element 868, 870, 880, in particular a base cooling element, for preventing heating the base plate 862 above a defined temperature and/or wherein the side wall section 864*a* preferably comprises at least one cooling element 868, 870, 880, in particular a bell jar cooling element, for preventing heating the side wall section 864*a* above a defined temperature and/or wherein the top wall section 864*b* preferably comprises at least one cooling element 868, 870, 880, in particular a bell jar cooling element, for preventing heating the top wall section 864*b* above a defined temperature. The cooling element 868 can be an active cooling element 870, thus the base plate 862 and/or side wall section 864*a* and/or top wall section 864*b* preferably comprises a cooling fluid guide unit 872, 874, 876 for guiding a cooling fluid, wherein the cooling fluid guide unit 872, 874, 876 is configured limit heating of the base plate 862 and/or side wall section 864*a* and/or top wall section 864*b* to a temperature below 1000 °C. It is additionally possible that a base plate and/or side wall section and/or top wall section sensor unit 890 is provided to detect the temperature of the base plate 862 and/or side wall section 864*a* and/or top wall section 864*b* and to output a temperature signal or temperature data. The at least one base plate and/or side wall section and/or top wall section sensor unit 890 can be arranged as part of a surface or on a surface inside the process chamber, in particular on a surface of the base plate 862 or the side wall section 864*a* or the top wall section 864*b*. Additionally or alternatively it is possible to provide one or more base plate and/or side wall section and/or top wall section sensor unit/s 890 inside the base plate 862 or inside the side wall section 864*a* or inside the top wall section 864*b*. Additionally or alternatively it is possible to provide a cooling fluid temperature sensor 820 to detect the temperature of the cooling fluid guided through the cooling fluid guide unit 870. A fluid forwarding unit 873 can be provided for forwarding the cooling fluid through the fluid guide unit 872, 874, 876, wherein the fluid forwarding unit 873 is preferably configured to be operated in dependency of the temperature signal or temperature data provided by the base plate and/or side wall section and/or top wall section sensor unit 890 and/or cooling fluid temperature sensor 892. The cooling fluid can be oil or preferably water, wherein the water preferably comprises at least one additive, in particular corrosion inhibiter/s and/or antifouling agent/s (biocides).

Additionally or alternatively the cooling element 868 is a passive cooling element 880. Thus, the cooling element 868 can be at least partially formed by a polished steel surface 865 of the base plate 862, the side wall section 864*a* and/or the top wall section 864*b*, preferably by a polished steel surface 865 of the base plate 862, the side wall section 864*a* and the top wall section 864*b*. The passive cooling element 868 can be a coating 867, wherein the coating 867 is preferably formed above the polished steel surface 865 and wherein the coating 867 is configured to reflect heat. The coating 867 can be a metal coating or a comprises metal, in particular silver or gold or chrome, or can be an alloy coating, in particular a CuNi alloy. The emissivity of the polished steel surface 865 and/or of the coating 867 is 0.3, in particular below 0.1 and highly preferably below 0.03.

The base plate 862 can comprise at least one active cooling element 870 and one passive cooling element 880 for preventing heating the base plate 862 above a defined temperature and/or the side wall section 864*a* can comprise at least one active cooling element 870 and one passive cooling element 880 for preventing heating the side wall section 864*a* above a defined temperature and/or the top wall section 864*b* can comprises at least one active cooling element 870 and one passive cooling element 880 for preventing heating the top wall section 864*b* above a defined temperature.

The side wall section 864*a* and the top wall section 864*b* are preferably formed by a bell jar 864, wherein the bell jar 864. The bell jar 864 is preferably movable with respect to the base plate 862.

Figure 8:
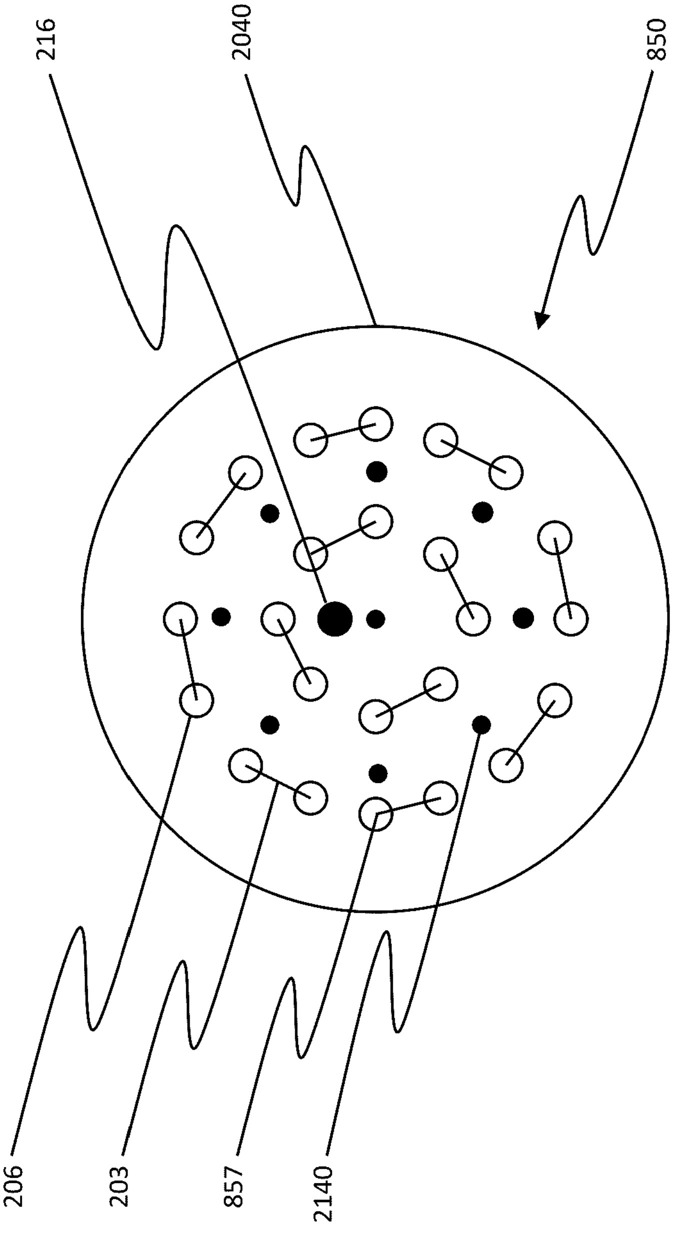
FIG. 8 shows an example of the CVD unit lower housing top view according to the present invention.

FIG. 8 shows the top view of one preferred embodiment of the lower housing 2040 or baseplate of the CVD unit respectively CVD reactor respectively SiC production reactor, in particular SiC PVT source material production reactor, 850. In this case, there are a total of 24 fluid, in particular oil or water, cooled electrodes 206 arranged in two concentric rings with 8 electrodes 206 in the inner ring and 16 electrodes 206 in the outer ring. Between the two rings, a plurality of feed gas inlets 2140 is disposed. In this case there are 8 feed gas inlets 2140. The arrangement of the feed gas inlets 2140 at equal intervals between the two rings provides a maximized contacting of fresh feed gas with the deposition substrates respectively SiC growth substrate 857. The cross members 203 form an electrical connection between the two deposition substrates respectively SiC growth substrate 857 of each pair. Vent gas 2120 formed during the deposition reaction is removed from the deposition chamber respectively process chamber 856 through one or more gas outlet unit or vent gas outlets 216. This arrangement is beneficial since a plurality of deposition substrates respectively SiC growth substrate 857 matched with a plurality of feed gas inlets 2140 allows for a high volumetric deposition rate of CVD SiC crust 211 with a minimized usage of feed gas mixture 1160.

FIG. 9 demonstrates how volumetric deposition rate can be increased even further beyond just having a plurality of deposition substrates respectively SiC growth substrate 857 by increasing the starting surface area of the deposition substates respectively SiC growth substrate 857. FIG. 9*a* shows a low surface area deposition substrate 857 which is typically rod shaped with a diameter of approximately 1 cm. Thus, at the begin of a run the standard surface area 219 for deposition per cm of height of the rod is 3.14 $cm^2/cm$. Assuming a perpendicular deposition rate of 0.1 cm/hr and a run time of 70 hours, a 7 cm thick CVD SiC crust 211 deposits on the substrate 857 and the end run standard surface area 220 is therefore 47.1 $cm^2/cm$. With this geometry the ratio of begin run to end run standard surface area is low at just 6.67%. Consequently, the average volumetric deposition rate is also low at 2.51 $cm^3/hr$. The total volume of CVD SiC, in particular UPSiC, deposited is just 175.84 $cm^3$.

By contrast, the high surface area substrate 222 utilized in a preferred embodiment of the present invention has a perimeter of preferably more than 5 cm and is preferably plate shaped. If a substrate 222 with width of 14 cm and thickness of 0.2 cm is utilized, it provides a begin run high surface area 223 of 28.40 $cm^2/cm$. Again, assuming a perpendicular deposition rate of 0.1 cm/hr and a run time of 70 hrs, a 7 cm thick CVD SiC crust 211 deposits on the substrate 222 and the end run high surface area 224 is 72.36 $cm^2/cm$. The ratio of begin run to end run high surface area is much improved to 39.25% as is the average volumetric deposition rate at 5.04. The total volume of CVD SiC, in particular UPSiC, deposited is twice as high at 352.66 $cm^3$. Thus, it is a finding of the present invention that changing the shape of the deposition substrate the production capacity of the apparatus can be increased, in particular doubled, with relative low capital expenditure.

As a further aspect of the present invention, it has been discovered that use of high surface area resistively self-heated graphite substrates provides the benefits of cost effective heating while still allowing for sufficient separation of the substrates from the deposited CVD SiC crust 211 such that any remaining carbon contamination is within the limits required for the material to perform properly as an preferably ultrapure source material for PVT production of single crystal SiC boules. In a further preferred embodiment of the present invention, such graphite high surface area substrates are coated with a SiC, in particular UPSiC, powder via painting on and drying of an aqueous or solvent based slurry. This creates a separation layer between the substrate and the deposited CVD SiC crust 211 that allows the CVD SiC crust 211 to be easily separated from the substrate by simply cracking it off with a suitable non-contaminating tool such as a silicon carbide hammer.

In summary, in one preferred embodiment of the present invention the CVD unit respectively CVD reactor respectively SiC production reactor, in particular SiC PVT source material production reactor, 850 is equipped with a plurality of high surface area substrates 222. This is beneficial because the volumetric deposition rate is maximized.

Thus, a preferred SiC production reactor 850, in particular for the production of UPSiC, in particular for the use as PVT source material comprises a process chamber 856, wherein the process chamber 856 is at least surrounded by a base plate 862, a side wall section 864*a* and a top wall section 864*b*, in particular the side wall section 864*a* and the top wall section 864*b* are parts of one bell jar 864. The preferred SiC production reactor 850 also comprises a gas inlet unit 866 for feeding one feed-medium or multiple feed-mediums into a reaction space 966 of the process chamber 856 for generating a source medium, one or multiple SiC growth substrates 857 are arranged inside the process chamber 856 for depositing SiC. Thus, the Si and C provided by means of the feed gases forms a source medium and deposits on the SiC growth substrates 857. Each SiC growth substrate 857 comprises a first power connection 859*a* and a second power connection 859*b*, wherein the first power connections 859*a* are first metal electrodes 206*a* and wherein the second power connections 859*b* are second metal electrodes 206*b*, wherein the first metal electrodes 206*a* and the second metal electrodes 206*b* are preferably shielded from a reaction space of the process chamber 856. Each SiC growth substrate 857 is coupled between at least one first metal electrode 206*a* and at least one second metal electrode 206*b* for heating the outer surface of the SiC growth substrates 857 or the surface of the deposited SiC to temperatures between 1300 °C and 1800 °C, in particular by means of resistive heating and preferably by internal resistive heating. The SiC growth substrate 857 highly preferably has an average perimeter 970 of at least 5 cm and preferably of at least 7 cm and highly preferably of at least 10 cm around a cross-sectional area 218 orthogonal to the length direction of the SiC growth substrate 857 or multiple SiC growth substrates 857 have an average perimeter per SiC growth substrate 857 of at least 5 cm and preferably of at least 7 cm and highly preferably of at least 10 cm around a cross-sectional area 218 orthogonal to the length direction of the respective SiC growth substrate 857. In case of a cylindrical SiC growth substrate 857 having a circular cross section the perimeter 970 (cf. FIG. 9*c*) is calculated according to the following formula: perimeter=diameter×π. In case of a rectangular SiC growth substrate 857 a perimeter is calculated according to the formula: perimeter=2a plus 2b. The SiC growth substrate 857 comprises or consists of SiC or C, in particular graphite, or wherein multiple SiC growth substrates 857 comprise or consist of SiC or C, in particular graphite.

The preferred shape of the cross-sectional area 218 orthogonal to the length direction of the SiC growth substrate 857 differs at least is sections and preferably along more than 50% of the length of the SiC growth substrate 857 and highly preferably along more than 90% of the length of the SiC growth substrate 857 from a circular shape. A ratio U/A between the cross-sectional area A 218 and the perimeter U 226 around the cross-sectional area 218 is higher than 1.2 1/cm and preferably higher than 1.5 1/cm and highly preferably higher than 2 1/cm and most preferably higher than 2.5 1/cm.

Figure 9D:
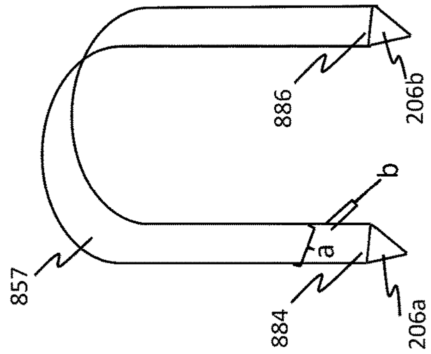
FIG. 9*d* shows an example of the deposition substrates according to the present invention.

FIG. 9*d* shows an example of a SiC growth substrate 857, which is preferably formed by at least one carbon ribbon 882, in particular graphite ribbon, wherein the at least one carbon ribbon 882 comprises a first ribbon end 884 and a second ribbon end 886, wherein the first ribbon end 882 is coupled with the first metal electrode 206*a* and wherein the second ribbon end 886 is coupled with the second metal electrode 206*b* or wherein each of multiple the SiC growth substrates 857 is formed by at least one carbon ribbon 882, in particular graphite ribbon, wherein the at least one carbon ribbon 882 per SiC growth substrate 857 comprises a first ribbon end 884 and a second ribbon end 886, wherein the first ribbon end 884 is coupled with the first metal electrode 206*a* of the respective SiC growth substrate 857 and wherein the second ribbon end 886 is coupled with the second metal electrode 206*b* of the respective SiC growth substrate 857.

The carbon ribbon 882, in particular graphite ribbon, preferably comprises a curing agent.

Figure 9E:
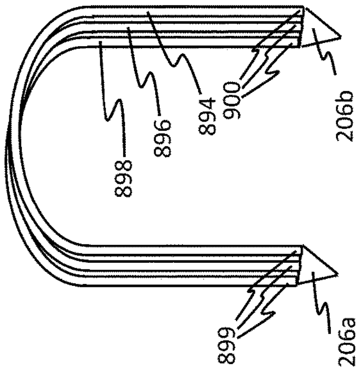
FIG. 9*e* shows an example of the deposition substrates according to the present invention.

As shown in FIG. 9*e* one SiC growth substrate 857 is formed by multiple rods 894, 896, 898, wherein each rod 894, 896, 898 has a first rod end 899 and a second rod end 900, wherein all first rod ends 899 are coupled with the same first metal electrode 206*a* and wherein all second rod ends 900 are coupled with the same second metal electrode 206*b*.

According to the present disclosure one SiC growth substrate 857 can be made of multiple rods 894, 896, 898 as long as said rods 894, 896, 898 are connected to the same first metal electrode 206*a* and the second metal electrode 206*b*. It results from a combination of FIG. 9*e* and wherein each of multiple SiC growth substrates 857 is formed by multiple rods 894, 896, 898, wherein each rod 894, 896, 898 has a first rod end 899 and a second rod end 900, wherein all first rod ends 899 are coupled with the same first metal electrode 206*a* of the respective SiC growth substrate 857 and wherein all second rod ends 900 are coupled with the same second metal electrode 206*b* of the respective SiC growth substrate 857. The rods 894, 896, 898 of the SiC growth substrate 857 are preferably contacting each other or are arranged in a distance to each other. The SiC growth substrate 857 comprises three or more than three rods 894, 896, 898 or each of multiple SiC growth substrates 857 comprises three or more than three rods 894, 896, 898.

Figure 9F:
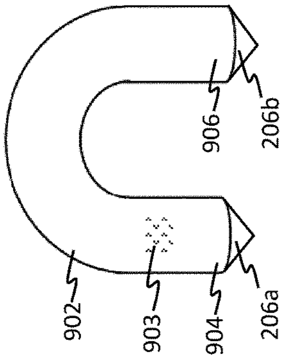
FIG. 9*f* shows an example of the deposition substrates according to the present invention.
Figure 9B:
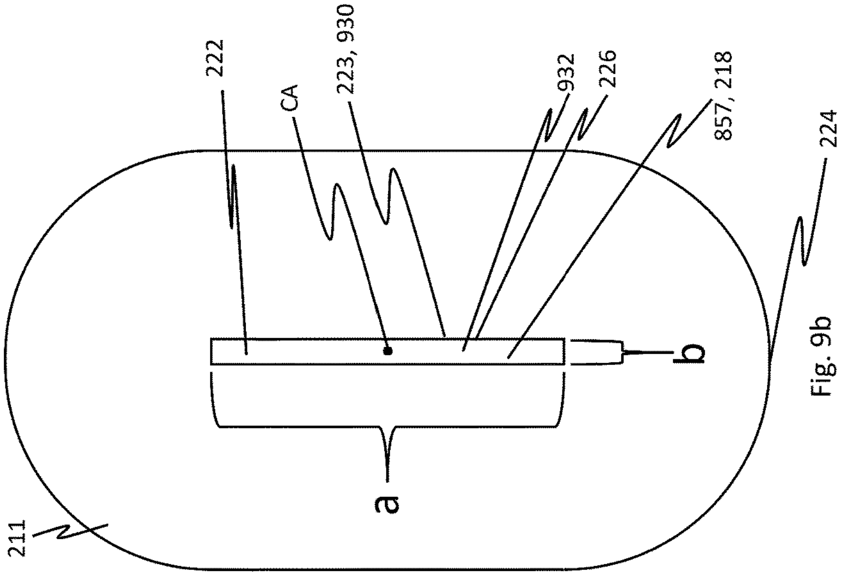
FIG. 9*b* shows an example of the deposition substrates according to the present invention.
Figure 9A:
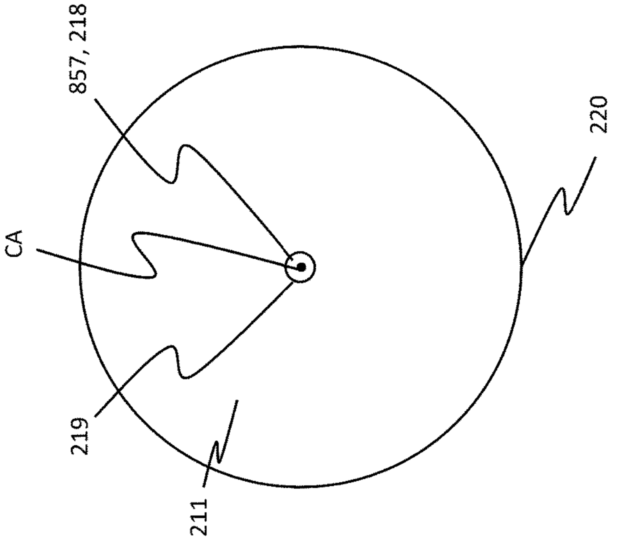
FIG. 9*a* shows an example of the deposition substrates according to the present invention.
Figure 9C:
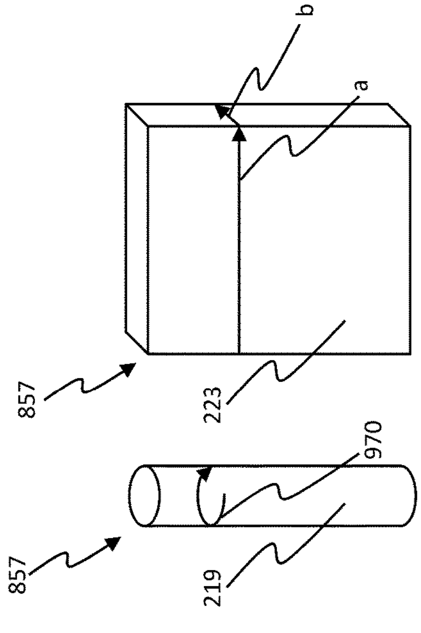
FIG. 9*c* shows an example of the deposition substrates according to the present invention.

FIG. 9*f* shows a further preferred embodiment, wherein the SiC growth substrate 857 is formed by at least one metal rod 902, wherein the metal rod 902 has a first metal rod end 904 and a second metal rod end 906, wherein the first metal rod end 904 is coupled with the first metal electrode 206*a* and wherein the second metal rod end 906 is coupled with the second metal electrode 206*b*. Alternatively each of multiple SiC growth substrates 857 is formed by at least one metal rod 902, wherein each metal rod 902 has a first metal rod end 904 and a second metal rod end 906, wherein the first metal rod end 904 is coupled with the first metal electrode 206*a* of the respective SiC growth substrate 857 and wherein the second metal rod end 906 is coupled with the second metal electrode 206*b* of the respective SiC growth substrate 857.

The metal rod 902 preferably comprises a coating 903, wherein the coating 903 preferably comprises SiC and/or wherein the coating 903 preferably has a thickness of more than 2 μm or preferably of more than 100 μm or highly preferably of more than 500 μm or between 2 μm and 5 mm, in particular between 100 μm and 1 mm, or of less than 500 μm.

Figure 10:
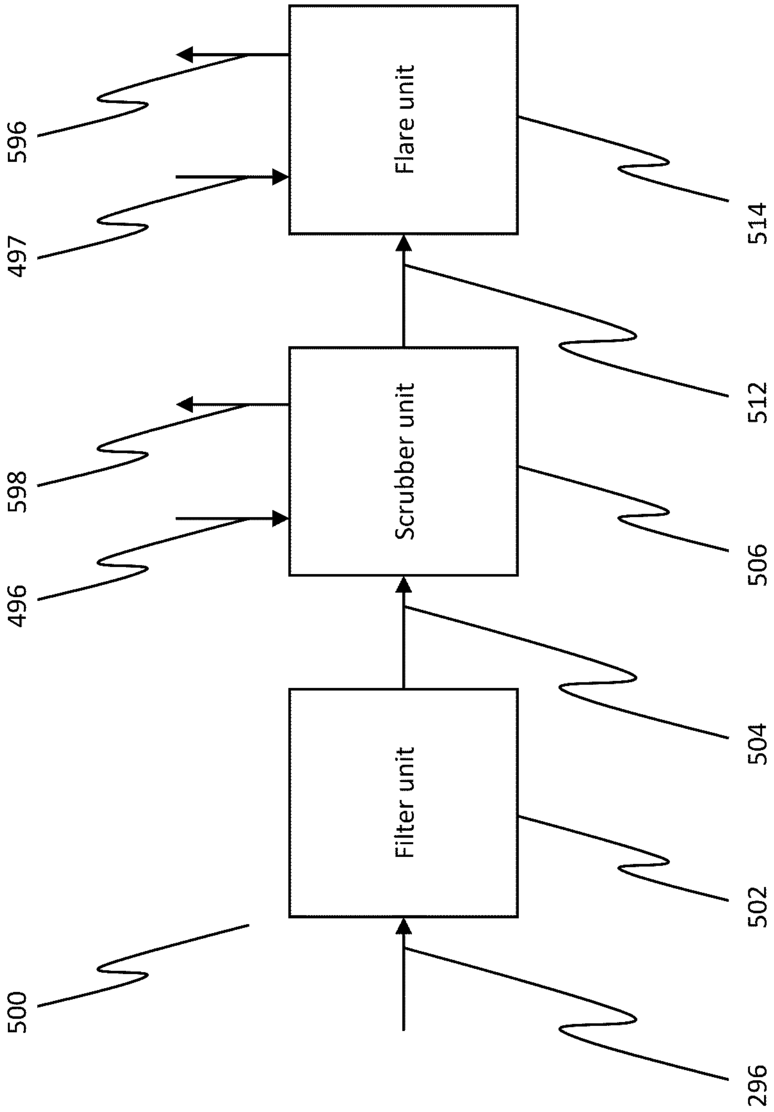
FIG. 10 shows an example of the vent gas treatment unit according to the present invention.

FIG. 10 shows the vent gas treatment unit 500 of the CVD SiC, in particular UPSiC, apparatus 850 in one preferred embodiment of the present invention where the vent gas 296 is treated and discharged rather than recycled. The vent gas 296 is routed from the CVD unit respectively CVD reactor respectively SiC production reactor, in particular SiC PVT source material production reactor, 850 to the filter unit 502 of the vent gas treatment unit 500 where any particulates that may have formed in the gas are removed. The filtered vent gas 504 is then preferably sent to the scrubber unit 506 where it is preferably absorbed into scrubber inlet fluid, in particular water 496. Scrubber outlet water 598 preferably containing any Si-bearing compounds and HCl then exits the scrubber, in particular to be processed for disposal. The scrubbed vent gas 512 is then preferably sent to the flare unit 514 where it is combusted with flare combustion gas 497, preferably natural gas, and the resulting flare exhaust gas 596 is suitable for discharge.

Figure 11:
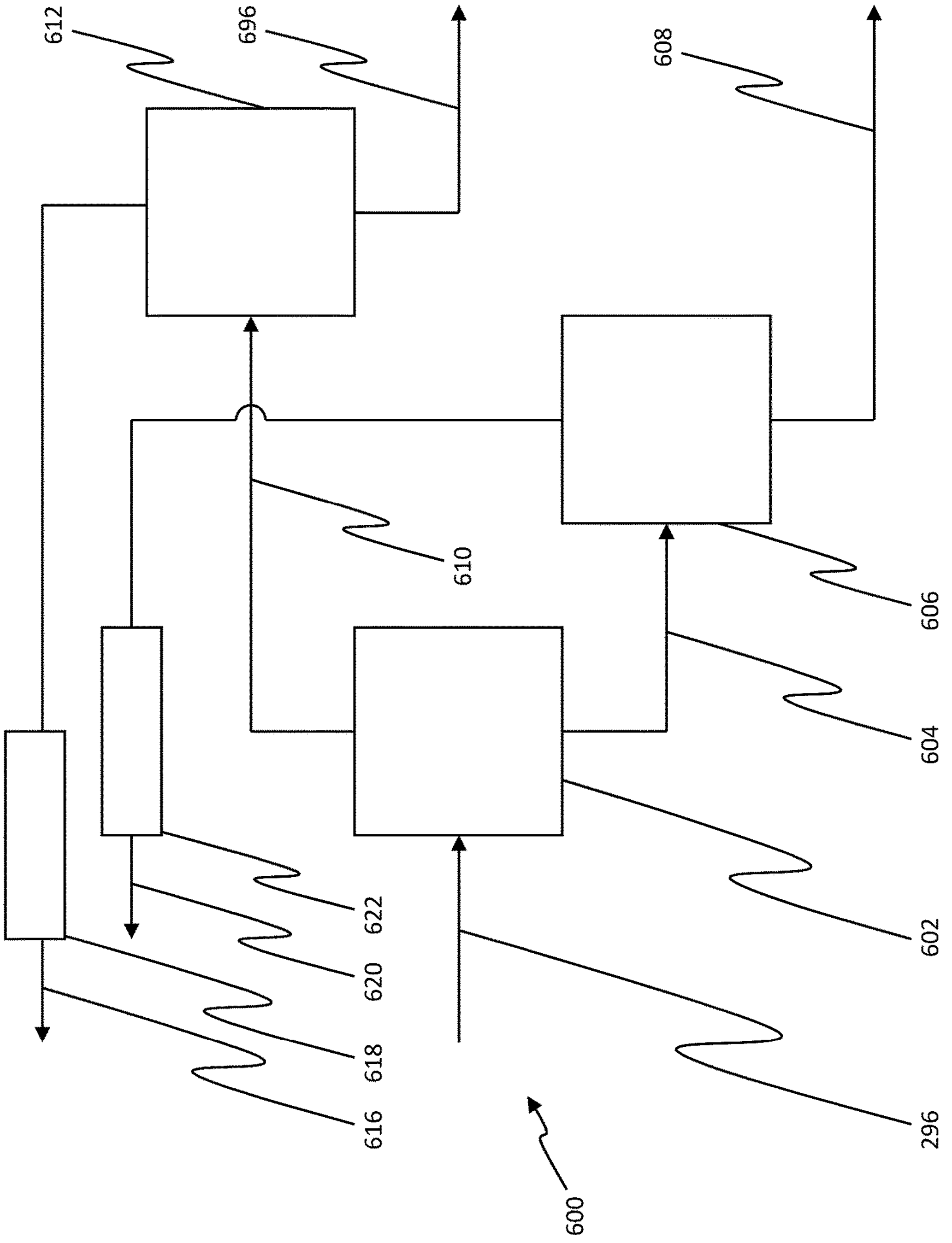
FIG. 11 shows an example of the vent gas recovery unit according to the present invention.

FIG. 11 shows an example of a vent gas recycling unit 600 of the CVD SiC, in particular UPSiC, apparatus 850 in another preferred embodiment of the present invention where the vent gas 296 is recycled rather than treated and discharged. The vent gas 296 is routed from the CVD unit respectively CVD reactor respectively SiC production reactor, in particular SiC PVT source material production reactor 850 to the cold distillation unit 602 which preferably operates in a temperature range of −30 °C to −196 °C. In this temperature range any Si-bearing gases condense and exit the bottom of the distillation unit 602 as an Si-bearing liquid mixture 604. This Si-bearing liquid mixture 604 is periodically routed to a HMW distillation unit 606 which operates in a temperature range that evaporates the Si-bearing liquid 604 while any heavy-molecular-weight compounds remain liquid and exit the bottom of the HMW distillation unit 606 as the HMW liquids discharge 608.

Meanwhile, the Si-bearing gas mixture 620 is exiting the top of the HMW distillation unit 606 and passing through an Si detector unit 622 which determines the mass of Si present. The Si detector unit 622 communicates this information to the central process control unit of the CVD SiC, in particular UPSiC, apparatus 850 which then adjusts the mass flow meter 1120 on the Si-bearing gas 110 line such that the total mass of Si coming from the Si-bearing gas mixture 620 and the Si-bearing gas 110 is in the desired ratio with the total mass of C coming from the H/C-bearing gas mixture 616 and the C-bearing gas 111. Meanwhile, cold distillation gas 610 is exiting the top of the top of the cold distillation unit 602 and is sent to the cryogenic distillation unit which preferably operates in a temperature range between −140 °C and −40 °C in this temperature range, the H/C-bearing gas mixture 616 remains in the gaseous form but the HCl condenses and is removed from the bottom of the Cryogenic distillation unit 612 as the HCl liquid discharge 696 to be further processed for disposal.

The H/C-bearing gas mixture 616 is passed through an H/C detector unit which determines the masses of H and C present. The H/C detector unit communicates this information to the central process control unit of the CVD SiC, in particular UPSiC, apparatus 850 which then adjusts the mass flow meters 1120 on the hydrogen gas 102 line and the C-bearing gas 111 line such that the mass ratios of H, C, and Si are all in the desired range.

Figure 12B:
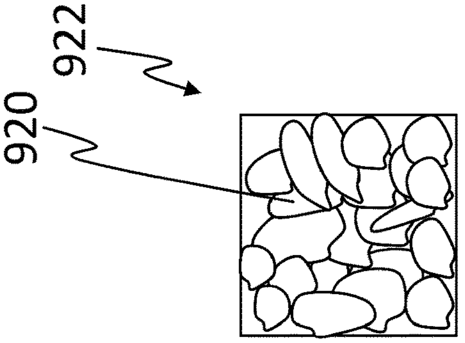
FIG. 12*b* shows an example of one and multiple SiC particles and a SiC produced by the CVD reactor according to the present invention.
Figure 12C:
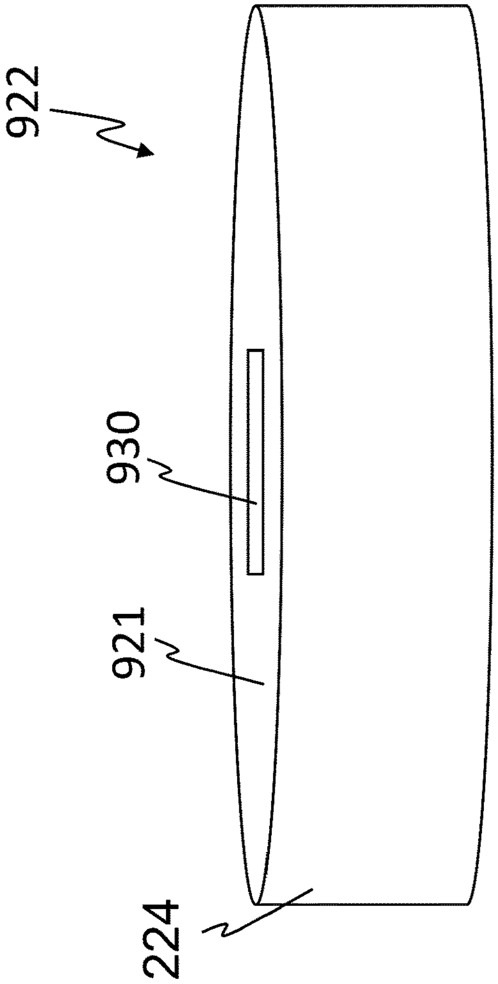
FIG. 12*c* shows an example of one and multiple SiC particles and a SiC produced by the CVD reactor according to the present invention.
Figure 12A:
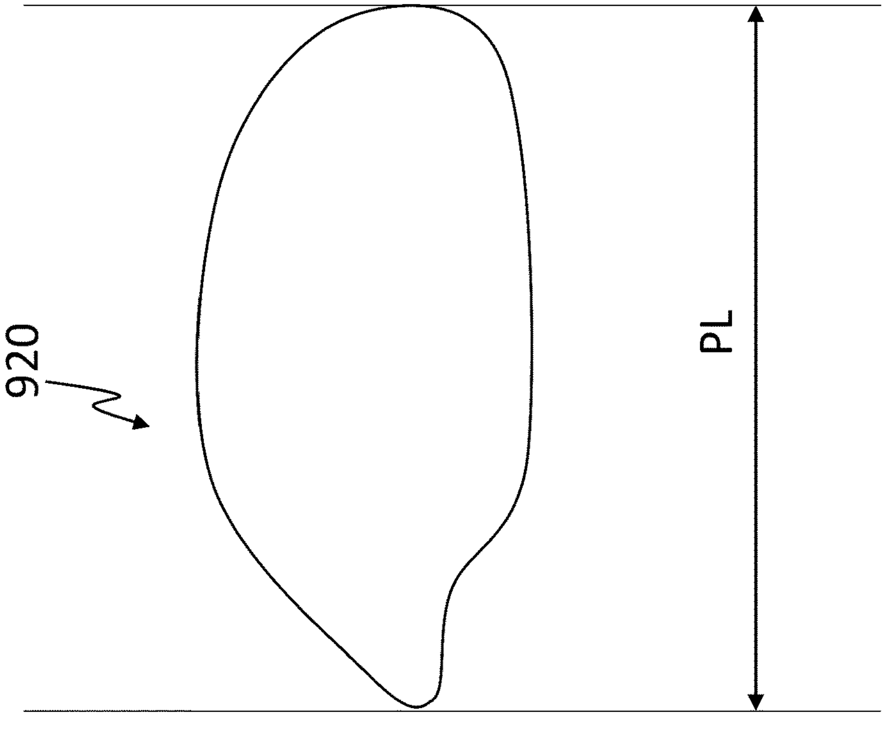
FIG. 12*a* shows an example of one and multiple SiC particles and a SiC produced by the CVD reactor according to the present invention.

FIG. 12*a* shows the length of a SiC particle 920 which is defined in analogous manner to Fmax according to ISO 13322-2. The SiC particle 920 is produced in a SiC production reactor 850 according to the present invention and disaggregated afterwards. The term "average length" defines that the length of multiple particles is added and divided through the number of particles, the result is the average length of said multiple particles.

FIG. 12*b* shows a plurality of SiC particles 920 of PVT source material produced according to the present invention. The plurality of SiC particles 920 is provided as batch and preferably has an apparent density above 1.4 g/cm$^3$, in particular above 1.6 g/cm$^3$.

FIG. 12*c* shows a SiC solid 921. The SiC solid 921 forms a boundary surface 930 in a defined distance to a central axis of the SiC solid 921, and wherein the SiC solid 921 forms an outer surface 224, wherein the outer surface 224 and the boundary surface 930 are formed in a distance to each other. The distance preferably extends orthogonal to the central axis, wherein an average distance between the outer surface 224 and boundary surface 930 is preferably larger compared to an average distance between the boundary surface 930 and the central axis. The average distance between the outer surface 224 and boundary surface 930 is preferably calculated in the following manner: (shortest distance (in radial direction) plus longest distance (in radial direction))/2.

Figure 13:
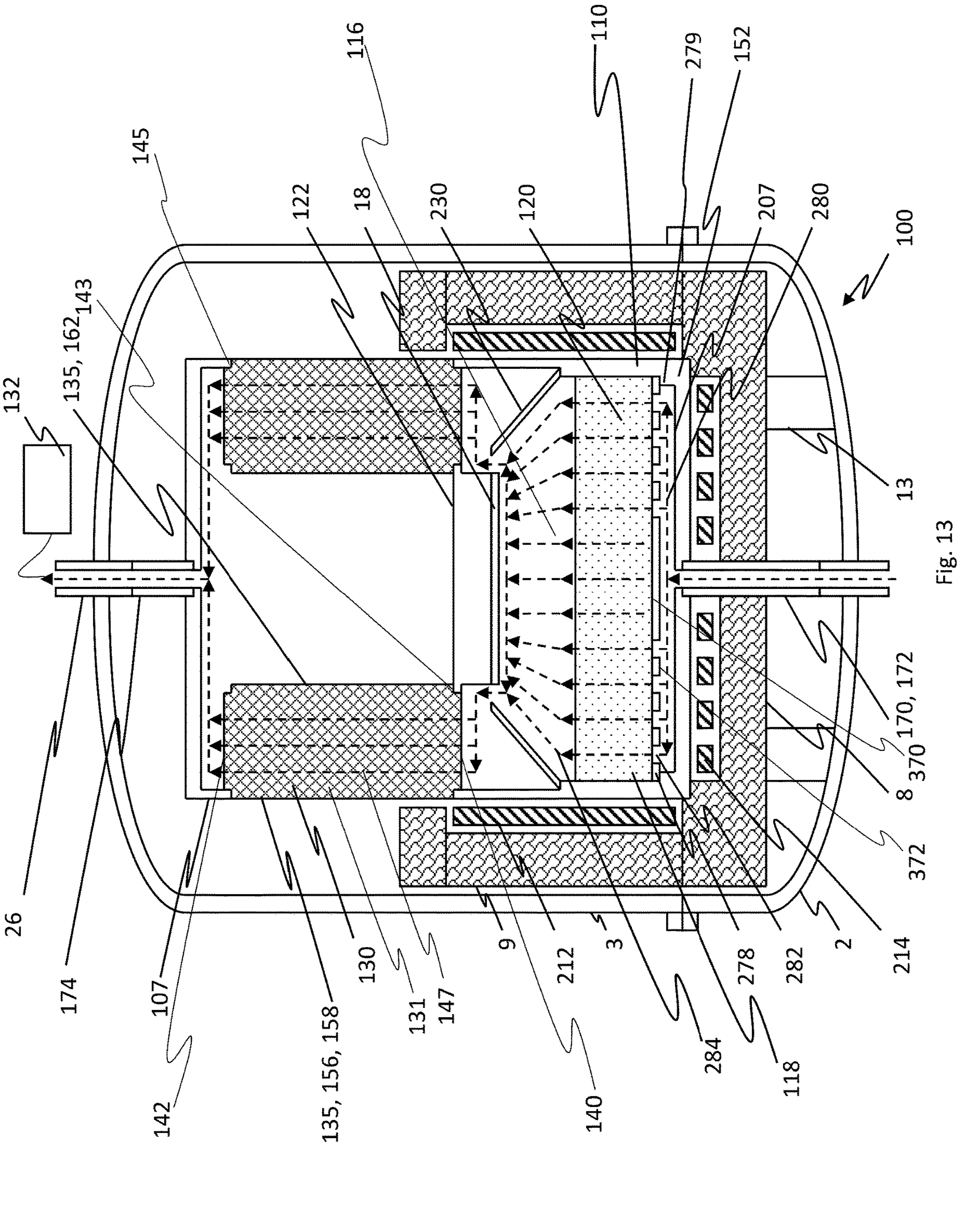
FIG. 13 shows an example of a further example of a PVT reactor according to the invention.

FIG. 13 shows a further example of a PVT reactor 100 used according to the present invention. It has to be understood that the PVT reactor 100 shown in FIG. 2 is based on the same technological principle, thus features from one of said PVT reactors 100 (FIG. 2 or FIG. 13) can be exchanged or added to the other PVT reactor 100. It has also to be understood that the CVD reactors 850 shown in FIGS. 1, 7 and 8 are based on the same technological principle, thus features from one of said CVD reactors 850 (FIG. 1 or FIG. 6 or FIG. 7) can be exchanged or added to the other CVD reactor 850.

Furthermore, the system according to the present invention preferably comprises a CVD reactor according to any of FIG. 1, 7 or 8 and a PVT reactor according to FIG. 2 or 13.

the furnace apparatus 100 preferably comprises a crucible gas flow unit 170. The crucible gas flow unit 170 preferably comprises a crucible gas inlet tube 172 for conducting gas into the crucible volume 116, wherein the crucible gas inlet tube 172 is highly preferably arranged in vertical direction below the receiving space 118. The receiving space 118 is located between the crucible gas inlet tube 172 and the seed holder unit 122 for conducting gas flow around the receiving space 118 and/or through the receiving space 118.

A source-material-holding-plate 278 can be provided, wherein the source-material-holding-plate 278 comprises an upper surface 370 preferably forming a bottom section of the receiving space 118 and a lower surface 372 preferably forming a source-material-holding-plate-gas-flow-path-boundary-section. The source-material-holding-plate 278 preferably comprises multiple through holes 282, in particular more than 10 or preferably more than 50 or highly preferably up to 100 or most preferably up to or more than 1000, wherein the multiple through holes 282 extend from the upper surface 370 of the source-material-holding-plate 278 through a main body of the source-material-holding-plate 278 to the lower surface 372 of source-material-holding-plate 278. At least the majority of the multiple through holes 282 has a diameter of less than 12 mm, in particular less than 10 mm and preferably less than 6 mm and highly preferably less than 2 mm and most preferably of 1 mm or less than 1 mm. The number of through holes 282 through the main body of the source-material-holding-plate 278, preferably depends on the surface size of the upper surface 370 of the source-material-holding-plate 278, wherein at least one though hole 282 is provided per 10 cm$^2$ surface size of the upper surface 370. The number of through holes 282 per 10 cm$^2$ is preferably higher in a radially outer section of the source-material-holding-plate 278 compared to a radially inner section of the source-material-holding-plate, wherein the radially inner section extends up to 20% or 30% or 40% or 50% of the radial extension of the source-material-holding-plate 278, wherein the radially outer section of the source-material-holding-plate 278 extends between the radially inner section and the radial end of the source-material-holding-plate 278. The lower surface 372 of the source-material-holding-plate 278 preferably forms together with a bottom wall section 207 of the crucible housing 110 a gas-guide-gap 280 or gas-guide-channel for guiding gas from the crucible gas inlet tube 172 to the receiving space 118 or around the receiving space 118, in particular to the through holes 282 of the source-material-holding-plate 278. Additionally or alternatively a pressure unit 132 for setting up a crucible volume pressure P1 inside the crucible volume 116 is provided, wherein the pressure unit 132 is configured to cause crucible volume pressure P1 above 2666.45 Pa and preferably above 5000 Pa or in a range between 2666.45 Pa and 50000.00 Pa. A crucible gas outlet tube 174 for removing gas from the crucible volume 116 is preferably provided, wherein the crucible gas inlet tube 172 is arranged in gas flow direction preferably before a filter unit 130 and wherein the crucible gas outlet tube 174 is arranged in gas flow preferably direction after a filter unit 130. The filter unit 130 can be arranged inside the crucible volume 116 between the crucible gas inlet tube 172 and the crucible gas outlet tube 174 for capturing at least $Si_2C$ sublimation vapor, $SiC_2$ sublimation vapor and Si sublimation vapor. The filter unit 130 preferably forms a filter-unit-gas-flow-path 147 from the filter input surface 140 to the filter output surface 142, wherein the filter gas flow path is part of the gas flow path between the crucible gas inlet tube 172 and the crucible gas outlet tube 174, wherein the filter unit 130 preferably has a height S1 and wherein the filter-unit-gas-flow-path 147 through the filter unit 130 preferably has a length S2, wherein S2 is at least 2 times, in particular 10 times, longer compared to S1. The filter unit 130 forms preferably a filter outer surface 156, wherein the filter outer surface 156 comprises a filter outer surface covering element 158, wherein the filter outer surface covering element 158 is a sealing element, wherein the sealing element is preferably a filter coating 135, wherein the filter coating 135 is generated at the filter outer surface 156 or attached to the filter outer surface 156 or forms the filter outer surface 156. The filter coating 135 of the filter outer surface 156 is preferably formed by a layer of pyrocarbon which has a thickness of more than 10 μm, in particular of more than or of up to 20 μm or of more than or of up to 50 μm or of more than or of up to 100 μm of more than or of up to 200 μm of more than or of up to 500 μm, and/or wherein the filter coating 135 of the filter outer surface 156 is formed by a layer of glassy carbon which has a thickness of more than 10 μm, in particular of more than or of up to 20 μm or of more than or of up to 50 μm or of more than or of up to 100 μm of more than or of up to 200 μm of more than or of up to 500 μm.

Figure 14:
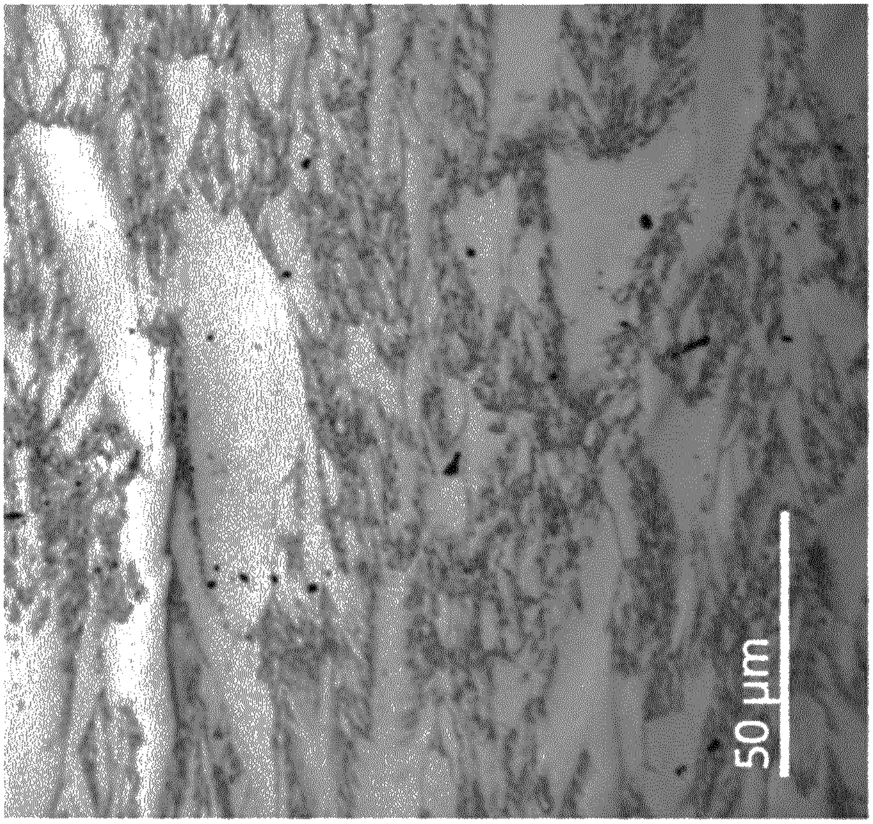
FIG. 14 shows an example of a photo of the SiC material produced in the CVD reactor according to the invention.

FIG. 14 shows a microscopic image of PVT source material produced according to the present invention. It can be seen from the figure that the produces PVT source material is preferably a polycrystalline SiC material.

The PVT source material can be provided as SiC particles 920, wherein the average length of the SiC particles is more than 100 μm, wherein the SiC particles have impurities of less than 10 ppm (weight) of the substance N and of less than 1000 ppb (weight), in particular of less than 500 ppb (weight), of each of the substances B, Al, P, Ti, V, Fe, Ni.

Alternatively, the PVT source material can be provided as SiC solid 921 having a mass of more than 1 kg, a thickness of at least 1 cm and preferably of more than or highly preferably of more than 10 cm or most preferably of more than 15 cm, and a length of more than 25 cm or preferably of more than 50 cm. The SiC solid 921 has impurities of less than 10 ppm (weight) of the substance N and of less than 1000 ppb (weight), in particular of less than 500 ppb (weight), of each of the substances B, Al, P, Ti, V, Fe, Ni.

Figure 15:
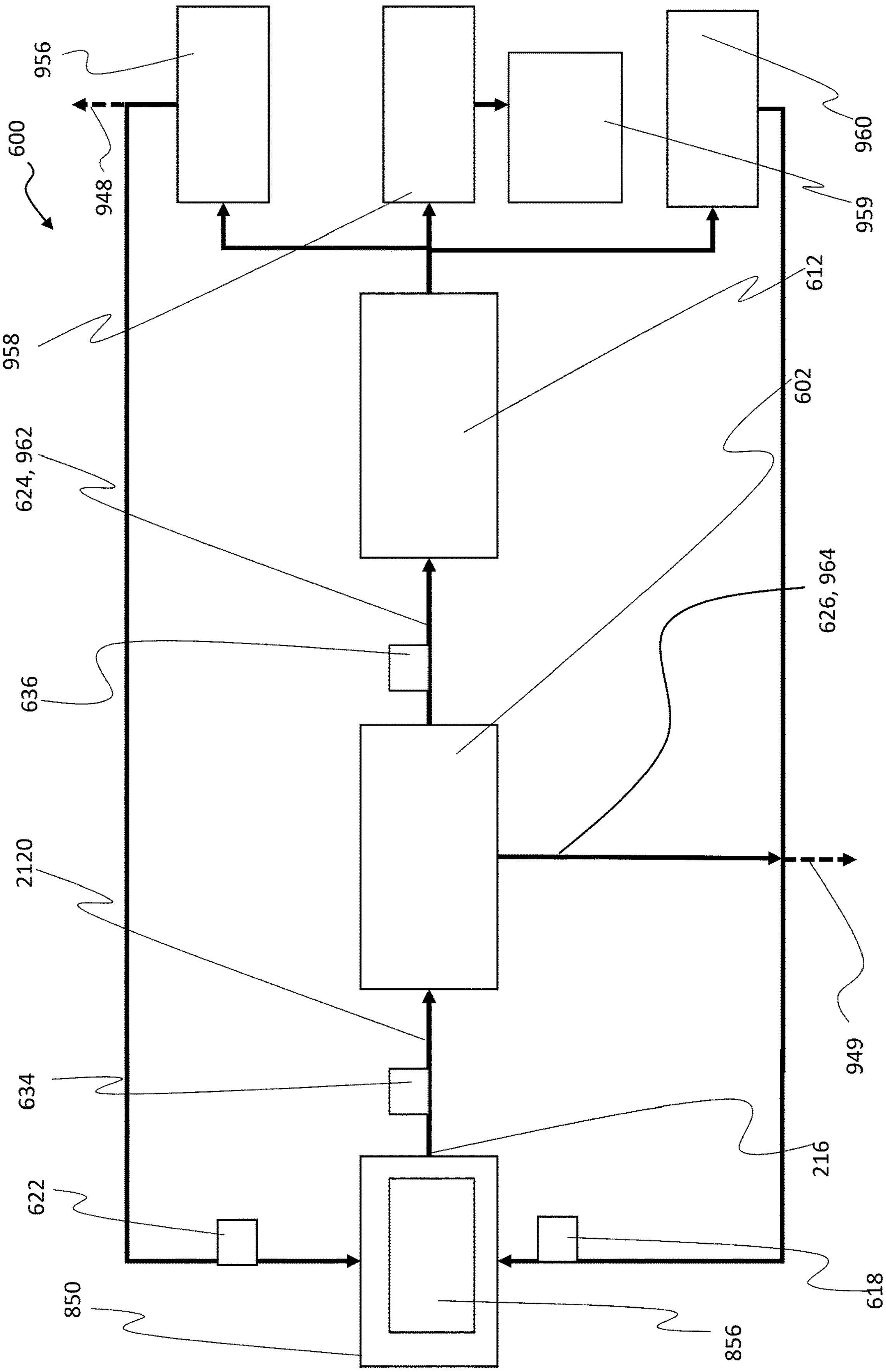
FIG. 15 shows a further example of a vent gas recovery unit according to the present invention.

FIG. 15 shows a further example of a vent gas recycling unit 600. According to this example the vent gas recycling unit 600 is attached or coupled to at least von gas outlet unit for outputting vent gas 216 of at least one SiC production reactor 850.

The vent gas recycling unit 600 preferably comprises at least a separator unit 602 for separating the vent gas 216 into a first fluid 962 and into a second fluid 964. The first fluid 962 is preferably a liquid and the second fluid 964 is preferably a gas. A first storage and/or conducting element for storing or conducting the first fluid 624 is part of the separator unit 602 or coupled with the separator unit 602 and a second storage and/or conducting element 626 for storing or conducting the second fluid 964 is part of the separator unit 602 or coupled with the separator unit 602.

The vent gas recycling unit 600 preferably comprises a further separator unit 612 for separating the first fluid into at least two parts, wherein the two parts are a (a) mixture of chlorosilanes and (b) a mixture of HCl, H2 and at least one C-bearing molecule. Alternatively the further separator unit 612 separates the first fluid into at least three parts, wherein the three parts are (a) a mixture of chlorosilanes and (b) HCl and (c) a mixture of H2 and at least one C-bearing molecule. The first storage and/or conducting element 624 preferably connects the separator unit 602 with the further separator unit 612. The further separator unit 612 is preferably coupled with a mixture of chlorosilanes storage and/or conducting element 628 and with a HCl storage and/or conducting element 630 and with a H2 and C storage and/or conducting element 632. The mixture of chlorosilanes storage and/or conducting element 628 preferably forms a section of a mixture of chlorosilanes mass flux path for conducting the mixture of chlorosilanes into the process chamber 856, in particular to a mixing device 854.

A Si mass flux measurement unit 622 for measuring an amount of Si of the mixture of chlorosilanes can be provided as part of the mass flux path prior to the process chamber 856, in particular prior to a mixing device 854. The Si mass flux preferably serves as further Si feed-medium source providing a further Si feed medium. It has to be noted that the mixture of chlorosilanes preferably can be a random mixture respectively can have a random composition of different chlorosilanes. The mixture of chlorosilanes storage and/or conducting element 628 alternatively forms a section of a mixture of chlorosilanes mass flux path for conducting the mixture of chlorosilanes into a further process chamber 952 of a further SiC production reactor 950, in particular via fluid path 948.

The H2 an C storage and/or conducting element 632 preferably forms a section of a H2 and C mass flux path for conducting the H2 and the at least one C-bearing molecule into the process chamber 850. A C mass flux measurement unit 618 for measuring an amount of C of the mixture of H2 and the at least one C-bearing molecule is preferably provided as part of the H2 and C mass flux path prior to the process chamber 856, in particular prior to a mixing device 854, and preferably as further C feed-medium source providing a further C feed medium. The H2 an C storage and/or conducting element 632 alternatively forms a section of a H2 and C mass flux path for conducting the H2 and the at least one C-bearing molecule into a further process chamber 952 of a further SiC production reactor 950, in particular via fluid path 949.

The second storage and/or conducting element 626 preferably forms a section of the H2 and C mass flux path for conducting the second fluid, which comprises H2 and at least one C-bearing molecule, into the process chamber 856, wherein the second storage and/or conducting element 626 and the H2 an C storage and/or conducting element 632 are preferably fluidly coupled.

The second storage and/or conducting element 626 preferably forms a section of a further H2 and C mass flux path for conducting the second fluid, which comprises H2 and C, into the process chamber 856. A further C mass flux measurement unit for measuring an amount of C of the second fluid is preferably provided as part of the further H2 and C mass flux path prior to the process chamber 856, in particular prior to a mixing device 854. The mixing device 854 can be part of the gas inlet unit 866 or can belong to the gas inlet unit 866 or can be a sub unit of the gas inlet unit 866. The second storage and/or conducting element 626 can be coupled with a flare unit for burning the second fluid.

The separator unit 602 is highly preferably configured to operate at a pressure above 5 bar and a temperature below −30 °C.

A first compressor 634 for compressing the vent gas to a pressure above 5 bar can be provided as part of the separator unit 602 or in a gas flow path between the gas outlet unit 216 and the separator unit 602. The further separator unit 612 is highly preferably configured to operate at a pressure above 5 bar and a temperature below −30 °C and/or a temperature above 100 °C. A further compressor 636 for compressing the first fluid to a pressure above 5 bar can be provided as part of the further separator unit 612 or in a gas flow path between the separator unit 602 and the further separator unit 612. The further separator unit 612 highly preferably comprises a cryogenic distillation unit, wherein the cryogenic distillation unit is preferably configured to be operated at temperatures between −180 C° and −40 C°.

A control unit 929 for controlling fluid flow of a feed-medium or multiple feed-mediums is preferably part of the SiC production reactor 850, wherein the multiple feed-mediums comprise the first medium, the second medium, the third medium and the further Si feed medium and/or the further C feed medium via the gas inlet unit into the process chamber 856. The further Si feed medium highly preferably consists of at least 95% [mass] or at least 98% [mass] or at least 99% [mass] or at least 99.9% [mass] or at least 99.99% [mass] or at least 99,999% [mass] of a mixture of chlorosilanes. Additionally or alternatively the further C feed medium preferably comprises the at least one C-bearing molecule, H2, HCl and a mixture of chlorosilanes. The further C feed medium highly comprises the at least one C-bearing molecule, HCl, H2 and a mixture of chlorosilanes, wherein the further C feed medium comprises of at least 3% [mass] or preferably at least 5% [mass] or highly preferably at least 10% [mass] of C respectively the at least one C-bearing molecule and wherein the further C feed medium comprises up to 10% [mass] or preferably between 0.001% [mass] and 10%[mass], highly preferably between 1% [mass] and 5%[mass], of HCl, and wherein the further C feed medium comprises more than 5% [mass] or preferably more than 10% [mass] or highly preferably more than 25% [mass] of H2 and wherein the further C feed medium comprises more than 0.01% [mass] and preferably more than 1% [mass] and highly preferably between 0.001% [mass] and 10%[mass] of the mixture of chlorosilanes.

Additionally, a heating unit 954 can be arranged in fluid flow direction between the further separator unit and the gas inlet unit, in particular as part of the further separator unit 612, for heating the mixture of chlorosilanes to transform the mixture of chlorosilanes from a liquid form into a gaseous form.

Figure 16:
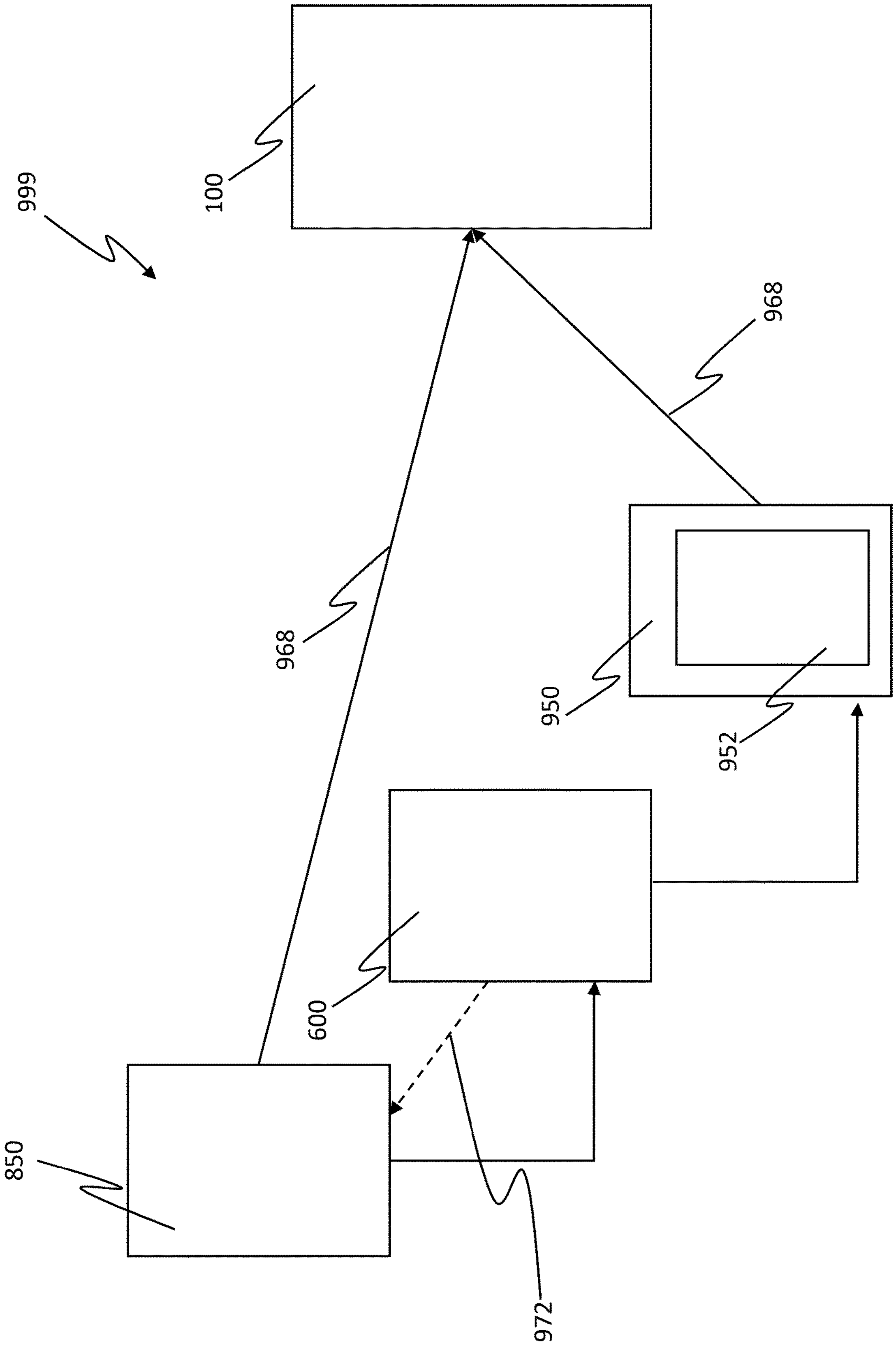
FIG. 16 shows an example of a preferred system setup according to the invention.

FIG. 16 show an example of a system 999 according to the present invention. The inventive system 999 comprises at least one SiC production reactor 850 and one PVT reactor 100, wherein the SiC production reactor 850 produces SiC source material which is used in the PVT reactor 100 to produce monocrystalline SiC.

According to FIG. 16 it is additionally or alternatively possible that multiple SiC production reactors 850, 950 are provided. It is additionally or alternatively possible that multiple PVT reactors 100 are provided. Furthermore, it is possible that a SiC production reactor 850 comprises a vent gas recycling unit 600. It is alternatively possible that multiple SiC production reactors 850, 950 are connected through a vent gas recycling unit 600. Thus, the vent gas of a first SiC production reactor 850 can be recycled and used as source material for the other SiC production reactor 950. Thus, at least some output of the vent gas recycling unit 600, in particular the Si, C and H2 components, can be used as feed gas for the same or another SiC production reactor 850. Arrow 972 alternatively indicates that the output of the vent gas recycling unit 600 can be used for the CVD reactor 850 which emitted the vent gas.

Thus, due to the before mentioned system the present invention provides a method for the production of at least one SiC crystal. Said method preferably comprises the steps: Providing a CVD reactor 850 for the production of SiC of a first type, introducing at least one source gas, in particular a first source gas, in particular SiCl3(CH3), into a process chamber 856 for generating a source medium, wherein the source medium comprises Si and C, introducing at least one carrier gas into the process chamber 856, the carrier gas preferably comprising H, electrically energizing at least one SiC growth substrate 857 disposed in the process chamber 856 to heat the SiC growth substrate 857, wherein the surface of the SiC growth substrate 857 is heated to a temperature in the range between 1300 °C and 1800 °C, depositing SiC of the first type onto the SiC growth substrate 857, in particular at a deposition rate of more than 200 μm/h, wherein the deposited SiC is preferably polycrystalline SiC, removing the deposited SiC of the first type from the CVD reactor 850, preferably transforming the removed SiC into fragmented SiC of the first type or into one or multiple solid bodies SiC of the first type, providing a PVT reactor 100 for the production of SiC of a second type, adding the preferably fragmented SiC of the first type or adding one or multiple solid bodies of SiC of the first type as source material 120 into a receiving space 118 of the PVT reactor 100, subliming the SiC of the first type inside the PVT reactor 100 and depositing the sublimated SiC on a seed wafer 18 as SiC of the second type.

The PVT reactor 100 hereby preferably comprises a furnace unit 102, wherein the furnace unit 102 comprises a furnace housing 108 with an outer surface 242 and an inner surface 240, at least one crucible unit 106, wherein the crucible unit 106 is arranged inside the furnace housing 108, wherein the crucible unit 106 comprises a crucible housing 110, wherein the crucible housing 110 has an outer surface 112 and an inner surface 114, wherein the inner surface 114 at least partially defines a crucible volume 116, wherein a receiving space 118 for receiving a source material 120 is arranged or formed inside the crucible volume 116, wherein a seed holder unit 122 for holding a defined seed wafer 18 is arranged inside the crucible volume 116, wherein the seed wafer holder 122 holds a seed wafer 18, wherein the furnace housing inner wall 240 and the crucible housing outer wall 112 define a furnace volume 104, at least one heating unit 124 for heating the source material 120, wherein the receiving space 118 for receiving the source material 120 is at least in parts arranged above the heating unit 124 and below the seed holder unit 122.

Figure 17:
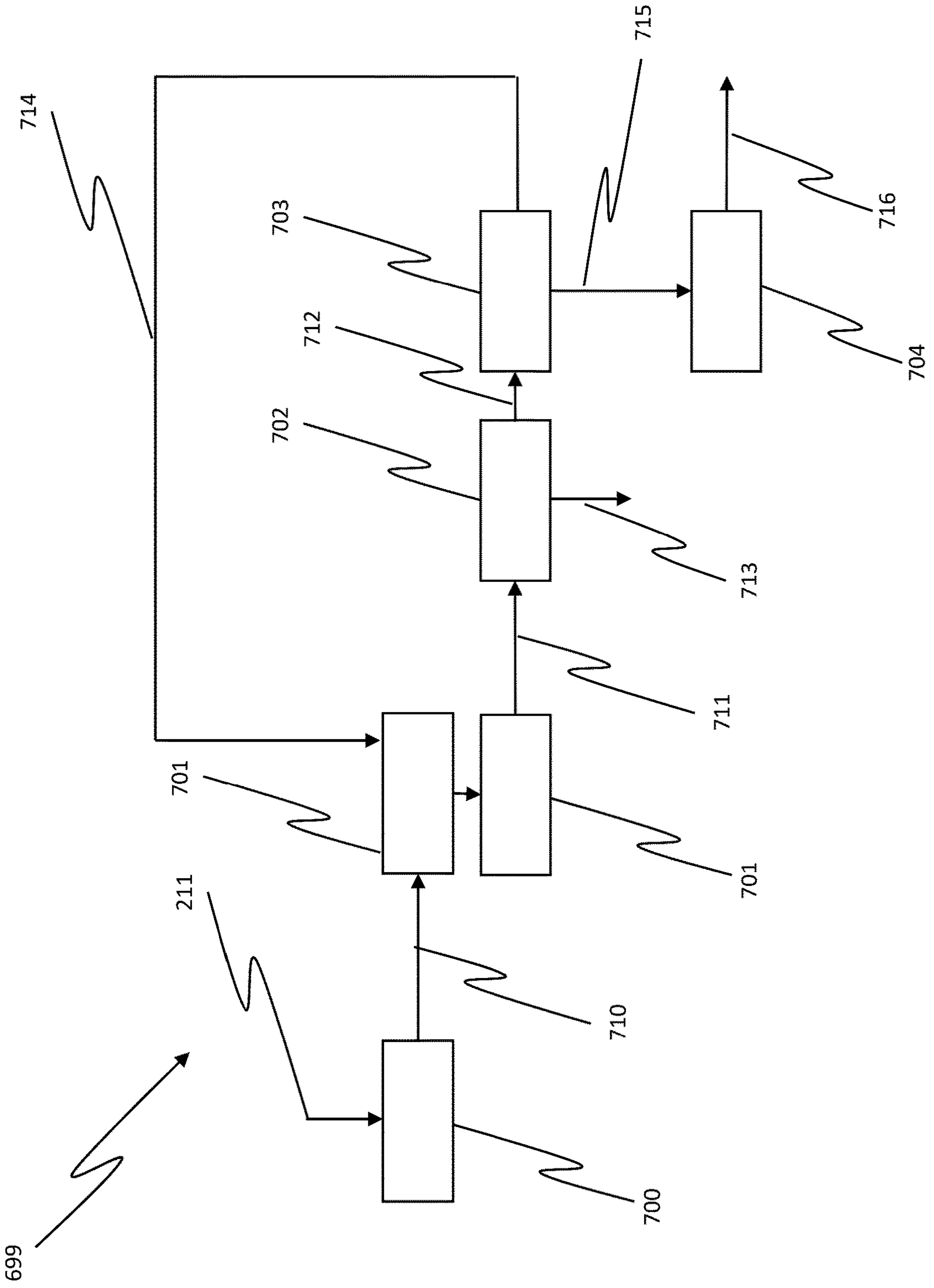
FIG. 17 shows a schematic example of an comminution unit and FIG. 18 shows a schematic example of an etching unit.

FIG. 17 shows a comminution unit 699.

At the end of the deposition process, after purging the reactor and rendering inert, the bell jar can be lifted and the thick rods removed from the CVD reactor. This process is widely known as harvesting.

The harvested rods have to be transferred into a shape suitable for PVT processing. This can either be a cut rod segment or broken chips and chunks of various sizes.

Different methods to comminute hard and brittle solids like silicon carbide into smaller pieces are known. Most common is the mechanical approach. SiC rods or larger fragments thereof are fed into a crusher, which is preferably a jaw crusher or a roll crusher. Adjustable machine parameters as gap distance, rotational speed or swing amplitude are determining the final particle size distribution. To avoid large amounts of fines and/or high contamination level, a multiple stage application of crusher machines is possible. Crushing machines are ordered in series, where the outlet of one crusher is connected, either directly or indirectly via a transportation device like belt conveyor or vibrating chutes, with the feed opening of a subsequent crusher with differing machine parameters. Finally, the comminuted pieces have to be classified to remove undersize material and to return oversize material to the comminution process.

Alternative crushing methods are also applicable. A known method is thermal cracking. A rod of hard, brittle material is heated and cooled down with a high temperature gradient, e.g. by rapid dipping into a cold fluid.

Typically, mechanically driven screening machines are used to classify irregular pieces of solid material into size classes. A summary of used screening machines is described in US2018169704. The mechanical approach to classify pieces of solid material can be extended by a more flexible optoelectronic method, which was disclosed in US 2009/120848.

The comminution process excavates the starting substrate, if graphite is used as starting material, because the interface between starting substrate and silicon carbide growth layer acts as a predetermined breaking point. This fact can be used to easily remove the graphite substrate from the product by annealing/heating to at least 900 °C to 1400 °C in the presence of air or any gas mixture enriched with oxygen. The surface color changes from grey to blueish-brownish, caused by thin layers (100-300 nm) of silicon oxides. This can easily be removed by an acid treatment.

Figure 18:
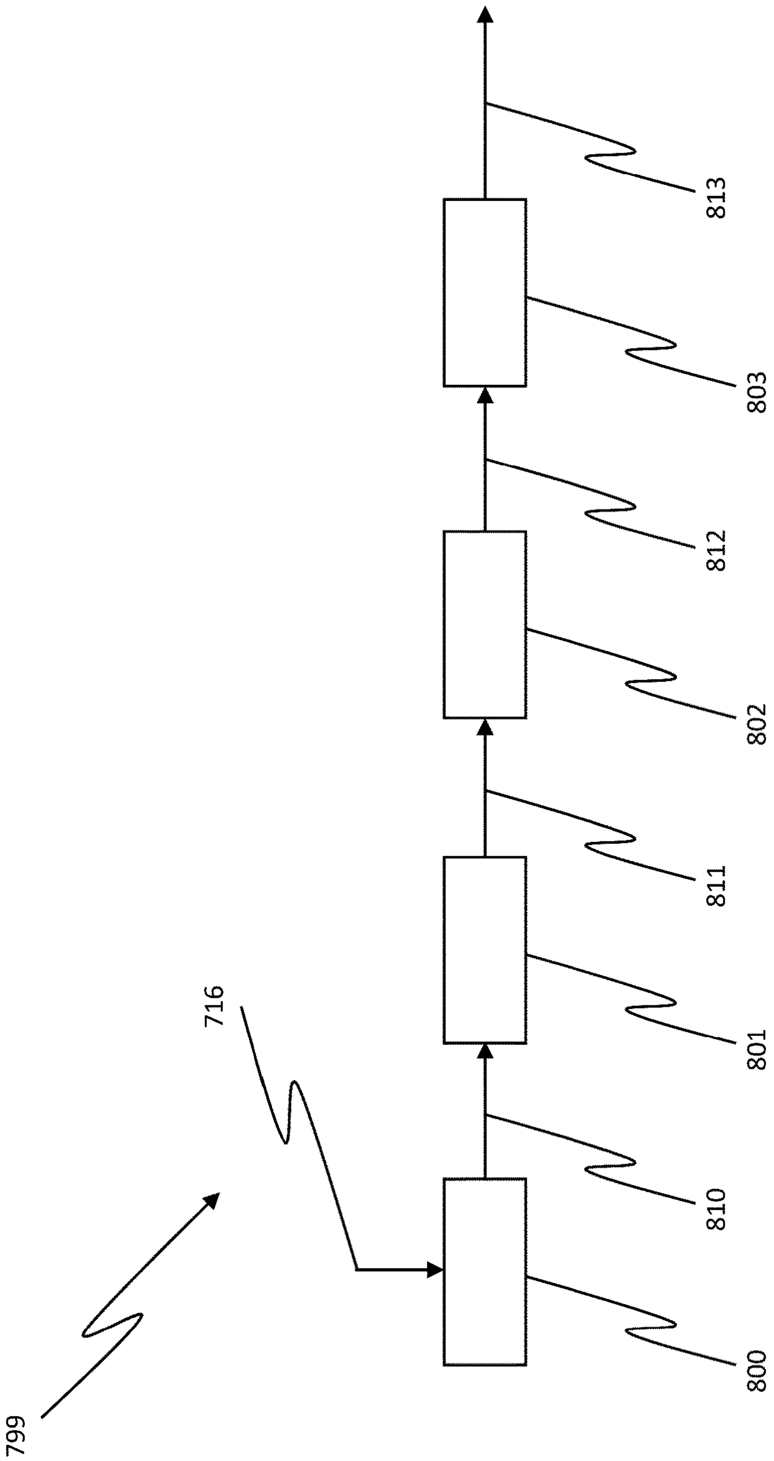

FIG. 18 shows an etching unit 799. The etching unit preferably comprises the following units:

An etching basin 800, water basins (water cascade) 801, a drying unit 802, a packaging unit 803. Reference number 810 indicates etched SiC and refence number 811 indicates acid-free SiC and reference number 812 indicates dried SiC and reference number 813 indicates packed SiC, in particular according to a specification.

Thus, the present invention relates to a method for producing a preferably elongated SiC solid, in particular of polytype 3C. The method according to the invention preferably comprises at least the following steps:

- Introducing at least a first source gas into a process chamber, said first source gas comprising Si,
- introducing at least one second source gas into the process chamber, the second source gas comprising C,
- electrically energizing at least one separator element disposed in the process chamber to heat the separator element,
- setting a deposition rate of more than 200 μm/h,
- wherein a pressure in the process chamber of more than 1 bar is generated by the introduction of the first source gas and/or the second source gas, and
- wherein the surface of the deposition element is heated to a temperature in the range between 1300 °C and 1800 °C.

| List of reference signs | |
|---|---|
| 2 | Furnace housing (lower part) |
| 3 | Furnace housing (upper part) |
| 4 | Furnace gas inlet |
| 5 | Crucible gas inlet |
| 7 | Crucible gas inlet connection piece |
| 8 | Bottom insulation |
| 9 | Side insulation |
| 13 | Crucible leg |
| 17 | Crystal |

-continued

| List of reference signs | |
|---|---|
| 18 | Seed wafer |
| 20 | Seals |
| 22 | Filter grooves or pores |
| 26 | Crucible vacuum outlet |
| 28 | Pyrometer sight line |
| 50 | Source material |
| 100 | Furnace respectively furnace apparatus respectively PVT reactor |
| 102 | Hydrogen gas |
| 104 | Furnace volume |
| 105 | Cryogenic distillation unit |
| 106 | Si-bearing liquid |
| 107 | Crucible lid respectively filter cover |
| 108 | furnace housing |
| 110 | crucible housing |
| 112 | outer surface |
| 116 | crucible volume |
| 118 | receiving space |
| 120 | PVT source material |
| 122 | Seed holder |
| 130 | Filter |
| 132 | pressure unit |
| 135 | filter coating |
| 140 | filter input surface |
| 142 | filter output surface |
| 147 | filter-unit-gas-flow-path |
| 152 | Crucible base |
| 156 | filter outer surface |
| 158 | Filter outer surface coating |
| 164 | Filter outer surface coating |
| 170 | crucible gas flow unit |
| 172 | Crucible gas inlet tube |
| 174 | Crucible vacuum outlet tube |
| 198 | Feed gas mixture |
| 202 | Upper housing |
| 203 | Cross member |
| 204 | Oven vacuum outlet |
| 206a | first electrode |
| 206b | second electrode |
| 208 | Chuck |
| 209 | Temperature measurement path |
| 212 | radial heating element |
| 211 | CVD SiC crust or SiC solid |
| 213 | Sight glass |
| 214 | heating element |
| 216 | Vent gas outlet respectively gas outlet unit |
| 218 | cross-sectional area |
| 219 | Begin run standard surface area |
| 220 | End run standard surface area |
| 222 | High surface area substrate |
| 223 | Begin run high surface area |
| 224 | End run high surface area |
| 226 | perimeter |
| 230 | growth guide element |
| 231 | top of growth guide element |
| 278 | source-material-holding-plate |
| 280 | gas-guide-gap |
| 282 | through holes |
| 296 | Vent gas |
| 298 | UPSIC rods |
| 300 | Comminution unit |
| 370 | upper surface of source-material-holding-plate |
| 372 | lower surface of source-material-holding-plate |
| 398 | UPSiC granules |
| 400 | Acid etching unit |
| 496 | Scrubber inlet water |
| 497 | Flare combustion gas |
| 498 | UPSiC etched granules |
| 500 | Vent gas treatment unit |
| 502 | Vent gas filter unit |
| 504 | Filtered vent gas |
| 506 | Scrubber unit |
| 512 | Scrubbed vent gas |
| 514 | Flare unit |
| 596 | Flare exhaust gas |

-continued

| List of reference signs | |
|---|---|
| 598 | Scrubber outlet water |
| 600 | Vent gas recycling unit |
| 602 | Cold distillation unit respectively separator unit |
| 604 | Si-bearing liquid mixture |
| 606 | HMW distillation unit |
| 608 | HMW liquids discharge |
| 610 | Cold distillation gas |
| 612 | Cryogenic distillation unit or further separator unit |
| 616 | H/C-bearing gas mixture |
| 618 | H/C detector unit respectively C mass flux measurement unit |
| 620 | Si-bearing gas mixture |
| 622 | Si detector unit respectively Si mass flux measurement unit |
| 624 | first storage and/or conducting element |
| 626 | second storage and/or conducting element |
| 628 | mixture of chlorosilanes storage and/or conducting element |
| 630 | HCl storage and/or conducting element |
| 632 | H2 and C storage and/or conducting element |
| 634 | first compressor |
| 636 | further compressor |
| 696 | HCl liquid discharge |
| 698 | Recycled vent gas |
| 699 | Comminution Unit |
| 700 | Precrusher |
| 701 | Crusher |
| 702 | Screening machine (undersize removal) |
| 703 | Screening machine (oversize removal) |
| 704 | Annealing furnace |
| 710 | precrushed SiC |
| 711 | crushed SiC (all particle sizes) |
| 712 | crushed SiC w/o undersized particles (1 . . . 30 mm) |
| 713 | undersized SiC (0 . . . 1 mm) |
| 714 | oversized SiC, return to crushing (>12 mm) |
| 715 | SiC product (1 . . . 12 mm) |
| 716 | annealed SiC (graphite free; 1 . . . 12 mm) |
| 799 | etching unit |
| 800 | etching basin |
| 801 | water basins (water cascade) |
| 802 | drying unit |
| 803 | packaging unit |
| 810 | etched SiC |
| 811 | acid-free SiC |
| 812 | dried SiC |
| 813 | packed SiC according to specification |
| 850 | manufacturing device or CVD unit or CVD reactor respectively SiC production reactor, in particular SiC PVT source material production reactor |
| 851 | first feeding device respectively first feed-medium source |
| 852 | second feeding device respectively second feed-medium source |
| 853 | third feeding device respectively third feed-medium source respectively |
| 854 | mixing device |
| 855 | evaporator device |
| 856 | process chamber |
| 857 | separating element or SiC growth substrate or deposition substrate |
| 858 | temperature measuring device or temperature control unit |
| 859 | Energy source, especially power supply |
| 859a | first power connection |
| 859b | second power connection |
| 860 | Pressure maintaining device or pressure control unit |
| 861 | outer surface of SiC growth substrate or SiC growth surface |
| 862 | base plate |
| 864 | bell jar |
| 864a | side wall section |
| 864b | top wall section |

-continued

| List of reference signs | |
|---|---|
| 865 | metal surface |
| 866 | gas inlet unit |
| 867 | reflective coating |
| 868 | cooling element |
| 870 | active cooling element |
| 872 | cooling fluid guide unit |
| 873 | fluid forwarding unit |
| 874 | pipe |
| 876 | hollow space between an inner and an outer wall |
| 880 | passive cooling element |
| 882 | ribbon |
| 884 | first ribbon end |
| 886 | second ribbon end |
| 890 | base plate and/or side wall section and/or top wall section sensor unit |
| 892 | cooling fluid temperature sensor |
| 894 | first rod |
| 896 | second rod |
| 898 | third rod |
| 899 | first rod end |
| 900 | second rod end |
| 902 | metal rod |
| 903 | coating of the SiC growth substrate |
| 904 | first metal rod end |
| 906 | second metal rod end |
| 920 | SiC particle |
| 921 | SiC solid |
| 922 | PVT source material |
| 924 | PVT source material lot |
| 926 | control device or control unit |
| 930 | boundary surface |
| 932 | cross-sectional area |
| 934 | core member |
| 948 | additional or alternative path to further SiC production reactor 950 |
| 949 | additional or alternative further path to further SiC production reactor 950 |
| 950 | further SiC production reactor respectively CVD reactor for the production of SiC |
| 952 | further process chamber of further SiC production reactor |
| 954 | heating unit |
| 956 | mixture of chlorosilanes |
| 958 | HCl |
| 959 | further processing step to convert HCl to chlorosilanes |
| 960 | mixture of H2 and at least one C-bearing molecule |
| 962 | first fluid |
| 964 | second fluid |
| 966 | reaction space |
| 968 | forwarding of PVT source material produced in SiC production reactor to PVT reactor |
| 970 | perimeter |
| 972 | arrow |
| 999 | System |
| 1000 | feed gas unit |
| 1040 | industrial C-bearing gas |
| 1070 | N gas discharge |
| 1080 | Si-bearing liquid evaporator |
| 1090 | C-bearing liquid evaporator |
| 1120 | Mass flow meter |
| 1130 | C-bearing liquid |
| | Feed gas mixture |
| 1160 | |
| 1180 | C/Si-bearing liquid |
| 1200 | C/Si-bearing gas |
| 2040 | Lower housing |
| 2120 | Vent gas |
| 2140 | Feed gas inlet |
| CA | central axis |
| PL | particle length |

The invention claimed is:

1. An SiC production reactor comprising a process chamber, a gas inlet unit for feeding one feed-medium or multiple feed-mediums into a reaction space of the process chamber, wherein the gas inlet unit is coupled with at least one feed-medium source, wherein a Si and C feed-medium source provides at least Si and C and wherein a carrier gas feed-medium source provides a carrier gas, or wherein the gas inlet unit is coupled with at least two feed-medium sources, wherein a Si feed medium source provides at least Si, and wherein a C feed medium source provides at least C, and wherein a carrier gas medium source provides a third feed medium, wherein the third feed medium is a carrier gas, one or multiple SiC growth substrate are arranged inside the process chamber for depositing SiC, wherein each SiC growth substrate comprises a first power connection and a second power connection, wherein the first power connections are first metal electrodes and wherein the second power connections are second metal electrodes, wherein each SiC growth substrate is coupled between at least one first metal electrode and at least one second metal electrode for heating the outer surface of the SiC growth substrates or a SiC growth surface of the deposited SiC to temperatures between 1300 °C and 1800 °C, a gas outlet unit for outputting vent gas, and a vent gas recycling unit, wherein the vent gas recycling unit is connected to the gas outlet unit, wherein the vent gas recycling unit comprises a separator unit for separating the vent gas into a first fluid and into a second fluid, wherein the first fluid is a liquid and wherein the second fluid is a gas, wherein a first storage and/or conducting element for storing or conducting the first fluid is part of the separator unit or coupled with the separator unit and wherein a second storage and/or conducting element for storing or conducting the second fluid is part of the separator unit or coupled with the separator unit.

2. The SiC production reactor according to claim 1, characterized in that the vent gas recycling unit comprises a further separator unit for separating the first fluid into at least two parts, wherein the two parts are a mixture of chlorosilanes and a mixture of HCl, $H_2$ and at least one C-bearing molecule, wherein the first storage and/or conducting element connects the separator unit with the further separator unit.

3. The SiC production reactor according to claim 2, characterized in that the further separator unit is coupled with a mixture of chlorosilanes storage and/or conducting element and with a HCl storage and/or conducting element and with an $H_2$ and C storage and/or conducting element, wherein the mixture of chlorosilanes storage and/or conducting element forms a section of a mixture of chlorosilanes mass flux path for conducting the mixture of chlorosilanes into the process chamber, wherein a Si mass flux measurement unit for measuring an amount of Si of the mixture of chlorosilanes is provided as part of the mass flux path prior to the process chamber.

4. The SiC production reactor according to claim 3, characterized in that the mixture of chlorosilanes storage and/or conducting element forms a section of a mixture of chlorosilanes mass flux path for conducting the mixture of chlorosilanes into a further process chamber of a further SiC production reactor or the $H_2$ and C storage and/or conducting element forms a section of an $H_2$ and C mass flux path for conducting the $H_2$ and the at least one C-bearing molecule into a further process chamber of a further SiC production reactor or the $H_2$ and C storage and/or conducting element forms a section of an $H_2$ and C mass flux path for conducting the $H_2$ and the at least one C-bearing molecule into the process chamber, wherein a C mass flux measurement unit for measuring an amount of C of the mixture of $H_2$ and the at least one C-bearing molecule is provided as part of the $H_2$ and C mass flux path prior to the process chamber.

5. The SiC production reactor according to claim 4, characterized in that the second storage and/or conducting element forms a section of the $H_2$ and C mass flux path for conducting the second fluid, which comprises $H_2$ and the at least one C-bearing molecule, into the process chamber, wherein the second storage and/or conducting element and the $H_2$ and C storage and/or conducting element are fluidly coupled or wherein the second storage and/or conducting element is coupled with a flare unit for burning the second fluid, or wherein the second storage and/or conducting element forms a section of a further $H_2$ and C mass flux path for conducting the second fluid, which comprises $H_2$ and the at least one C-bearing molecule, into the process chamber, wherein a further C mass flux measurement unit for measuring an amount of C of the second fluid is provided as part of the further $H_2$ and C mass flux path prior to the process chamber.

6. The SiC production reactor according to claim 3, characterized in that the further separator unit is configured to operate at a pressure above 5 bar and a temperature below ° C. and/or a temperature above 100 °C, wherein a further compressor for compressing the first fluid to a pressure above 5 bar is provided as part of the further separator unit or in a gas flow path between the separator unit and the further separator unit, wherein the further separator unit comprises a cryogenic distillation unit.

7. The SiC production reactor according to claim 3, characterized in that a control unit for controlling fluid flow of a feed-medium or multiple feed-mediums is part of the SiC production reactor, wherein the multiple feed-mediums comprise the first medium, the second medium, the third medium and the further Si feed medium and/or the further C feed medium via the gas inlet unit into the process chamber is provided, wherein the further Si feed medium consists of at least 95% [mass] or at least 98% [mass] or at least 99% [mass] or at least 99.9% [mass] or at least 99.99% [mass] or at least 99.999% [mass] of a mixture of chlorosilanes, wherein the further C feed medium comprises the at least one C-bearing molecule, HCl, $H_2$ and a mixture of chlorosilanes, wherein the further C feed medium comprises of at least 3% [mass] of at least one C-bearing molecule and wherein the further C feed medium comprises up to 10% [mass] of HCl, and wherein the further C feed medium comprises more than 5% of $H_2$ and wherein the further C feed medium comprises more than 0.01% [mass] of the mixture of chlorosilanes.

8. The SiC production reactor according to claim 3, characterized in that a heating unit is arranged in fluid flow direction between the further separator unit and the gas inlet unit for heating the mixture of chlorosilanes to transform the mixture of chlorosilanes from a liquid form into a gaseous form.

9. The SiC production reactor according to claim 1, characterized in that the process chamber is at least surrounded by a base plate, a side wall section and a top wall section, wherein the base plate comprises at least one cooling element for preventing heating of the base plate above a defined temperature and/or wherein the side wall section comprises at least one cooling element for preventing heating of the side wall section above a defined temperature and/or wherein the top wall section comprises at least one cooling element for preventing heating of the top wall section above a defined temperature.

10. The SiC production reactor according to claim 9, characterized in that the cooling element is an active cooling element, wherein the base plate and/or side wall section and/or top wall section comprises a cooling fluid guide unit for guiding a cooling fluid, wherein the cooling fluid guide unit is configured to limit heating of the base plate and/or side wall section and/or top wall section to a temperature below 1000 °C, wherein a base plate and/or side wall section and/or top wall section sensor unit is provided to detect temperature of the base plate and/or side wall section and/or top wall section and to output a temperature signal or temperature data and/or a cooling fluid temperature sensor is provided to detect the temperature of the cooling fluid, and a fluid forwarding unit is provided for forwarding the cooling fluid through the fluid guide unit, wherein the fluid forwarding unit is configured to be operated in dependency of the temperature signal or temperature data provided by the base plate and/or side wall section and/or top wall section sensor unit and/or cooling fluid temperature sensor, wherein the cooling fluid is water.

11. The SiC production reactor according to claim 9, characterized in that the cooling element is a passive cooling element, wherein the cooling element is at least partially formed by a polished steel surface of the base plate, the side wall section and/or the top wall section, wherein the cooling element is a coating, wherein the coating is formed on top of the polished steel surface and wherein the coating is configured to reflect heat, wherein the coating is a metal coating or comprises metal, wherein the emissivity of the polished steel surface and/or of the coating is below 0.3.

12. The SiC production reactor according to claim 1, characterized in that the base plate comprises at least one active cooling element and one passive cooling element for preventing heating of the base plate above a defined temperature and/or the side wall section comprises at least one active cooling element and one passive cooling element for preventing heating of the side wall section above a defined temperature and/or the top wall section comprises at least one active cooling element and one passive cooling element for preventing heating of the top wall section above a defined temperature, wherein the side wall section and the top wall section are formed by a bell jar, wherein the bell jar is preferably movable with respect to the base plate, wherein more than 50% [mass] of the side wall section and/or more than 50% [mass] of the top wall section and/or more than 50% [mass] of the base plate is made of metal.

13. The SiC production reactor according to claim 1, characterized in that the SiC growth substrate has an average perimeter of at least 5 cm around a cross-sectional area orthogonal to the length direction of the SiC growth substrate or multiple SiC growth substrates have an average perimeter per SiC growth substrate of at least 5 cm around a cross-sectional area orthogonal to the length direction of the respective SiC growth substrate, wherein the SiC growth substrate comprises or consists of SiC or C or wherein multiple SiC growth substrates comprise or consist of SiC or C, characterized in that the shape of the cross-sectional area orthogonal to the length direction of the SiC growth substrate differs at least in sections from a circular shape, wherein a ratio U/A between the cross-sectional area A and the perimeter U around the cross-sectional area is higher than 1.2 1/cm, wherein the SiC growth substrate is formed by at least one carbon ribbon, wherein the at least one carbon ribbon comprises a first ribbon end and a second ribbon end, wherein the first ribbon end is coupled with the first metal electrode and wherein the second ribbon end is coupled with the second metal electrode or wherein each of multiple the SiC growth substrates is formed by at least one carbon ribbon, wherein the at least one carbon ribbon per SiC growth substrate comprises a first ribbon end and a second ribbon end, wherein the first ribbon end is coupled with the first metal electrode of the respective SiC growth substrate and wherein the second ribbon end is coupled with the second metal electrode of the respective SiC growth substrate.

14. The SiC production reactor according to claim 12, characterized in that the SiC growth substrate is formed by multiple rods, wherein each rod has a first rod end and a second rod end, wherein all first rod ends are coupled with the same first metal electrode and wherein all second rod ends are coupled with the same second metal electrode or wherein each of multiple SiC growth substrates is formed by multiple rods, wherein each rod has a first rod end and a second rod end, wherein all first rod ends are coupled with the same first metal electrode of the respective SiC growth substrate and wherein all second rod ends are coupled with the same second metal electrode of the respective SiC growth substrate.

15. The SiC production reactor according to claim 12, characterized in that the SiC growth substrate is formed by at least one metal rod, wherein the metal rod has a first metal rod end and a second metal rod end, wherein the first metal rod end is coupled with the first metal electrode and wherein the second metal rod end is coupled with the second metal electrode or wherein each of multiple SiC growth substrates is formed by at least one metal rod, wherein each metal rod has a first metal rod end and a second metal rod end, wherein the first metal rod end is coupled with the first metal electrode of the respective SiC growth substrate and wherein the second metal rod end is coupled with the second metal electrode of the respective SiC growth substrate.

16. An SiC production facility, at least comprising multiple SiC production reactors, wherein each SiC production reactor at least comprises a process chamber, a gas inlet unit for feeding a feed-medium or multiple feed-mediums into the process chamber a SiC growth substrate arranged inside the process chamber, a first power connection and a second power connection, wherein the SiC growth substrate is coupled between the first power connection and the second power connection for heating the SiC growth substrate due to resistant heating, and a gas outlet unit for outputting vent gas a vent gas recycling unit, wherein the vent gas recycling unit is connected to the gas outlet units of the SiC production reactors, wherein the vent gas recycling unit comprises a separator unit for separating the vent gas into a first fluid and into a second fluid, wherein the first fluid is a liquid and wherein the second fluid is a gas.

17. A PVT source material production method for the production of a PVT source material consisting of SiC, at least comprising the steps of:

Providing a source medium inside a process chamber, wherein a gas outlet unit for outputting vent gas out of the process chamber and a vent gas recycling unit are provided, wherein the vent gas recycling unit is connected to the gas outlet unit, wherein the vent gas recycling unit comprises a separator unit for separating the vent gas into a first fluid and into a second fluid, wherein the first fluid is a liquid and wherein the second fluid is a gas, wherein the vent gas recycling unit comprises a further separator unit for separating the first fluid into at least two parts, wherein the two parts are a mixture of chlorosilanes and a mixture of HCl, $H_2$ and at least one C-bearing molecule, or alternatively into at least three parts, wherein the three parts are a mixture of chlorosilanes HCl and a mixture of $H_2$ and at least one C-bearing molecule, wherein the first storage and/or conducting element connects the separator unit with the further separator unit, wherein the further separator unit is coupled with a mixture or chlorosilanes storage and/or conducting element, wherein the mixture of chlorosilanes storage and/or conducting element forms a section of a mixture of chlorosilanes mass flux path for conducting the mixture of chlorosilanes into the process chamber Feeding the mixture of chlorosilanes via the mixture of chlorosilanes mass flux path into the process chamber for providing at least one part of the source medium, Electrically energizing at least one SiC growth substrate, disposed in the process chamber to heat the SiC growth substrate/s to a temperature in the range between 1300 °C and 2000 °C, wherein each SiC growth substrate comprises a first power connection and a second power connection, wherein the first power connections are first metal electrodes and wherein the second power connections are second metal electrodes, and Setting a deposition rate for removing Si and C from the source medium and for depositing the removed Si and C as SiC on the SiC growth substrate/s.

18. The PVT source material production method according to claim 17, characterized by measuring a Si mass flux of the mixture of chlorosilanes, wherein the Si mass flux measurement is carried out by a Si mass flux measuring unit, wherein the Si mass flux measuring unit is provided as part of the mixture of chlorosilanes mass flux path prior to the process chamber and controlling feeding of the mixture of chlorosilanes to a mixing device in dependency of an output of the Si mass flux measuring unit and conducting the second fluid, which comprises $H_2$ and the at least one C-bearing molecule, into the process chamber, wherein the second fluid is conducted via a second storage and/or conducting element which forms a section of the $H_2$ and C mass flux path into the process chamber and measuring a C mass flux, wherein the C mass flux measurement is carried out by a C mass flux measuring unit, wherein the C mass flux measuring unit is provided as part of the $H_2$ and C mass flux path prior to the process chamber and controlling feeding the second fluid in dependency of an output of the C mass flux measuring unit.

19. The PVT source material production method according to claim 18, characterized by measuring a Si mass flux of the mixture of chlorosilanes, wherein the Si mass flux measurement is carried out by a Si mass flux measuring unit, wherein the Si mass flux measuring unit is provided as part of the mixture of chlorosilanes mass flux path prior to the process chamber, conducting the second fluid, which comprises $H_2$ and the at least one C-bearing molecule, into the process chamber, wherein the second fluid is conducted via a second storage and/or conducting element which forms a section of the $H_2$ and C mass flux path into the process chamber, measuring a C mass flux, wherein the C mass flux measurement is carried out by a C mass flux measuring unit, wherein the C mass flux measuring unit is provided as part of the $H_2$ and C mass flux path prior to the process chamber, controlling feeding of the mixture of chlorosilanes to a mixing device in dependency of an output of the Si mass flux measuring unit and controlling feeding the second fluid in dependency of an output of the C mass flux measuring unit, wherein the process chamber is at least surrounded by a base plate, a side wall section and a top wall section, wherein more than 50% [mass] of the side wall section and more than 50% [mass] of the top wall section and more than 50% [mass] of the base plate is made of metal, wherein the base plate comprises at least one cooling element for preventing heating the base plate above a defined temperature and/or wherein the side wall section comprises at least one cooling element for preventing heating the side wall section above a defined temperature and/or wherein the top wall section comprises at least one cooling element for preventing heating the top wall section above a defined temperature, wherein a base plate and/or side wall section and/or top wall section sensor unit is provided to detect temperature of the base plate and/or side wall section and/or top wall section and to output a temperature signal or temperature data and/or a cooling fluid temperature sensor is provided to detect the temperature of the cooling fluid, and a fluid forwarding unit is provided for forwarding the cooling fluid through the fluid guide unit, wherein the fluid forwarding unit is configured to be operated in dependency of the temperature signal or temperature data provided by the base plate and/or side wall section and/or top wall section sensor unit and/or cooling fluid temperature sensor.

20. The PVT source material production method according to claim 18, characterized in that the step of providing a source medium inside a process chamber also comprises introducing at least a first feed-medium into the process chamber, said first feed medium comprises Si, wherein the first-feed medium has a purity which excludes at least 99.9999% (ppm wt) of the substances B, Al, P, Ti, V, Fe, and Ni, and introducing at least a second feed-medium into the process chamber, the second feed medium comprises C, wherein the second-feed medium has a purity which excludes at least 99.9999% (ppm wt) of the substances B, Al, P, Ti, V, Fe, and Ni, and introducing a carrier gas, wherein the carrier gas has a purity which excludes at least 99.9999% (ppm wt) of the substances B, Al, P, Ti, V, Fe, and Ni, or introducing one feed-medium into the process chamber, said feed medium comprises Si and C, wherein the feed medium has a purity which excludes at least 99.9999% (ppm wt) of the substances B, Al, P, Ti, V, Fe, and Ni, and introducing a carrier gas, wherein the carrier gas has a purity which excludes at least 99.9999% (ppm wt) of the substances B, Al, P, Ti, V, Fe, and Ni and setting a pressure inside the process chamber above 1 bar by introducing a defined amount of a mixture of the first source gas, which provides Si, and the second source gas, which provides C, into the process chamber, wherein the defined amount is an amount between 0.32 g of the mixture per hour and per $cm^2$ of a SiC growth surface and 10 g of the mixture per hour and per $cm^2$ of the SiC growth surface or setting a pressure inside the process chamber above 1 bar by introducing a defined amount of a Si and C containing source gas into the process chamber, wherein the defined amount is an amount between 0.32 g of the Si and C containing source gas per hour and per $cm^2$ of the SiC growth surface and 10 g of the Si and C containing source gas per hour and per $cm^2$ of the SiC growth surface.

21. The PVT source material production method according to claim 18, characterized in that the SiC growth substrate has an average perimeter of at least 5 cm around a cross-sectional area orthogonal to the length direction of the SiC growth substrate or multiple SiC growth substrates have an average perimeter per SiC growth substrate of at least 5 cm around a cross-sectional area orthogonal to the length direction of the respective SiC growth substrate wherein the SiC depositing on the SiC growth substrate has impurities of less than 10 ppm (weight) of the substance N and of less than 1000 ppb of the sum of all of the metals Ti, V, Fe, and Ni.

22. The PVT source material production method according to claim 18, characterized by Disaggregating the SiC solid into SiC particles having an average length of more than 100 μm.

23. The PVT source material produced according to claim 22 wherein the PVT source material consists of SiC particles, wherein the average length of the SiC particles is more than 100 μm, wherein the SiC particles have impurities of less than 10 ppm of the substance N and of less than 1000 ppb (weight), of the sum of all of the metals Ti, V, Fe, and Ni, wherein the tapped density of the SiC particles is above 1.8 g/cm3.

24. The PVT source material produced according to claim 23, wherein the PVT source material forms a SiC solid, wherein the SiC solid is characterized by a mass of more than 1 kg, a thickness of at least 1 cm, a length of more than 50 cm wherein the SiC solid has impurities of less than 10 ppm (weight) of the substance N and of less than 1000 ppb (weight) of the sum of all of the metals Ti, V, Fe, and Ni, wherein the SiC is SiC of polytype 3C and/or polycrystalline SiC.

25. A method for the production of at least one SiC crystal comprising the steps:

providing a PVT reactor for the production of at least one SiC crystal, wherein the PVT reactor comprises a furnace unit, wherein the furnace unit comprises a furnace housing with an outer surface and an inner surface, at least one crucible unit wherein the crucible unit is arranged inside the furnace housing, wherein the crucible unit comprises a crucible housing, wherein the crucible housing has an outer surface and an inner surface, wherein the inner surface at least partially defines a crucible volume, wherein a receiving space for receiving a source material is arranged or formed inside the crucible volume, wherein a seed holder unit for holding a defined seed wafer is arranged inside the crucible volume, wherein the seed wafer holder holds a seed wafer, wherein the furnace housing inner wall and the crucible housing outer wall define a furnace volume, at least one heating unit for heating the source material, wherein the receiving space for receiving the source material is at least in parts arranged above the heating unit and below the seed holder unit, adding PVT source material as source material into the receiving space, sublimating the added PVT source material and depositing the sublimated SiC on the seed wafer and thereby forming the at least one or exactly one SiC crystal, wherein the PVT reactor comprises a crucible gas flow unit, wherein the crucible gas flow unit comprises a crucible gas inlet tube for conducting gas into the crucible volume, wherein the crucible gas inlet tube is arranged in vertical direction below the receiving space and the step conducting gas via the crucible gas flow unit into the crucible housing.

26. The SiC crystal produced according to claim 25 characterized in that the SiC crystal has impurities of less than 1000 ppb (weight) of the sum of all of the metals Ti, V, Fe, and Ni and the SiC crystal is a monocrystalline SiC crystal forming a monolithic block, wherein the monolithic block has a volume of more than 400 $cm^3$.

27. A system for carrying out the method according to claim 18.

* * * * *